United States Patent [19]

Bellay et al.

[11] Patent Number: 4,459,660
[45] Date of Patent: Jul. 10, 1984

[54] MICROCOMPUTER WITH AUTOMATIC REFRESH OF ON-CHIP DYNAMIC RAM TRANSPARENT TO CPU

[75] Inventors: Jeffrey D. Bellay, Houston; Michael J. Hogan, Sugar Land; Kevin C. McDonough; John W. Hayn, both of Houston, all of Tex.

[73] Assignee: Texas Instruments Incorporated, Dallas, Tex.

[21] Appl. No.: 253,467

[22] Filed: Apr. 13, 1981

[51] Int. Cl.³ ............................................. G06F 13/00
[52] U.S. Cl. ..................................... 364/200; 365/222
[58] Field of Search ... 364/200 MS File, 900 MS File; 365/222

[56] References Cited

U.S. PATENT DOCUMENTS 4,332,008  5/1982  Shima et al. ..................... 365/222 X

OTHER PUBLICATIONS

Glaise, R., "Quasi-Transparent Refresh Mechanism for Dynamic Memories in Microprocessor Environment," *IBM T.D.B.*, vol. 22, No. 3, Aug. 1979, pp. 1037-1038.

Primary Examiner—Raulfe B. Zache
Attorney, Agent, or Firm—John G. Graham

[57] ABSTRACT

A microcomputer device is disclosed containing a ROM for program memory, a read/write memory, and a CPU in a single integrated circuit. Input/output ports, interrupt and operating mode controls are memory mapped in the same logical address space as the program and read/write memory. The read/write memory is an array of one-transistor type dynamic storage cells in which data bits are stored in capacitor; refresh of this dynamic RAM is accomplished in a manner transparent to the CPU by an automatically-incremented address counter. Each data bit uses two one-transistor cells in a balanced, complementary array.

9 Claims, 56 Drawing Figures

MEMORY MAP

PF REGS USED FOR SINGLE-CHIP MICRO-COMPUTER MODE

| REG. NO | HEX ADDRESS | FUNCTION |
|---|---|---|
| P0 | 0100 | I/O REG. 25 |
| P1 | 0101 | TIMER DATA |
| P2 | 0102 | TIMER CONTROL |
| P3 | 0103 | PORT A DATA |
| P4 | 0104 | |
| P5 | 0105 | |
| P6 | 0106 | PORT B DATA |
| P7 | 0107 | PORT B EXP |
| P8 | 0108 | PF EXPANSION |
| P9 | 0109 | |
| P10 | 010A | PORT D DATA |
| P11 | 010B | PORT D DIRECTION |
| P12 | 010C | PF REGISTERS AT 010C TO 01FF AVAILABLE FOR PERIPHERAL FILE EXPANSION |
| ... | ... | |
| P255 | 01FE / 01FF | |

Fig. 2b

PF REGS FOR PERIPHERAL EXPANSION MODE

| PF REG NO | HEX ADDRESS | | | | | | | | FUNCTION |
|---|---|---|---|---|---|---|---|---|---|
| P0 | 0100 | | | | | | | | I/O REG. 25 |
| P0 | 0101 | | | | | | | | |
| P2 | 0102 | | | | | | | | TIMER DATA |
| P3 | 0103 | | | | | | | | TIMER CONTROL |
| P4 | 0104 | | | | | | | | PORT A DATA |
| P5 | 0105 | | | | | | | | |
| P6 | 0106 | DATA | | | EXP. | | | | PORT B |
| P7 | 0107 | | | | | | | | |
| P8 | 0108 | | | | | | | | |
| P9 | 0109 | | | | | | | | |
| P10 | 010A | | | | | | | | |
| P11 | 010B | | | | | | | | PF REGISTERS AT 0108 TO 01FF AVAILABLE FOR EXPANSION OFF-CHIP |
| P | 010C | | | | | | | | |
| | 01FE | | | | | | | | |
| P255 | 01FF | | | | | | | | |
| | 0200 | | | | | | | | 60,928 BYTES AVAILABLE FOR MEMORY EXPANSION OFF-CHIP |
| | EFFF | | | | | | | | |
| | F000 | | | | | | | | PROGRAM MEMORY IN ROM ON-CHIP |
| | FFFF | | | | | | | | |

*Fig. 2c*
MEMORY MAP FOR FULL EXPANSION

MEMORY MAP FOR MICROPROCESSOR MODE

MEMORY MAP FOR SYSTEM EVALUATOR MODE

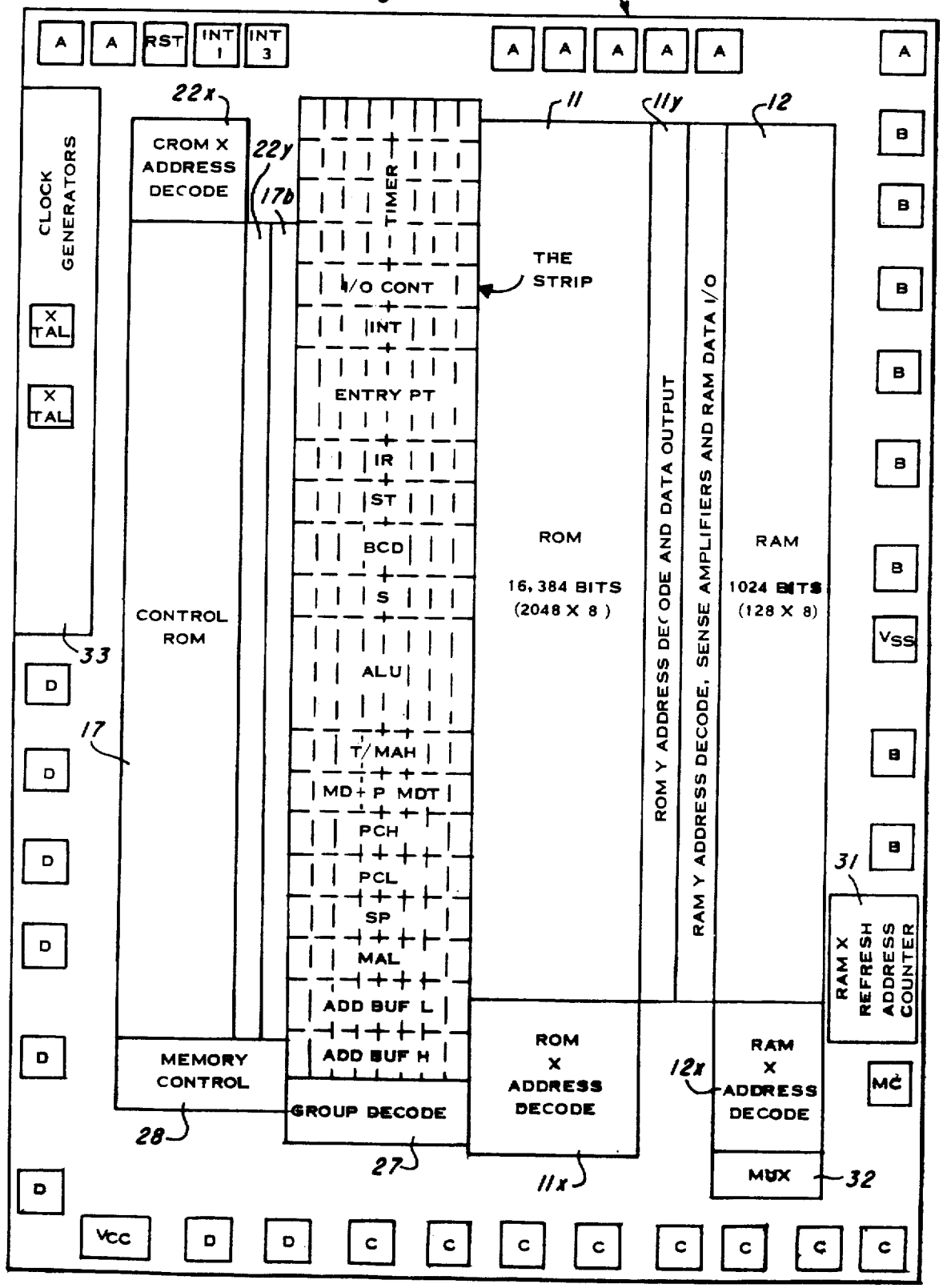

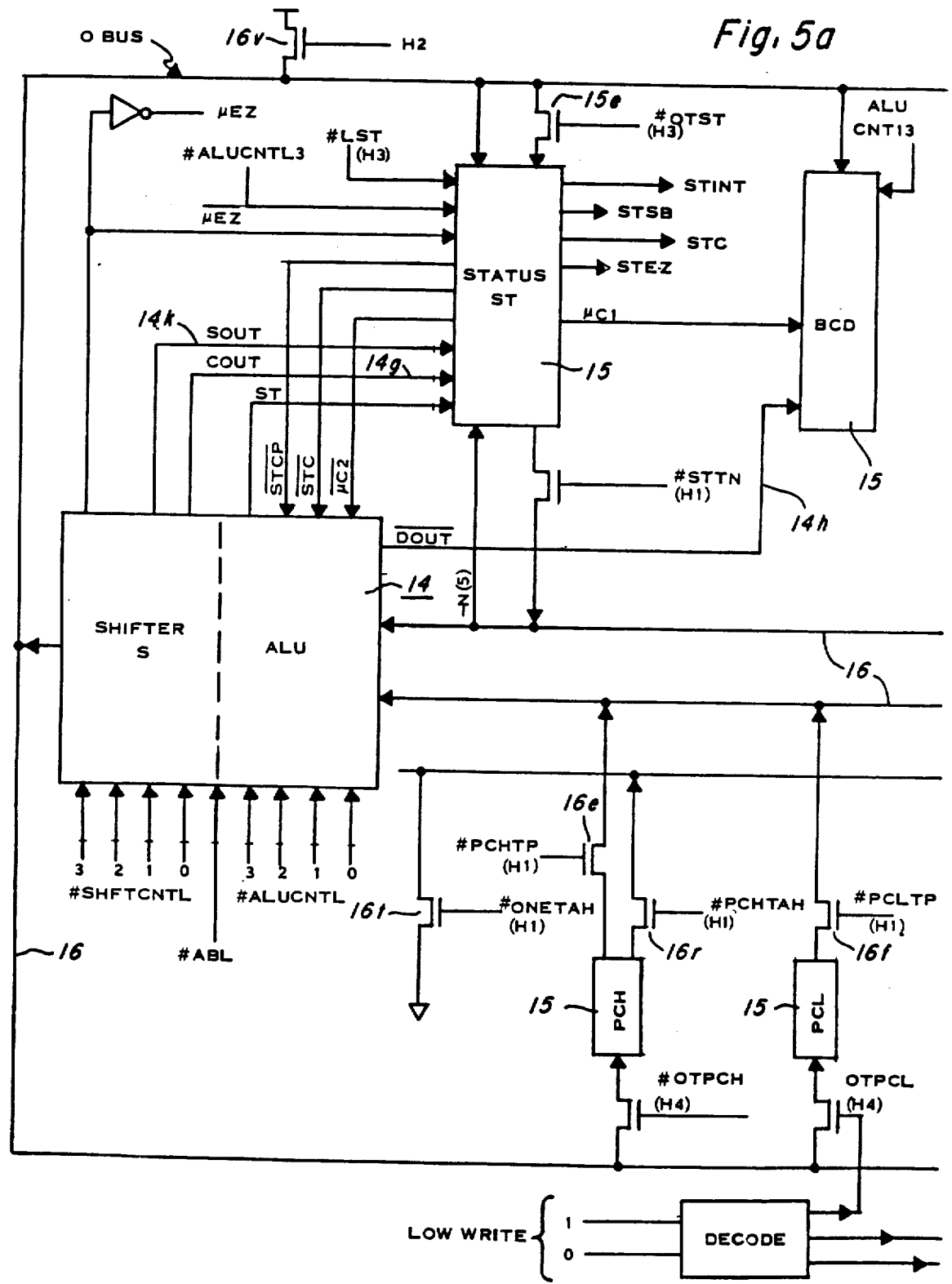

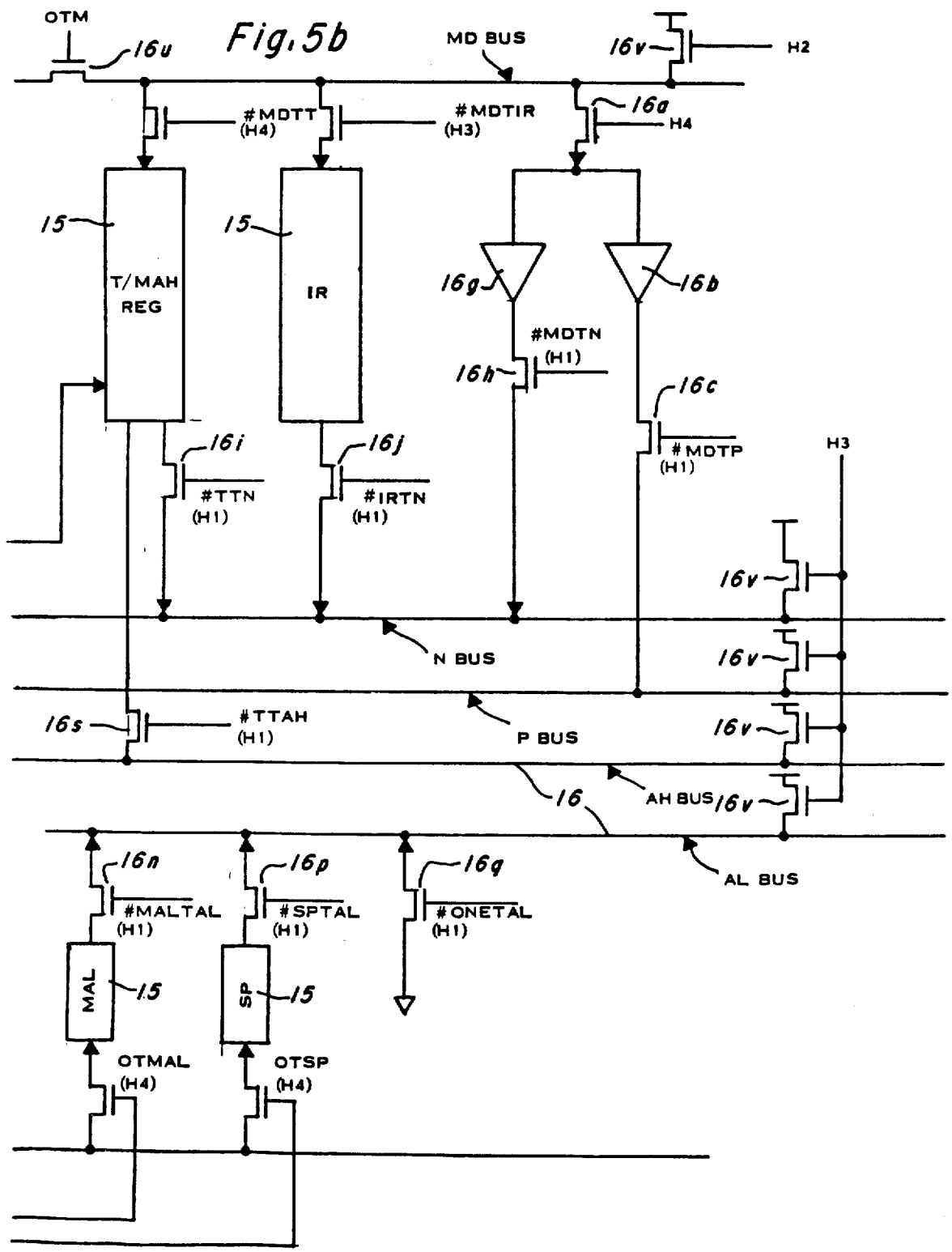

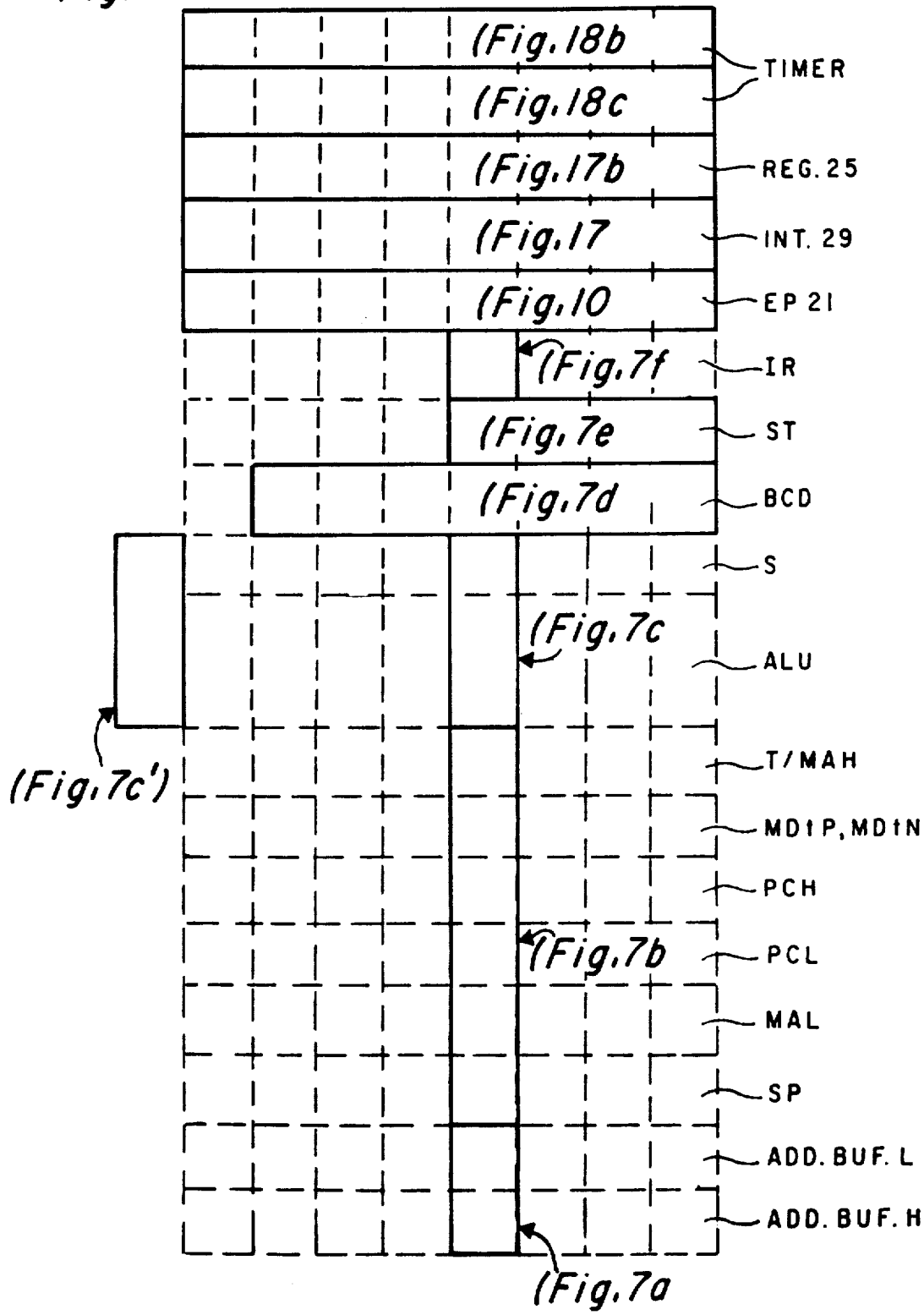

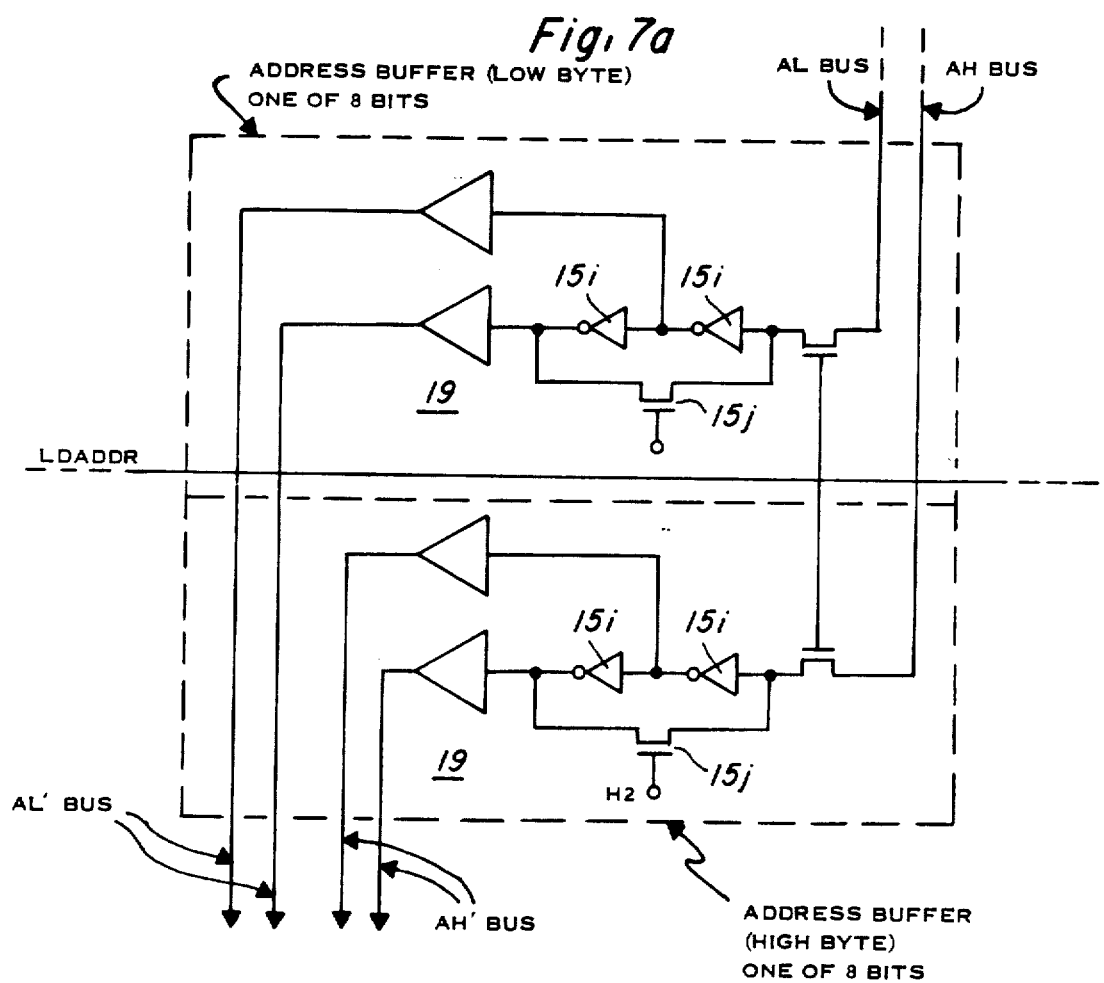

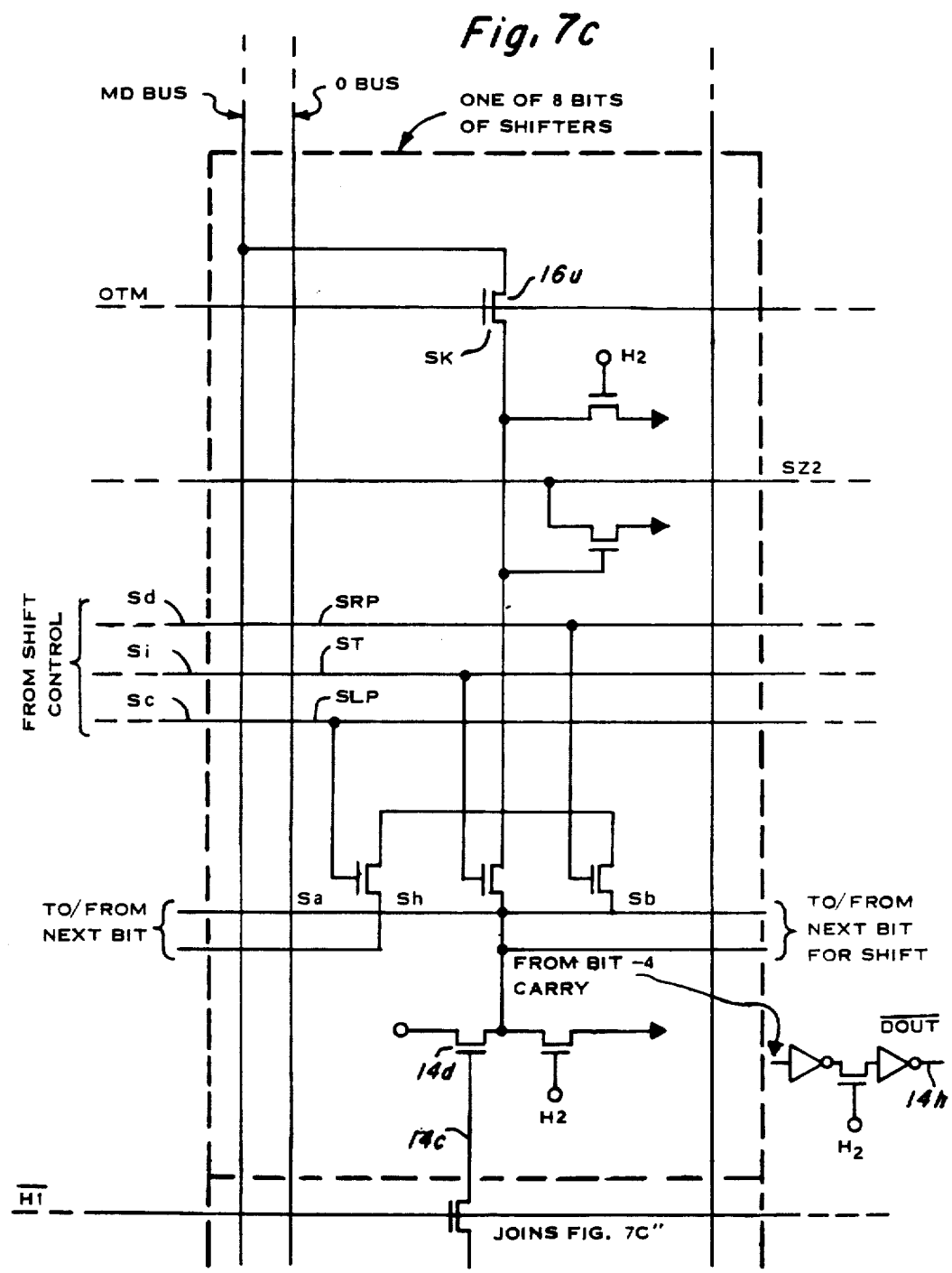

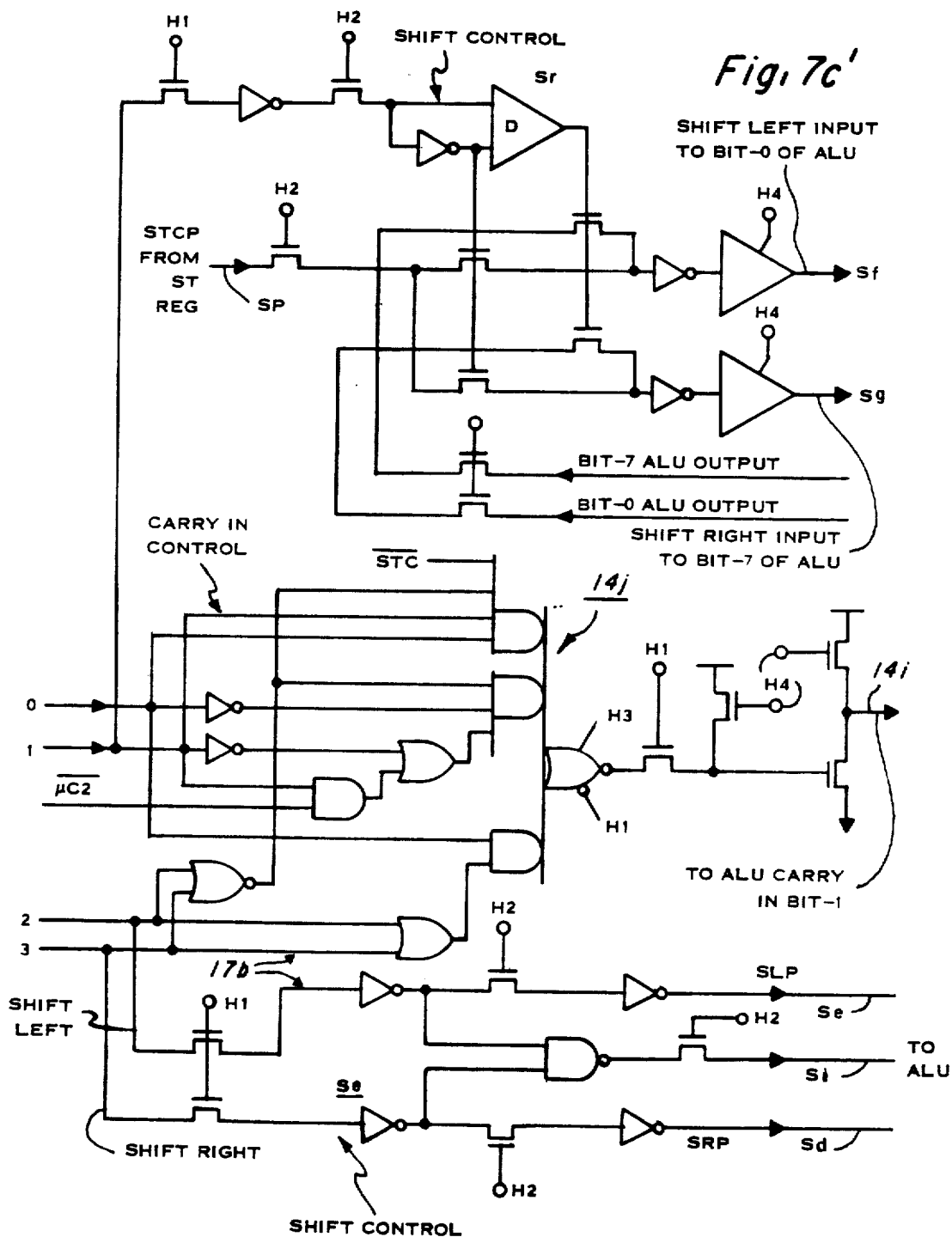

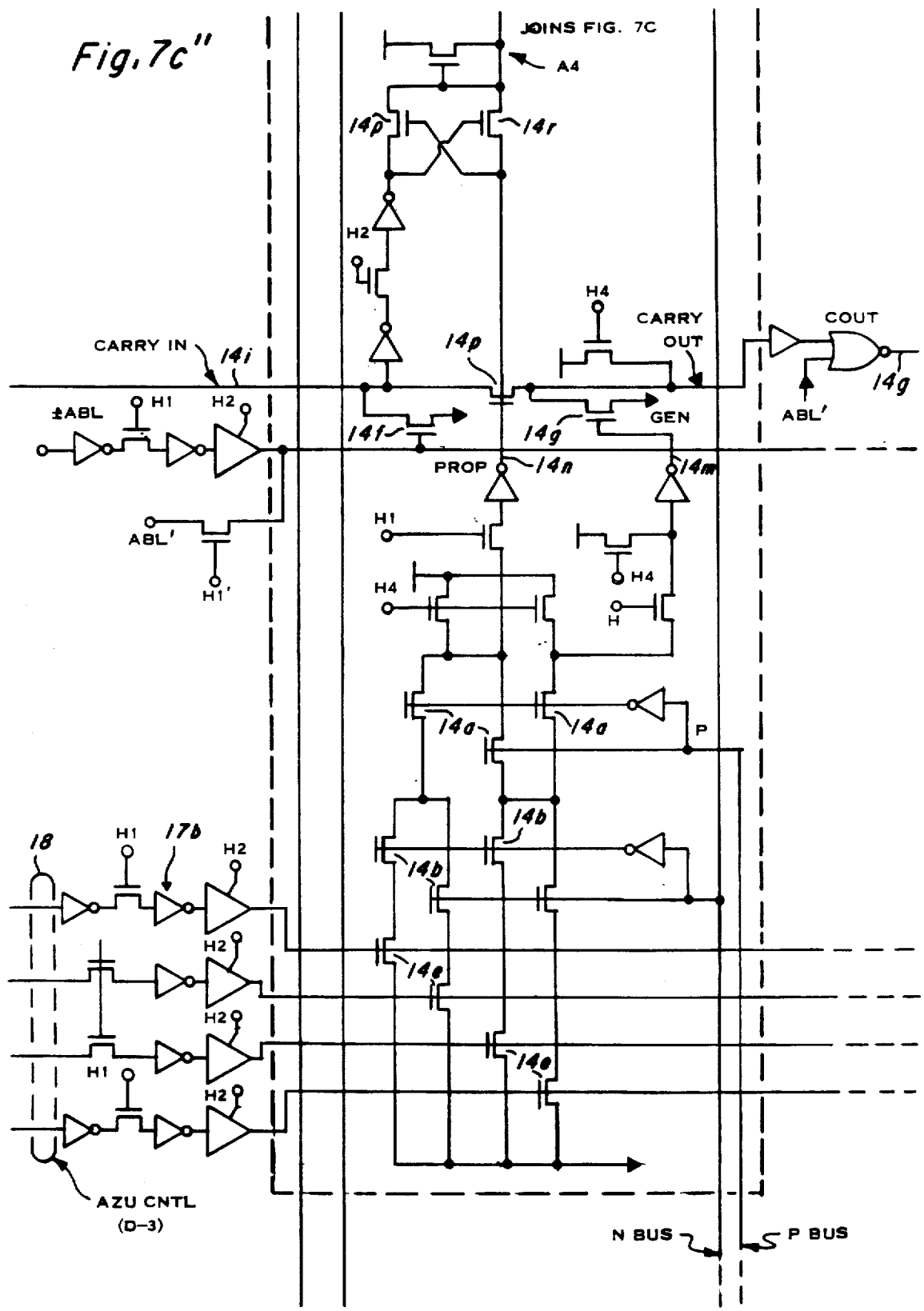
Fig. 7c"

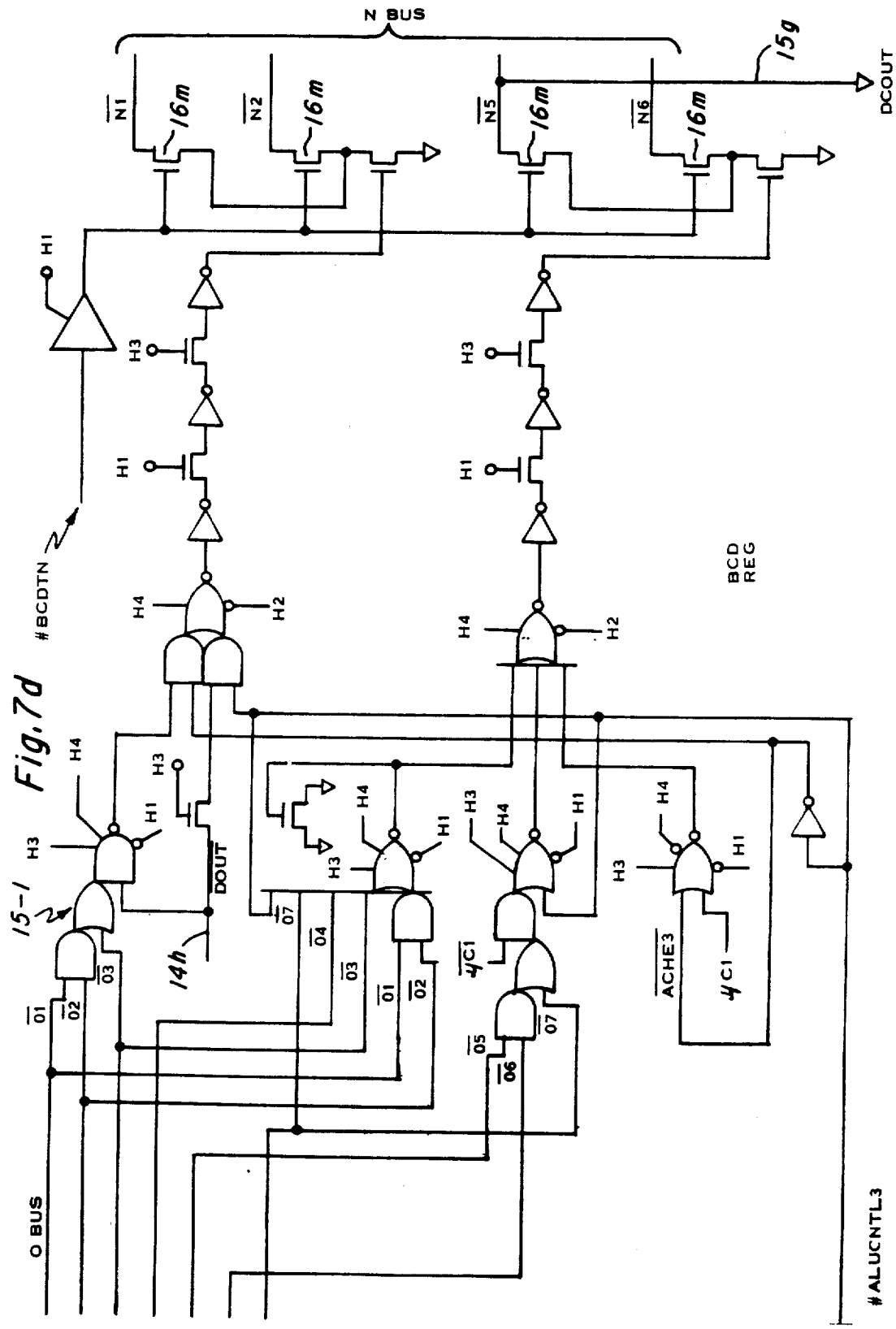

BCD ARITHMETIC OPERATION TIMING

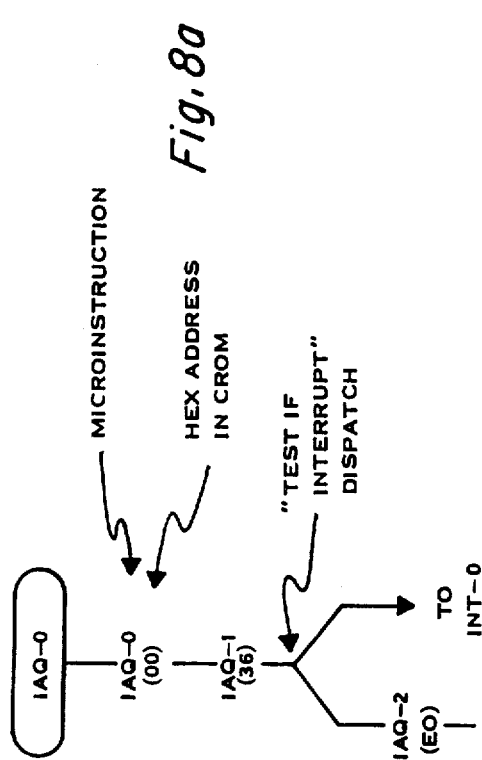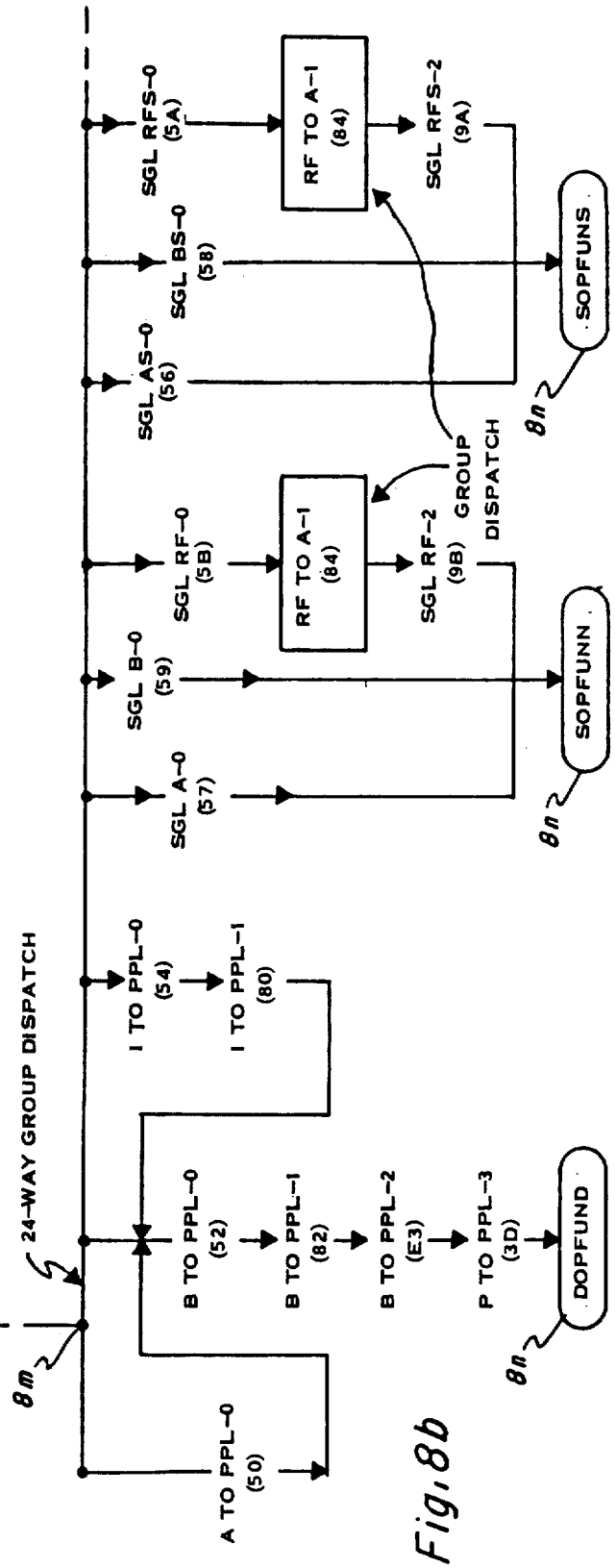

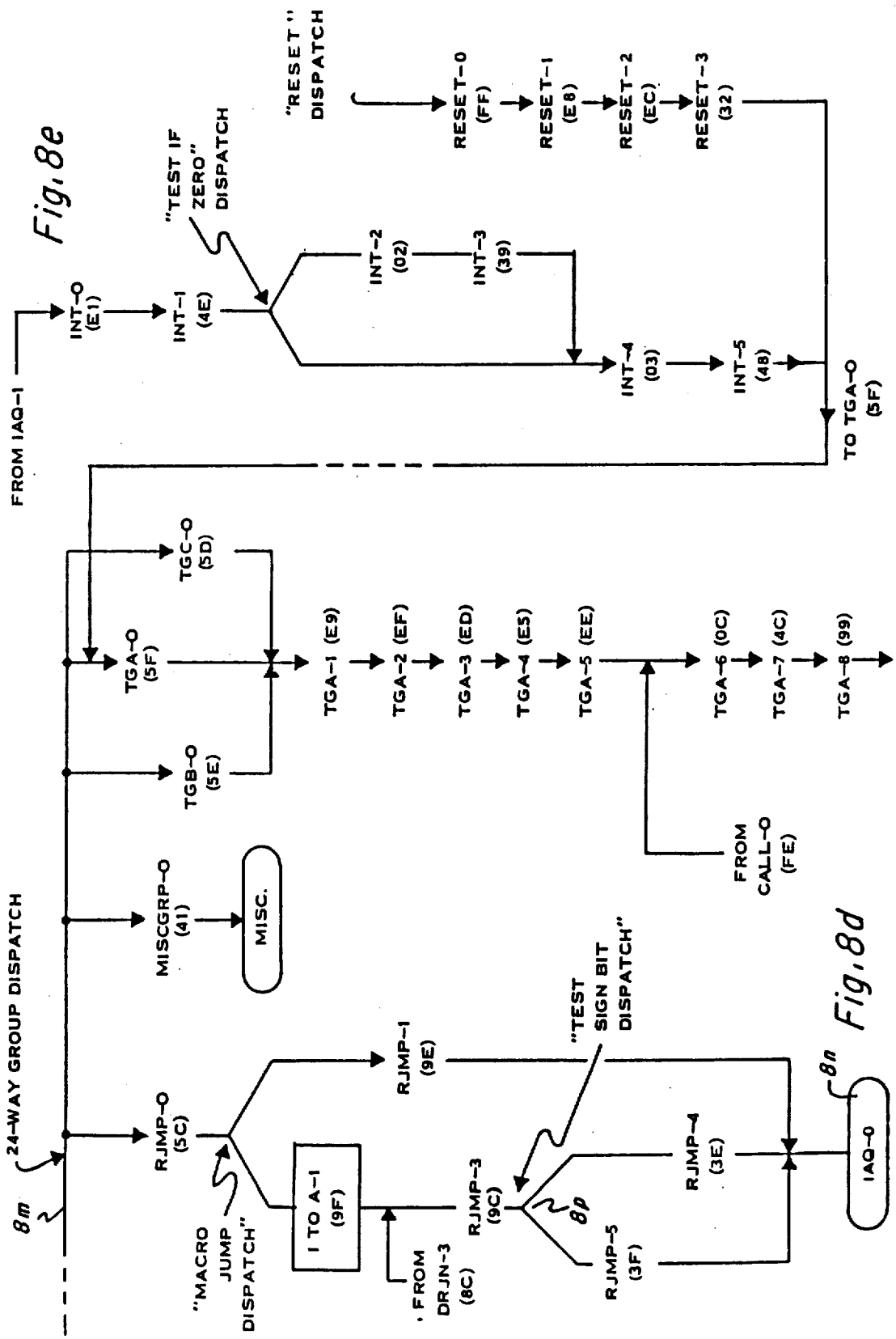

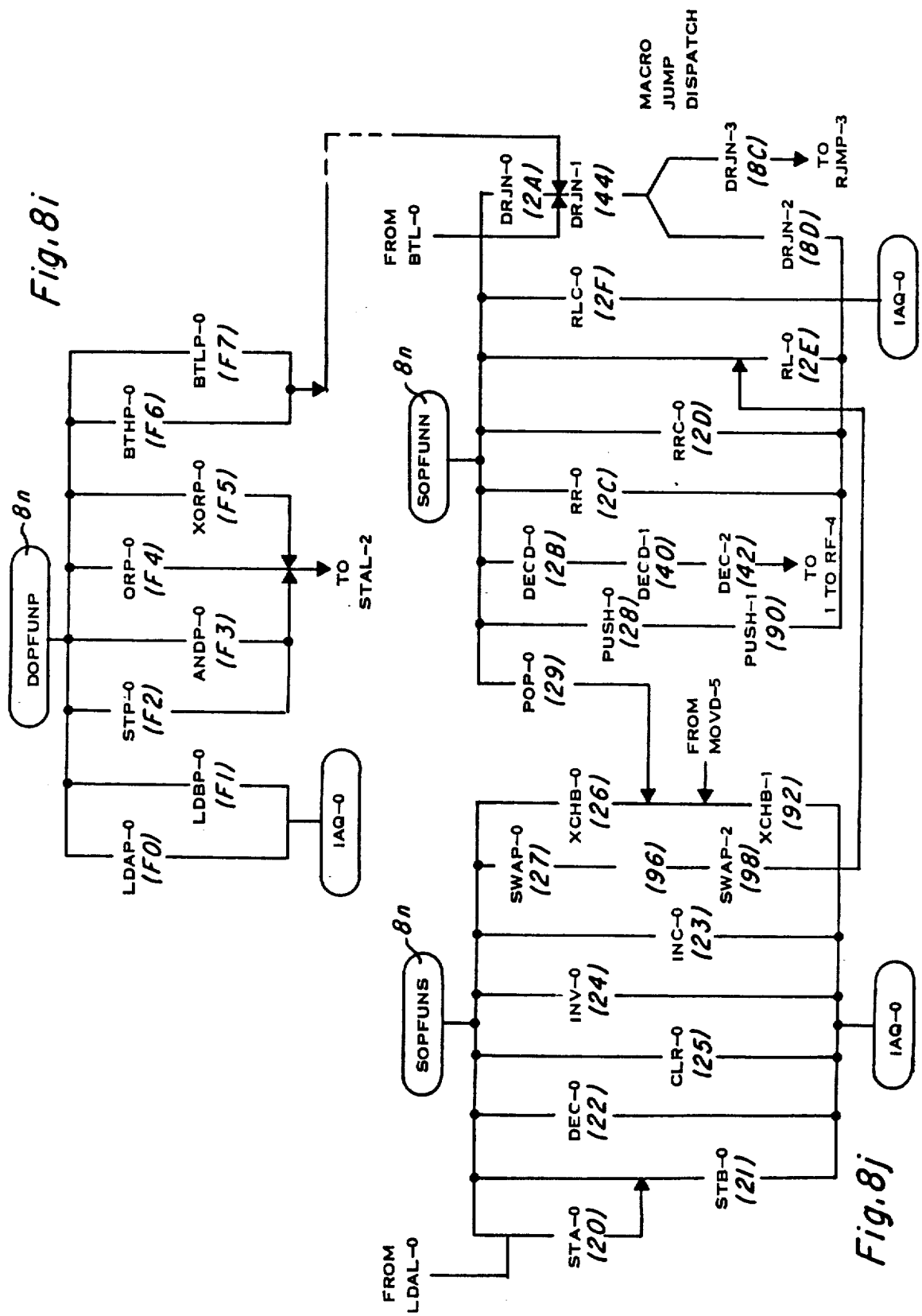

– OPCODE MAP –

Legend:
- A – A Register
- B – B Register
- Rn – Register File
- Pn – Peripheral File
- %n – Immediate
- @n – Direct
- *Rn – Indirect

| Hi\Lo | 0000 0 | 0001 1 | 0010 2 | 0011 3 | 0100 4 | 0101 5 | 0110 6 | 0111 7 | 1000 8 | 1001 9 | 1010 A | 1011 B | 1100 C | 1101 D | 1110 E | 1111 F |
|---|---|---|---|---|---|---|---|---|---|---|---|---|---|---|---|---|
| 0000 0 | NOP | | | | | | | | | | | | | | JMP | TRAP 15 |
| 0001 1 | IDLE | MOV Rn,A | MOV %n,A | MOV Rn,B | MOV Rn,Rn | MOV %n,B | MOV B,A | MOV %n,Pn | MOVP Pn,A | MOVP Pn,B | | TSTA/CLRC | TSTB | MOV A,Rn | JN/JLT | TRAP 14 |
| 0010 2 | | AND Rn,A | AND %n,A | AND Rn,B | AND Rn,Rn | AND %n,B | AND B,A | AND %n,R | MOVP A,Pn | MOVP B,Pn | MOVP %n,Pn | DEC A | DEC B | DEC Rn | JZ/JEQ | TRAP 13 |
| 0011 3 | | OR Rn,A | OR %n,A | OR Rn,B | OR Rn,Rn | OR %n,B | OR B,A | OR %n,R | ANDP A,Pn | ANDP B,Pn | ANDP %n,Pn | INC A | INC B | INC Rn | JC/JHS | TRAP 12 |
| 0100 4 | | XOR Rn,A | XOR %n,A | XOR Rn,B | XOR Rn,Rn | XOR %n,B | XOR B,A | XOR %n,R | ORP A,Pn | ORP B,Pn | ORP %n,Pn | INV A | INV B | INV Rn | JP/JGT | TRAP 11 |
| 0101 5 | EINT | BTJO Rn,A | BTJO %n,A | BTJO Rn,B | BTJO Rn,Rn | BTJO %n,B | BTJO B,A | BTJO %n,R | XORP A,Pn | XORP B,Pn | XORP %n,Pn | CLR A | CLR B | CLR Rn | JPZ/JGE | TRAP 10 |
| 0110 6 | DINT | BTJZ Rn,A | BTJZ %n,A | BTJZ Rn,B | BTJZ Rn,Rn | BTJZ %n,B | BTJZ B,A | BTJZ %n,R | BTJOP A,Pn | BTJOP B,Pn | BTJOP %n,Pn | XCHB A | XCHB B | XCHB Rn | JNZ/JNE | TRAP 9 |
| 0111 7 | SETC | BTJZ Rn,A | BTJZ %n,A | BTJZ Rn,B | BTJZ Rn,Rn | BTJZ %n,B | BTJZ B,A | BTJZ %n,R | BTJZP A,Pn | BTJZP B,Pn | BTJZP %n,Pn | SWAP A | SWAP B | SWAP Rn | JNC/JL | TRAP 8 |
| 1000 8 | POP ST | ADD Rn,A | ADD %n,A | ADD Rn,B | ADD Rn,Rn | ADD %n,B | ADD B,A | ADD %n,R | MOVD @n,Rn | MOVD Rn,Rn | MOVD %n(B),Rn | PUSH A | PUSH B | PUSH Rn | TRAP 23 | TRAP 7 |
| 1001 9 | STSP | ADC Rn,A | ADC %n,A | ADC Rn,B | ADC Rn,Rn | ADC %n,B | ADC B,A | ADC %n,R | | | | POP A | POP B | POP Rn | TRAP 22 | TRAP 6 |
| 1010 A | RETS | SUB Rn,A | SUB %n,A | SUB Rn,B | SUB Rn,Rn | SUB %n,B | SUB B,A | SUB %n,R | LDA @n | LDA *Rn | LDA @n(B) | DJNZ A | DJNZ B | DJNZ Rn | TRAP 21 | TRAP 5 |
| 1011 B | RETI | SBB Rn,A | SBB %n,A | SBB Rn,B | SBB Rn,Rn | SBB %n,B | SBB B,A | SBB %n,R | STA @n | STA *Rn | STA @n(B) | DECD A | DECD B | DECD Rn | TRAP 20 | TRAP 4 |
| 1100 C | | MPY Rn,A | MPY %n,A | MPY Rn,B | MPY Rn,Rn | MPY %n,B | MPY B,A | MPY %n,R | BR @n | BR *Rn | BR @n(B) | RR A | RR B | RR Rn | TRAP 19 | TRAP 3 |
| 1101 D | LDSP | CMP Rn,A | CMP %n,A | CMP Rn,B | CMP Rn,Rn | CMP %n,B | CMP B,A | CMP %n,R | CMPA @n | CMPA *Rn | CMPA @n(B) | RRC A | RRC B | RRC Rn | TRAP 18 | TRAP 2 |
| 1110 E | PUSH ST | DAC Rn,A | DAC %n,A | DAC Rn,B | DAC Rn,Rn | DAC %n,B | DAC B,A | DAC %n,R | CALL @n | CALL *Rn | CALL @n(B) | RL A | RL B | RL Rn | TRAP 17 | TRAP 1 |
| 1111 F | | DSB Rn,A | DSB %n,A | DSB Rn,B | DSB Rn,Rn | DSB %n,B | DSB B,A | DSB %n,R | | | | RLC A | RLC B | RLC Rn | TRAP 16 | TRAP 0 |

Fig. 9

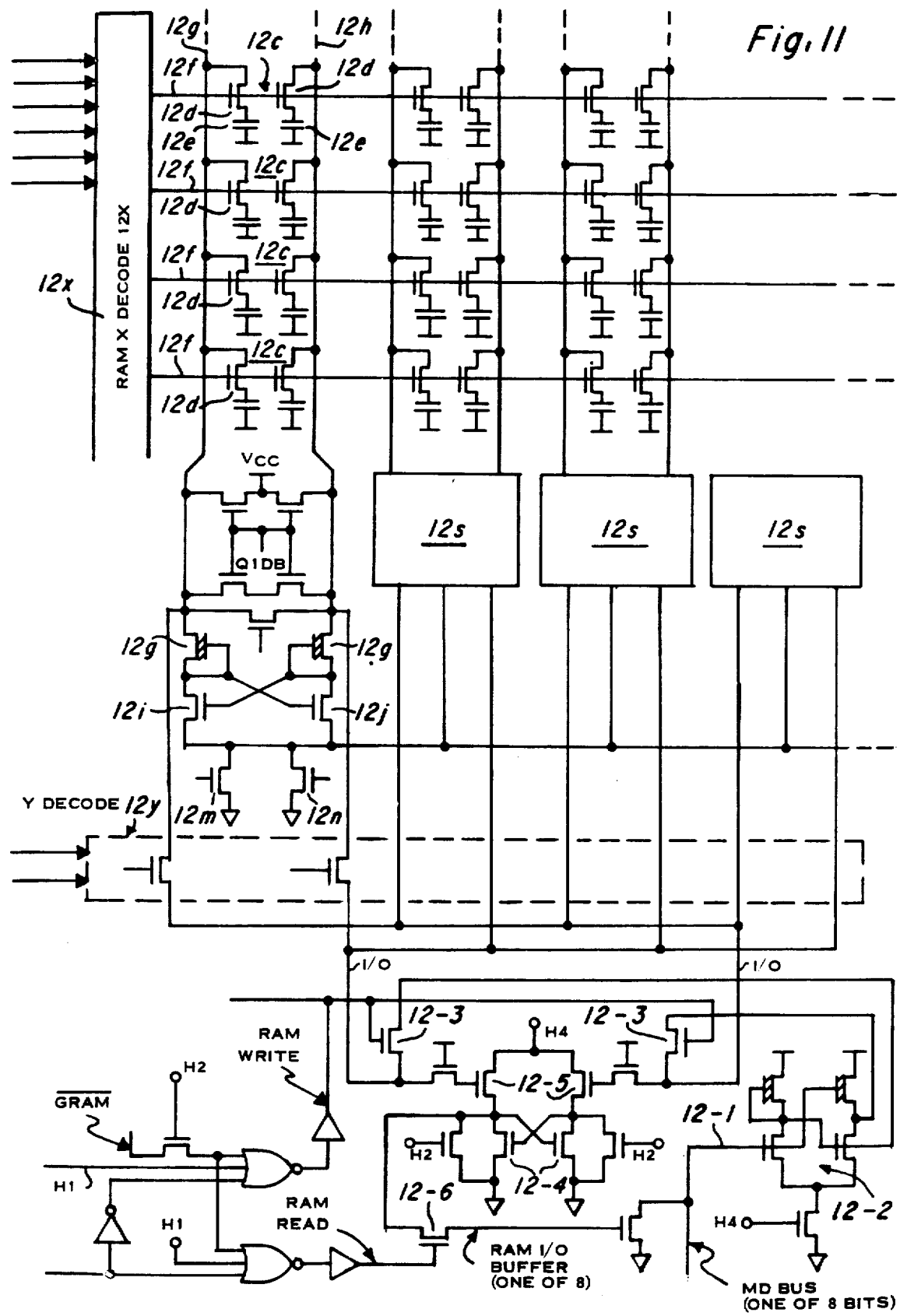

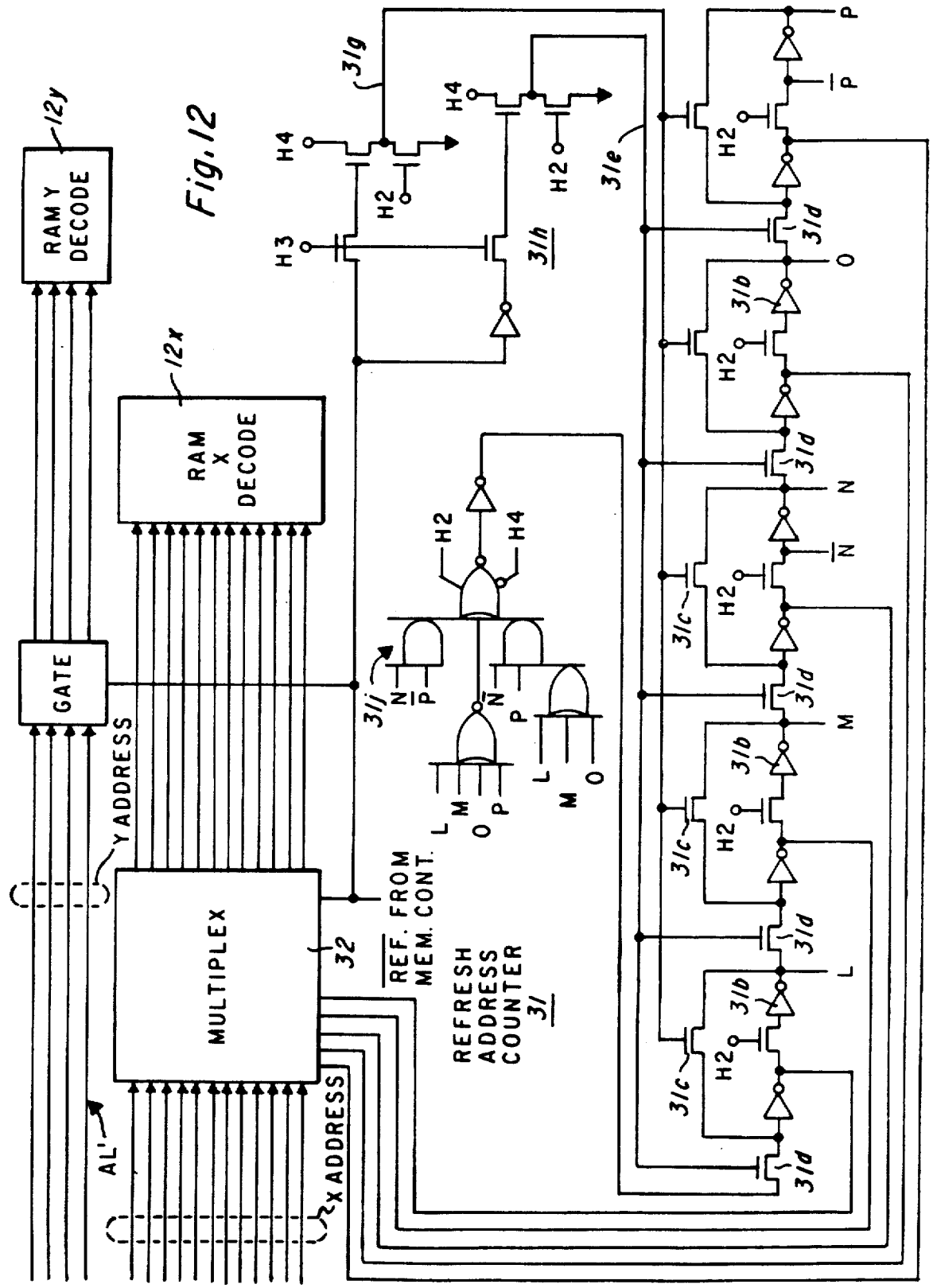

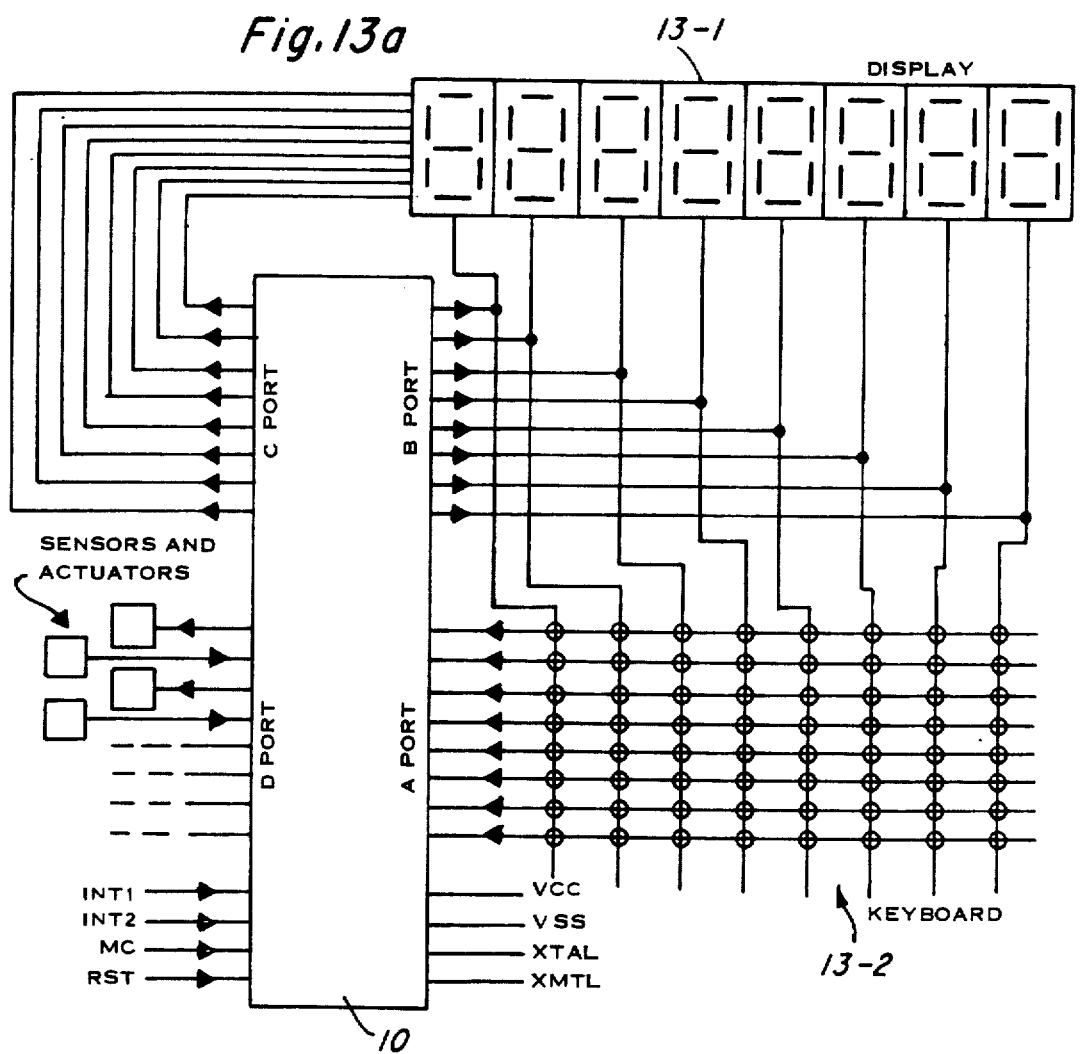

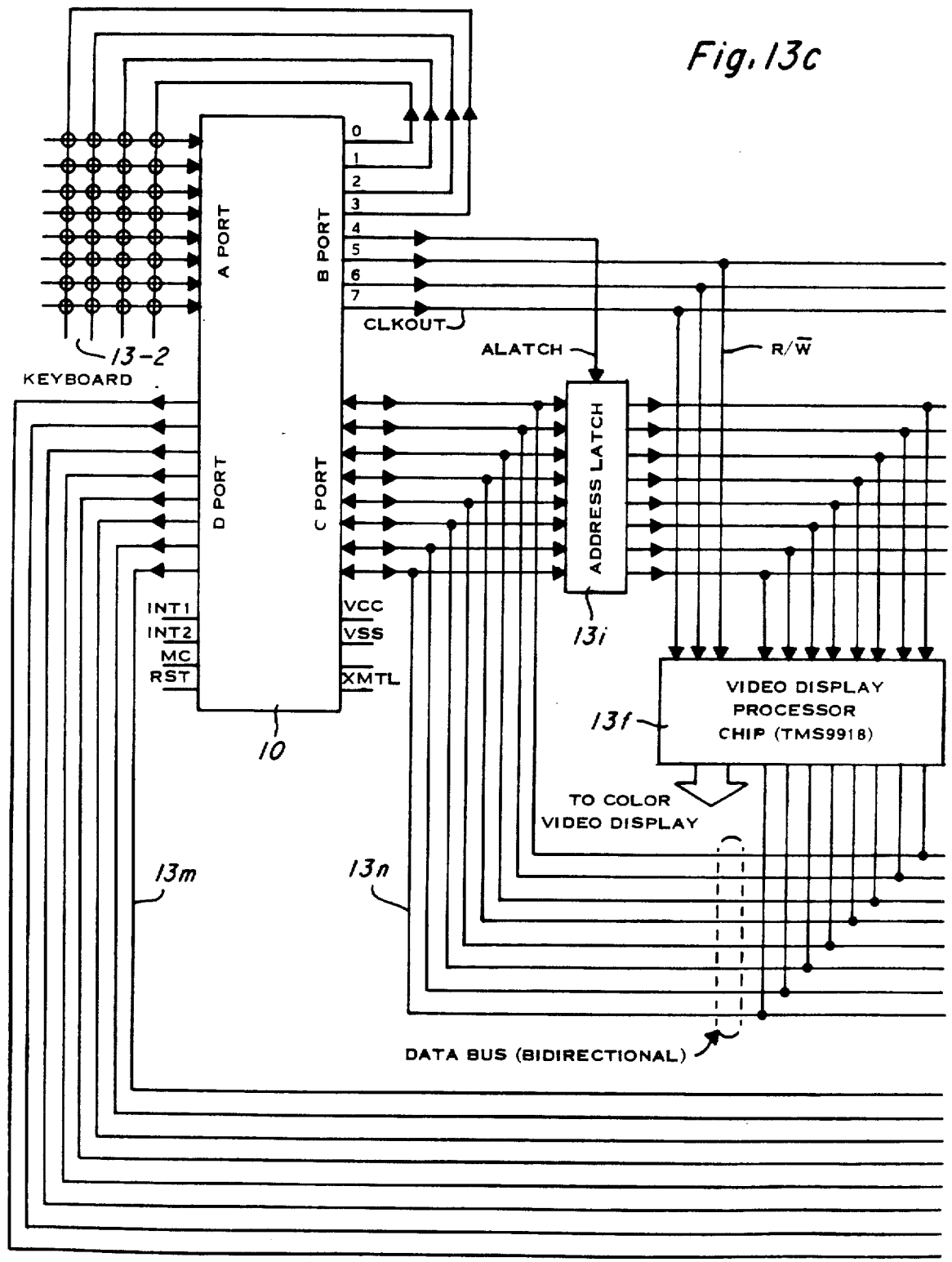

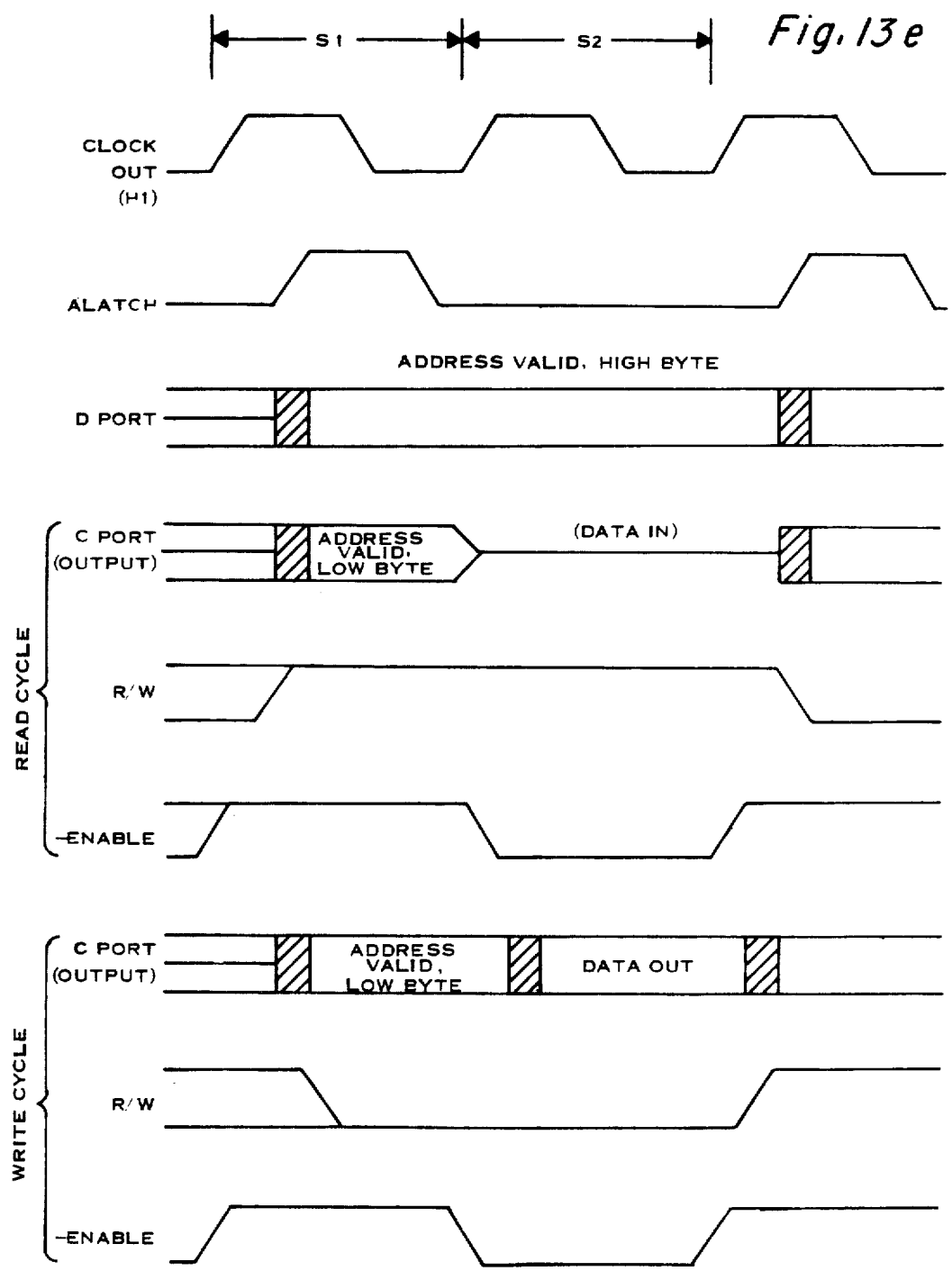
B AND C PORT TIMING WITH ALATCH, R/W, ENABLE AND CLKOUT
FOR OFF-CHIP ACCESSES IN FIG. 13b, 13c, 13d MODE OF OPERATION

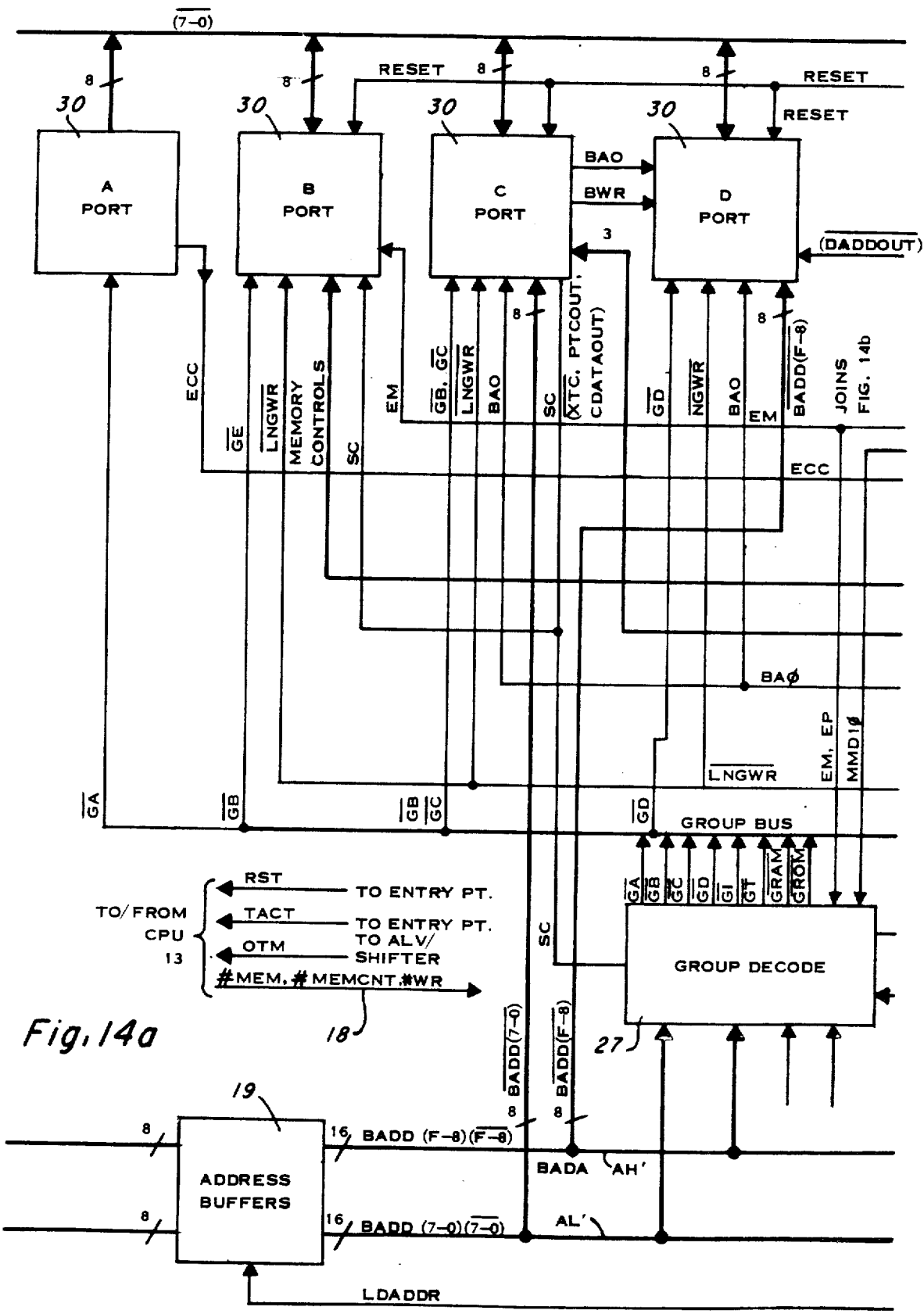

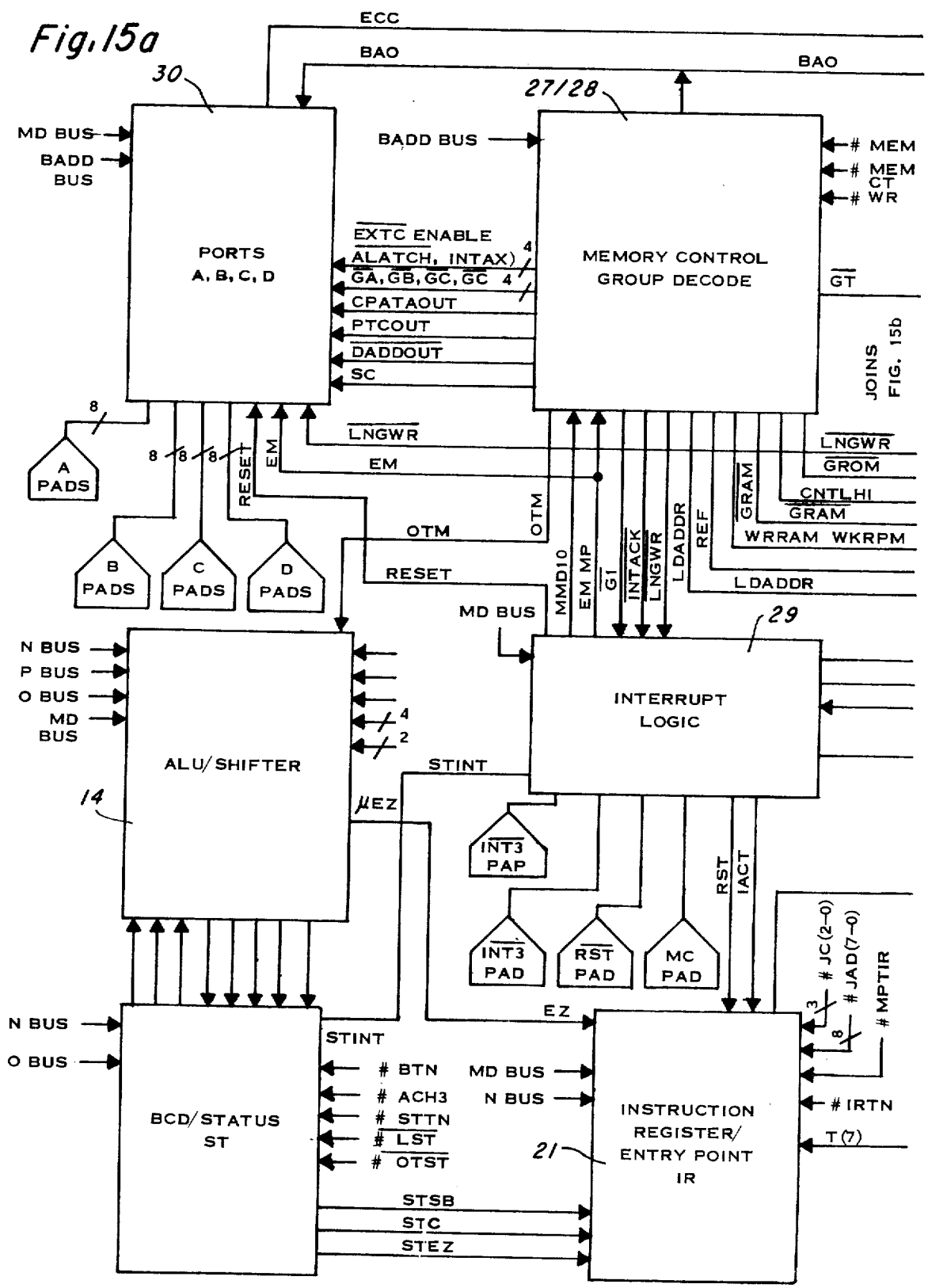

Fig. 16a

| CONTROL SIGNAL | INTERNAL PERIPHERALS | F F | E E | D D | C C | B B | A A | 9 9 | 8 8 | 7 7 | 6 6 | 5 5 | 4 4 | 3 3 | 2 2 | 1 1 | 0 0 | EM | MP | MMD1 | MMD0 | MEM |
|---|---|---|---|---|---|---|---|---|---|---|---|---|---|---|---|---|---|---|---|---|---|---|
| $\overline{GRAM}$ | RAM | X | X | X | X | X | X | X | X | X | | | | | | | | | | | | X |
| $\overline{GROM}$ | ROM | X | X | X | X | X | | | | | | | | | | | | | | | | X |
| $\overline{GI}$ | INTERRUPT | X | X | X | X | X | X | X | X | XX | XX | X | X | X | XX | | X | X | | | | X |
| $\overline{GT}$ | TIMER | X | X | X | X | X | X | X | X | XX | XX | X | X | X | XX | XX | X | X | | | | X |
| $\overline{GA}$ | PORT A | X | X | X | X | X | X | X | X | XX | XX | X | X | X | XX | XX | | X | | | | X |
| $\overline{GB}$ | PORT B | X | X | X | X | X | X | X | X | XX | XX | X | X | X | XX | XX | X | X | | | | X |
| $\overline{GC}$ | PORT C | X | X | X | X | X | X | X | X | XX | XX | X | X | X | XX | XX | X | X | X | X | X | X |
| $\overline{GD}$ | PORT D | X | X | X | X | X | X | X | X | XX | XX | X | X | X | XX | XX | X | X | X | X | | X |

BUS ADDRESS

EM - EMMULATOR MODE
MP - MICROPROCESSOR MODE
MMD0
MMD1 - MEMORY MODE BITS
MEM - MICROINSTRUCTION CONTROL (SEE TIMING DIAGRAM FIGURE 4)

|  | MC | MMD1 | MMD0 |
|---|---|---|---|
| EMULATOR | HV | X | X |
| MICROPROCESSOR | 1 | X | X |
| FULL EXPANSION | 0 | 1 | 0 |
| PARTIAL EXPANSION | 0 | 0 | 1 |
| SINGLE CHIP | 0 | 0 | 0 |

Fig. 16c

HV = HIGH VOLTAGE

X = DON'T CARE

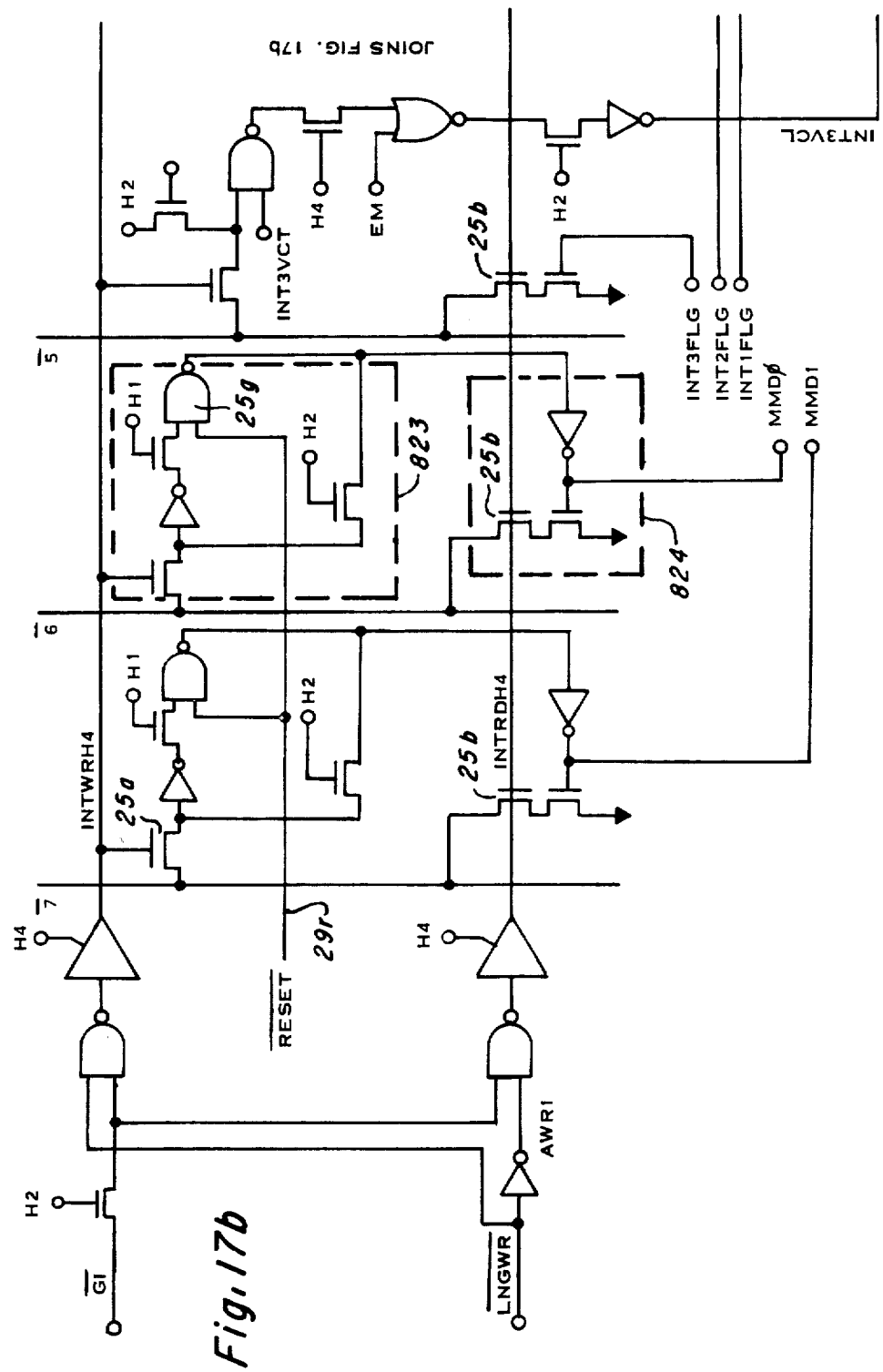

Fig. 17c

RESET/INTERRUPT VECTOR LOCATION

| VECTOR MSB | VECTOR LSB | DESCRIPTION | SERVICE ORDER |
|---|---|---|---|
| FFFE | FFFF | RESET | IMMEDIATE |
| FFFC | FFFD | INT1 | 1 |
| FFFA | FFFB | INT2 (TIMER) | 2 |
| FFF8 | FFF9 | INT3 | 3 |

Fig. 17d

I/O CONTROL REGISTER CONTENTS

BIT POSITION

| | 7 | 6 | 5 | 4 | 3 | 2 | 1 | 0 |
|---|---|---|---|---|---|---|---|---|
| READ | MEMORY MODE1 | MEMORY MODE0 | INT3 FLAG | INT3 ENABLE | INT2 FLAG | INT2 ENABLE | INT1 FLAG | INT1 ENABLE |
| WRITE | MEMORY MODE1 | MEMORY MODE0 | INT3 CLEAR | INT3 ENABLE | INT2 CLEAR | INT2 ENABLE | INT1 CLEAR | INT1 ENABLE |

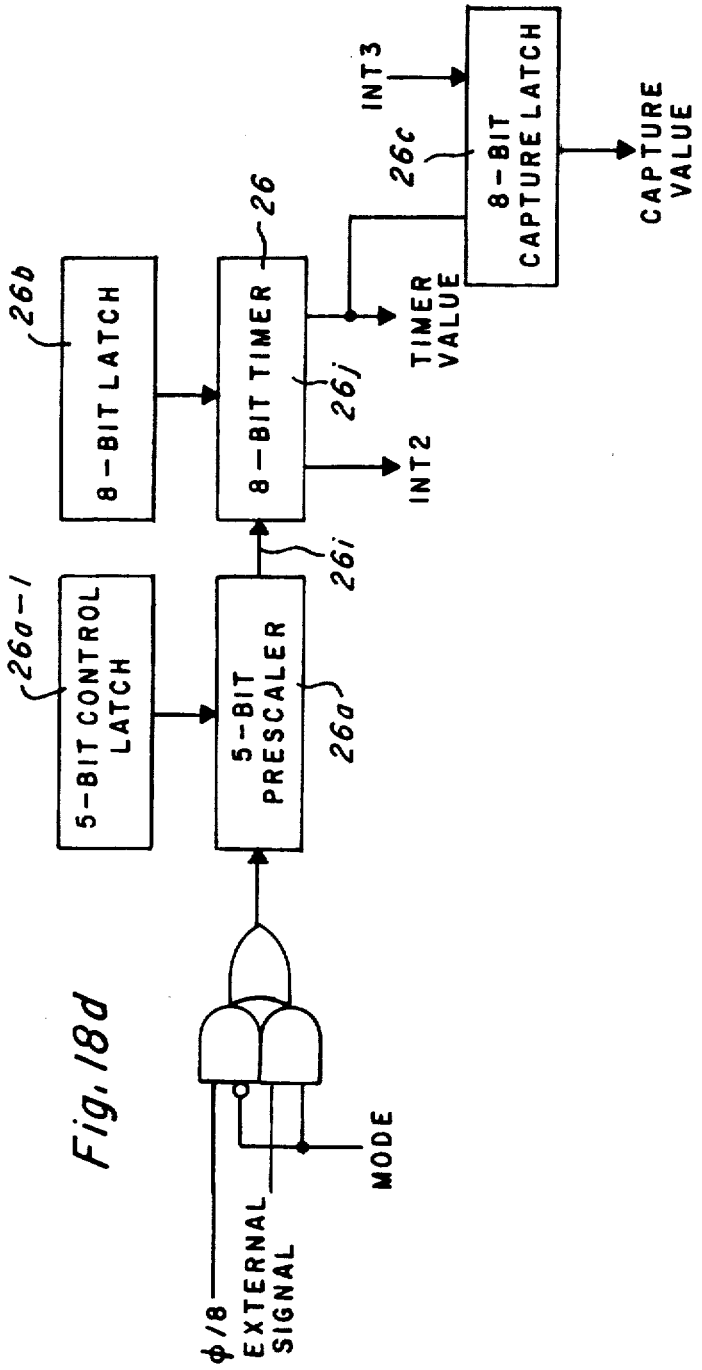
Fig. 18d
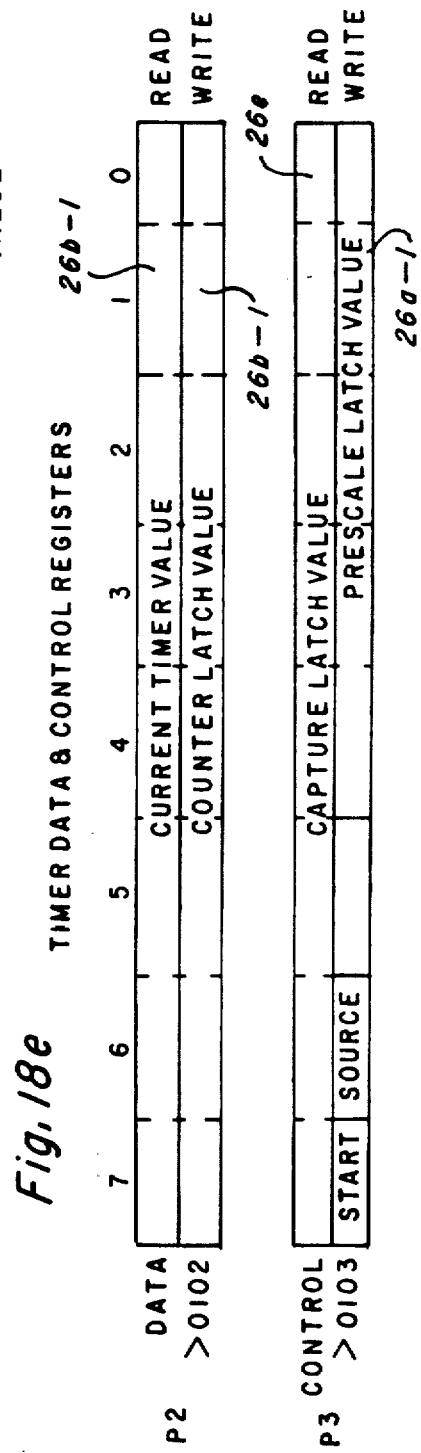
Fig. 18e  TIMER DATA & CONTROL REGISTERS

INTERRUPT GENERATION FOR THE SYSTEM EMULATOR MODE

MICROCOMPUTER WITH AUTOMATIC REFRESH OF ON-CHIP DYNAMIC RAM TRANSPARENT TO CPU

RELATED CASES

This application discloses subject matter disclosed in co-pending application Ser. Nos. 253,452, 253,623, 253,624, 253,642, 253,643, 253,644, 253,951, 253,981, filed herewith, and further discloses subject matter disclosed in co-pending application Ser. No. 210,109, filed Nov. 24, 1980, all said applications being assigned to Texas Instruments.

BACKGROUND OF THE INVENTION

This invention relates to integrated semiconductor devices and systems, and more particularly to features used in an electronic digital processing system of the single-chip microprocessor or microcomputer form.

A microprocessor device is a central processing unit or CPU for a digital processor which is contained in a single semiconductor integrated circuit, usually fabricated by "MOS/LSI" technology, as shown in U.S. Pat. No. 3,757,306 issued to Gary W. Boone and assigned to Texas Instruments. The Boone patent shows an 8-bit CPU on a chip including a parallel ALU, registers for data and addresses, an instruction register and a control decoder, all interconnected using a bidirectional parallel bus. U.S. Pat. No. 4,074,351, issued to Gary W. Boone and Michael J. Cochran, assigned to Texas Instruments, shows a single-chip "microcomputer" type device which contains a 4-bit parallel ALU and its control circuitry, with on-chip ROM and RAM for program and data storage. The term microprocessor usually refers to a device employing external memory for program and data storage, while the term microcomputer refers to a device with on-chip ROM and RAM for program and data storage; the terms are also used interchangeably, however, and are not intended as restrictive as to this invention.

Subsequent to 1971 when U.S. Pat. Nos. 3,757,306 and 4,074,351 were originally filed, many improvements have been made in microprocessors and microcomputers to increase the speed and capability of these devices and reduce the cost of manufacture, providing more circuitry in less space, i.e., smaller chip size. Improved photolithographic techniques allow narrower line widths and higher resolution, providing added circuit density, but circuit and system improvements also contribute to the goals of increased performance with smaller chip size. Some of these improvements in microprocessors are disclosed in the following U.S. Pat. Nos., all assigned to Texas Instruments: 3,991,305 issued to Edward R. Caudel and Joseph H. Raymond Jr.; 4,156,927 issued to David J. McElroy and Graham S. Tubbs; 3,934,233 issued to R. J. Fisher and G. D. Rogers; 3,921,142 issued to J. D. Bryant and G. A. Hartsell; 3,900,722 issued to M. J. Cochran and C. P. Grant; 3,932,846 issued to C. W. Brixey et al; 3,939,335 issued to G. L. Brantingham, L. H. Phillips and L. T. Novak; 4,125,901 issued to S. P. Hamilton, L. L. Miles, et al; 4,158,432 issued to M. G. VanBavel; 3,757,308 and 3,984,816.

Additional examples of microprocessor and microcomputer devices in the evolution of this technology are described in publications. In Electronics, Sept. 25, 1972, p. 31-32, a 4-bit P-channel MOS microcomputer with on-chip ROM and RAM is shown which is similar to U.S. Pat. No. 3,991,305. Two of the most widely used 8-bit microprocessors like that of U.S. Pat. No. 3,757,306 are described in Electronics, Apr. 18, 1974 at pp. 88-95 (the Motorola 6800) and pp. 95-100 (the Intel 8080). A microcomputer version of the 6800 is described in Electronics, Feb. 2, 1978 at pp. 95-103. Likewise, a single-chip microcomputer version of the 8080 is shown in Electronics, Nov. 25, 1976 at pp. 99-105 and a 16-bit microprocessor evolving from the 8080 is described in Electronics, Feb. 16, 1978, pp. 99-104. Another single-chip microcomputer, the Mostek 3872, is shown in Electronics, May 11, 1978, at pp. 105-110. An improved version of the 6800 is disclosed in Electronics, Sept. 17, 1979 at pp. 122-125, while a 16-bit microprocessor identified as the 68000 which evolved from the 6800 is described in Electronic Design, Sept. 1, 1978 at pp. 100-107.

The technology of integrated circuit design and manufacture has progressed to a point where virtually any electronic system having digital processing or control functions can employ a microcomputer or microprocessor chip. The cost of designing and manufacturing the devices is a limiting factor, however. Semiconductor manufacturing is oriented toward production of large quantities of a single device type, rather than production of a few of many different specialty items, and so to be economical a chip design must be adaptable for a wide variety of uses, not only by changing the ROM code but also by providing many input/output options and similar features. Thus, a device as in U.S. Pat. No. 3,991,305 has been manufactured in quantities of millions of units for many different electronic calculators, electronic games, appliance controllers, and the like. Not only the semiconductor manufacturing cost is minimized by use of the same device, but also the design cost is minimized because very little circuit design is needed (only external to the chip) and the programming effort employs an instruction set and commonly-used subroutines and algorithms in which a high level of experience is acquired. Nevertheless, the design cost for using a microcomputer device in a new application may be prohibitive even though only assembly language programming is needed; this software cost is unduly high because of the number of different and incompatable programming languages used on the wide variety of device types.

It is the principal object of this invention to provide an improved microcomputer or microprocessor device which is adaptable for a wide variety of uses but yet is constucted to facilitate low-cost manufacture and to minimize programming costs.

SUMMARY OF THE INVENTION

In accordance with one embodiment of the invention, a microcomputer device is disclosed containing a ROM for program memory, a read/write memory, and a CPU in a single integrated circuit. Input/output ports, interrupt and operating mode controls are memory mapped in the same logical address space as the program and read/write memory. The read/write memory is an array of one-transistor type dynamic storage cells in which data bits are stored in capacitor; refresh of this dynamic RAM is accomplished in a manner transparent to the CPU by an automatically-incremented address counter. Each data bit uses two one-transistor cells in a balanced, complementary array. This construction allows the read/write memory to be much more dense compared to the traditional six-transistor static RAM cells used in microcomputers, and yet provides favorable noise margins and avoids refresh overhead. The use of two cells for each bit rather than the conventional dummy cell arrangement provides a larger voltage differential for the sense amplifier and thus provides more reliable sensing; because of the layout of the bar, the array is partitioned such that multiple rows of dummy cells would be needed if the conventional dynamic RAM structure was used, and so the increase in the number of cells is less than the factor of two which would be initially expected. The two complementary cells also allow the one-level to decay further and still be reliably sensed, so the refresh time can be longer; this allows the system clock to be slower, and permits fewer constraints on writing ROM programs because a longer time period can be tolerated between refresh for a given row. The RAM is refreshed by a row address applied from a refresh counter on every cycle that the RAM is not accessed, plus the first state of every long memory reference; a program with intensive multiply or divide loops making repeated access to the register file with few long memory cycles would conceivably leave long periods of few refresh cycles, so longer refresh time is needed.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 3 is a greatly enlarged plan view of the semiconductor chip containing the microcomputer of FIG. 1 showing the physical layout of the various parts of the device;

FIG. 5 is a detailed electrical diagram of the CPU, including ALU, shifter S, registers and busses, in the microcomputer of FIG. 1;

FIG. 7 is a map of the relative locations of the FIGS. 7a–7f;

FIGS. 7a–7f are electrical schematic diagrams of various parts of the ALU and register strip within the CPU of the microcomputer of FIG. 1;

FIG. 7d' is a timing diagram for BCD arithmetic operations;

FIGS. 8a–8j (six sheets) show a logic flow chart of the execution of the microinstructions of Tables B and C in the microcomputer device of FIG. 1;

FIG. 9 is a map of the opcodes for the macroinstructions of Table A executed by the microcomputer of FIG. 1;

FIG. 11 is an electrical diagram, in schematic and logic form, of the RAM 12 of FIG. 1;

FIG. 12 is an electrical diagram, in schematic and logic form, of the RAM refresh counter 31 and address multiplex circuit 32 of FIG. 1;

FIGS. 13a–13d are electrical diagrams of microprocessor systems using the microcomputer chip 10 of FIG. 1 in various operating modes;

FIG. 13e is a timing diagram for operating modes of FIGS. 13b–13d;

FIG. 16a is a table illustrating the group decode circuit bus addresses which produce peripheral activating signals;

FIG. 16d is a table illustrating the operating mode specifications for the different memory configurations of FIGS. 2 and 13;

FIG. 17c is a table listing the interrupt vector locations in memory;

FIG. 17d is a table illustrating the input/output control register contents;

FIG. 18d is a conceptual block diagram of the programmable timer/event counter of FIGS. 18a–18c;

FIG. 18e is a table illustrating the contents of the timer data register and the timer control register;

DETAILED DESCRIPTION OF SPECIFIC EMBODIMENT

The Microcomputer Chip

Figure 1A:
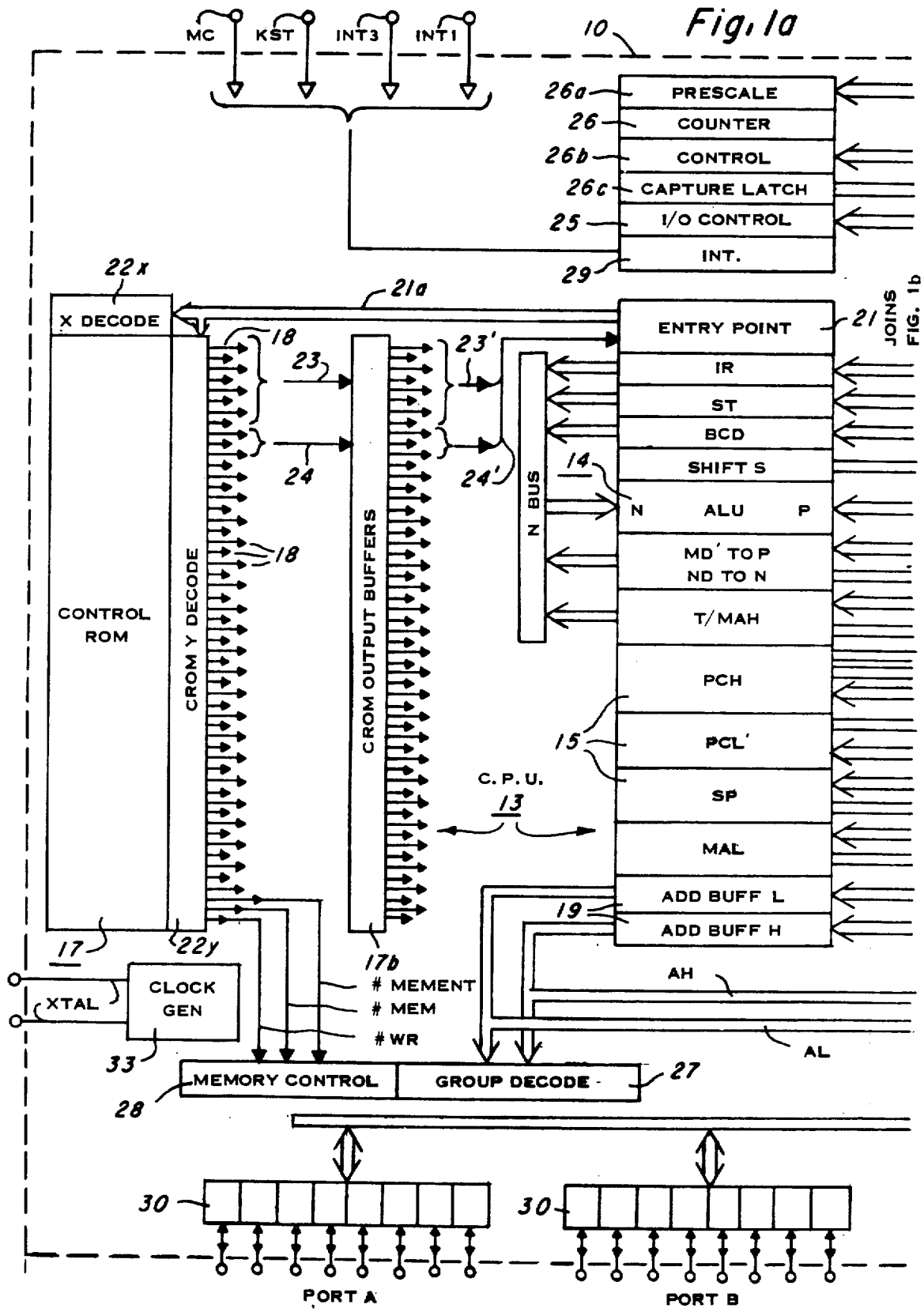
FIG. 1 is an electrical diagram in block form of an MOS/LSI microcomputer chip including CPU, ROM and RAM, and utilizing features of the invention.
Figure 1B:
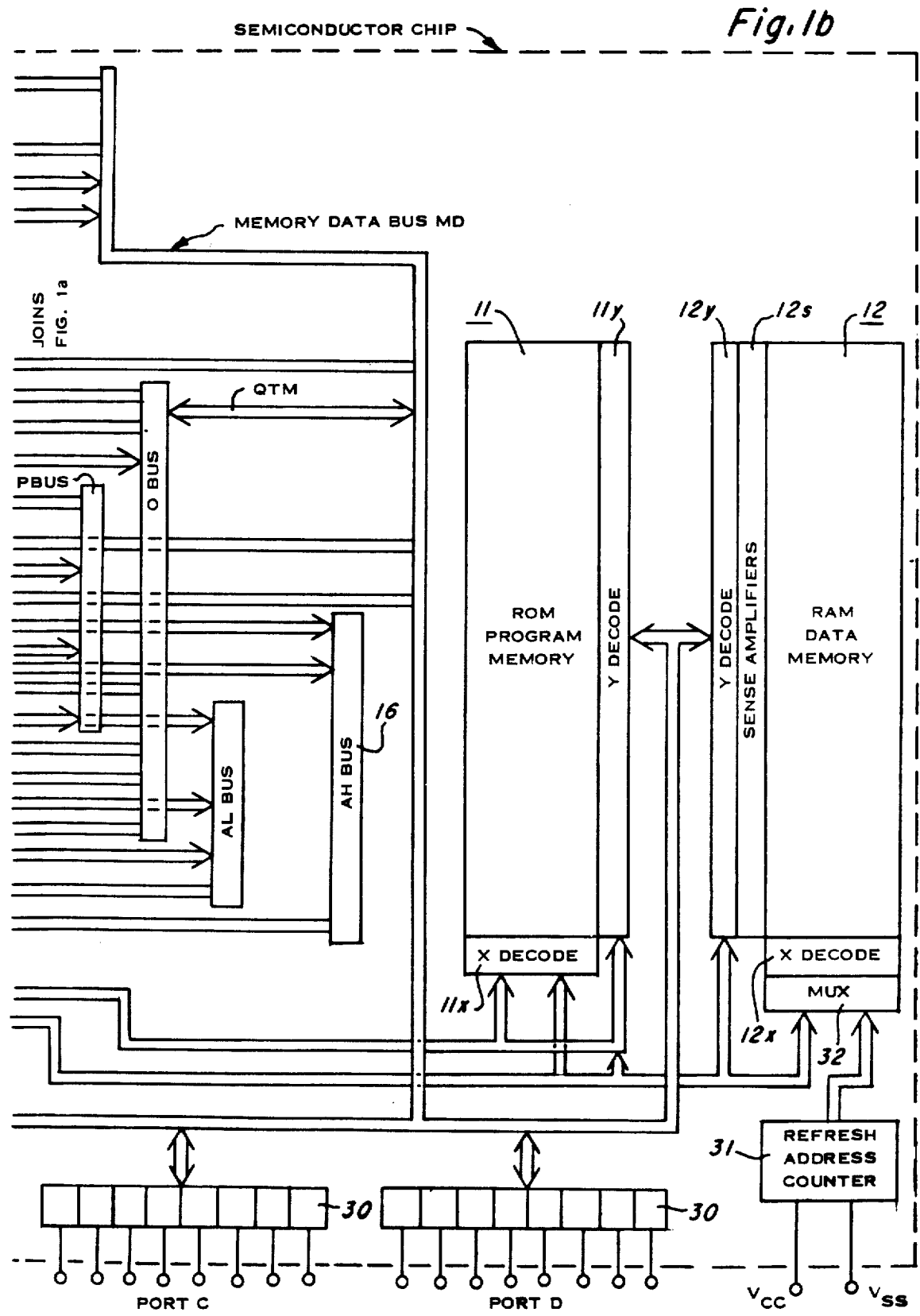

With reference to FIG. 1, a microcomputer chip 10 is shown which employs features according to one embodiment of the invention. The chip 10 is a semiconductor integrated circuit of the MOS/LSI type including a silicon bar of less than about 200 mils on a side, mounted in a standard 40-pin package. Totally contained within the chip 10 is a digital processor having a ROM or read-only memory 11 for program storage and a RAM or read/write memory 12 for data storage, along with a CPU 13. The CPU consists of an arithmetic logic unit or ALU 14 with its working registers 15 and busses 16, along with a control ROM or CROM 17 for generating microinstructions or control signals on lines 18. The CPU 13 accesses the ROM and RAM memory 11, 12 by three busses; a memory data bus MD, a high address bus AH, and a low address bus AL, along with three of the 5 control lines 18. Communication with devices external to the chip is by means of four 8-bit ports A, B, C and D which are accessed by the MD bus and operated by peripheral control circuitry as will be described. The MD, AH and AL busses are each eight bits wide, as are the ALU 14, the registers 15 and the ports, although of course concepts herein described would be applicable to 4-bit, 16-bit or 32-bit devices, for example.

The registers 15 in the CPU 13 include: an instruction register IR; a status register ST; circuitry BCD for binary-coded-decimal constants; a shift circuit S which receives the output of the ALU 14; a register T/MAH which functions as both a temporary store for operands and for the high order byte of the memory address (memory address high); a sixteen bit program counter split into two eight bit registers PCH and PCL (program counter high and low); a stack pointer SP; and a memory address low register MAL. Address buffers 19 generate true and complement address signals on busses AH' and AL' from the address busses AH and AL. Operands are for the most part stored in the RAM 12 which functions as a register file RF, rather than in temporary registers 15 associated with the CPU 13.

The busses 16 interconnect the various registers 15, the ALU 14 and MD, AH' and AL' busses. The ALU 14 always receives a P input from a P bus and an N input from an N bus, and produces an output via shifter S to an output on O bus. Access to these P, N and O busses 16, to the registers 15 and ALU 14, and to the MD, AH and AL busses is controlled by the control signals 18 from the CROM 17.

The microcomputer chip 10 operates on the basis of 8-bit macroinstruction words stored in the ROM 11 and transferred to the instruction register IR one at a time. One example of a macroinstruction set executed in the CPU 13 is described in Table A which will be discussed in detail below. The Table gives the instruction word in mneumonics, also referred to as assembly language or source code, and also gives the machine-language opcode in binary (this is like object code except object is in hex). Usually an opcode plus one or more address bytes are used to execute an instruction. An instruction word or opcode held in IR is an input to an entry point circuit 21 which produces an 8-bit address via lines 21a to address circuitry 22 for the CROM 17, accessing one of 256 possible CROM addresses (in the example embodiment) to produce signals 18 defining a microinstruction as set forth in Tables B and C, to be described below. One macroinstrution of Table A produces a sequence of microinstructions. A part of each of the microinstructions (i.e. some of outputs 18) is used to generate the next CROM address; a microjump address is fed back to the entry point circuit via lines 23, and dispatch control information is fed back via lines 24, as will be explained. Thus, a sequence of microinstructions is generated from each macroinstruction in IR, also dependent upon status bits in the status register ST and other conditions. Addresses for operands, if needed, are contained in words from ROM 11 following the opcode and are transferred to MAL or MAH while the opcode stays in IR during this sequence.

Figures 2, 2A:
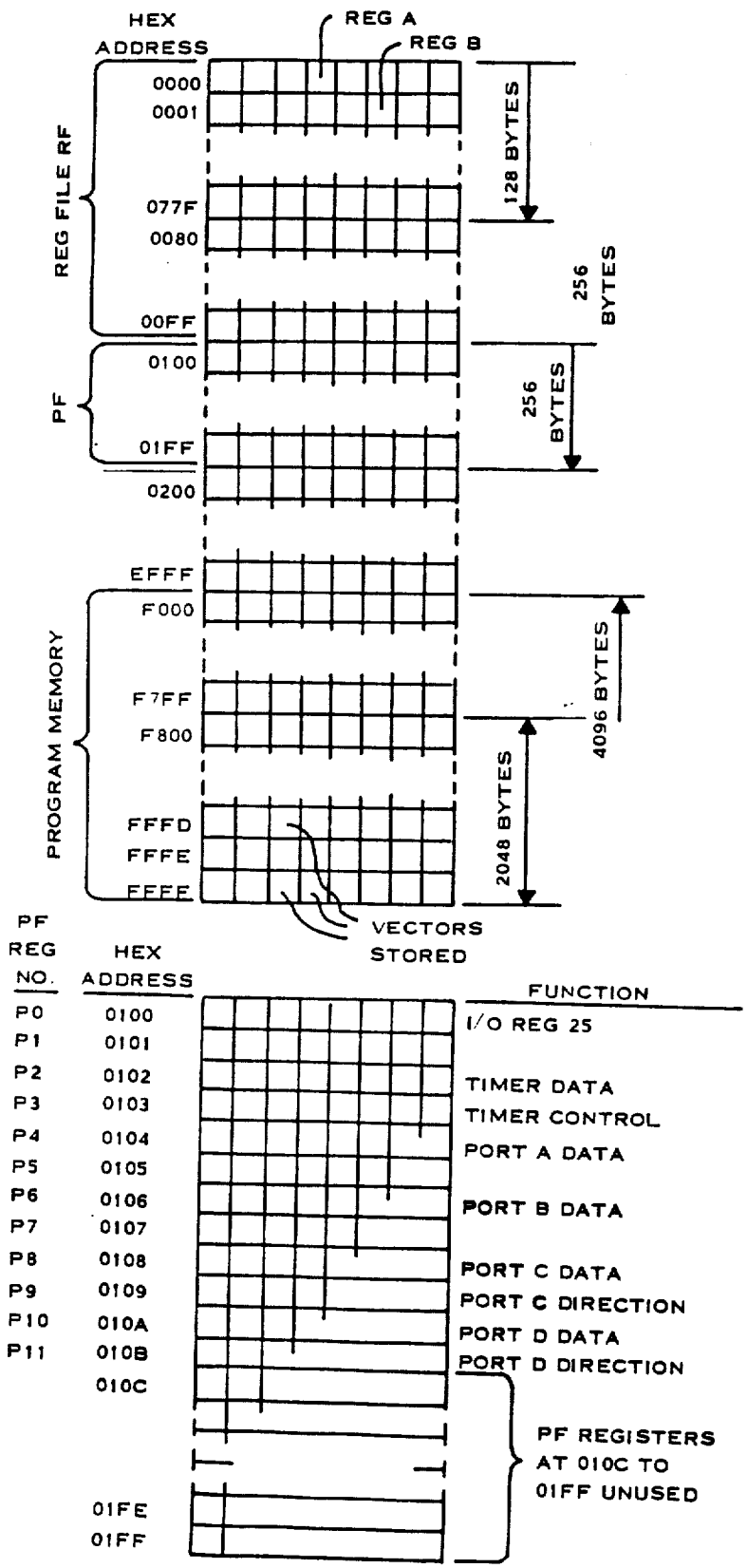
FIG. 2 is a memory map for the logical address space for the microcomputer of FIG. 1 and FIGS. 2a–2e are detailed memory maps like FIG. 2 for various operating modes of this microcomputer.

A map of the logical address space for the microcomputer of FIG. 1 is shown in FIG. 2. The example embodiment employs 8-bit AH and AL addresses, providing a 16-bit address, and so $2^{16}$ or 65,536 bytes are available in this space (often referred to as "64K" bytes where one "K" is 1,024). The addresses are shown in four hexidecimal digits, ranging from the first address 0000 to the last FFFF. In this description memory addresses will be given in hex, unless noted. A page is $2^8$ or 256 bytes, i.e. all addresses on a page are defined by AL and the page is selected by AH. The microcomputer 10 uses the zero page (addresses 0000 to 00FF) for the register file RF in RAM 12; the "one" page (addresses 0100 to 01FF) for the peripheral file PF; and the F0 to FF pages (addresses F000 to FFFF) for the program memory of ROM 11. Some of these spaces for RF and ROM 11 may not be populated, depending upon the size of the ROM and RAM chosen. Other space such as 0200 to EFFF is available for the expansion modes as will be explained.

In the microcomputer of FIG. 1, the control circuitry responsive to the AH' and AL' busses and control bits 18 defines the way in which the CPU 13 accesses the peripheral file PF including external ports, timer, reset and interrupts, as well as memory control. An I/O and interrupt control register 25 at memory location 0100 of FIG. 2 is loaded directly by the MD bus and is part of the ALU/register strip; this register contains two memory mode control bits which define the memory expansion modes as will be described, as well as interrupt masks and flags. A progammable timer and event counter is also included in this peripheral control circuitry, and comprises: a counter 26; a register 26a which functions as start/stop control, input select and prescaler; a control 26b; and a capture latch 26c. These elements of the timer are accessed by the MD bus and are eight bits wide, so are advantageously constructed as part of the ALU/register strip. The counter 26 is a fixed divide-by-8 pseudorandom 8-bit shift counter which simply divides its input by eight. The input to the counter 26, which may be an internal clock or an external clock or event, goes through the prescaler part of the register 26a which is an additional 5-bit divide-by-N counter loaded (via a prescale register) from the MD bus with any number up to thirty-two. The 8-bit timer register 26b is loaded from MD with the desired final count, up to eight bits or 256. When this count is reached, an interrupt INT2 is signalled. The instantaneous count may be read out on MD via the 8-bit capture latch 26c without stopping an ongoing count the counter 26; this is instigated by INT3.

In this peripheral control circuitry, a group decode circuit 27 and memory control circuit 28 receive the AH' and AL' address bits and three control signals 18 (#MEM, #WR and #MEMCNT) and produce controls which select between the ROM 11, RAM 12, ports A, B, C or D, the timer or I/O control, etc. for access by a given address. Only one of these is activated in any one cycle. The group decode 27 and memory control circuitry 28 likewise generate commands for controlling and/or selecting functions as will be explained.

Two interrupt input pins INT1 and INT3 are provided, in addition to the timer interrupt INT2. These inputs are connected to interrupt control circuitry 29 which is also responsive to the contents of the register 25. A reset input RST is used to zero or initallize the microcomputer, overriding any function or interrupt.

A mode control input pin MC connected as an input to the peripheral control circuitry provides a selection of the operating modes (along with the internally-loaded bit-7 and bit-6 of the I/O control register 25). FIGS. 2a to 2e are memory maps showing the unique parts of the address space for these modes; the register file address space RF remains the same as FIG. 2 for all modes. The modes are: (1) single-chip microcomputer mode where all memory is on-chip in the ROM 11 and RAM 12 as in FIG. 2 and the peripheral file PF is configured as in FIG. 2a, this being the primary mode of operation; (2) a peripheral expansion mode of FIG. 2b where some additional off-chip circuitry may be accessed in the PF space via ports B and C; (3) a full expansion mode of FIG. 2c where almost 64K bytes of off-chip memory may be accessed by ports B and C, the RF and ROM being the same as FIG. 2; (4) a microprocessor mode of FIG. 2d where the on-chip ROM 11 is ignored and all program memory is off-chip, but the on-chip RAM 12 is used as FIG. 2; or (5) the emulator mode of FIG. 2e in which both the peripheral file PF and the on-chip ROM 11 are disabled and all I/O and program memory is off chip, accessed by ports B and C with the on-chip RAM 12 or RF being used as in FIG. 2. The various modes allow a wide variety of different functions to be provided by one basic chip type without design, layout or microcode modifications, thus greatly reducing the cost. Input/output buffers 30 connect the ports A, B, C, D to the the MD bus, as defined by direction control registers P7, P9, P11, for some modes and by the mode control arrangement via group decode 27 and memory control circuitry 28.

One of the important features of the microcomputer chip of FIG. 1 is that the RAM 12 is of the dynamic type using one-transistor cells with transparent refresh. On-chip RAM for microcomputers is usually of the static or pseudo-static type; if the RAM is of the dynamic type as in U.S. Pat. No. 4,074,351, then the refresh function may interfere with access by the CPU. In contrast, the microcomputer of FIG. 1 contains a refresh address counter 31 which is self-incrementing and may produce a new 5-bit row address to the row address decoder 12X every machine cycle, so one row of the RAM is accessed for refresh if none is accessed by the CPU. If a memory 12 access cycle is occurring, however, the counter 31 is not incremented and the refresh address output of the counter 31 is not applied to the decoder 12X. The RAM 12 is of the folded-bit-line type with a memory bit and its complement on opposite sides of sense amplifiers 12S; i.e., dual memory bits are employed instead of dummy cells traditionally used in dynamic RAMs. In the 128 byte RAM of the example, 128×8 or 1024 bits are needed, and with two one-transistor cells per bit the RAM array 12 has 2048 one-transistor cells. The array is partitioned 32×8×4, so the X decoder 12X is a one-of-32 select, the Y decoder 12Y is a one-of-4 select for each of the eight input/output bits of the RAM, and thirty-two sense amplifiers 12S are used. Of course, the RAM size can be doubled to use the whole zero page of FIG. 2, in which case 256×8×2=4096 cells are needed.

The Strip Architecture

Figure 3A:
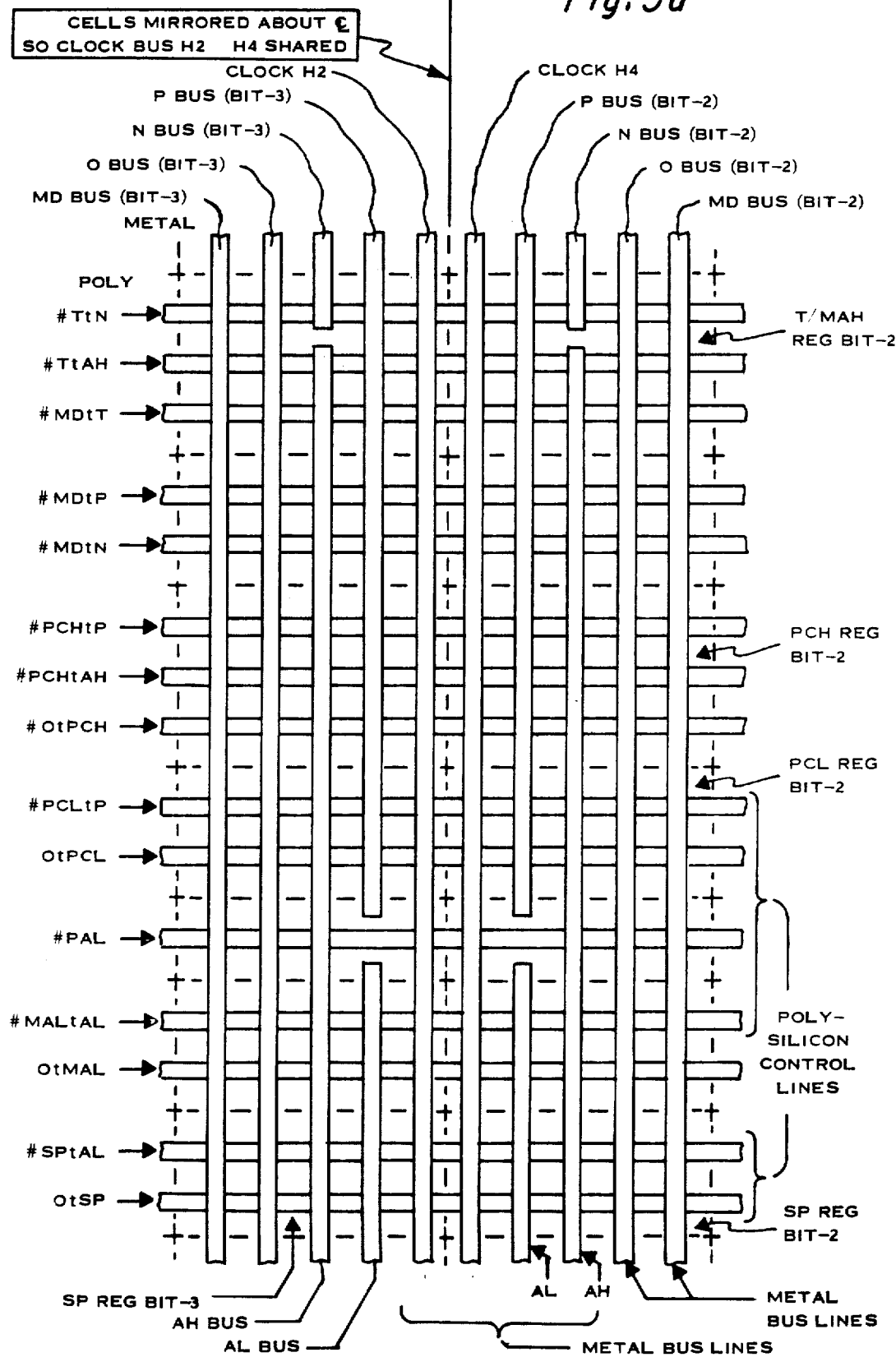
FIG. 3a is an enlarged detail view of a part of the layout of FIG. 3 showing the regular pattern of the ALU and register strip.
Figure 3B:
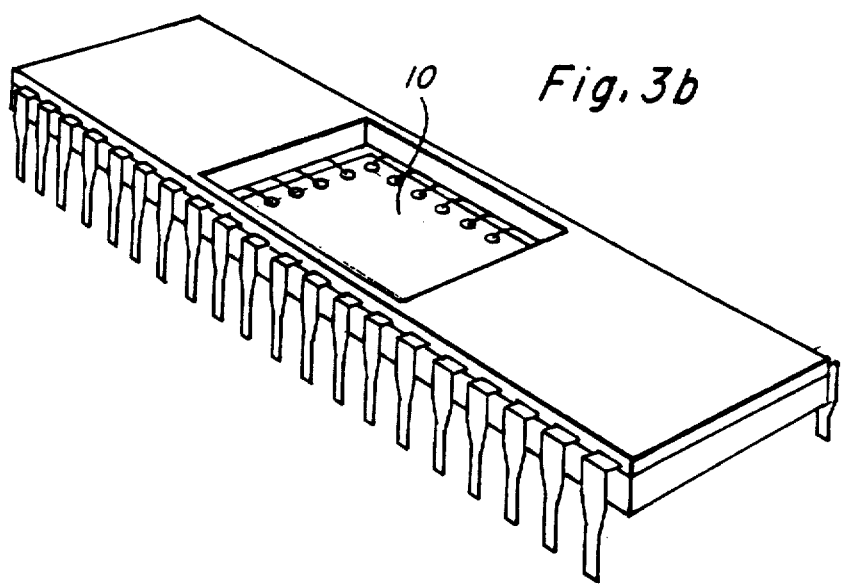
FIG. 3b is a pictorial view of the microcomputer chip of FIG. 3. mounted in a 40-pin dual-in-line package.

In FIG. 3, the microcomputer of FIG. 1 is illustrated in chip layout form. A major part of the area of the chip 10 is occupied by the memory including the ROM 11 and RAM 12 with their address decoders. The ROM 11 has associated with it an X address decoder 11X and a Y address decode and ROM data output circuit 11y of conventional design; eleven address bits are used to define one of 2048 eight-bit bytes in the ROM (twelve bits if a 4096 byte ROM is employed), so an address for the ROM needs both the MAL and MAH registers, i.e., address bits from both AL and AH busses. The RAM has an X address decoder 12X which selects 1-of-32 row lines, and a Y address decoder 12Y which selects 1-of-4 column lines, so only seven bits are needed for the RAM select (eight if a 256 byte RAM is used). Another major part of the chip area is the control ROM 17 and its associated X and Y decoders 22X and 22Y, and output buffers 17b. If fully populated, the number of bits in the control ROM would be 256 times the number of output lines 18. Only forty-five output lines 18 are needed for the example instruction set of Table A, and only 160 microinstruction addresses as in Tables B and C, so the control ROM is only 160×45 or 7,200 bits. The output ports A, B, C, and D each have eight bonding pads on the chip (total of thirty-two) for connection to external, and the areas of the chip around these bonding pads are occupied by the buffers 30 used for the ports. It will be noted that the port A is only used for input, so the space needed for the input buffers for this port is much less than for the remaining ports B, C, and D which require tri-state output buffers.

Between the ROM 11 and the CROM buffers 17b on the chip 10 of FIG. 3 is the "strip" which is an array of rows (parallel to control lines 18) and columns (parallel with metal bus lines 16 and register/ALU bits 14, 15) containing all of the 8-bit registers, ALU bits, and like circuitry associated with the busses 16 and control lines 18. As set forth in prior application Ser. No. 210,109, filed Nov. 24, 1980 by McDonough, Guttag and Laws, assigned to Texas Instruments, an important feature is that the ALU 14 and its associated registers IR, ST, S, T/MAH, PCH, PCL, SP, and MAL as described above are laid out on the MOS/LSI chip 10 in a regular strip pattern as seen in FIG. 3. Other circuitry connected to the busses and having controls 18 shared by eight bits is also in the strip, such as entry point 21, address buffers 19, timer 26, I/O control register 25, etc. Each of these registers as well as the ALU contains eight bits or stages which are laid out in a pattern like memory cells, the bits arranged horizontally and alligned vertically as seen in FIG. 3. The MD, AL, AH, O, N and P busses of FIG. 1 are each eight parallel metal strips on top of the cells of the ALU and registers (rather than beside the registers as depicted in FIG. 1), and all of the dozens of control ilnes 18 are horizontal polysilicon lines typically used as the control gates for transistors in the ALU 14 and its registers and like circuitry. The number of control lines 18 needed for the ALU 14 is greater than for a single register such as the MAL register, for example, and conveniently the space needed to lay out the ALU stages is greater than for a single register, so waste space in minimized. That is, the space needed in the control ROM 17 to generate the controls 18 is about the same as the space needed for the controlled circuitry. This layout arrangement is indeed advantageous because the ALU and registers fit alongside the control ROM with virtually none of the wasted space used merely for routing conductors in conventional construction of microprocessors. All bus lines MD, AL, AH, O, N and P, and all control lines 18 are routed over functional regions or cells of the chip rather than over unused silicon, and almost all 90 degree turns are produced inherently at functional cells rather than in conductor routing. In the prior devices, the control ROM, the registers, the ALU, etc., were islands of circuitry connected by busses or conductors. The enlarged view of FIG. 3a shows a small part of the strip, two-bit wide, illustrating the metal bus lines and the polysilicon control lines 18 for an N-channel silicon gate MOS device made generally by a single-level polysilicon process according to U.S. Pat. No. 4,055,444, assigned to Texas Instruments. Various contacts (not shown) would be made within each register bit or stage from metal to silicon or to polysilicon. It is significant to note that most of the connecting lines from registers to busses illustrated in FIG. 1 are not physically lines or elongated conductors at all but instead are merely metal-to-silicon or metal-to-poly contact areas along the metal bus lines of FIG. 3a. That is, routing of 8-bit sets of parallel conductors is minimized by the strip feature, and the size of the chip 10 is reduced. The busses 16 are staggered so that all six busses are not needed in any one part of the strip, and thus the pitch or maximum width of cells of the strip is minimized since the metal-to-metal spacing is a critical limiting factor in bit density. To this end, the placement of the registers 15 is such that the N bus need not coexist in any register with the AL or AH busses, and the P bus ends where the AL bus starts, as illustrated in FIGS. 1 and 3a. Some of the clocks needed in the registers and ALU of the strip are run in metal lines like the busses 16 (H1, H4 shared in FIG. 3a) so these place further constraints on the density and make the strip concept and bus/register optimum placement more significant. Connections from MD to P or N busses are made by transistors located in the strip like a register and labelled MDtP, MDtN; since this logic requires eight parallel bits of transfer gates, tied to sets of eight parallel busses, and using CROM outputs 18 as controls, it fits well in the strip.

The control ROM 17 my be of the "compressed" design as set forth in U.S. patent application Ser. No. 209,915, filed Nov. 24, 1980, by Guttag, McDonough and Laws, although as described herein the CROM is of non-compressed design. The CROM fits alongside the strip to provide the controls 18 in the control-intensive areas of the ALU and register/bus connections, and alongside the entry point circuit 21 where the address control and jump address lines 23, 24 are needed. The design is oriented toward the control ROM as the source of all controls rather than random logic, and the chip layout of FIGS. 3 and 3a illustrates that the area of the chip is dominated by the ROM, RAM and CROM with their decoders, and the strip containing a regular array of ALU/register bits, with little space occupied by other control logic. This design approach is enhanced by and enhances the microprogramming facility which makes the microcomputer 10 particularly easy to modify by changing the micro or macrocode.

The microcomputer 10 may be modified at three levels, plus the mode control. The first level is changing the ROM code of the ROM 11, and of course this is the most widely practiced modification. The ROM code is defined by a single mask in the manufacturing process as set forth for example in U.S. Pat. Nos. 3,541,543, 4,208,726 or 4,230,504, assigned to Texas Instruments. The macroinstruction set may be supplemented (keeping basically the same microinstruction set), or the microinstruction set may be changed, both of these levels requiring changes in the CROM 17 code upon manufacture. The CROM code is defined by a single mask in manufacture, just as the ROM code, so physically it is just as easy to change the microinstruction set; however, the macro assemblers and micro assemblers (computer programs used as design aids for customers) then are different. In addition to these ways of altering the device 10, the sizes of the ROM and RAM may be increased to allow more complex algorithmns to be programmed in the ROM code, and the size of the CROM 17 may be increased to provide more complex micro- and/or macro-instruction sets. It is important to note that the mode control MC (and bits 6–7 of register 25) allows changes without any type of physical or mask change; no fuse links or the like are needed.

System Timing

Figure 4:
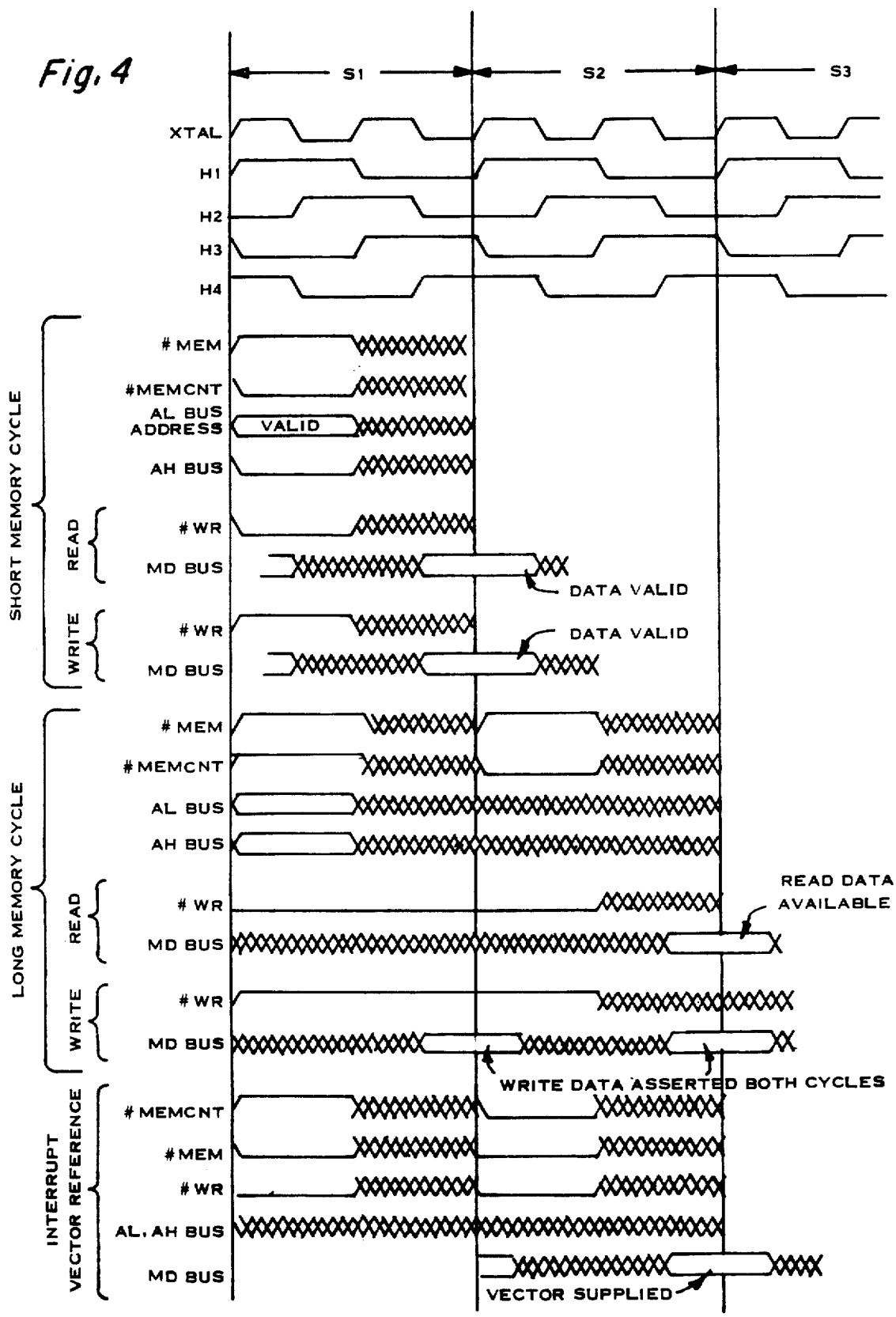
FIG. 4 is a timing diagram showing voltage vs. time for various events in operation of the system of FIG. 1.

The microcomputer chip 10 operates from a basic clock frequency referred to as Xtal in FIG. 4. This frequency of about 5 MHz is supplied by an internal oscillator 33 controlled by an external crystal coupled to two pads labelled Xtal in FIG. 1 or 3. From the clock Xtal, clock generator circuitry 33 produces four basic overlapping half-cycle clocks H1, H2, H3 and H4 for each microinstruction cycle or state time S1, S2, etc., as seen in FIG. 4 Each state time equals two complete cycles of the clock Xtal. H4 overlaps two state times.

Short memory cycles to access the RAM 12 are completed in one state time such as S1 of FIG. 4; #MEMCNT is low and all bits of the AH bus are low during H1, and the RAM address is valid on the AL bus while #MEM is high. The write control #WR is high for write or low for read. The data accessed is then valid on the MD bus during H4 at the end of the cycle, extending over into the beginning of the next cycle, so the data may be loaded into the registers T or IR at the end of a cycle or gated onto the P or N busses at the beginnning of the next cycle.

All memory references to the register file RF in the RAM 12 use this short cycle; all other memory references (i.e. to the on-chip ROM 11, the peripheral file PF, and extended memory) require two microinstruction executions and are called long memory cycles as illustrated in FIG. 4. For long cycles, the memory continue command #MEMCNT is high during the first state time and low during the second. The memory command #MEM must be high during H1 of both cycles, and the address valid on AH and AL during H1 of the first cycle. For read, the write command #WR is low from the beginning of the first cycle through H1 of the second, and the data is valid during H4 beginning at the end of the second cycle. For long write, #WR is high, and the write data is gated onto the MD bus for H4 of both first and second cycles.

Within a given state time or microinstruction cycle, the address on the AH' and AL' busses becomes valid during H2. This address is based on the address loaded onto AH and AL during H1. In the ROM 11, the array is precharged during H1 with all row or X lines going to Vss and all column or Y lines going to Vcc, then the ROM X address gated into the array from decoder 11X beginning at H3 and the ROM Y address coming valid at the beginning of H4, so the ROM output is valid at H4.

THE CPU

Figure 6:
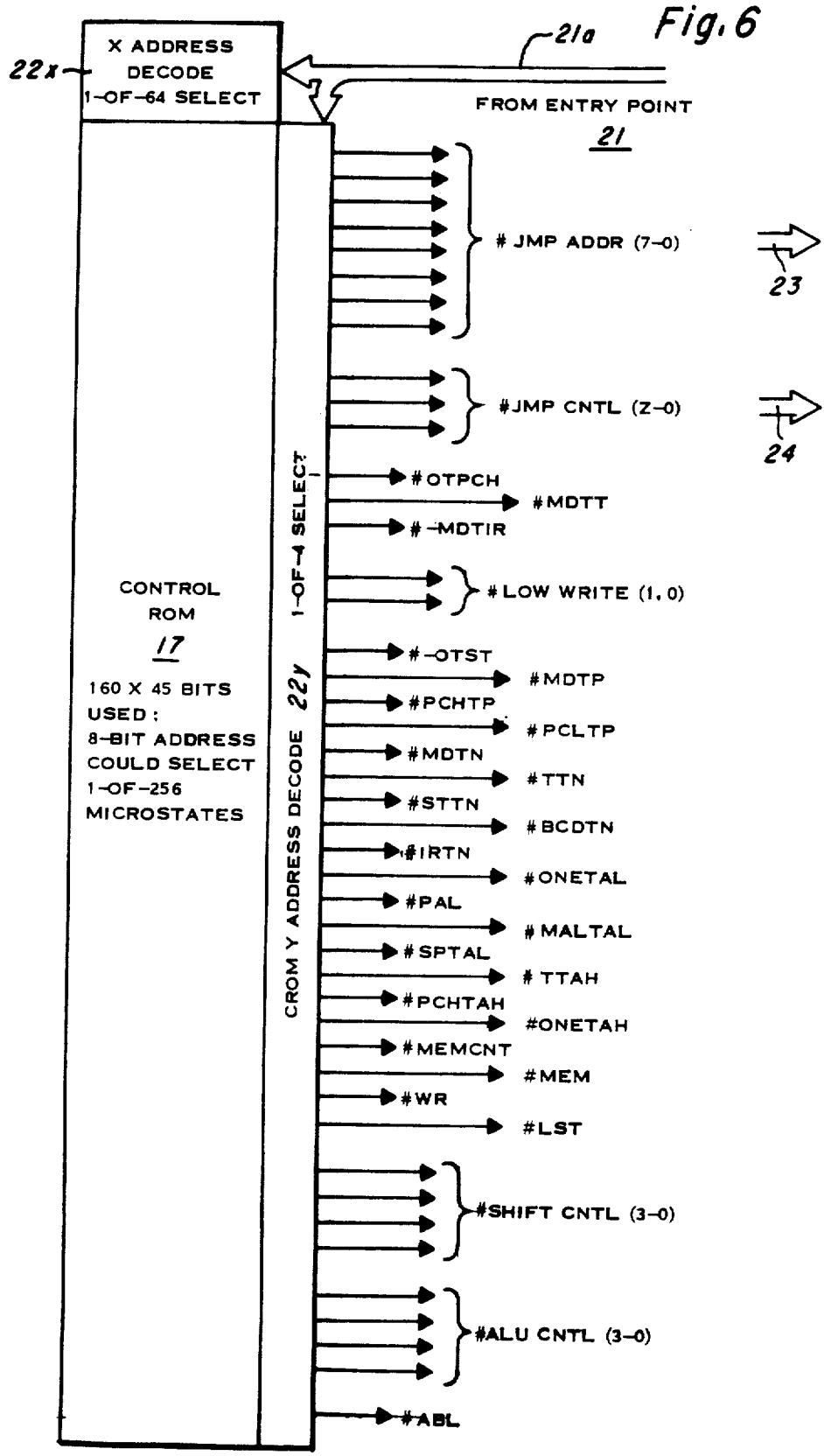
FIG. 6 is a detailed electrical diagram of the control ROM used in the microcomputer of FIG. 1.

The CPU 13 in the microcomputer 10 of FIG. 1 consists of the ALU 14, the registers 15 and the busses 16 controlled by the CROM 17. In FIG. 5 a more detailed block diagram of the ALU and shifter S and the associated busses is shown, and FIG. 6 shows the CROM 17 and its microinstruction output bits 18. Control of the ALU and access to the busses is defined entirely by these microinstructions or bits 18, identified in FIG. 6 for the illustrative embodiment. An 8-bit address on lines 21a from the entry point circuitry 21 contains a 6-bit X address on lines 21X and a 2-bit Y address on lines 21Y. The lines 21X are connected to X decoder 22X which selects one of up to 64X lines in the array of ROM bits of the CROM 17. The lines 21Y are connected to a Y decoder 22Y which selects 1-of-4 in each group for four Y lines (only forty-five groups used). Thus, for each 8-bit address on lines 21a, a different "microinstruction" is output on the lines 18; a microinstruction may have any number of the lines 18 active, but usually a combination of only a few lines 18 is active for a given microinstruction. Each line 18 goes to a buffer 17b to drive a higher capacitance load than the array output Y line itself would allow, and to clocked gates and other such logic as needed. All microinstruction bits (control lines 18) in FIG. 6 and throughout this description are referred to with a prefix "#". Some bits are active low and thus have a minus sign prefix, like #-OtST. In the microinstruction bits of FIG. 6, the letter "t" means "to", so #-OtST means "O bus to ST register", i.e., the gates connecting the O bus to the status register are activated by this bit. The eight bit jump address on the lines 23 is denoted #JmpAddr (7-0), while the 3-bit jump control on the lines 24 used for dispatch addressing is denoted #JmpCntl (2-0); these eleven bits are used in the entry circuit 21 to generate the next CROM address. All of the twenty-one bits 18 from #OtPCH down to #ONEtAH in FIG. 6 control the access to registers 15 from busses 16. Of these, #LowWrite0 and #LowWrite1 are decoded to produce pseudo-microinstructions OtPCL, OtMAL and OtSP. The bits #ONEtAL and #ONEtAH place a "1" on the AL or AH busses to generate the B register address 0001 or the PF page address 0100 (hex) in a microinstruction. Default to all 0's on AL and AH is A register address in the register file. Connections between registers 15 and busses 16 are described in detail below. The #MEMCNT bit is a "memory continue" control for long memory cycles; the RAM 12 can be accessed for read or write in one state time, but the ROM 11 or peripherals in PF require two states, so for this reason control line #MEMCNT is active in the first state of every long memory cycle as seen in FIG. 4. #MEMCNT is used to form several other control signals, and always identifies the first or second state of a long memory cycle. The #MEM bit signifies a memory cycle and is active whenever ROM 11, RAM 12 or external memory is accessed. The #WR bit is a write command, so if #MEM and #WR are active a memory write condition exists, while if #MEM is active and #WR is not, a memory read condition exists. The #-LST signal is a load status command for ALU operations; the status register ST can also be loaded from the 0 bus by the #-LST command. The ALU is controlled by nine bits labelled #ShiftCntl (3-0), #AluCntl (3-0) and #ABL; these controls will be described below in detail.

The microinstruction bits 18 are physically arranged in the order used in FIGS. 7a-7e rather than in the order shown in FIG. 6, so that a control bit 18 is generated as close as possible to the point it is used in the strip.

The microinstruction control of access to the registers 15, busses 16 and ALU 14 will now be described in reference to FIGS. 5, 6 and 7a-7f.

P bus

The P bus is one of the inputs to the ALU 14. It is called 'P' for "Positive", because in a subtract operation where the ALU 14 only computes P-N the P bus contains the positive, or left-hand, operand. The P bus is loaded from the MD bus via transistors 16a, 16b, and 16c, loaded from the AL bus via transistor 16d (FIG. 7b), loaded from the PCH register via transistor 16e, or from the PCL register via transistor 16f. Any of the AL bus sources may be placed on the P bus by gating them on the AL bus and asserting the #PAL microinstruction bit going to the gate of transistor 16d, connecting the P bus to the AL bus. If no source is specified, i.e., "default", the P bus assumes the value of all zeros. The P bus is loaded in the beginning of a microinstruction cycle, on phase H1. All of the possible P bus sources and the microinstruction bits or outputs 18 needed for each are as follows:

| P Bus Source | Microinstruction Bit(s) |
| --- | --- |
| MD Bus | #MDtP |
| PCH Register | #PCHtP |
| PCL Register | #PCLtP |
| MAL Register | #MALtAL,#PAL |
| SP Register | #SPtAL,#PAL |
| 01 Constant | #ONEtAL,#PAL |

N bus

The N bus is the other input to the ALU 14. It is called N for "negative", since on the ALU subtract operation it contains the negative, or right-hand, operand. It is loaded from the MD bus via transistors 16a, 16g and 16h, loaded from the T/MAH register via transistor 16i, loaded from the IR register via transistor 16j, the status register ST via transistor 16k, or the BCD constant register via transistor 16m. It is understood, of course, that there are sets of eight of each of the transistors 16a to 16j, one for each of the eight bits of each bus and each register. Only four transistors in the sets 16k or 16m are needed. The source of the N bus is indicated directly by a bit in the microinstruction word, as shown below. If the bit is '1', the source is gated onto the N bus. If no source is specified, the N bus assumes the value of all zeros. The N bus is also loaded at the beginning of a microinstruction cycle, on phase H1.

| N Bus Source | Microinstruction Bit(s) |
| --- | --- |
| MD Bus | #MDtN |
| T Register | #TtN |
| Status Register | #STtN |
| BCD Constant | #BCDtN |
| IR Register | #IRtN |

AL bus

The AL or address low bus holds the lower eight bits of all memory addresses. This comprises the entire address for references to the register file RF in RAM 12, or the lower byte for references to the peripheral file PF, on-chip ROM 11 and extended memory in expansion modes. The AL bus is loaded during the phase H1. The sources of the AL bus are the MAL register via transistor 16n, the SP register via transistor 16p, or the constant 01 via transistor 16q. The constant is provided to efficiently address RAM location 01 which is the "B" register. If no source is specified, "default", the AL bus assumes the value 00 which is the A register in the RAM.

The AL bus may also be connected to the P bus via transistor 16d by asserting the #PAL microinstruction bit. In this manner, the AL bus sources (MAL, SP, and the constant 01) may be gated onto the AL bus and then onto the P bus to be operated on by the ALU. Likewise, the P bus sources (PCH, PCL, and MD bus contents) may be gated onto the P bus and then onto the AL bus via transistor 16d and #PAL to serve as low order address lines. The MD bus contents moved in this case are those present at the start of the microinstruction. In summary, all of the possible sources of the AL bus are listed below:

| AL Bus Source | Microinstruction Bit(s) |
| --- | --- |
| MAL Register | #MALtAL |
| SP Register | #SPtAL |
| PCL Register | #PCLtP,#PAL |
| PCH Register | #PCHtP,#PAL |
| MD Bus | #MDtP,#PAL |
| 01 Constant | #ONEtAL |

AH Bus

The 8-bit AH (Address High) bus contains the high-order byte of the address referenced by the CPU, loaded during H1. It may be loaded with the contents of the PCH register via transistor 16r, the T/MAH register via transistor 16s, or the constant 01 via transistor 16t. The high byte of the program counter is usually transferred to the buffers 19 for use in the peripheral control circuitry 20, and the T/MAH register is used to hold the high byte of other addresses in memory for use in a later microinstruction state. The constant 01 is provided to efficiently access addresses in the peripheral file in this embodiment (i.e. page-one addresses of the form 01xx in hex). If no source is explicitly specified in the microinstruction word, "default", the AH bus takes on the value 00; this is useful for referencing the on-chip register file RF in RAM 12. The sources of the AH bus are summarized below:

| AH Bus Source | Microinstruction Bit(s) |
| --- | --- |
| PCH Register | #PCHtAH |
| T/MAH Register | #TtAH |
| 01 Constant | #ONEtAH |

O Bus

Figure 7B:
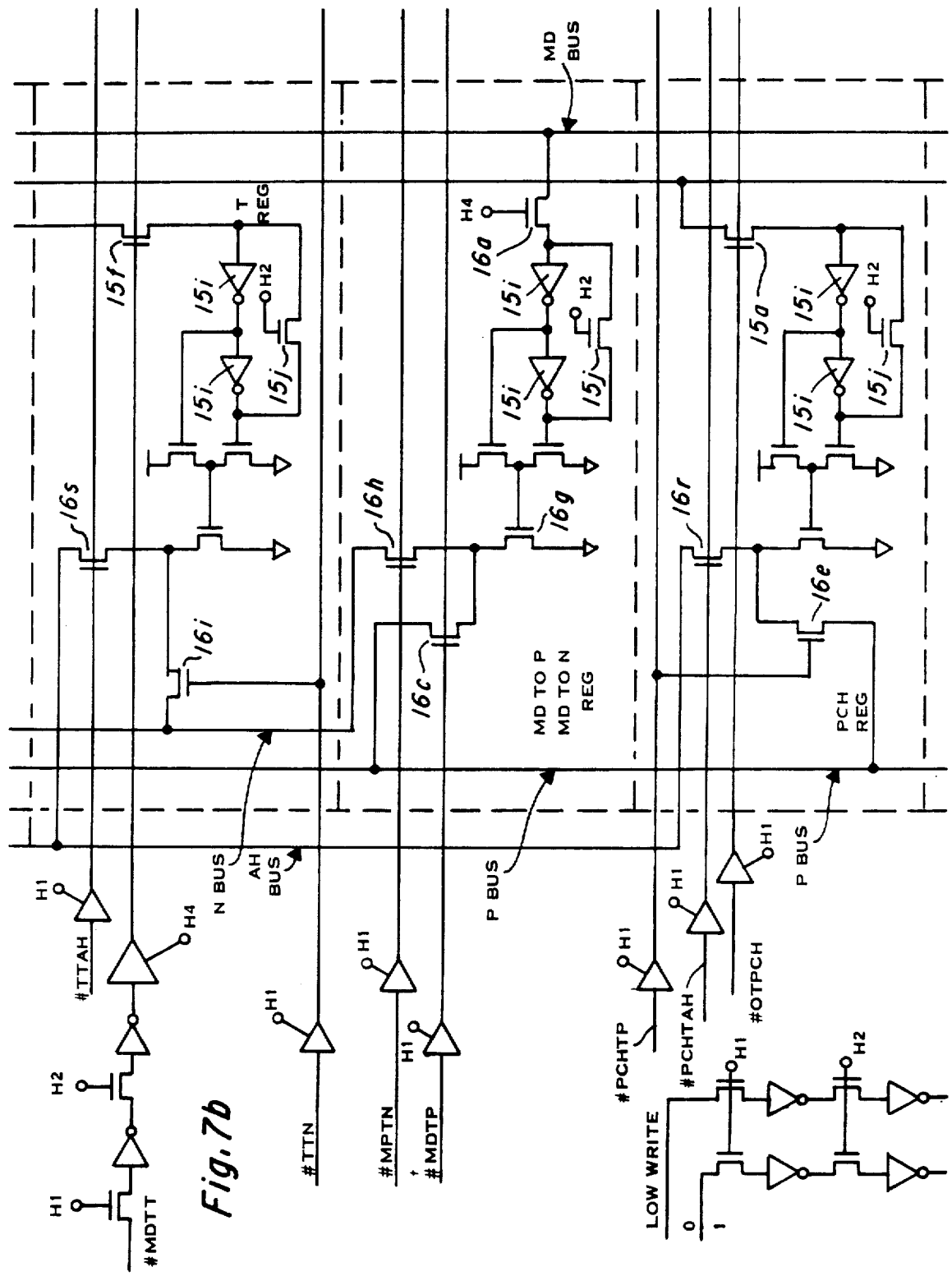
Figure 7B:
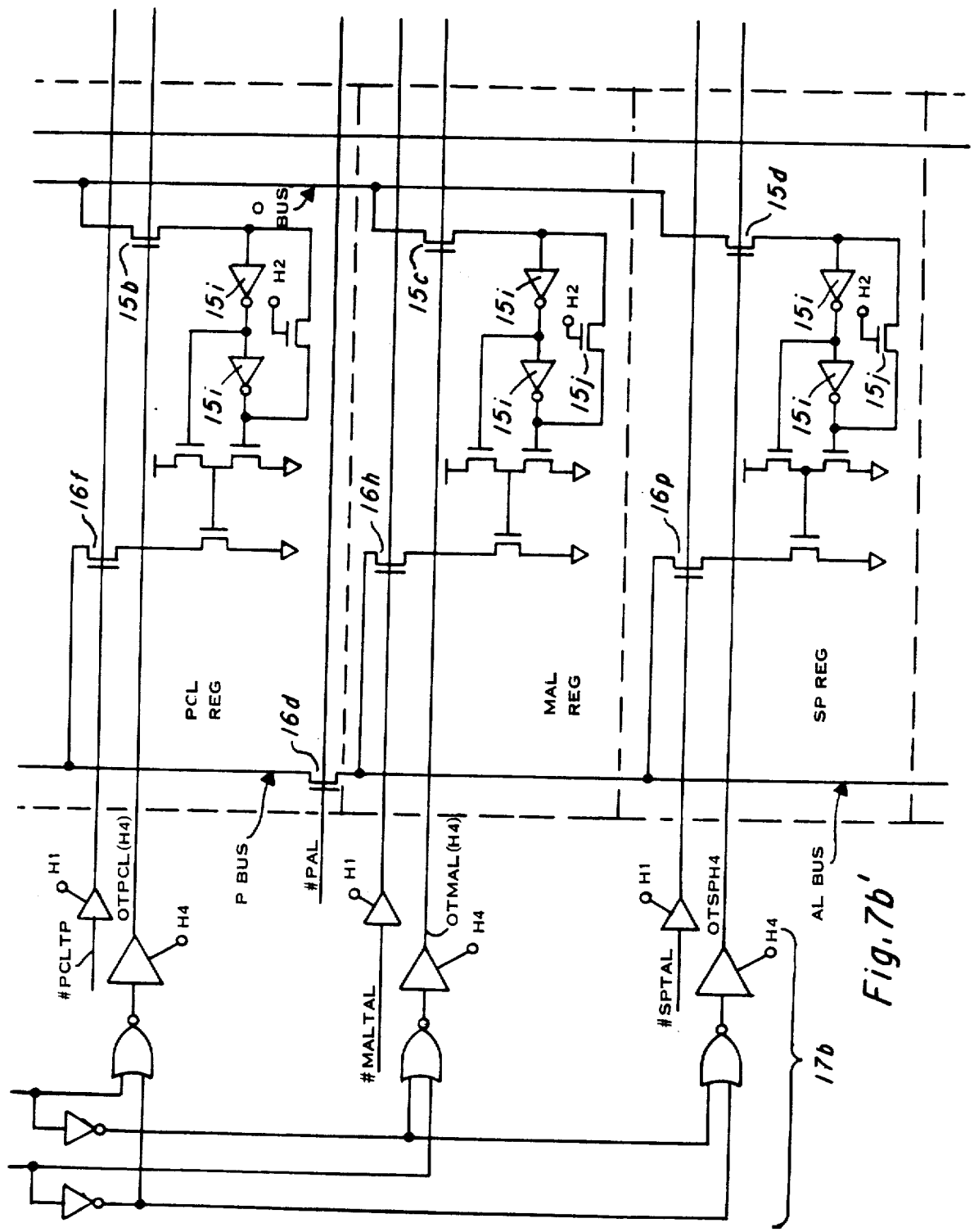

The O or output bus always contains the output of the ALU 14 and shifter S combination. As seen in FIGS. 5 and 7c, the O bus contents may be loaded onto the MD bus via transistors 16u and OtM, or into the PCH, PCL, MAL, or SP registers via sets of eight each of transistors 15a to 15d, respectively. The status register ST is loaded from O bus by the true-low microinstruction bit #-OtST and four transistors 15e (FIG. 7e). The PCH register is loaded by the true-high microinstruction bit #OtPCH. The load signals for the other destination registers (MAL, PCL, SP) are encoded in the two microinstruction bits #LowWrite (1–0), according to the combinations of #LowWrite(1–0) below:

| #LowWrite (1) | #LowWrite (0) | O Bus Destination | Pseudo-Microinstruction Bit |
| --- | --- | --- | --- |
| 0 | 0 | -No Write- | |
| 0 | 1 | MAL Register | OtMAL |
| 1 | 0 | PCL Register | OtPAL |
| 1 | 1 | SP Register | OtSP |

There is no microinstruction bit that directly loads the MD bus from the O bus, because the MD bus contents are under control of the peripheral control circuitry 20. This transfer is controlled by the OtM signal sent from the circuitry 20 to the CPU on a control line. OtM is asserted on every memory write cycle (on-chip or extended memory), and on the first state of every long memory cycle.

The O bus may be gated onto the MD bus via transistors 16u by specifying the appropriate values of the #MEMCNT and #WR microinstruction bits so that OtM will be asserted by the peripheral control circuitry 20. The O bus contents may then be loaded into the T/MAH or IR register from the MD bus via transistors 15f and 15g.

In summary, the destinations of the O bus are described below:

| O Bus Destination | Microinstruction Bit(s) |
| --- | --- |
| ST Register | #-OtST |
| PCH Register | #OtPCH |
| PCL Register | OtPCL |
| MAL Register | OtMAL |
| SP Register | OtSP |
| T Register | #WR,#MDtT |
| IR Register | #WR,#MDtIR |
| Short Mem Cycle | #WR,#MEM |
| Long Mem, Cycle 1 | #MEMCNT,#WR,#MEM |
| Long Mem, Cycle 2 | #WR,#MEM |

The O bus is loaded during phase H4 of the microinstruction cycle. It contains the result of the ALU and shifters operations specified in the current microinstruction.

MD Bus

The memory data bus MD is a bidirectional bus that transfers data to and from the CPU 13. Data is valid on MD during phase H4 of the microinstruction cycle, which spans two microinstructions. For example, data may be read via transistors 16b from the MD bus onto the P bus at the beginning of a cycle H1 and the ALU results then loaded back onto MD via transistors 16u at the end of the cycle at H4.

At the beginning of a cycle, the MD bus contents may be loaded on the P or N busses via transistors 16c or 16h, as described earlier (FIG. 5 or 7b). Thus the results of the previous microinstruction (or the data read from memory by it), may be loaded into the ALU 14.

At the end of a cycle, the MD bus may be loaded in one of three ways;

(1) The O bus contents may be gated into the MD bus via transistors 16u and OtM;
(2) The on-chip RAM 12 or ROM 11 may place data onto the MD bus; or
(3) The peripheral control circuitry 20 may place data onto the MD bus from ports A, B, C or D, latch 26c, I/O control register 25, etc.

The MD bus contents are controlled by the peripheral control circuitry which sends the OtM signal to the CPU to signal loading the bus from the O bus. The CPU 13 requests use of the MD bus by asserting combinations of the #MEM, #MEMCNT, and #WR signals, as outlined above. The group decode and memory control 27, 28 in the peripheral control circuitry 20 sends signals to the on-chip ROM 11 and RAM 12 to control their accesses to the MD bus.

The timing of read and write accesses to memory is explained with reference to FIG. 4. For short memory reads, the data on MD bus is available at the end of the same microinstruction cycle that initiated the read. Data on MD may be loaded into the T/MAH or IR registers during that microinstruction by specifying the #MDtT or #-MDtIR bits, respectively, or may be loaded into the P or N bus on the next microinstruction by specifying the #MDtP or #MDtN bits in the next microinstruction. For short memory cycle writes, the O bus data is placed on the MD bus, and the #WR control asserted. For long memory reads, the desired address is placed on the AH and AL lines, and the #MEMCNT command asserted in the first of the two cycles required. At the end of the second cycle, the data is available on the MD bus. (By a command "Load Address", LDADDR, the memory address is latched in buffers 19 going to AL' and AH' and the peripheral control circuitry 20 on the first cycle, and need not be asserted on the second cycle.) For long memory writes, the address is specified in the first cycle, and the data is placed on the MD bus for the first and second cycles.

In summary, the destinations of the MD bus in the CPU 13 are described below:

| MD Bus Destination | When Loaded | Microinstruction Bit(s) |
|---|---|---|
| T/MAH Register | End of Cycle | #MDtT |
| IR Register | End of Cycle | #-MDtIR |
| P Bus | Start of Cycle | #MDtP |
| N Bus | Start of Cycle | #MDtN |

The MD, P, N, AH, AL and O busses are precharged on H2 or H3 by transistors 16v as indicated.

ALU Operation

The arithmetic logic unit or ALU 14 as seen in block form in FIG. 5 and in detail in FIGS. 7c and 7c' accepts as inputs the values on the P bus via transistors 14a and N bus via transistors 14b. The ALU outputs its result to the shifter S during H4 via line 14c and transistor 14d. Its operation is controlled by the #AluCntl(3-0) bits inputted via buffers 17b and transistors 14e, and by the #ABL bit going to transistors 14f, both from the current microinstruction. The ALU operates on the values loaded on the P and N busses during H1 of the current microinstruction, and produces an 8-bit ALU output on lines 14c which is input to the shifter S, and also produces two carry bits: Cout on line 14g, an arithmetic full byte carry bit, and Dout on line 14h, a 4th-bit half carry bit used by the decimal adjust circuitry in the BCD constant register for binary coded decimal operations. The available operations of the ALU controlled by transistors 14e and 14f are defined below:

| #AluCntl | | | | #ABL | ALU Output on Lines 14c | Operations |
|---|---|---|---|---|---|---|
| 3 | 2 | 1 | 0 | | | |
| 0 | 0 | 0 | 0 | 0 | P + N + Cin | Add |
| 0 | 0 | 0 | 0 | 1 | P XNOR N | Exclusive NOR |
| 0 | 0 | 0 | 1 | 1 | P AND N | AND |
| 0 | 0 | 1 | 0 | 1 | (NOT P) OR N | OR |
| 0 | 0 | 1 | 1 | 1 | N | Pass N |
| 0 | 1 | 0 | 0 | 1 | P OR (NOT N) | OR |
| 0 | 1 | 0 | 1 | 1 | P | Pass P |
| 0 | 1 | 1 | 0 | 1 | FF(hex) | all 1's |
| 0 | 1 | 1 | 1 | 1 | P OR N | OR |
| 1 | 0 | 0 | 0 | 1 | P NOR N | NOR |
| 1 | 0 | 0 | 1 | 1 | 00 | All 0's |
| 1 | 0 | 1 | 0 | 1 | NOT P | Invert P |
| 1 | 0 | 1 | 1 | 1 | (NOT P) AND N | AND |
| 1 | 1 | 0 | 0 | 1 | NOT N | Invert N |
| 1 | 1 | 0 | 1 | 1 | P AND (NOT N) | AND |
| 1 | 1 | 1 | 0 | 1 | P NAND N | NAND |
| 1 | 1 | 1 | 1 | 0 | P − N − 1 + Cin | Subtract |
| 1 | 1 | 1 | 1 | 1 | P XOR N | Exclusive OR |

The carry-in bit Cin on line 14i of the ALU 14 is specified by the #ShiftCntl(3-0) bits 18 of the microinstruction. For operations requiring no shifting of the ALU contents, #ShiftCntl(3,2) bits are zero and the possible carry-in bits are defined in logic 14j of FIG. 7c' as follows:

| #ShiftCntl | | | | ALU Carry In on Line 14i |
|---|---|---|---|---|
| 3 | 2 | 1 | 0 | |
| 0 | 0 | 0 | 0 | 0 |
| 0 | 0 | 0 | 1 | 1 |
| 0 | 0 | 1 | 0 | uC; micro carry bit |
| 0 | 0 | 1 | 1 | STC; status carry bit |

The micro carry bit uC is the carry out Cout on line 14g from the ALU operation of the immediately preceding microinstruction. This is not the same as the shift-out bit Sout on line 14k from the shifter S operation of the previous microinstruction. The status carry bit STC is the carry bit of the status register ST.

The first section of each ALU bit produces a "generate" on line 14m and/or a "propagate" on line 14n. The arithmetic carry-out Cout bit from the ALU 14 on line 14g is generated and/or propagated by transistors 14f, 14p and 14q, depending upon #ABL, and if '1' is there is a carry-out during an add or subtract operation in the ALU. For the add operation, Cout=1 indicates there was a carry, i.e. the sum of the (unsigned) operands exceed $2^8$. For the subtract operation, Cout=0 indicates there was a borrow, i.e., the P operand was lower than the N operand (unsigned). For all other operations (i.e. logical operations), Cout on line 14g is equal to 0. Cout is sent via line 14g to the status register ST circuitry for possible loading into STC, the status carry bit. The decimal half-carry Dout is sent via line 14h to the BCD constant register for use in generating a constant for decimal arithmetic correction. In each bit of the ALU, the propagate bit on line 14n and a carry-dependent bit 14p' are inputs to an exclusive-or circuit 14r, which produces the output 14c.

As an example of ALU operation, an add operation with zero carry in (#AluCntl and #ShiftCntl all zeros) will cause the ALU to calculate the sum of the P and N bus contents. To calculate the difference between the P and N bus contents, #AluCntl=1111 and #ShiftCntl=0001. A '1' must be carried in for this subtract since no borrow was desired. As a complete example, the following two microinstructions read the current byte addressed by the PCL and PCH registers, place it in the T/MAH register, and increment the PCL and PCH registers:

FIRST MICROINSTRUCTION CYCLE:

| Bits(s) | Operations(s) |
|---|---|
| #PCLtP,#PAL | Place PCL on AL bus via P bus |
| #CPHtAH | Place PCH on AH bus |
| none (default) | Place all zeros on N bus |
| #AluCntl = 0000, #ShiftCntl = 0001 | Adds P and N with Carry in (sets micro carry uC) to increment PCL by 1 |
| #LowWrite = 10 (OtPCL) | ALU output goes back to PCL with no shift, via O bus |
| #MEMCNT,#MEM | 1st cycle of long read |
| #Jump Addr XXXXXXX | Go to this CROM address for second microinstruction cycle |
| #Jump Cntl XXXX | |

SECOND MICROINSTRUCTION CYCLE:

| Bit(s) | Operation(s) |
|---|---|
| none (don't care-AH,AH) | The contents of AH and AL busses were latched in buffers 19 on the first cycle |
| #PCHtP | Place contents of PCH register on P bus |
| none (default) for N | Place all zeros on N bus |
| AluCntl = 0000, #ShiftCntl = 0010 | Add the micro carry uC from the PCL increment in first cycle |
| #OtPCH | ALU output via O bus (no shift) is placed back in PCH register |
| #MEM | Memory read continues |
| #MDtT | Place the byte read into the T/MAH register via MD bus |
| #Jump Addr XXXXXXX | Go to next instruction |
| #Jump Cntl XXXX | |

Notice that an increment was done in the first cycle by using an ALU carry-in of '1'. The second instruction incremented the high byte of the program counter in PCH only if the micro carry bit (uC) generated in the first cycle was '1'.

Shifter Operation

The shifter S of FIGS. 5 and 7 performs a variety of 1-bit shift operations on the outputs 14c of the ALU 14. The #ShiftCntl(3-0) bits on control lines 18 to the ALU control the following entities:

(1) the ALU carry in bit Cin via logic 14j and input line 14i;
(2) the shift direction left or right via transistors Sa or Sb, left and right control lines Sc and Sd (or straight on Si), and logic Se; and
(3) the bit shifted in via lines Sf and Sg.

The following describes the various combinations of shift control lines:

| #ShiftCntl | | | | ALU | Shift | Shift-In |
|---|---|---|---|---|---|---|
| 3 | 2 | 1 | 0 | Carry In | Direction | Bit |
| 0 | 0 | 0 | 0 | 0 | No | — |
| 0 | 0 | 0 | 1 | 1 | Shift | — |
| 0 | 0 | 1 | 0 | uC | | — |
| 0 | 0 | 1 | 1 | STC | | — |
| 0 | 1 | 0 | 0 | 1 | Shift | ALU(7) |
| 0 | 1 | 0 | 1 | 0 | Left | ALU(7) |
| 0 | 1 | 1 | 0 | 1 | | STC |
| 0 | 1 | 1 | 1 | 0 | | STC |
| 1 | 0 | 0 | 0 | 1 | Shift | ALU(0) |
| 1 | 0 | 0 | 1 | 0 | Right | ALU(0) |
| 1 | 0 | 1 | 0 | 1 | | STC |
| 1 | 0 | 1 | 1 | 0 | | STC |
| 1 | 1 | x | x | x | Invalid | — |

For #ShiftCntl=00xx, no shifting is performed and the transistors Sh are turned on by Si and logic Sj, so the ALU output bits go to transistors Sk as inputs to the O bus; the ALU carry-in bit 14i is as described in the ALU description, above. For #ShiftCntl=010X, the ALU output is rotated left via transistors Sa, with the least significant bit, ALU(1), shifted in via line Sf. For #ShiftCntl=011x, the ALU output is rotated left through the status carry bit, STC, via lines Sm and 14k. For #ShiftCntl=100x, the ALU output is rotated right via transistors Sb, and for #ShiftCntl=101x, the output is rotated right through the status carry bit in ST via lines Sn, Sp, Sq and logic Sr. In each case, #ShiftCntl(1) indicated the SLU carry-in bit.

The shift-out bit Sout on line 14k shifted out in a rotate instruction is sent to the status register ST. It will be loaded in ST as the new status carry bit STC if the #-LST microinstruction bit is set.

IR Register

Referring to FIGS. 5 and 7a, the 8-bit instruction register IR is a register intended to hold the current machine opcode (one of the opcodes or first bytes of the Table A instructions). The opcode is loaded through transistors 15g from the MD bus by the #-MDtIR bit in a microinstruction. IR may be loaded onto the N bus with the #IRtN bit through transistors 16j.

The output of IR, includes true outputs IR0 to IR7 and complement outputs -IR0 to -IR7, all on lines 21b;

this output primarily is used in the entry point circuit 21 as will be described.

Each of the bits of the registers 15 of FIG. 7 basically consists of two inverters 15i with the output coupled back to the input via a transistor 15j. All transistors 15j are clocked on H2 except for IR and ST in which the transistor is clocked on H1.

Status Register

The status register ST of FIG. 5 or 7e is a 4-bit register indicating various conditions of the machine. Each bit of the status register has a special meaning, and has separate circuitry devoted to it. Only bits 4–7 of ST are used in this example, but other embodiments could use additional bits.

STC or the "C" bit referred to in instructions of Table A is the status carry bit. It holds either the carry-out of the ALU 14 from line 14g, the shift-out of the shifter S from line 14k, or the decimal arithmetic carry-out from line 14h. STSB is the status sign bit ("N" in Table A), and contains the most significant bit of the 0 bus contents. STEZ is the status equal to zero bit, and contains a '1' when all bits of the 0 bus are zero which is detected by transistors Sz and line Sz2 in shifter S. STINT is the status interrupt enable bit. Bits 3-0 of the status register are not used in this embodiment but may be used in expanded versions of the device; the value of these bits whern the ST register is loaded onto the N bus is undefined.

The status register bits may be modified in one of two ways:
(1) by asserting #-OtST, all bits may be replaced by the contents of the 0 bus via transistors 15e; or
(2) by asserting #-LST the STC, STSB, and STEZ bits may be set according to their particular input circuitry via transistors 15n (the STINT bit is unaffected in this case).

There is no way to individually load the STC, STSB, and STEZ bits; they are loaded together via transistors 15n and #-LST. This feature permits an efficient implementation of the status logic, typically a very costly item (in space used) in single-chip microarchitectures. The special circuitry defining the value of the STC, STSB, and STEZ register bits is described in the following paragraphs.

Setting Status Bits

When the #-LST signal is asserted, the STC bit will be loaded from one of three sources:
(1) from the ALU arithmetic carry-out bit Cout on line 14g, via transistors 15p and 15n. Cout is the carry/borrow bit generated by the ALU on arithmetic operations. Cout is loaded if no shifter S operation is specified, i.e. #ShiftCntl = 00xx.
(2) from the shifter S shift-out bit Sout on line 14k, via transistor 15n. This is the bit shifted out on shifter operations. If a shifter operation is specified (i.e. #ShiftCntl other than 00xx), then Sout is loaded into the carry bit.
(3) from a BCD decimal carry/borrow-out bit on line 15q and transistor 15r. This is the carry bit computed by the decimal adjust circuitry within the BCD constant register. It is loaded into the STC status carry bit if the #BCDtN bit is set, indicating a decimal adjust constant is loaded onto the N bus. When the #BCDtN microinstruction bit is present, indicating a decimal adjust operation, no shift should be applied to the ALU output.

When #-LST is asserted, the input to the STSB bit is bit-7 of the 0 bus, the most significant bit of the 0 bus, via transistor 15n.

When #-LST is asserted, the input to the status equal to zero STEZ bit is the micro equal-to-zero bit, uEZ from the shifter S, derived from the transistors Sz. The uEZ bit is simply the logical NOR of all 0 bus lines. That is, if all 0 bus line are zero, the uEZ is set to '1'. Otherwise, it is set to '0'.

The status interrupt enable STINT bit may only be modified by loading the 0 bus contents into the status register ST via transistor 15e when #OtST is asserted. The STINT bit corresponds to bit-4 of the 0 bus in this case. STINT is output from the CPU 13 to the peripheral control circuitry 20 on a control line from the CPU. If STINT=0, the circuitry 20 will not pass on an interrupt to the CPU via the IACT control line. If STINT=1, the IACT control is asserted by circuitry 20 on an interrupt. By dispatching on the IACT bit, the microcode is able to test for interrupts.

All of the status bits may be loaded from the status register ST to the N bus via transistors 16k. The STEZ, STSB and STC bits go to the entry point circuit 21 via lines 21b.

MICROINSTRUCTION SEQUENCE CONTROL WITH DISPATCHING

The micro architecture of the invention including entry point circuit 21 and CROM 17 is designed to dispatch on various subfields of the IR contents, providing for the execution of appropriate microcode as in FIG. 8 and Table B and C for each machine opcode or Table A instruction. FIG. 9 shows a map of the opcodes. The opcode in IR may be considered to have two possible formats, and the entry point circuit 21 seen in detail in FIG. 10 responds to these formats to produce the address on lines 21a:

Format 0 is indicated by a '0' in IR(7), the most significant bit of the IR register (all opcodes with 0000 to 0111 for their most significant half). In this format, bits IR(6-4) form a 3-bit "group" field via transistors 21g and bits IR(3-0) form a 4-bit "function" field via transistors 21f. These are the basic arithmetic and logic dual-operand instructions, for the most part.

Format 1 is indicated by a '1' in IR(7) (all opcodes with 1000 to 1111 for MSH). In this format, bits IR(6-3) form a 4-bit "group" field via transistors 21g' and bits IR(2-0) form a 3-bit "function" field via transistors 21f'. These include the peripheral page instructions, single operand instructions, special addressing (direct, indirect, indexed) and traps.

The terms "group" and "function" refer to logical subsets of machine opcodes. In the example shown, the group field in an opcode indicates the addressing mode of the instruction (i.e. which group of FIGS. 8b to 8d to go to on the first dispatch at decision point 8m), and the function field indicates the arithmetic or logical opration performed on the operands on the second dispatch at points 8n of FIGS. 8b to 8d, after the operands are fetched. The microarchitecture allows significant sharing of microinstructions among opcodes within the same group or function. In the microcode for the illustrated embodiment, for instance, all opcodes of the format 1 share a microcode state RFtoA-1 which fetches the A register and a general RF register, as seen in FIG. 8 and as will be explained in reference to Tables B and C.

The mechanism for dispatching on the group and function field values in the IR are described herein. Dispatching on an IR subfield may be performed on one of the first microinstructions after the IR is loaded (e.g., at IAQ-2). Thereafter, dispatching may be performed by microinstructions up to and including the next one that reloads the IR. If no dispatching is required during executing a given opcode, then the IR may be used as a general purpose 8-bit register.

Figure 10A:
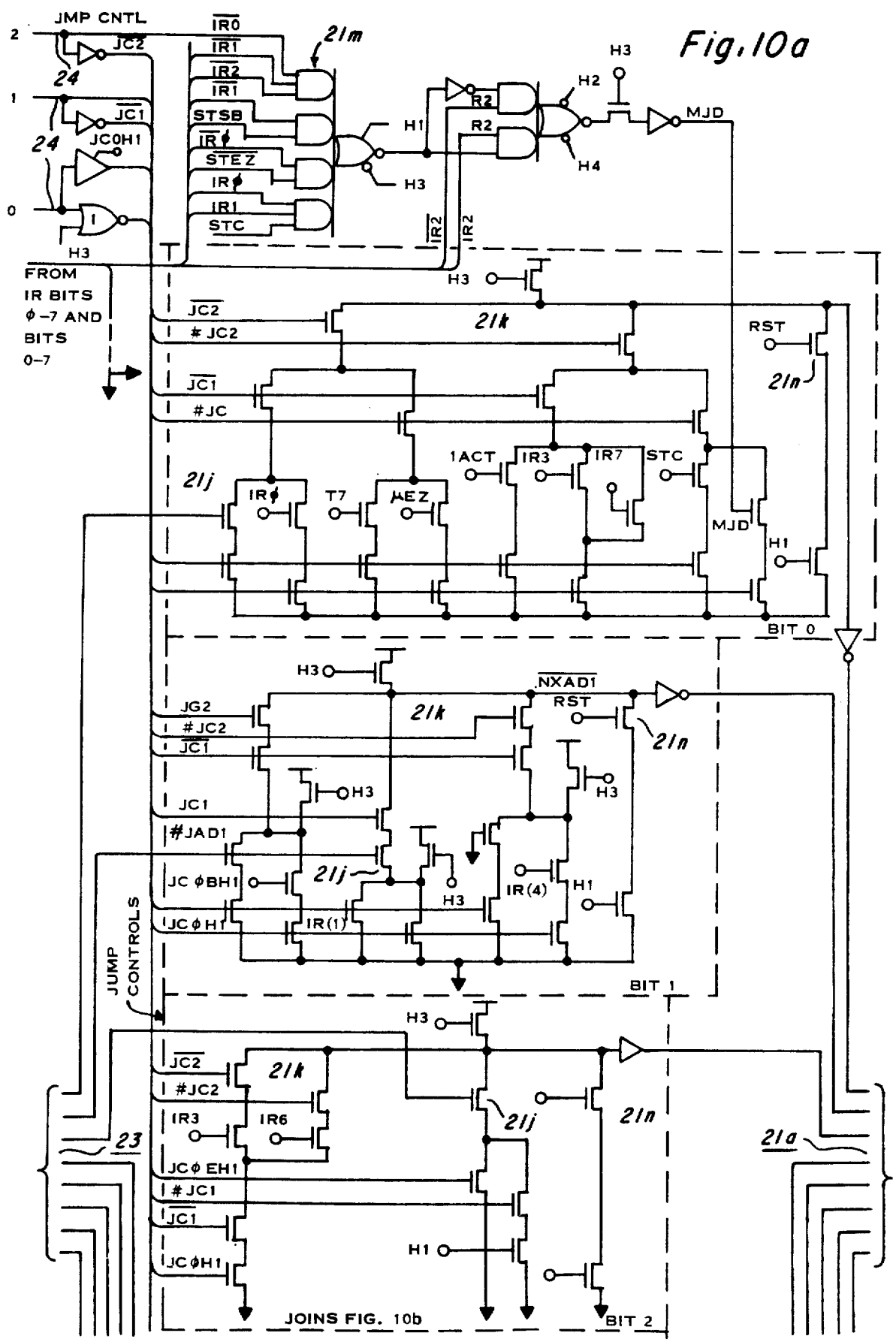
FIG. 10 is an electrical diagram, in schematic and logic form, of the entry point circuit 21 of FIG. 1.
Figure 10B:
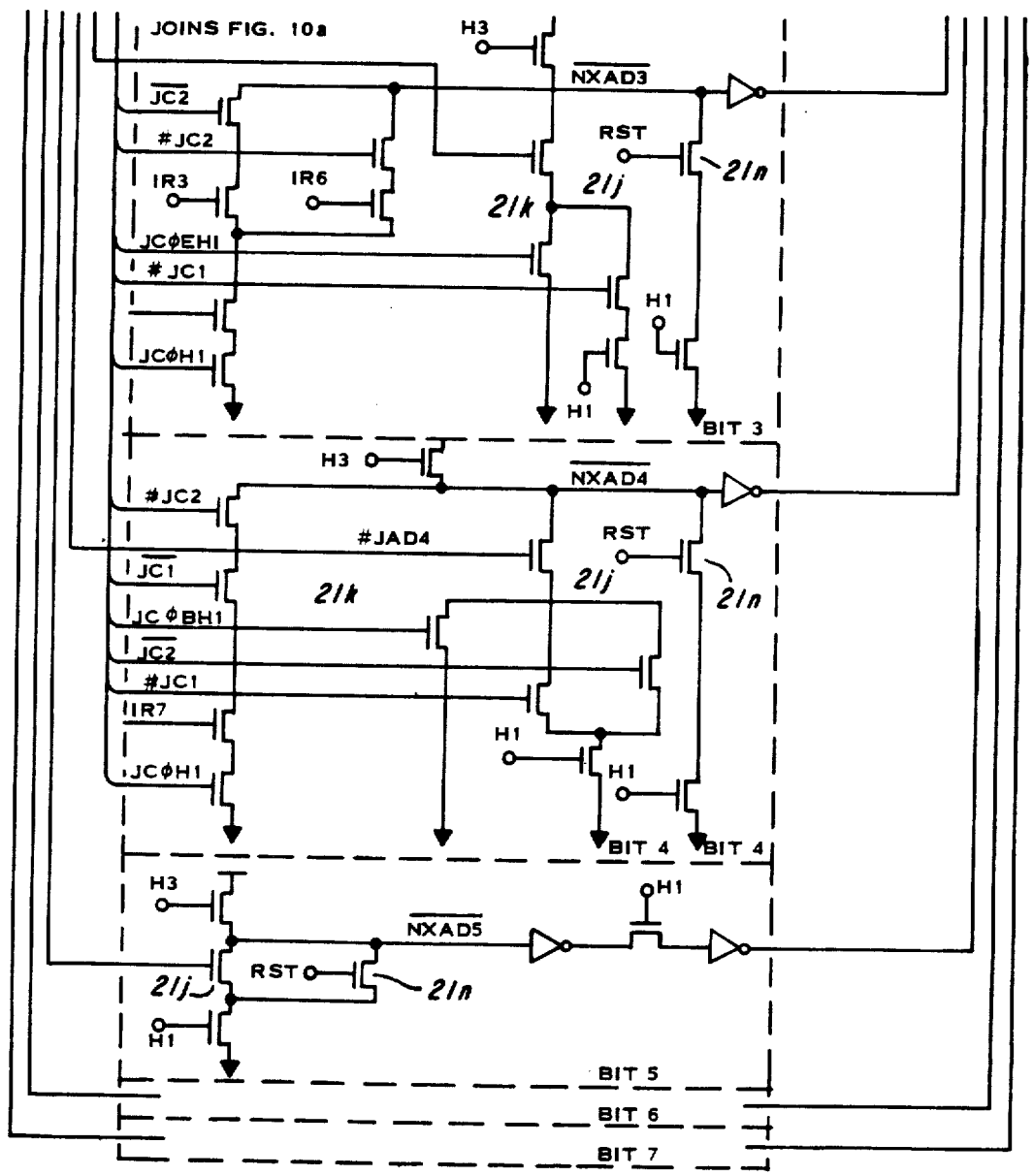

The flow of control between microinstructions is determined by how the next microinstruction address on lines 21a to CROM 17 is generated in the circuit of FIG. 10, in both conditional and unconditional branching. The dispatching capability of the processor is used to share microinstructions among several macroinstructions.

The microinstructions of Tables B and C, stored in the control ROM or CROM 17 on the chip, may be characterized as horizontally microprogrammed in that each microinstrution indicates the address at which the next microinstruction to be executed is located. The next micro-address is specified by two fields of the CROM output 18 (lines 23 and 24) indicated as inputs in the logic circuit of FIG. 10;

(1) #JumpAddr(7-0), an 8-bit field indicating a base address in CROM; and (2) #JmpCntl(2-0), a 3-bit code indicating one of eight dispatch offsets from the base address in #JmpAddr(7-0); also complements of #JmpCntl, such as -JmpCnt(12), are used.

If #JmpCntl(2-0)='000', then the #JmpAddr field is simply used directly as the address of the next microinstruction via transistors 21j; and example in FIG. 8b is the BtoPPL-0 through BtoPP1-3 series. If #JmpCntl(2-0) is nonzero, it indicates which control lines will replace the low order bits of #JmpAddr via logic circuits 21k, and so form the next micro-address on lines 21a. This technique is refered to herein as dispatching, and is readily implemented in MOS technology as seen in the circuit of FIG. 10.

In the example device, a maximum of 256 microinstructions are possible, each consisting of a multi-bit word (outputs 18) in FIG. 6, but a total of only 160 microinstructions are required to implement the Table A instruction set, and so only 160 words of CROM are formed. Each of these is only a 45-bit word, containing a possible forty-five outputs 18 of microinstruction control. Additional microcoded functions for the device (new macroinstructions not in Table A) may be added by implementing a subset of the Table A instruction set, or replacing it entirely. The functions executed may be expanded by using a larger CROM 17, requiring more bits in the address 21a, and for more bits 18 for the output, in other embodiments.

All conditional branching in microcode is accomplished by means of dispatching. A base address is specified in the #JmpAddr(7-0) bits of the microinstruction. The #JmpCntl(2-0) lines indicate which control lines then replace the low order bits of this base address to generate the new microinstruction address on lines 21a of FIG. 10. For example, FIG. 8k depicts dispatching on the IR(3-0) bits, as implemented in the logic circuits 21k of FIG. 10.

The dispatch field bits (like bit-3 to bit-0 in FIG. 8k) actually replace the low order address bits in the #JmpAddr(7-0) field; they are not ORed with them. For example, suppose #JmpAddr was specified to be 00010001, and the #JmpCntl(2-0) lines set to '110', indicating a dispatch on STC, the status carry bit input to logic circuitry 21m. If STC were '0' the next micro address would be 00010000. The possible dispatch fields implemented in FIG. 10 are summarized in Table E, and each of the dispatch possibilities is further explained below; however, the microinstruction sequences for the illustrative instruction set will be examined.

Figure 8C:
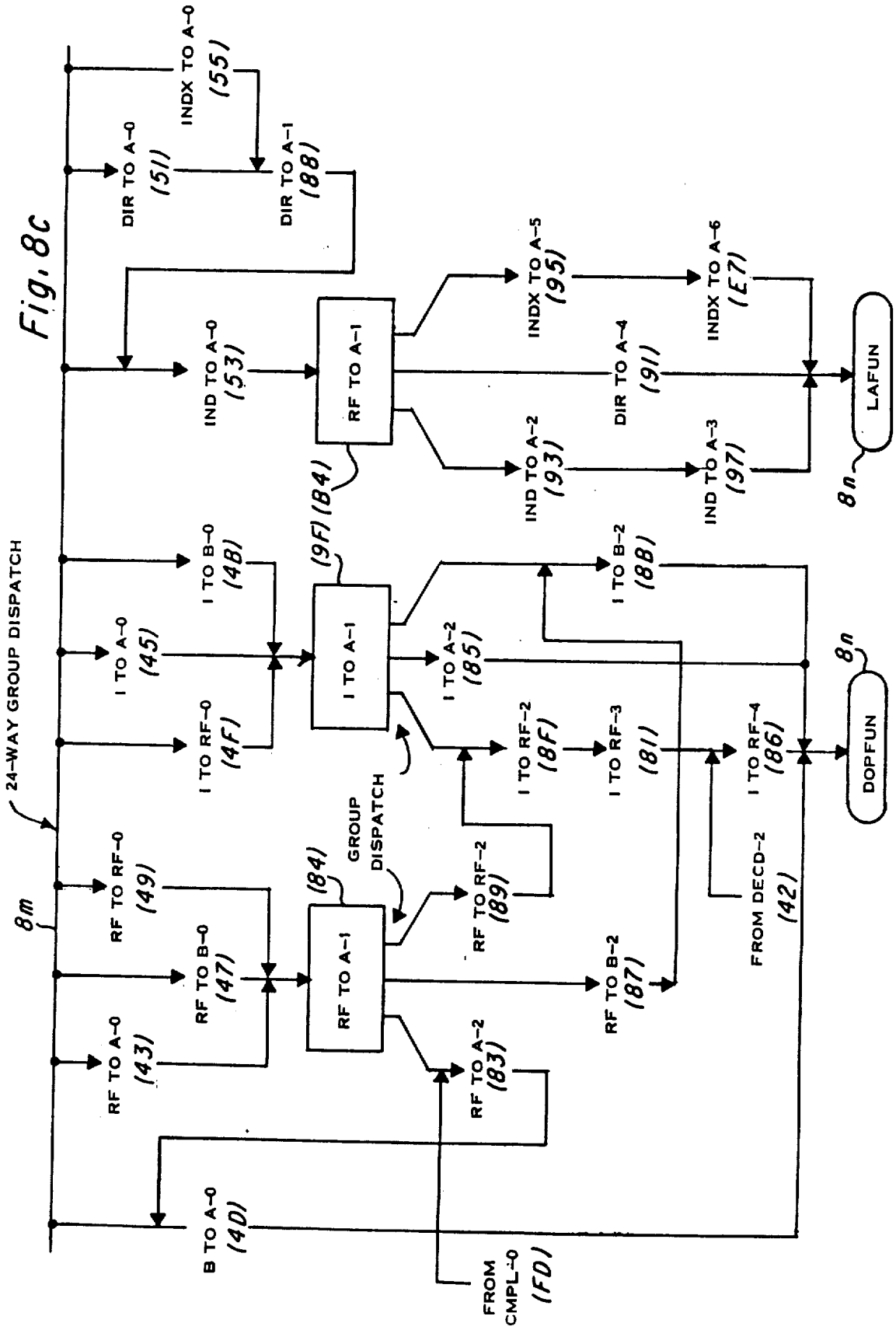
Figure 8F:
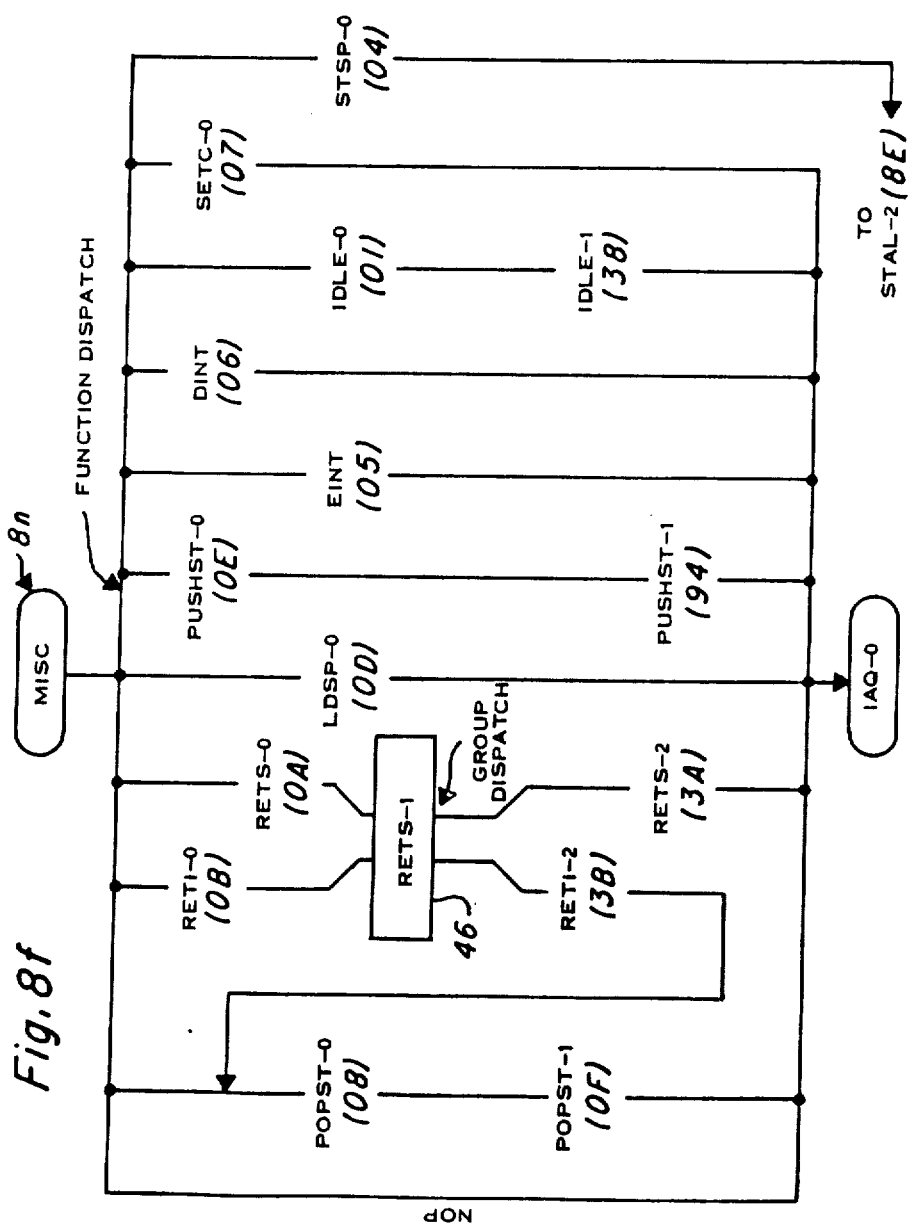
Figure 8G:
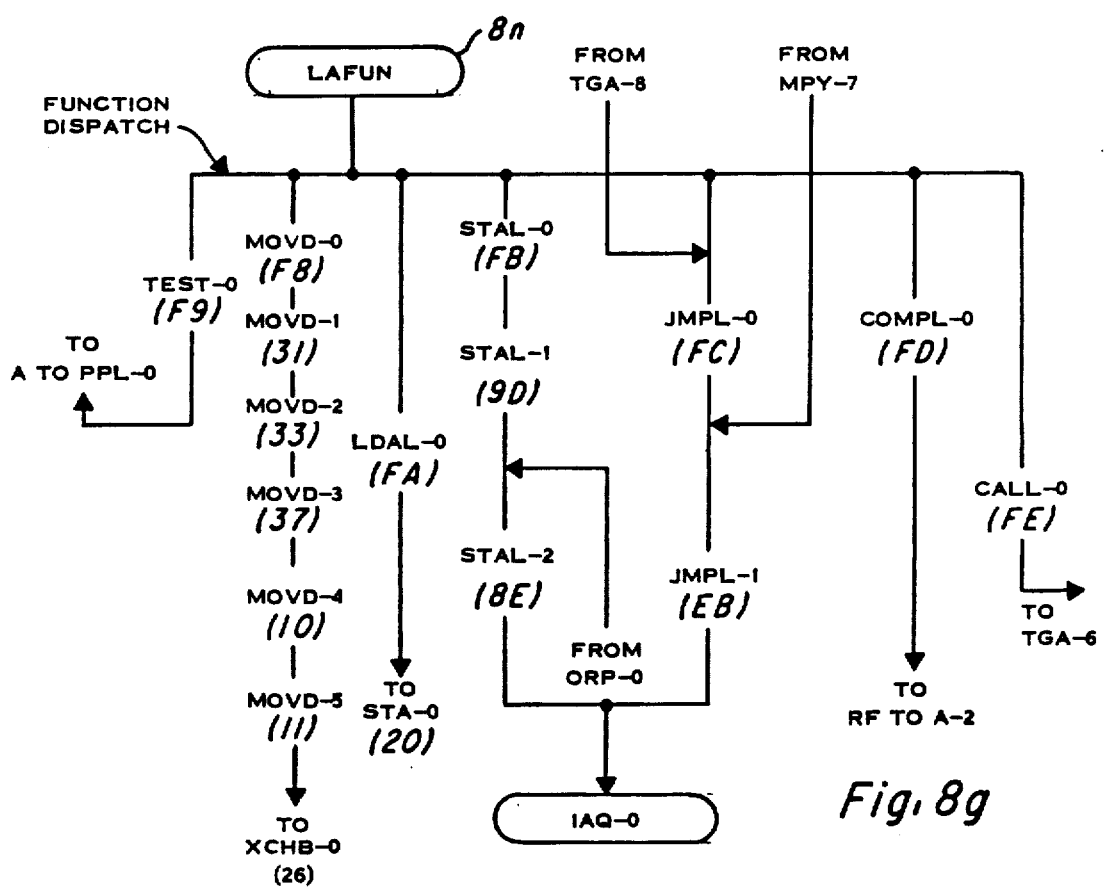
Figure 8H:
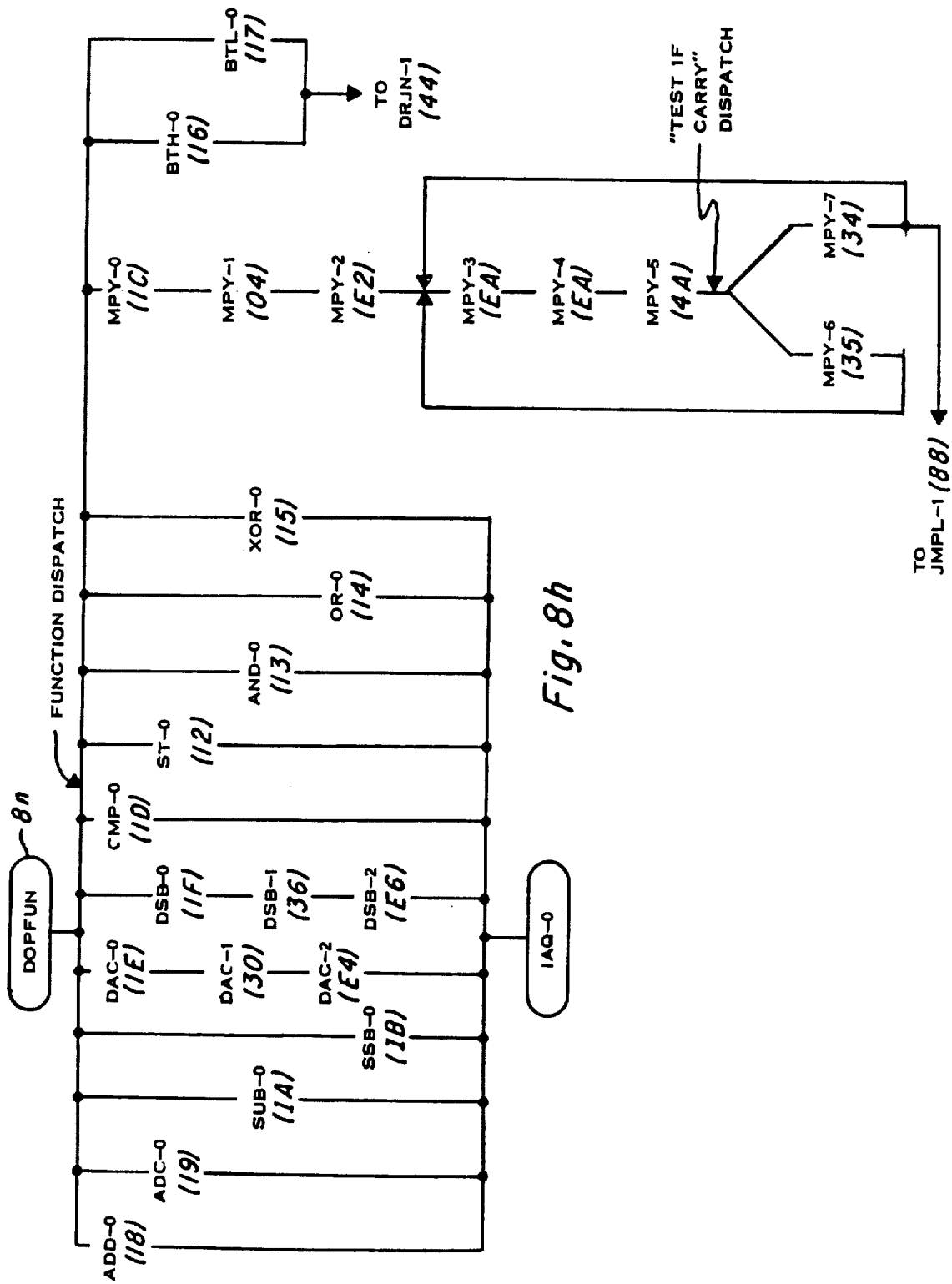

In FIGS. 8a to 8j, a flow chart of the microinstructions of Tables B and C as executed to implement the macroinstruction set of Table A is illustrated. FIGS. 8a to 8j reference the microinstructions of Table C by name, as well as the CROM addresses of Table C in hex. Table C is only a partial listing of the microinstruction set. Execution of each of the the Table A macroinstructions begins with the instruction acquisition IAQ sequence of FIG. 8a, starting at IAQ-0. Assuming no interrupt or reset is asserted, a group dispatch is performed on the group field at IAQ-2, selecting one of twenty-four addresses for one of th operand addressing modes or for miscellaneous jumps or traps. These twenty-four alternatives are shown in FIGS. 8b to 8d. Note that some of the operand fetch microinstructions are shared by several addressing modes, particularly RFtoA-1 (at address 84) which is used by eight different modes or paths, or "immediate-to-A", ItoA-1, at 9F used in five different paths. All four of the B-register-to-peripheral-page BtoPPL microstates are used in the A-register-to-peripheral and immediate-to-peripheral modes. For the general opcodes, after stepping through the operand fetch microstates of FIGS. 8b to 8d for the appropriate addressing mode, a function dispatch is performed, using the low order bits of the instruction word (#JmpCntl=001), to select one of up to sixteen possible functions to execute on the operands which have been fetched; these are shown in FIGS. 8e to 8j and are labelled dual operand function DOPFUN, dual operand function-peripheral DOPFUNP, single operand function normal SOPFNN, single operand function special SOPFUNS, long access function LAFUN, or miscellaneous MISC, all of which end in a return to IAQ-0 at CROM address 00. Note that the mneumonic such as ADD, MOV, CMP, etc., is used for the microinstruction for functions in the flow chart of FIG. 8 of FIGS. 8a-8j or Tables B and C as in the macroinstruction set of Table A.

Dispatch Modes For Crom Addressing

The first type of dispatch is unconditional branching. If no conditional branching of the microcode is desired, #JmpCntl=000. This causes transistors 21j to control for all bits (FIG. 10) and the device branches unconditionally to the microinstruction at the address on the eight #JmpAddr lines 23 after the current microinstruction is executed. The address is formed by the CROM bits in the #JmpAddr(7-0) field of the current micorinstruction. This type is used for sequences like BtoPPL-0, BtoPP1-1, BtoPPL-2, etc. of FIG. 8b.

The next type is function dispatch used to select the function at decision points 8n, SOPFUNN, DOPFUN, etc. in FIGS. 8a-8d. Fuction dispatch is defined in Table F. When #JmpCntl=001, the next microinstruction is determined by the low four bits of the IR register. The base address for dispatch is formed in the #JmpAddr(7-0) field of the microinstruction. The next micro address is determined by replacing the bits 3-0 of the base address with bits 3-0 of the IR register, so the offset can be up to sixteen. To avoid confusion, the base address should be a multiple of sixteen (i.e. the lowest four bits of the base address equal '0'). A function dispatch is a dispatch on the "function" field of the instruction word in the register IR. The function field indicates the arithmetic operation to be performed. This is contrasted with the 'group' field, bits 7-4, which indicate the addressing mode of the macro instruction (Table A instruction). Even though format "1" instructions have a 3-bit function field (IR bits 2-1-0), the function dispatch still performs a 16-way branch on the lower four bits of the IR register. The function dispatch for format "1" opcodes thus depends on the value of the IR(3) bit.

Another type is the test sign bits dispatch. An example is the RJmp-3 microstate of FIG. 8d, decision point 8p. The sign bit which is the contents of bit-7 the T/MAH register, T(7), may be used for dispatch by specifying #JmpCntl='010'. Two alternative jumps exist here. One is the 8-bit address of the microinstruction to be executed if T(7) is '1', and the other is the address of the microinstruction to be executed if T(7) is '0'. The address for T(7)=1 is the address for T(7)=0 plus 1. The address for T(7)=0 is loaded into the #JmpAddr field, then 1 is added if the test indicates T(7)=1.

The next type of dispatch is "test if zero". The microcode may test the value on the 0 bus of the immediately preceding microinstruction by specifying #JmpCntl='011'. When this code appears in microinstruction i, it tests the 0 bus contents of the previously executed microinstruction, i-1. The entry point logic 21 replaces #JmpAddr(0) bit with a bit which is '1' when the 0 bus is all zeros and '0' otherwise.

Another type of dispatch is "test if interrupt". The microcode tests for a pending interrupt by dispatching on the IACT (Interrupt Active) signal input from the peripheral control circuitry 20. This is accomplished by #JmpCntl=100 in the output 18. This type is used in FIG. 8a at IAQ-1 to branch off to INT-0 if an interrupt is signalled. As with other dispatch instructions, two alternative addresses exist, one (E1) is the microinstruction address of INT-0 to branch to if IACT='1', and the other (E0) is the address of IAQ-2 branched to if IACT='0'; these are adjacent addresses. The IACT line is asserted by the peripheral control circuitry 20 when an interrupt condition is detected. IACT can be asserted only when STINT (Status Interrupt Enable) is '1'. Interrupts may be signalled from the external interrupts -INT1 and -INT3 or the internal timer interrupt, INT2.

Another type of dispatch is "group dispatch". This is done at IAQ2, decision point 8m of FIG. 8a as well as after RFtoA-1 in FIGS. 8b and 8c at decision points 8q. Note that another group dispatch is possible because the opcode is still in IR. Group dispatch is defined in Table E. Dispatching on the group field of the IR register is accomplished by specifying '101' in the #JmpCntl field. The base address field is defined by the #JmpAddr field of the microinstruction. As described above, there are twenty-four groups defined, eight in format 0, IR(7)=0, and sixteen in format 1, IR(7)='1'. The groups may be numbered as in Table D. The group dispatch performs a 24-way dispatch on the group field by replacing the low order bits of #JmpAddr lines 23 with a function of the group number. The high nibble of the IR register, IR(7-4), is placed in the low nibble of the next address, shifted by one bit. The low order bit of the next address is IR(3) OR NOT IR(7). For format '0' instructions, NOT IR(7)='1', and the 0 bit of the next address always equal '1'. Thus, the machine will jump to a micro address which is the base address plus (group *2)+1 for format '0' group numbers. For format '0' instructions, NOT IR(7)='0', and the 0 bit of the next address equals IR(3). Thus, the machine will jump to a micro address +IR(3) for format '1' group numbers. The group names given in Table G are the first hex digit in the two-digit hex representation of the IR register contents. Format '1' names have an 'L' if IR(3)=0 and 'H' if IR(3)=1.

In a group dispatch, the CROM addresses, "base address", "base address+2", "base address+4", etc., may be used for other microinstructions; only alternate CROM addresses are used after the 24-way group dispatch. The example microinstruction set of Tables B and C and FIG. 8 uses the group dispatch at IAQ-2 after the instruction is loaded into the IR. Each "group" corresponds to one of the addressing modes, and the microcode executed after the dispatch fetches the appropriate operands for this instruction. A "function" dispatch is then done, and the microcode branches to perform the appropriate ALU operation on the operands. In this manner, the operand fetch microinstructions are shared among the instructions, but each instruction has its own microcode to perform the function of the instruction.

A "test if carry" type of dispatch is also available. The microcode tests the value of the carry bit in status register ST by performing a dispatch on the STC bit. This is indicated by #JmpCntl(2-0)='110'. The bit tested is the value of the STC or status carry bit after the execution of the immediately preceding microinstruction, i.e. the microinstruction executed prior to the one containing the #JmpCntl(2-0)=110 bits. The STC bit is placed in bit (0) of #JmpAddr, and the result used as the next microinstruction address. If the STC bit is '1', control transfers to one address, and if STC='0', control transfers to the next lower address.

Another available type of dispatch is "test status register" or macro jump. The contents of the status register are tested with this "macro jump" dispatch by specifying #JmpCntl(2-0)='111'. This dispatch tests eight possible conditions of the status register, indicated by the three bits in IR(2-0). If the condition is true, control transfers to the base address plus 1. If the condition is not true, control transfers to the base address. The conditions tested for macro jump are indicated below:

| IR Bits | | | Condition Tested | | | |
| --- | --- | --- | --- | --- | --- | --- |
| 2 | 1 | 0 | STC | STSB | STEZ | Comment |
| 0 | 0 | 0 | — | — | — | Unconditionally Jump |
| 0 | 0 | 1 | — | 1 | — | Jump if Negative |
| 0 | 1 | 0 | — | — | 1 | Jump if Zero |
| 0 | 1 | 1 | 1 | — | — | Jump if Carry |
| 1 | 0 | 0 | — | 0 | 0 | Jump if Positive |
| 1 | 0 | 1 | — | 0 | — | Jump if Posiive or Zero |
| 1 | 1 | 0 | — | — | 0 | Jump if Not Zero |
| 1 | 1 | 1 | 0 | — | — | Jump if No Carry |

The base address field must be even and is placed into the #JmpAddr field of the microinstruction. The result of the condition test is placed in bit 0 of #JmpAddr to form the new microinstruction address. The macro jump dispatch is used in the microcode of Table B and FIG. 8 to implement the conditional branch instruction at RJmp-3, selecting RJmp-4 or -5.

Another type of dispatch is the reset operation, microstate Reset-0 of FIG. 8e. When the RESET pin of chip 10 is asserted (driven high externally), the peripheral control circuitry 20 asserts the RST signal to the CPU. The entry point logic 21 of FIG. 10 immediately forces the next microinstruction address to be hex FF or all ones by transistors 21n, grounding the lines 21a on H1. Unlike the normal interrupt facility, the microcode does not poll the RST line; rather, the microinstsruction at CROM address FF is unconditionally forced to be the next microinstruction executed. The sequence of microinstructions RESET-0 to RESET-3 of FIG. 8a executed upon reset results in fetching a subroutine entry point address at address FFFE in memory (in the on-chip ROM 11) and branching to this subroutine.

Addressing Modes For Macroinstructions

The macroinstructions of Table A are shown also in an instruction map of FIG. 9 wherein the most significant half MSH of the instruction is listed across the top and the least significant half LSH is listed down the left side, in binary and hex. Thus, an ADD instruction with an addressing mode of "B, A" has an opcode of 0101000 in binary or 68 in hex; this addressing mode means that the contents of the B register or R1 in RAM 12 is added to the contents of the A register (R0 in the RAM) and the sum is written into the A register, so B is the source address and A is the destination address. The B, A addressing mode uses the least possible states in execution, and shares some of these states with several other instructions, such as MOV, AND, OR, XOR, SUB, CMP, etc., all of which have the same MSH opcode of 0110.

The ADD B,A and MOV B,A instructions (and the like) are dual operand instructions using the A and B registers. Also, single operand instructions can use the A or B register; for example the instruction DEC A (opcode=10110010) means decrement the A register, or the instruction CLR B (opcode=11000101) means clear the B register. Instructions in the 1011 column of FIG. 9 operate on the A register, and instructions in the 1100 column operate on the B register (with exceptions as noted), and these are single operand instructions. Generally, the A or B register (or B,A) addressing modes require only five machine states to execute, three of these being instruction acquisition shared by all.

Register file addressing is also available for most instructions; this mode is identified by Rn in FIG. 9, and means that one of the 128 or 256 registers in the register file RF or RAM 12 is the source or destination address. So, for an instruction "ADD Rn, Rn" the opcode is 00111000 (FIG. 9) followed by two 8-bit addresses of the two registers Rn, Rn used for the source and destination operands; thus three bytes are needed for an ADD Rn, Rn instruction. To execute such an ADD Rn, Rn instruction, ten machine states are used, but the source and destination fetch states are shared with all other similar instructions such as AND, OR, MOV, SUB, CMP, etc., all having a MSH opcode of 0100. Register file addressing with A or B register addressing is used in the MSH columns for 0001 and 0011 opcodes, for all of the common arithmetic and logic instructions. Again, single operand Rn addressing is used for instructions of the Rn or 1101 column of FIG. 9. Thus, "ADD R113,A" means add the contents of A register to the contents of the 113th register in RF or RAM 12 and store the sum in the register R113. "MOV R5, R78" means copy the contents of R5 into R78. "DEC R78" means decrement the contents of R78. Since the A and B registers are in the register file as R0 and R1, these may be used in the Rn, Rn addressing mode.

All of the major instructions can use the immediate addressing mode which is specified by "%n" in FIG. 9, particularly the 0010, 0101, 0111 and 1010 columns for MSH. Immediate addressing uses the contents of a byte following the opcode byte as an operand. Thus, "MOV %98, R123" means replace the contents of register R123 with the hex number 98; this sequence requires three bytes to define, these being "01110010 10011000 01111011" in machine instruction format (object code in binary as actually coded in ROM 11), and the three bytes would be stored in sequential addresses in the ROM 11, accessed in sequence by incrementing the program counter.

Peripheral file addressing specifies one of the PF addresses or registers P0 to P225 (see FIGS. 2 to 2d) as an 8-bit field following the opcode. Thus, the I/O ports A, B, C, D, the timer 26 and the I/O control register 25 may be accessed (depending upon the operating mode), all by the instructions in the three columns 1000, 1001, and 1010 of FIG. 9 containing a Pn notation. For example, the instruction "MOVP A, P2" means copy the contents of A register into the P2 address (timer data).

As seen in FIG. 9, there are five instructions which can use direct memory addressing, these being LDA, STA, BR, CMPA and CALL; in each of these the opcode 10001XXX is followed by two bytes which specify a 16-bit address that contains the operand. Direct memory addressing is specified by an "at" sign @, so "LDA @F47D" means copy the contents of memory location F47D (hex) into register A, or BR @F47D means branch to location F47D.

Another addressing mode is register file indirect; the same five instructions, LDA, STA, BR, CMPA and CALL which can use direct can use register file indirect addressing, and these are in the 1001 column of FIG. 9. This mode is specified by asterisk * followed by the register name. The specified register contains the least significant half of a 16-bit address. The most significant half of the address is contained in the next higher register. Thus, STA *R45 means copy the contents of register A into address hex 43F8 (where R46 contains 43 and R45 contains F8).

These same five instructions LDA, STA, BR, CMPA and CALL can employ an indexed addressing mode in which the address of the operand is the sum of the contents of B register and a 16-bit direct address n. The address n is proceded by @ and following by (B) so STA @ 43F8(B) means copy the contents of the A register into the memory location specified by the contents of B added to the contents of 43F8 (hex). The opcodes for all these instructions start with 1010 as seen in FIG. 9.

The Reverse Accumulator

In a typical microcomputer or microprocessor, the ALU receives source and destination operands at its two inputs, and its output is connected to the location of the destination operand for storing the result. This destination location is, in effect, hardware defined or microcode defined, meaning that it functions as an "accumulator" which is automatically accessed, i.e., it need not be addressed by an address acquired from program memory or the like. This is well suited for general operations; however, for controller functions, where the peripheral file PF of the memory address space of FIG. 2 is often accessed for bit test operation, a "reverse accumulator" is of particular utility. This means that the destination location is defined from a memory address (typically in the program counter) rather than being defined by microcode (such as the A and B registers).

The peripheral instructions such as ANDP, ORP, XORP, etc. of the instruction set of Table A and FIG. 9 operate in this reverse accumulator manner. As an example, the ORP A, Pn instruction (opcode 10000100) will be examined in detail. This instruction is two bytes, the first being the opcode and the second being the 8-bit PF displacement or offset defining one of the 256 possible PF registers (the high byte of the PF address is a 00000001 generated by microcode #ONEtAH). The two bytes of the instruction are in sequence in the instruction stream, so they are accessed by PC and PC+1. The ORP A, Pn instruction requires ten states or machine cycles to execute: three for fetch, four for a long read, one to do the OR function, then two for a long write. These ten states are as follows:

First Microinstruction (first half of instruction fetch) IAQ-0

| Microinstruction Bits | Operations |
| --- | --- |
| #PCHtAH | PCH Register goes to AH bus |
| #PCLtP, #PAL | PCL Register goes to AL bus via P bus, and to P input to ALU |
| default for N | Zeros to N bus |
| #AluCntl = 0000 | Add P to N (zeros), carry in is one, so PCL is incremented by one. |
| #ShftCntl = | |
| #ABL | |
| #OtPCL | The result of the add operation goes back to the PCL register |
| #MCNT | Long Memory Cycle, read (first state) |
| #MEMEN | |

Second Microinstruction (second half of instruction fetch; interrupts sampled) IAQ-1

| Microinstruction Bits | Operations |
| --- | --- |
| Don't Care AH, AL | Don't care for AH and AL busses since this is second half of long read |
| #PCHtP | PCH register goes to P bus for increment of PC high; zero on N bus. |
| default to N | Zeros on N bus |
| #AluCntl = 0000 | Add PCH contents on P bus to zero on N bus, carry in is from prior state so if PCL + 1 generated a carry then PCH is incremented. |
| #ShftCntl = | |
| #ABL | |
| #OtPCH | Result to PCH |
| #MCNT | Long Memory Cycle, read (second state) |
| #MEMEN | |
| #MDtIR | The instruction coming back on MD bus is loaded into IR |
| #JmpAddr = | Interrupts sampled - if INT then go to INT-O |
| #JmpCntl = | |

Third Microinstruction (fetch B register-discarded for A Register instructions) IAQ-2

| Microinstruction Bits | Operations |
| --- | --- |
| default AH | Zeros to AH bus for zero page address |
| #ONEtAL | 00000001 to AL bus for B register address in RF |
| #ALtP | AL bus to P bus for Pass |
| default N | Zeros to N bus for Pass |
| #ALUCntl = | Pass P bus (AL) using Add |
| #ShiftCntl = | |
| #ABL | |
| #tMAL | Leaves B register address in MAL register |
| #MEMEN | Short memory cycle, fetch B register |
| #MDtT | Store B register contents in T Register from MD bus |
| #JumpAddress = | Group decision - jump to address defined |
| #JumpCntl = | by bits 4-7 of JmpAddr and bits 0-3 of IR. |

Fourth Microinstruction (fetch A register, store in T Register) AtoPPL-0

| Microinstruction Bits | Operations |
| --- | --- |
| default AH, AL | Produces all zeros on the AH and AL busses for A Register address |
| default P, N, ALU, ShiftCntl | No ALU operation |
| #MEMEN | Short memory cycle, fetch A Register at 00000000 |
| #MDtT | Store A register contents in T register |
| #JmpAddr = | Jump to address defined by JumpAddr bits |
| #JmpCntl = | |

Fifth Microinstruction (first half of fetch of address of destination operand; increment PCL) BtoPPL-0

| Microinstruction Bits | Operations |
| --- | --- |
| #PCHtAH | High Address for the next location in memory following the instruction |
| #PCLtP, #PtAL | Low Address for next location after instruction, and PCL to P bus for increment |
| default N | Zeros to N bus |
| #AluCntl = 0000 | ALU adds 1 (via carry) to PCL |
| #ShftCntl = | |
| #ABL = | |
| #OtPCL | Result goes back to PCL |
| #MEMEN | |
| #JmpAddress = | Jump to next state |
| #JmpCntl = | |

Sixth Microinstruction (second half of fetch of destination operand; increment PCH) BtoPPL-1

| Microinstruction Bits | Operations |
| --- | --- |
| Don't Care, AH, AL | The address on AL and AH continue from prior state |
| #PCHtP | Set up PCH for increment |
| default N | Zeros to N bus |
| #AluCntl = | Add 1 to PCH via microcarry from prior state if PCL was FF |
| #ShftCntl = | |
| #ABL = | |
| #JmpAddr = | Jump to next state |
| #JmpCntl = | |

Seventh Microinstruction (first half of fetch of destination operand from peripheral page) BtoPPL-2

| Microinstruction Bits | Operations |
| --- | --- |
| #ONEtAH | AH address for peripheral page = 00000001 |
| #MDtP, #PtAL | AL address for peripheral page comes from prior state (memory fetch of second byte of instruction) |
| default N | Zeros to N bus for pass |
| #AluCntl = | Pass P bus through ALU |
| #ShftCntl = | |
| #ABL = | |
| #OtMAL | Result to MAC register so dest address is saved for write |
| #MEMEN | Long memory cycle, first half, to read dest operand |
| #JmpAddr = | Jump to next state |

-continued

| Microinstruction Bits | Operations |
|---|---|
| #JmpCntl = 000 | |

Eighth Microinstruction (second half of fetch of destination operand from peripheral page) BtoPPL-3

| Microinstruction Bits | Operations |
|---|---|
| Don't Care for AH, AL, P, N, AluCntl, ShftCntl | The address bus continues from prior state, and no ALU operation. |
| #MEMEN | Second half of long memory read cycle |
| #JmpAddr = | Jump to next state |
| #JmpCntl = | |

Ninth Microinstruction (OR function for dual operand, peripheral page) ORP-0

| Microinstruction Bits | Operations |
|---|---|
| #ONEtAH | AH bus has address of 00000001 for peripheral page |
| #MALtAL | Destination operand address goes out from MAL register on AL bus |
| #MDtP | From prior fetch, destination operand comes in to P bus via MD bus |
| #TtN | Source operand goes to N bus from T register |
| #AluCntl = | ALU performs OR function, carry in = 0 |
| #ShftCntl = | |
| #ABL = | |
| #-LST | Load status as defined for OR |
| #MEMCNT | Begin long memory cycle, write, to store result in destination address |
| #WR | |
| #JmpAddr = | Jump to next state |
| #JmpCntl = | |

Tenth Microinstruction (second half of long memory write to store result) STAL-2

| Microinstruction Bits | Operations |
|---|---|
| Don't Care AH, AL, AluCntl, etc. | The address bus is don't care for the pending long write |
| #MEMEN | Second half of long memory cycle, write |
| #MR | |
| #JmpAddr = | Jump to Inst. Acquisition IAQ-O |
| #JmpCntl = 000 | |

BINARY CODED DECIMAL OPERATION

Figure 7D:
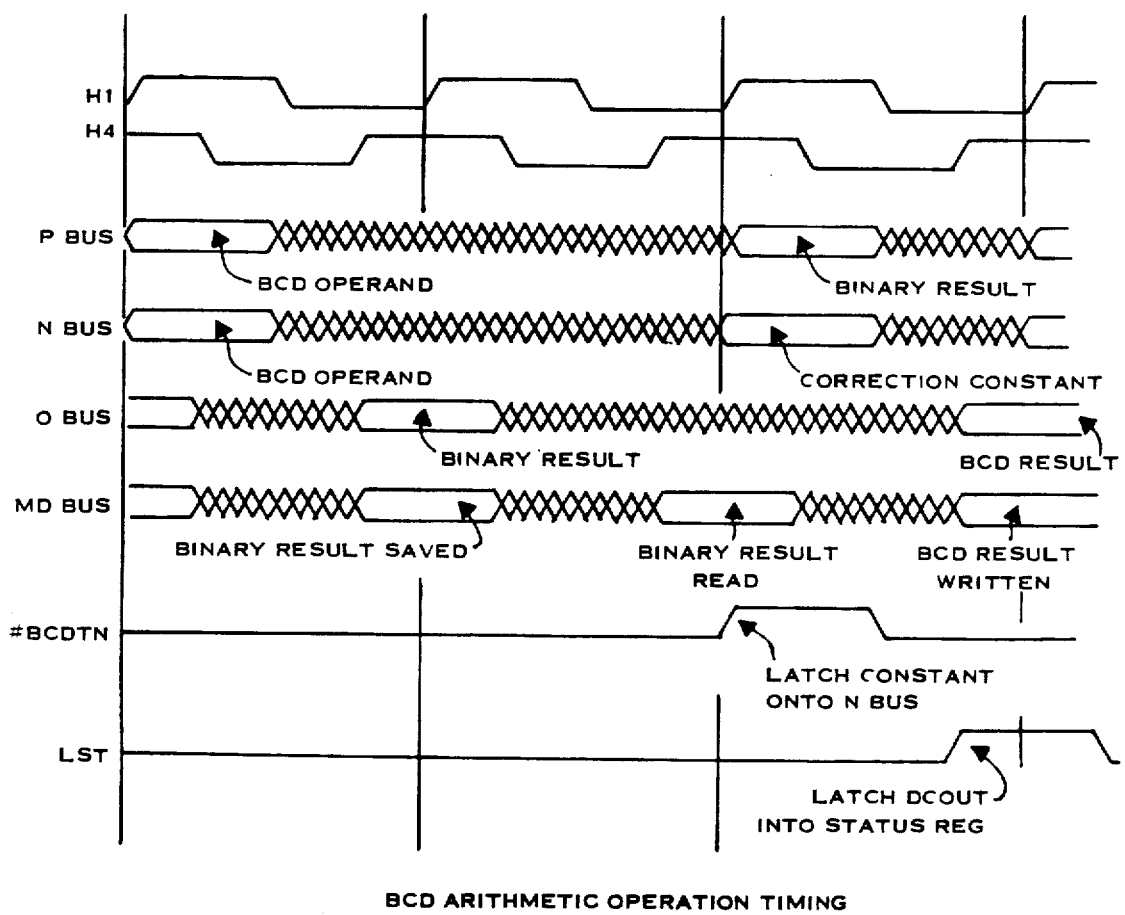
Figure 7E:
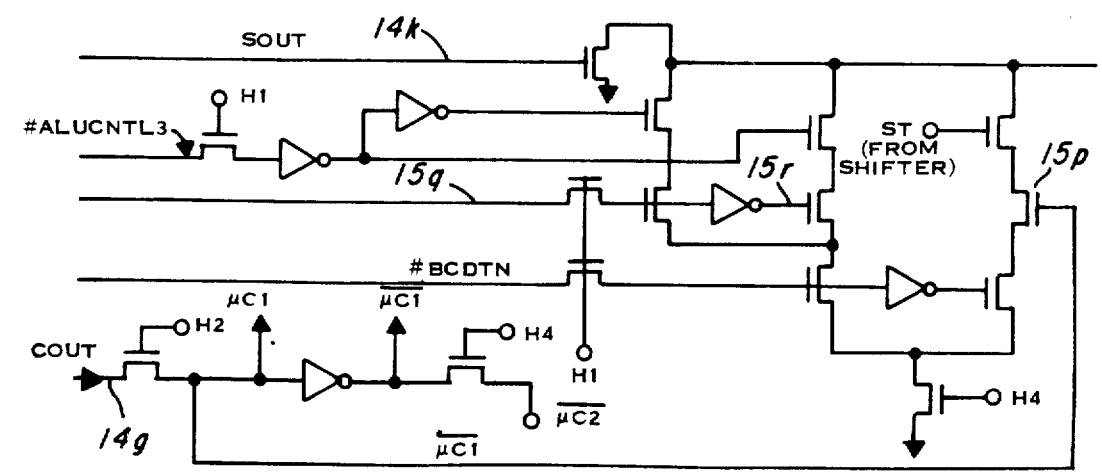
Figure 7E:
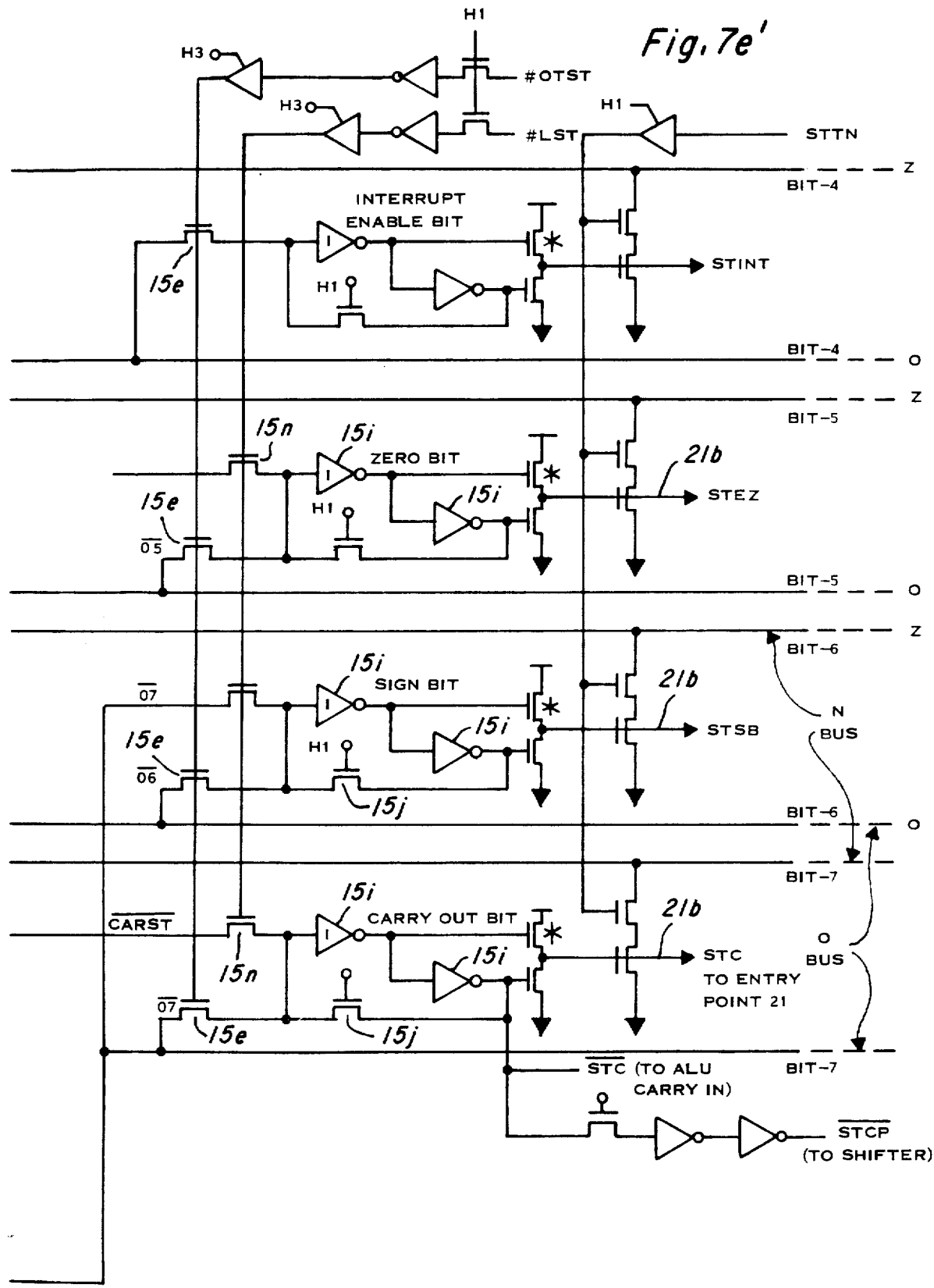
Figure 7F:
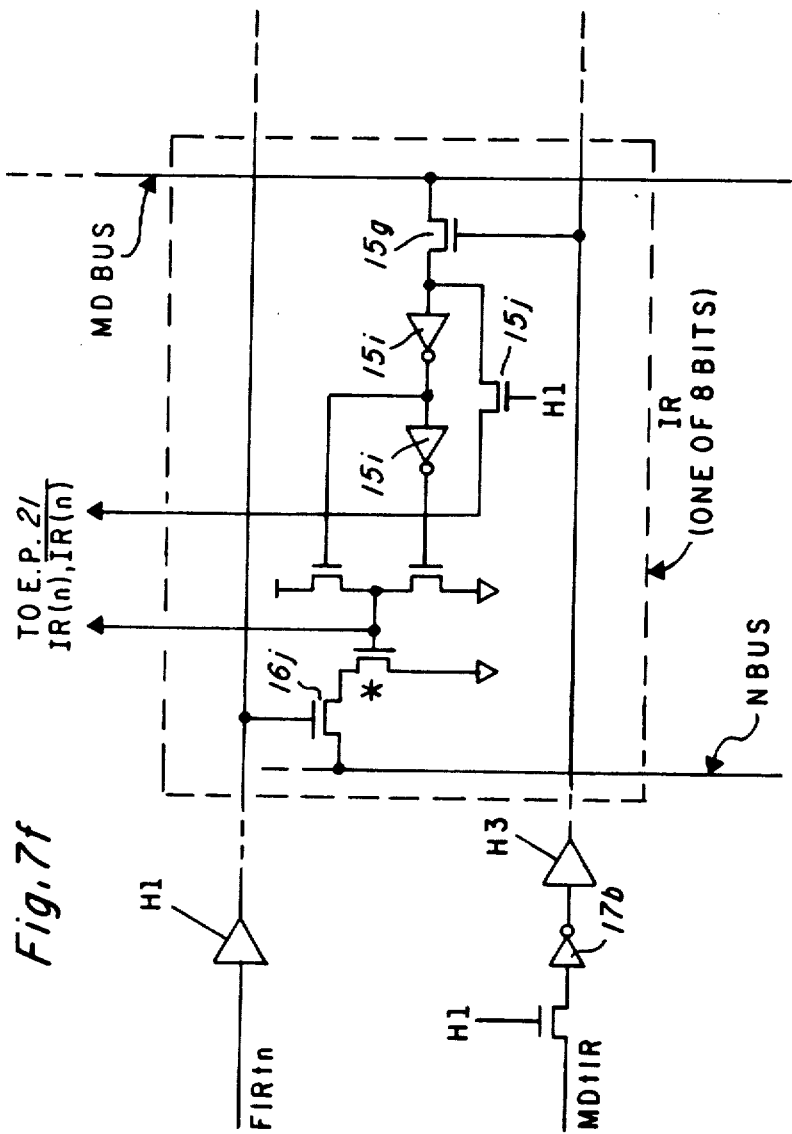

The constant register BCD of FIGS. 1 and 7d is not a register at all, but is circuitry to generate a correction constant for binary coded decimal arithmetic operations. The circuit is shown in detail in FIG. 7h. Decimal numbers in this processor are represented with two binary coded decimal digits per byte, with the least significant digit in the least significant nibble, bits 3-0, of a byte. For example, the decimal number 78 would be represented in binary as '01111000'. To perform decimal addition on two BCD bytes X and Y in the ALU 14, the following operations must be performed:
(1) the binary sum of X and Y is computed in ALU 14, with the STC bit carried in on Sp, and the result saved temporarily in RF;
(2) a decimal correction constant is computed by the BCD circuit; and
(3) the correction constant from BCD is added in ALU 14 to the saved result from RF to produce the final BCD sum as an ALU output.

Each of these operations requires a microinstruction cycle.

The STC carry bit is added in order to permit adding multiprecision strings of BCD digits. Decimal subtraction (with borrow) is similar to the above procedure. The binary difference X-Y is first computed, and the correction constant then subtracted from the result.

Table G indicates the proper decimal correction constant and decimal carry out bit for decimal addition and substraction. The BCD constant logic of FIG. 7d uses the ALU 8-bit carry Cout on line 14g to produce Ulc, 4-bit half-carry Dout on line 14h, the ALU operation code #AluCntl-3 bit, and the ALU outputs on the 0 bus to derive the correction constant in the logic circuits 15-1 (outputted on bits 1-2-5-6 of N bus by transistors 16m) and decimal carry bit DCout on N5 line 15q. Like the binary arithmetic carry, DCout is '1' if a carry is required after a subtraction. Table G indicates the conditions in which DCout is '1'. DCout is sent to the status register via line 15q for possible loading into the STC status carry bit.

Three microinstruction cycles are required to perform a decimal arithmetic operation. The timing for this sequence is shown in FIG. 7d'. The first state loads the BCD operands on the P and N busses, and performs the apropriate ALU operations (add or subtract) to produce the binary result. The binary result must be stored in RAM 12 in a temporary register in the register file. The second state reads the saved binary result from the register file and leaves it on the MD bus. This state allows the BCD constant circuit of FIG. 7d to determine the correction constant (and load on N bus) and decimal carry out bit, DCout. The third state loads the binary result on the P bus and the correction constant on the N bus and performs the appropriate ALU operation to produce the correct BCD result. The status register should be loaded by asserting the #—LST bit.

The following microinstructions implement a decimal add with carry. A source operand is added to a destination operand, and the result stored in the destination location (a register in the RAM 12 or RF). It is assumed that initially the T register contains the source operand, the MD bus contains the destination operand, and the MAL register contains the register number of the destination operand.

First Microinstruction (DAC-0)

| Microinstruction Bits | Operations |
|---|---|
| none (default) | Place all zeros on AH bus |
| #MALtAL | Place contents of MAL register (destination address) on AL bus |
| #MDtP | Destination operand from RAM 12 on MD bus goes onto P bus |
| #TtN | Source operand goes onto N bus |
| #AluCntl = 0000, #ShftCntl = 001 | Add with carry (from prior add) |
| #MEM,#WR | Adder output goes to O bus without shift and thus to MD bus, and is stored in destination register whose address is still on AH, AL busses. |
| #JmpAddr XXXXXXX #JumCntl XXX | Go to CROM address of second microinstruction |

Second Microinstruction (DAC-1)

| Microinstruction Bits | Operations |
|---|---|
| none (default) | Zeros on AH bus (always for RAM 12 address) |

-continued

| Microinstruction Bits | Operations |
|---|---|
| #MALtAL | MAL to AL bus so binary result in destination register is read back |
| none (don't care) | Ignor to P and N busses |
| #AluCntl 0000 | Maintain the ALu operation code, but not used |
| #MEM | Read the binary result at destination address, place on the MD bus |
| #JmpAddr, #JmpCntl | Go to CROM address of third microinstruction. |

Third Microinstruction (DAC-2)

| Microinstruction Bits | Operations |
|---|---|
| none (default) | Zeros on AH |
| #MALtAL | Destination address to AL bus |
| #MDtP | Binary result goes onto P bus |
| #BCDtN | Put BCD correction constant on N bus |
| #AluCntl 0000 | Add with no carry |
| #-LST | Load status register ST with decimal carry |
| #MEM,#WR | Store BCD result in destination register |
| #JmpAddr, etc. | Go to next microinstruction |

For a decimal substract operation, the Add operation in the ALU is replaced with subtract, so the second state subtracts the BCD constant. A carry-in of '1' is needed in such case since no borrow is required.

The Self-Refresh Ram

Figure 11A:
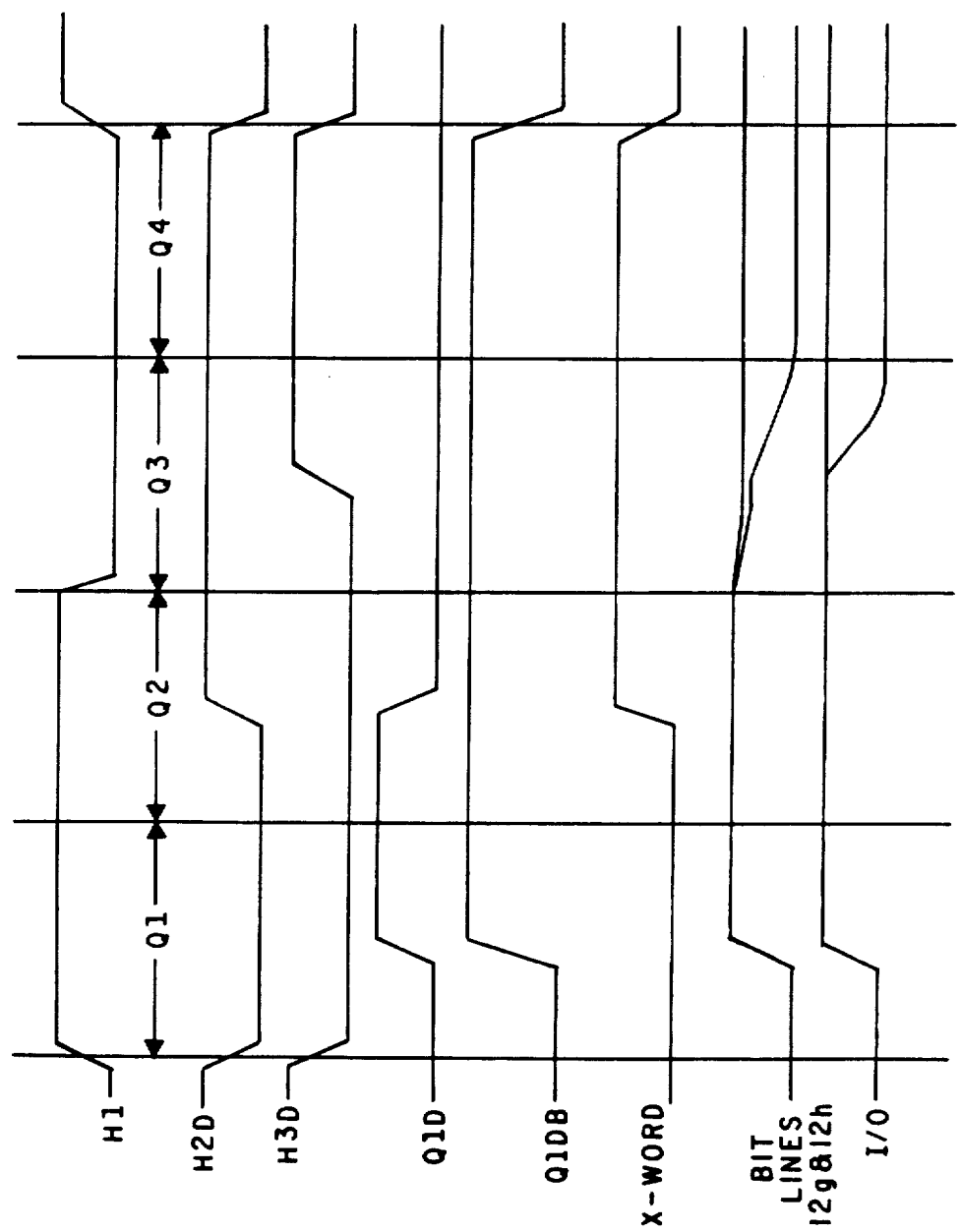
FIG. 11a is a timing diagram for the RAM of FIG. 11.

The RAM 12 shown in FIG. 11 consists of 128×8 bits, each bit containing two cells 12c of the one-transistor type as shown in U.S. Pat. No. 4,044,555 made by a single-level-poly N-channel self-aligned process. Each cell 12c has an access transistor 12d and a storage capacitor 12e. There are thirty-two row lines 12f, and the gates of the transistors 12d for all cells in a row are connected to a row line. The two cells 12c of each bit are connected to opposite bit line halves 12g and 12h, and the folded bit line halves are connected to opposite inputs of one of the thirty-two differential bistable sense amplifiers 12s. The circuit of the sense amplifier includes cross-coupled driver transistors 12i and 12j and two grouding transistors 12m and 12n, generally as illustrated in U.S. Pat. No. 4,198,697 issued to Kuo and Tsaur, assigned to Texas Instruments except two storage cells 12c are used instead of the traditional storage cells and dummy cells of dynamic RAMs. A sensing operation is initiated by clock H3 turning on high-resistance transistor 12m, then completed by clock H3D turning on longer, low-resistance transistor 12n after a slight delay. FIG. 11a shows the timing of the sense operation. A node 12p is connected to this point for all thirty-two sense amplifiers 12s so there is only one set of grounding transistors 12m, 12n. Depletion-mode coupling transistors 12q connect the bit lines 12g, 12h to the drains of transistors 12i, 12j as in U.S. Pat. No. 4,255,679, issued to Lionel White et al, assigned to Texas Instruments; these serve to isolate the sense modes from the bit lines after initial detection. The bit lines are precharged by transistors 12r, clocked on Q1D of FIG. 11a, and equallized by transistors 12t clocked on Q1D with tranfistor 12u clocked on boosted Q1D, so the bit lines 12g, 12h will start at very nearly Vcc and well equallized.

The bit lines 12g, 12h are connected through a one-of-4 Y decoder 12y so one pair will be connected to an input/output biffer 12v, in each group. There are eight identical buffers 12v, each having an I/O terminal 12-1 connected to one of the eight bits of the MS bus. For input or write, the bit on MD is applied to the bit lines through a push-pull circuit 12-2 which produces time and complement, clocked on H4 so incoming data is valid during H4 for write, then is gated through transistors 12-3 which have a RAM write control RAMWR from memory control 28 on their gates. For RAM read operations, the I/O buffer 12-3 includes a bistable intermediate output buffer comprising driver transistors 12-4 shorted to ground on H2 by parallel transistors. The bit lines 12h, 12g, gated through select transistors 12z in the Y decoder 12y, are connected to input transistors 12-5 for the I/O bufer. The output is taken at the drain of one transistor 12-4 and gated through a transistor 12-6 on the RAM read signal RAMRD from memory control 28; output mode 12-7 is precharged to Vcc on H2 and conditionally discharged by the transitor 12-4 when 12-6 turns on by RAMRD. A transistor 12-8 then conditionally discharged this bit of the MD bus, starting at H4 when the drains of transistors 12-5 go to Vcc.

The use of the two cells per bit RAM configuration instead of dummy cells is especially important in a microcomputer, as distinguished from a stand-alone dynamic RAM, because of the large number of other high level signals existing on the chip, creating a high noise level. The noise margin is enhanced by the two-cell balanced layout. Otherwise, using a conventional DRAM one-T cell with dummy cells, the noise margin would not be acceptable; for this reason, static cells have been traditionally used in microcomputers.

The X or row address supplied to the X decoder 12X comes from one of two sources; the AL' bus for normal read or write access, or the refresh counter 31 for refresh. The refresh counter is shown in detail in FIG. 12 with the multiplex circuit 32. The 5-bit RAM X address on lines 32a comes directly from the AL' lines through multiplexer 32 if a refresh signal -REF from memory control 28 is inactive (high). If -REF is active (low), the five-bit output 31a of the refresh counter is used. The refresh counter 31 contains five shift register stages 31b, each with two inverters 31c, gated on H2 by transistors 31c. Interstage coupling by transistors 31d occurs if a refresh-shift signal occurs on line 31e. Recirculate occurs if transistors 31f are gated on by a refresh-shift-bar signal on line 31g. In every machine cycle, one of these must occur during H4 as established by logic circuit 31h which generate the refresh-shift from the -REF signal. Thus, if -REF is present the counter 31 advances after the current address goes via lines 31i to the multiplexer 32. If -REF is inactive, the count holds as recirculate transistors 31f turn on. The feedback bit for the counter is generated by a logic circuit 31j as is conventional for pseudonandom shift counters.

THE OPERATING MODES

With reference to FIG. 2a, the primary operating mode of the microcomputer 10 of FIG. 1 is the microcomputer mode in which all of the memory is contained within the ROM 11 and RAM 12. The device is initiallized by RST or reset to be in the microcomputer mode; that is, zeros are placed in the bit-7 and bit-6 of the I/O control register 25. In this mode, only nine bytes of the peripheral file PF are used, the remaining 247 have no function. The peripheral register numbers P0, P2, etc., and hex addresses of the peripheral file registers for the microcomputer mode are shown in FIG. 2a. Port A is used only for input and port B in only an output, while ports C and D are either ourput or input; thus, registers P9 and P11 define the direction of data in the ports C and D, but no such control registers are needed for ports A and B as they are unconditionally input or output. The port A, B, C, D data registers are contained within the buffers 30 and are accessed by the MD bus, using addresses 04, 06, 08 and 0A (in hex) on the AL bus and page-one or 00000001 on the AH bus. Similarly, AL addresses 09 and 0B access the control registers contained in buffers 30 for ports C and D. A "0" in the control register bit sets the port for input and a "1" sets it for output. An address applied to AL and AH in the unused areas will produce no meaningful result, so the ROM 11 program is of course written to avoid these addresses.

In FIG. 13a a system containing an eight digit diaplay 13-1 and a keyboard matrix 31-2 is shown which uses the device of FIG. 1 in its microcomputer mode. The C port outputs are used for the segments of the display and the B port outputs drive the digits of the display 13-1 and columns of the keyboard matrix 13-2 as illustrated in U.S. Pat. Nos. 3,988,604, 3,921,142 or 4,158,431 for example. The rows of the keyboard matrix 13-2 are applied to the A port inputs. A $8 \times 8 = 64$ key matrix is possible, but ususally less are needed. Other acivators and sensors such as in the microwave oven controller of the Van Bavel U.S. Pat. No. 4,158,431, assigned to Texas Instruments, may be connected to the D port as inputs or outputs. An example of a program display scan in the system of FIG. 13a is available.

Figure 13B:
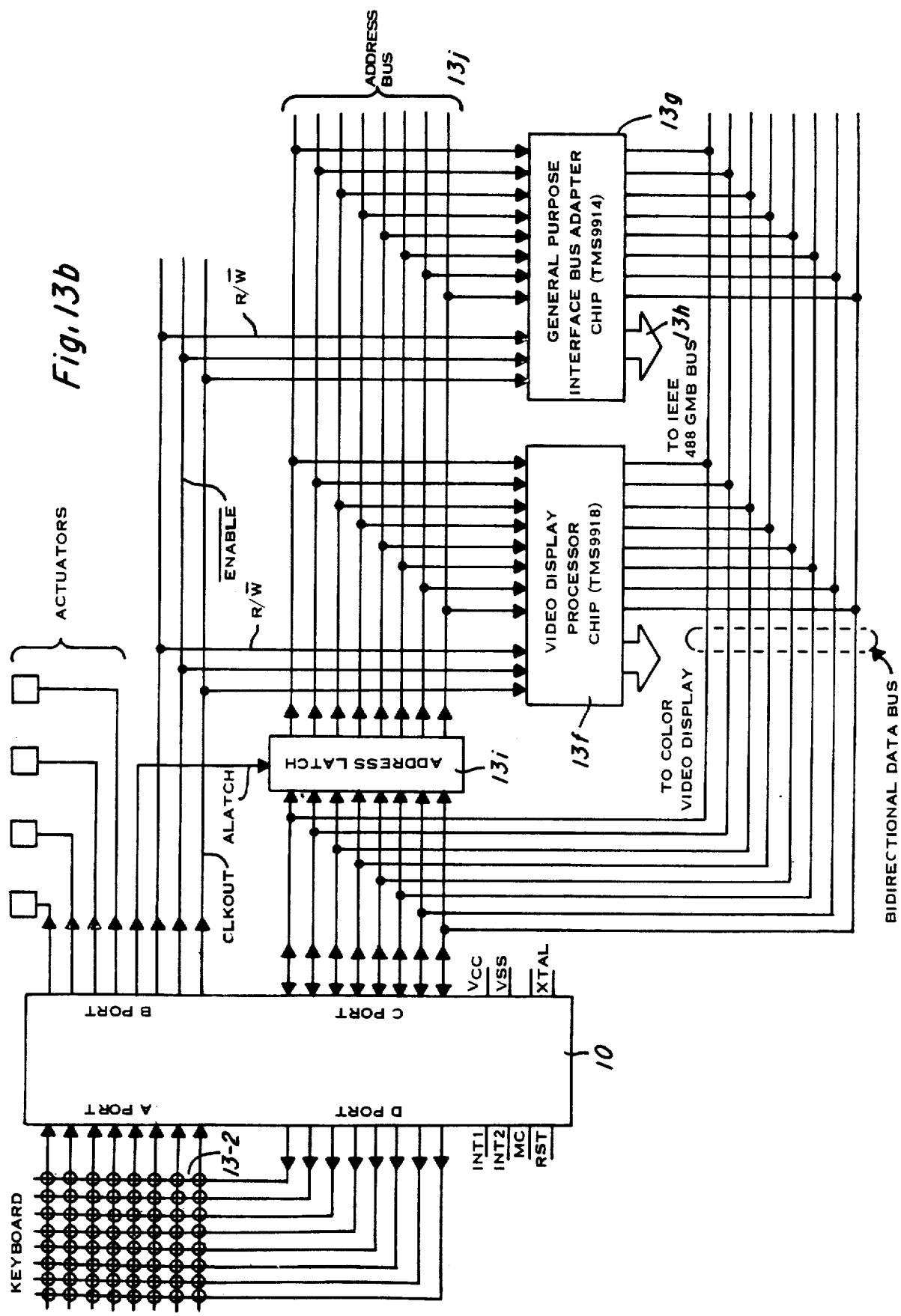

In the peripheral expansion mode of the memory map of FIG. 2b, the peripheral page 0100 to 01FF, 256 bytes, is utilized for off-chip accesses. The C port is used as a multiplexed 8-bit address/data bus, and four bits of the B bus are dedicated as control lines ALATCH, R/$\overline{W}$,-ENABLE and Clock Out as illustrated in the system of FIG. 13b. This system employs the microcomputer 10 of FIG. 1 as the main processor in a system which uses two other attached processors. One is a video display processor 13f as described in U.S. Pat. No. 4,243,984 issued to Guttag et al, assigned to Texas Instrumetns. The other is a general purpose interface bus adapter chip 13g which allows the chip 10 to interface with a standard IEEE 488 bus 13h. The chip 10 produces an 8-bit address on the C port which is latched into an 8-bit latch 13i by the address latch signal ALATCH on port B4, then the address is available on an address bus 13j for the chips 13f and 13 g when the enable signal on port B6 goes active. The chips 13f and 13g are synchronized with chip 10 by the clock output on port B7. The C port is then used for data from or to the chip 10 and chips 13f and 13g, depending upon the read/write control R/$\overline{W}$ on port B5. The chips 13f and 13g are thus configured to respond to addresses 0108, 0109 and 010A to 01FF on busses AL and AH. The AH bus of FIG. 1 will always contain 01 in this mode for off chip accesses, of course. The A port functions as an input and the D port as input or output in this peripheral expansion mode, so other functions are executed aside from accessing the chips 13f and 13g; for example, actuators and sensors, or a keyboard matrix as in FIG. 13a may be used here also.

Figure 13C:
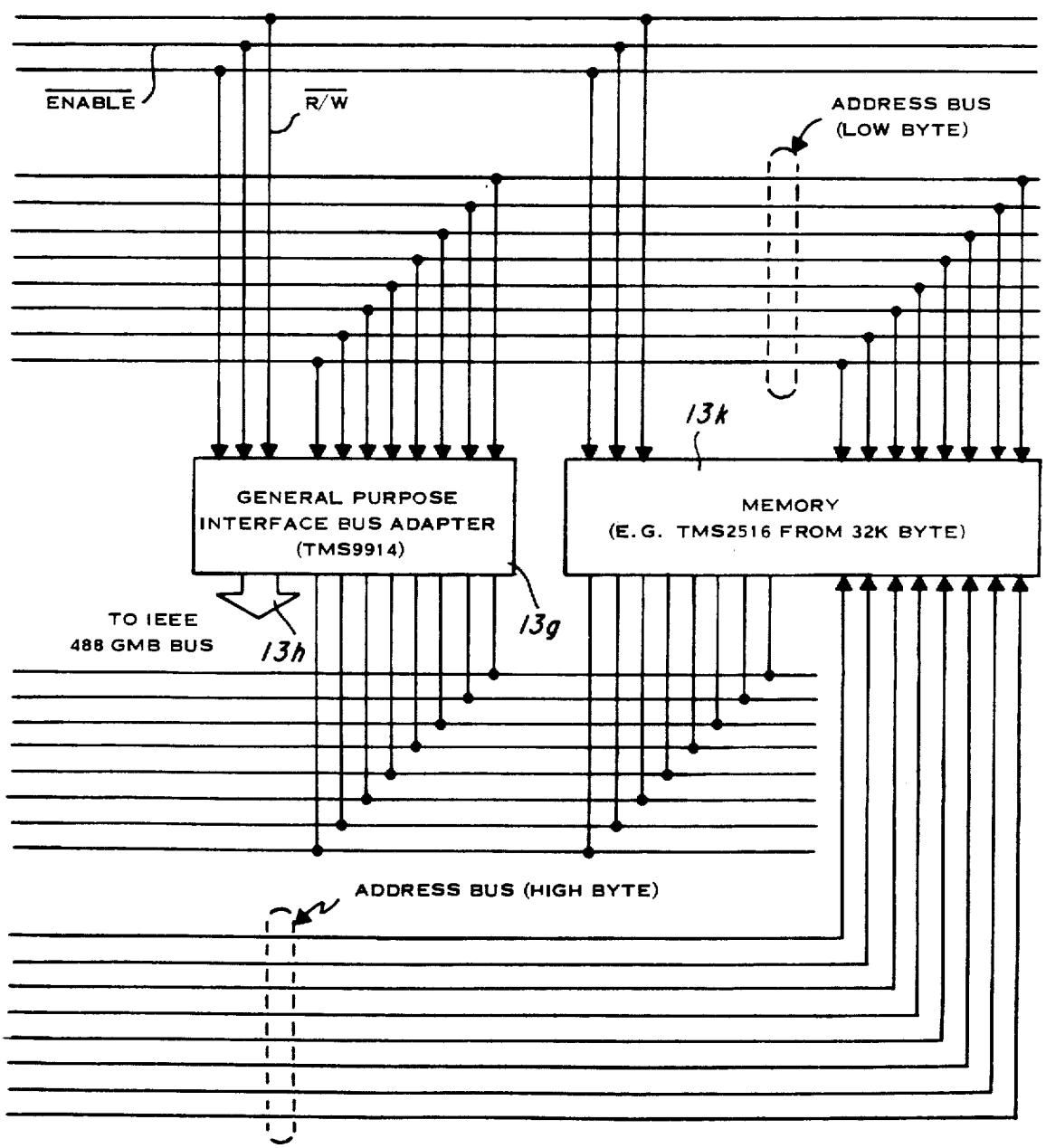

The full expansion mode of FIG. 2c and FIG. 13c provides the 8-bit address output on C port as in FIG. 13b plus anothr address byte on D port which may address a memory chip 13k, for example. The full expansion mode allows a full 64K (two bytes-C port and D port) of off chip address range; addresses 0108 to EFFF are available for off chip access. As above, port B at address 0106 provides the memory control and clocking on bits B4, B5, B6, B7. The memory chip 13k may be a 32K device, for example, and the lower byte address from C port is latched at 13i while the high byte goes directly to the chip 13k on lines 13m. The data bus 13n going to the C port is shared by the chips 13f, 13g and 13k. The system of FIG. 13c thus has much greater program capability, compared to that of FIG. 13b, but the D port is not available for other I/O. A keyboard matrix 13-2 could be connected to the remaining four bits of the B port (address 0106, bits 0–3) and the A port as shown, however.

Figure 2D:
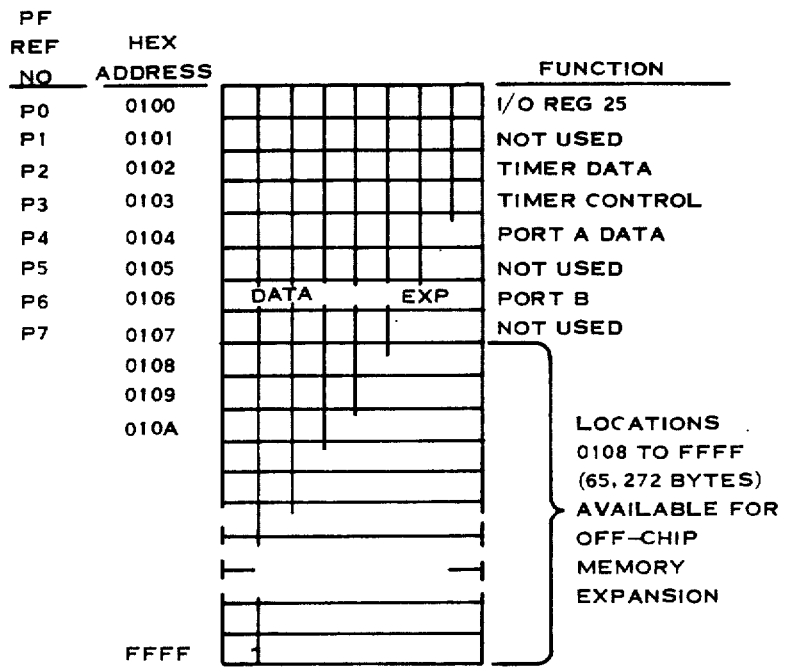

The microprocessor mode of FIG. 2d allows the chip 10 of FIG. 1 to ooperate as an 8-bit microprocessor; all of the addresses in the range 0108 to FFFF are available for off chip accesses. This mode functions the same as the full expansion mode of FIGS. 2c and 13c except there is no on-chip ROM for program memory; actually the chip contains a ROM 11 but it is not used, so if the ROM code built into the device is not correct then the chip can still be used as a microprocessor in this mode instead of a microcomputer, in which case addresses F000 to FFFF are treated as external memory locations. The system of FIG. 13c may use the chip 10 in the microprocessor mode, in which case the memory chip 13k could be 64K instead of 32K bytes.

Figure 2E:
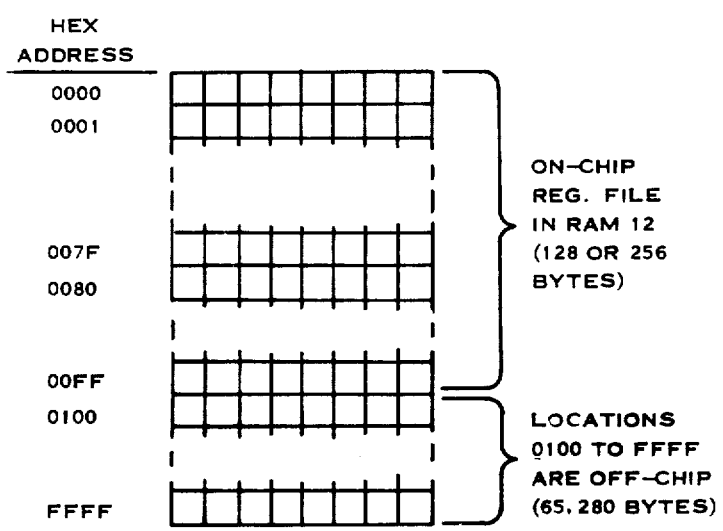
Figure 13D:
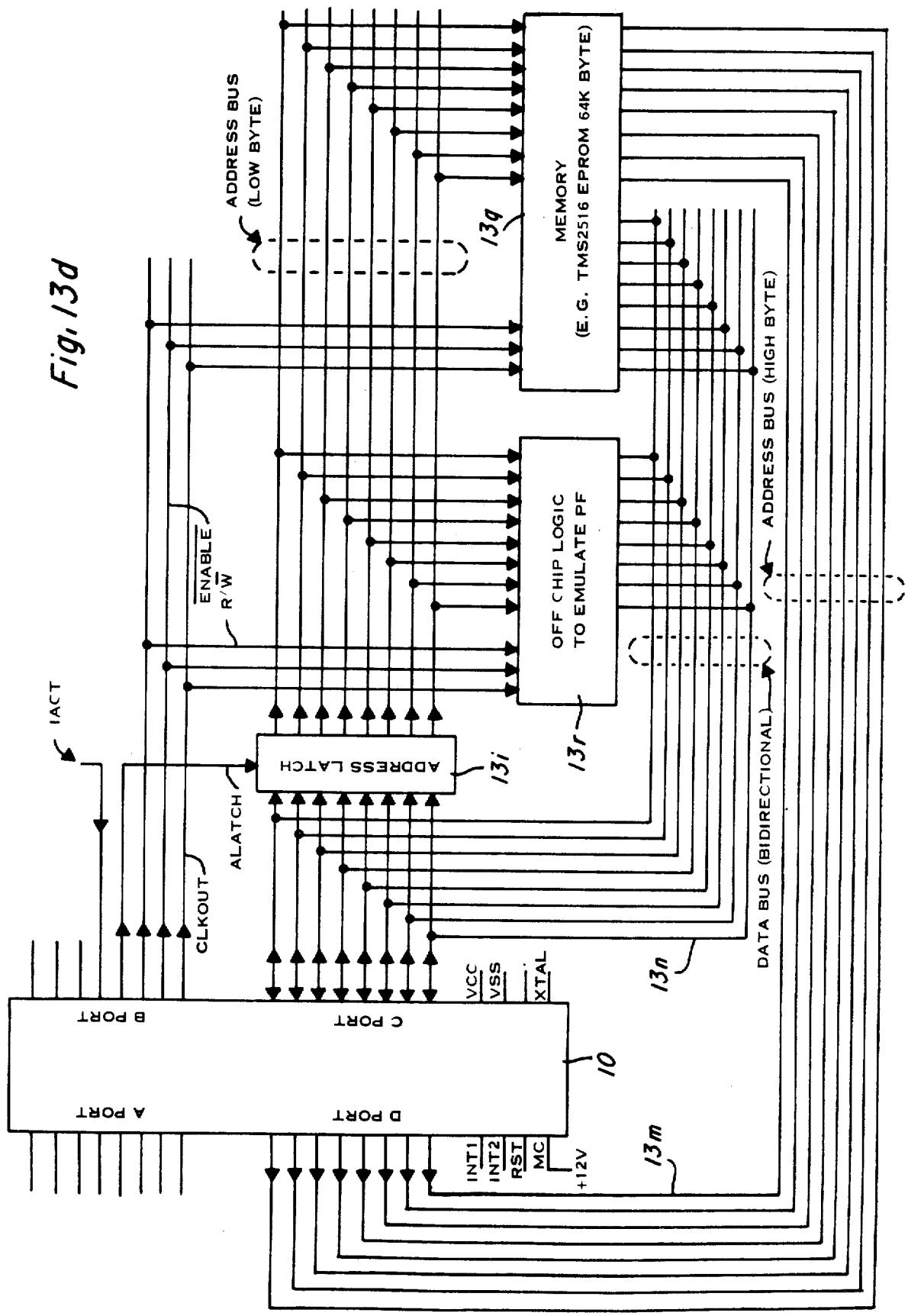

The system emulator mode of FIG. 2e facilitates the development of new ROM 11 programs. All on-chip ROM and peripheral file PF is disabled so all addresses 0100 to FFFF access off-chip locations. This mode permits inexpensive development of new systems by allowing the developer to emulate the desired on-chip ROM 11 code, I/O and interrupt structure with temporary external memory chips 13q and logic 13r of FIG. 13d. The system emulator mode is enabled when the MC pin is tied to a high voltage source (+12 v). The memory inteface operates just like the microprocessor mode of FIGS. 2d and 13c except for the peripheral file PF and pin out. The C and D ports are for addresses and data as in FIG. 13c, but the A port is not used (it is emulated off-chip, so the keyboard of FIG. 13c, for example, would be connected to the logic 13r). Pin B3 is an interrupt acknowledge line, pins B4 to B7 are used as before, and pins B0 to B2 are not used (emulated off-chip). The CPU 13 in a chip in the emulator mode functions just as if the on-chip ROM and PF is being used, but addresses asserted on the busses AH', AL' result is off-chip access.

Memory Control

Figure 14B:
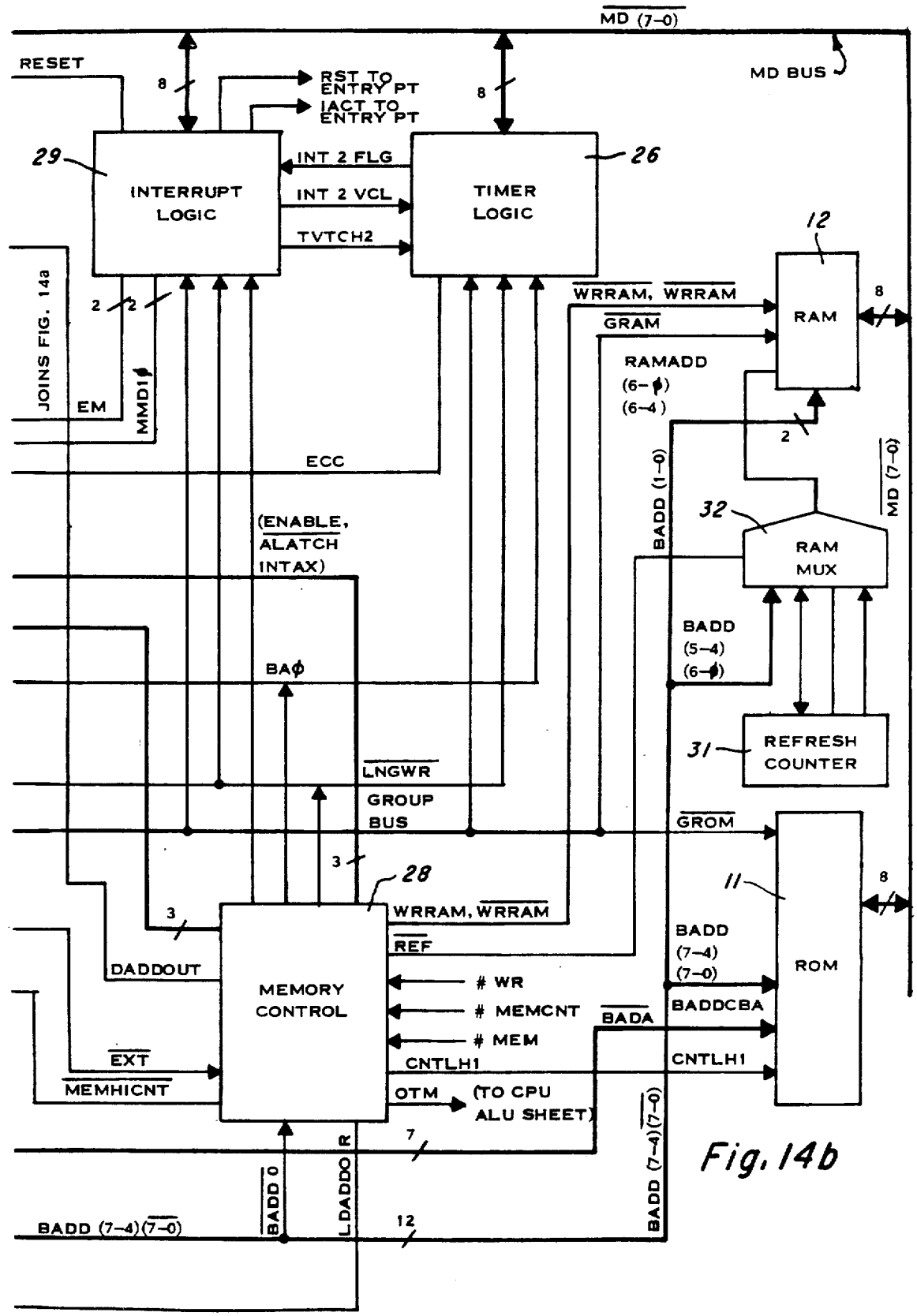
FIG. 14 is a block diagram of the internal peripheral circuits of the microcomputer of FIG. 1 illustrating connections to the central processing unit.
Figure 15B:
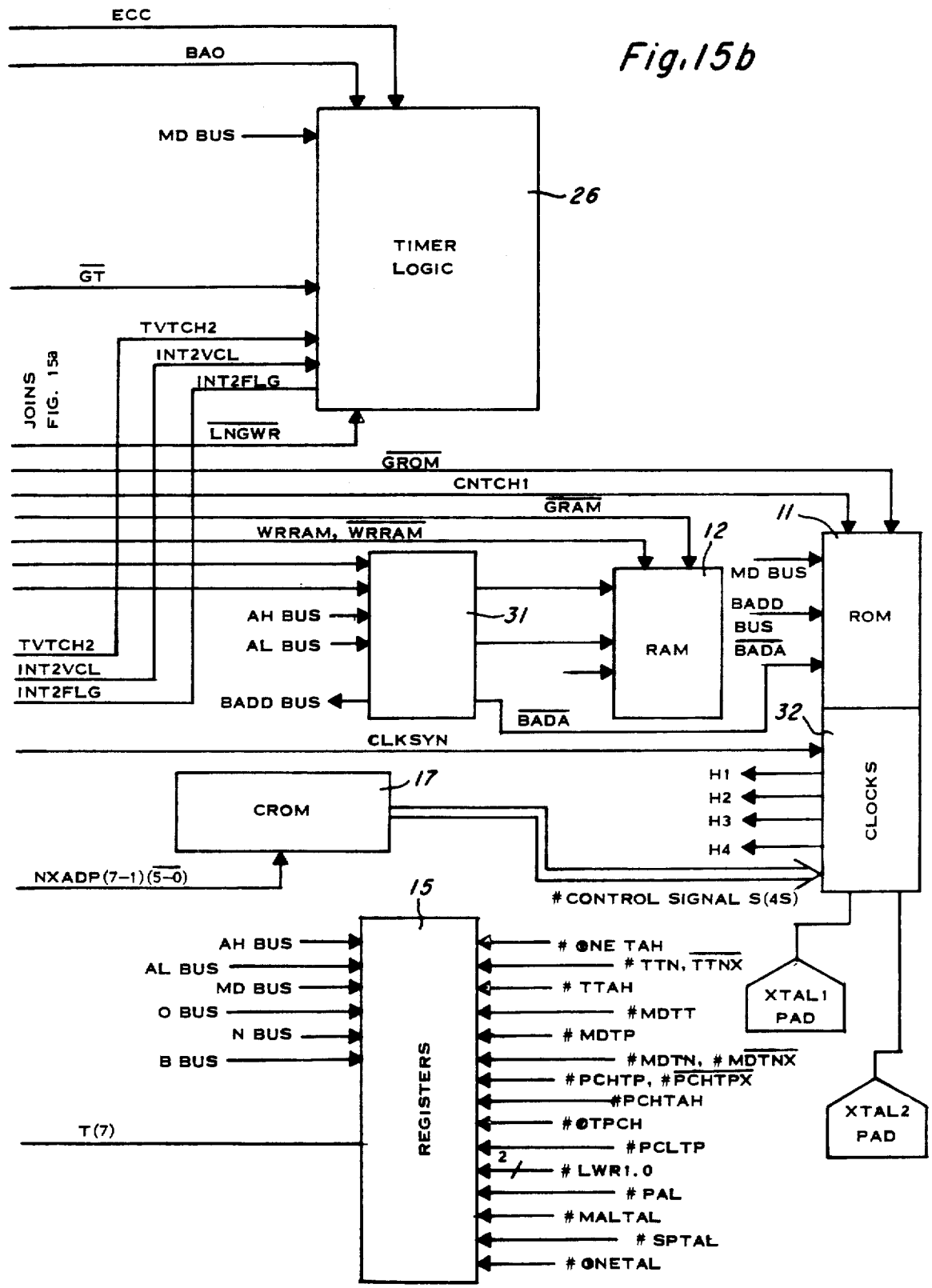
FIG. 15 is another block diagram of the circuits of the microcomputer of FIG. 1, illustrating only the interconnections between circuits.
Figure 16B:
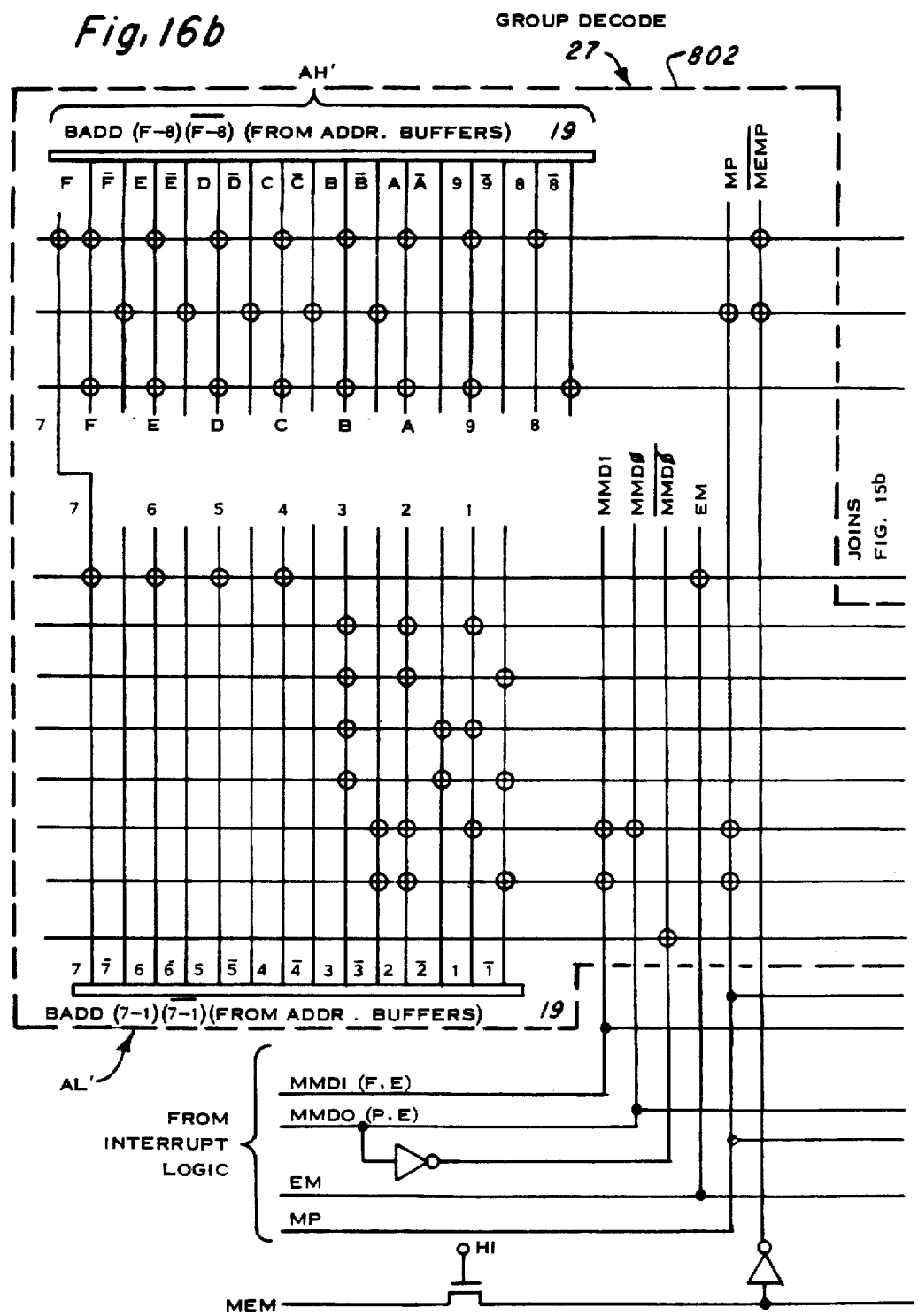
FIG. 16b is a schematic diagram of the group decode circuitry 27 in the microcomputer of FIG. 1 or 14.
Figure 16B:
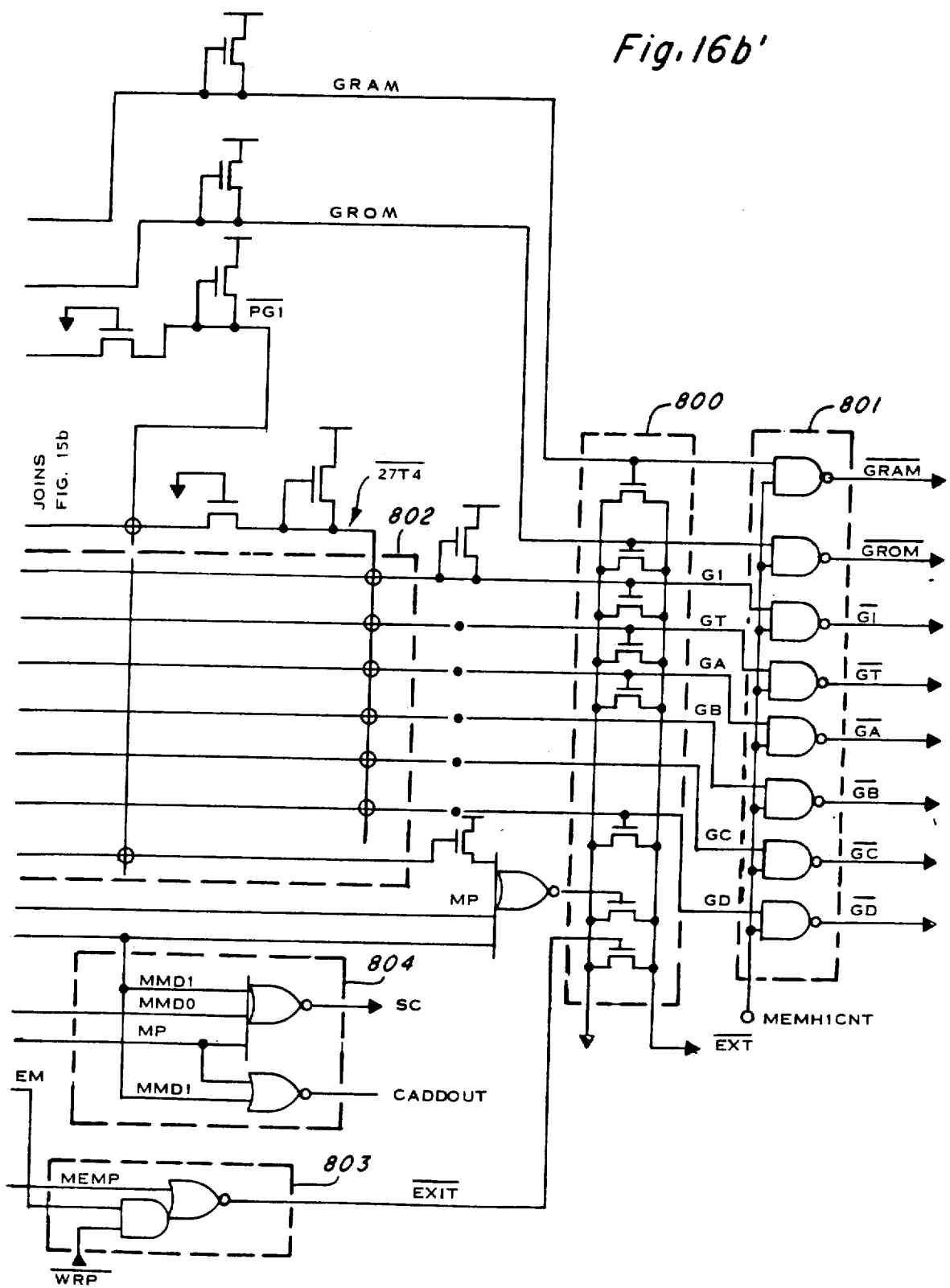
Figure 16C:
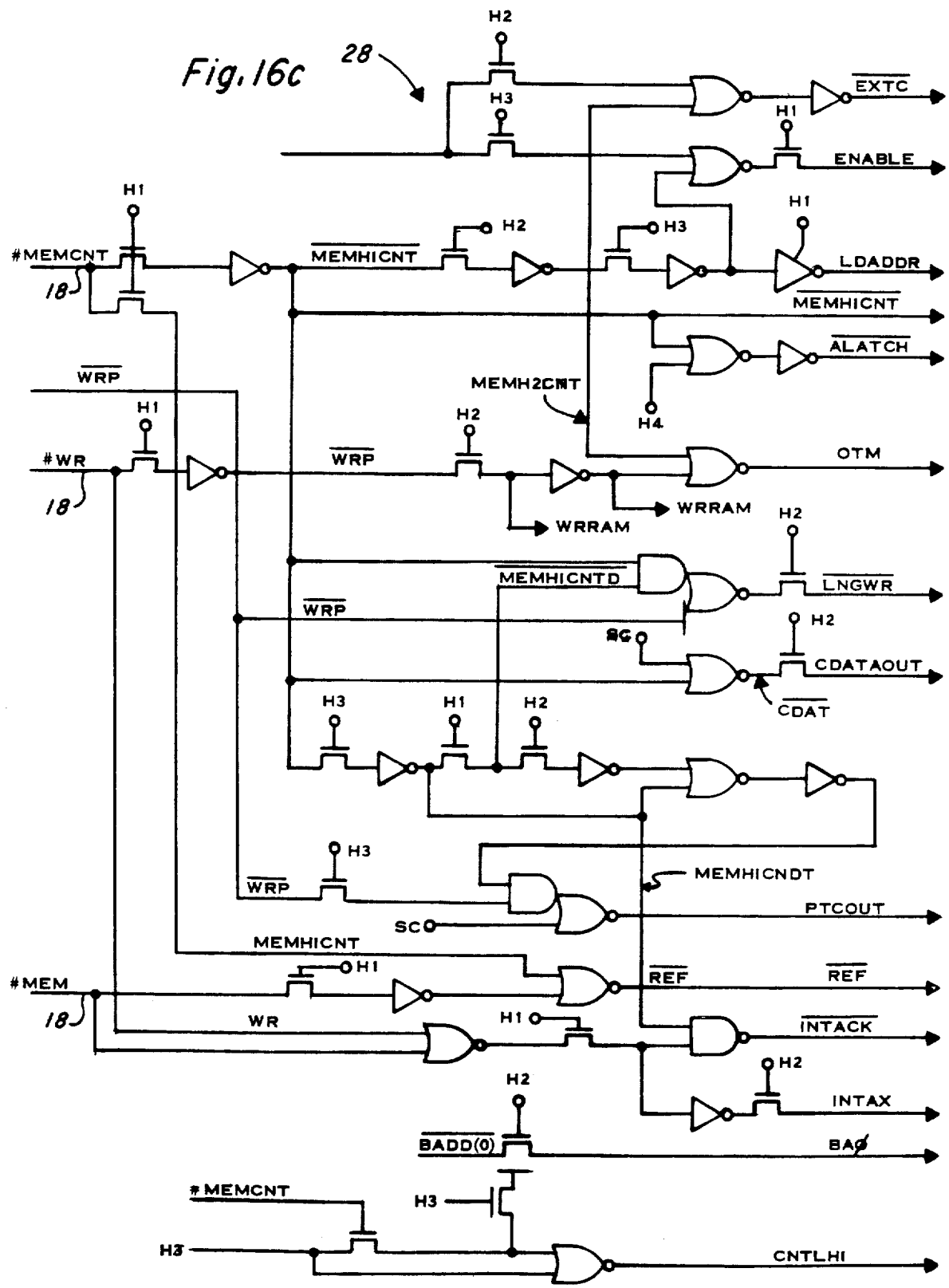
FIG. 16c is a schematic diagram of the memory control circuitry 28 of FIG. 1 or 14.

The function of the memory control logic is to control the addressing and timing of all peripherals and all memory expansion modes. The memory control circuitry consists of the circuitry contained in the memory control block 28 in FIG. 14 and the group decode 27 block in FIG. 14. The group decode circuitry 27 handles all the addressing by: (1) decoding the address lines AH' and AL' to determine which internal peripheral, if any, is being addressed (i.e., the RAM 12, ROM 11, INTERRUPT, TIMER, PORTS A, B, C or D) and (2) determine based on which expansion mode that the processor is currently in, if that peripheral exists internally. The group decode 27 outputs of this circuitry are active low and identify which peripheral is being addressed. FIG. 16a illustrates the decoding of the address AH' and AL' and other inputs to group decode 27 as a to specify an internal peripheral. FIG. 16b illustrates the group decoder 27 as a circuit implementation of FIG. 16a. The group decode circuitry includes a programmable logic array 802 that interfaces to the address bus AH' and AL' and external signals MMD0, MMD1, EM and MP from the interrupt logic circuitry 29 and #MEM from the CPU 13. The address low bus AL gated through the address buffer 19 to Al'; forms BADD (0–7), and these bits are inputs to the PLA 803. The output of the group decode circuit 27 of FIG. 16b is the $\overline{GRAM}$, $\overline{GROM}$, etc., signals which cause the selected one of the internal peripherals to be accessed during a machine state. The is a microinstruction control bit obtained from the microinstruction word and it signifies a memory operation. Note that in FIG. 16a $\overline{MEM}$ must be low or active for any of the internal peripherals to be accessed. EM and MP are derived from the interrupt logic circuitry to be discussed. EM specifies an emulator mode and MP specifies the microprocessor mode. MMD0 and MMD1 are memory mode bits (bits 6,7 of the register 25) which are internally programmable and determined the current memory expansion mode. FIG. 16c illustrates the five memory expansion modes determined by the external memory configuration pin MC and the two internally programmable memory mode bits MMD 1 and MMD0 in the control register 25. Referring back to FIG. 16b, it should also be noted that the circuitry coupled to line marked $\overline{PG1}$ and $\overline{Z7T4}$ are implemented for logic reduction purposes. In other words, PG1 is a reduction of an address ($\overline{F}$, $\overline{E}$, $\overline{D}$, $\overline{E}$, $\overline{B}$, $\overline{A}$, $\overline{9}$ and $\overline{8}$) gated into the address for $\overline{Z7T4}$ and $\overline{PG1}$. $\overline{Z7T4}$ is a logic reduction of 7, 6, 5, 4 and signals EM and $\overline{MEMP}$ where $\overline{MEMP}$ is the signal MEM inverted and clocked by phase H1. The group decode PLA 802 outputs into a set of devices 800. These are devices that will raise the $\overline{EXT}$ line when either the RAM, ROM, interrupt circuitry, timer circuitry, or A or D ports are accessed, or during the peripheral expansion mode when an external peripheral is being addressed on the peripheral page PF. The group decode PLA 802 further terminates into a set of gates 801. These are NAND gates that NAND the respective enabling signal from the PLA 802 with a signal $\overline{MEMH1CNT}$ which is the memory control signal from the microinstruction clocked by H1 and inverted. This signal is produced by the memory control circuitry 28 illustrated in FIG. 16c. The circuitry 803 in FIG. 16b also includes an input signal labeled $\overline{WRP}$. This signal originates from the memory control circuitry 28 illustrated in FIG. 16c and is simply the inverted microinstruction bit #WR clocked by H1 (signifying a read or write). In addition to producing the $\overline{EXT}$ signal as previously discussed, this circuitry also produces the SC signal which signifies a single chip mode of FIGS. 2a or 13a and is used in the memory control circuitry illustrated in FIG. 16c. $\overline{DADDOUT}$, produced by gates 804 which NOR the signals MP and MMD1, is a signal that is used in D port to signify the peripheral expansion mode or the single chip mode, thus allowing data to be output on the D port. EXT is functionally EXT = $\overline{GRAM}$ + $\overline{GROM}$ + $\overline{GI}$ + $\overline{GT}$- + $\overline{GA}$ + $\overline{GB}$ + $\overline{GC}$ + $\overline{GD}$ + $\overline{INT}$ + $\overline{EXTT}$- where $\overline{INT}$ = $\overline{(MMD0 \times PG1)}$ + MP + MMD1 and
$\overline{EXTT}$ = $\overline{MEM}$ + (EM × WR) = $\overline{EM \times MEM \times WR}$ + $\overline{MEM}$ × WR where
$\overline{PG1}$—not page 1 (AH:AL≠01XX)

MMD1—active in full expansion mode, MP = EM = MMD0 = 0
MMD0—active in peripheral expansion mode, MP = EM = MMD1 = 0
EM—active in emulator mode, MC pad = high voltage, MMD1, MMD0 = don't care
MP—microprocessor mode, MC pad = 1 and MMD1, MMD0 = don't care EXT has two functions: one is to allow ENABLE, which is one of the external memory controls (output from port B6). The second function is to allow port C to read the external peripheral onto the MD bus via EXTRDH4.

FIG. 16c illustrates the remaining memory control logic circuitry 28. Referring now to top of FIG. 16c, the $\overline{EXT}$ signal inputs to this logic circuit from the group decode circuitry 27 previously discussed in FIG. 16b. $\overline{EXT}$ is used to produce $\overline{EXTC}$, clocked in by H2, which is used in port C circuitry and ENABLE, by both H3 and H1, which is used in the port B logic circuitry. $\overline{EXTC}$ is used by the port C logic to enable the port to perform an external read during the time phase H4. ENABLE is used by Port B as an external memory control during all modes except the single chip mode. The remaining memory control logic circuitry receives three microinstruction bits 18 which are #MMCNT, #WR and #MEM, illustrated in the timing diagrams in FIG. 4. #MEMCNT is used to produce LDADDR which is the load address signal for the address buffers 19 in FIGS. 1 and 7a. #MEMCNT (memory continue) is also used to produce the $\overline{MEMH1CNT}$ signal used in the group decode logic, FIG. 16b. This memory continue signal is also used to produce $\overline{ALATCH}$ with phase H4. $\overline{ALATCH}$ is used by the Port B logic as an address latch signal in the peripheral expansion, full expansion microprocessor and emulator modes. The #WR microinstruction control signal which is high for memory regards and low for memory writes is used in producing the OtM signal sent to the CPU 13. The OtM is a signal that goes to the CPU and connects the O bus to the MD bus allowing the ALU to write onto the MD bus. This connection is made: (1) during the first state of a long memory cycle or (2) during a writing mode. The OtM signal is an OR of the memory continue line #MEMCNT and read/write line #WR. The read/write microcontrol signal #WR is also used to produce WRRAM and $\overline{WRRAM}$ which is used by the RAM logic of FIG. 11 for read/write operations. LNGWR is produced by the memory control and read/write microinstruction lines and is routed to ports B, C, D, the interrupt logic and the timing logic. This signal is used to designate long read or write cycles.

CDATAOUT is produced in the circuit 28 of FIG. 16c by the single chip mode signal SC produced by the group decode logic 28 as mentioned previously and the memory continue line clocked by H1. CDATAOUT allows port C to output the contents of the C data latch in the single chip mode output an address in the first state of a long read or write cycle. PTCOUT places port C into an input mode for the second state of all long read cycles or in other words, port C is placed into the output mode in both states of a long write cycle. When in the single chip mode, PTCOUT is disabled and the contents of the port direction latch determines the port direction.

$\overline{PTCOUT}$ = SC + (WR − × MEMCNTd)

where

MEMCNTd is delayed nd stretched form of #MEMCNT (memory continue from microinstruction) that goes high in H1 of the second state of long memory cycles and lasts until H2 of the state following the long cycle.

The next signal produced by the memory control logic circuitry of FIG. 16c is $\overline{REF}$ which is transmitted to the RAM multiplex 32 and notifies the RAM refresh multiplex 32 and coounter 31 that it may execute a refresh cycle using the address in the 5-bit row refresh counter 31. This signal causes the RAM address multiplex 32 to pass the refresh counter 31 contents rather than the bus address AL' to the RAM 12. It also increments the refresh counter 31 by one state. $\overline{REF}$ will occur (1) during any non-memory cycle, and (2) during the first state of any long memory cycle.

$\overline{REF} = \#\overline{MEM} + \#MEMCNT$ $\overline{INTACK}$ is produced by the memory control circuitry and is sent to the interrupt logic. $\overline{INTACK}$ (interrupt acknowledge) is produced by the microcode during the interrupt microroutine and tells the interrupt logic to place a vector on the memory data bus MD, identifying the highest priority interrupt active, i.e., flag set. ($\overline{INTACT} = \#\overline{MEM} \times \#\overline{WR}$.)

INTAX is a signal that is logically equivalent to INTACK but is output from port B in the emulator mode and is further clocked by H2.

BA0 produced by the memory control circuitry 28 is transmitted to the I/O ports and the timer and is simply a buffered contents of the 0-bit of address bus AL'.

The last signal produced by the memory control circuitry of FIG. 16c is CNTLH1 which is the H1 phase with #MEMCNT from the microinstruction.

INTERRUPT LOGIC CIRCUITRY

Figure 17A:
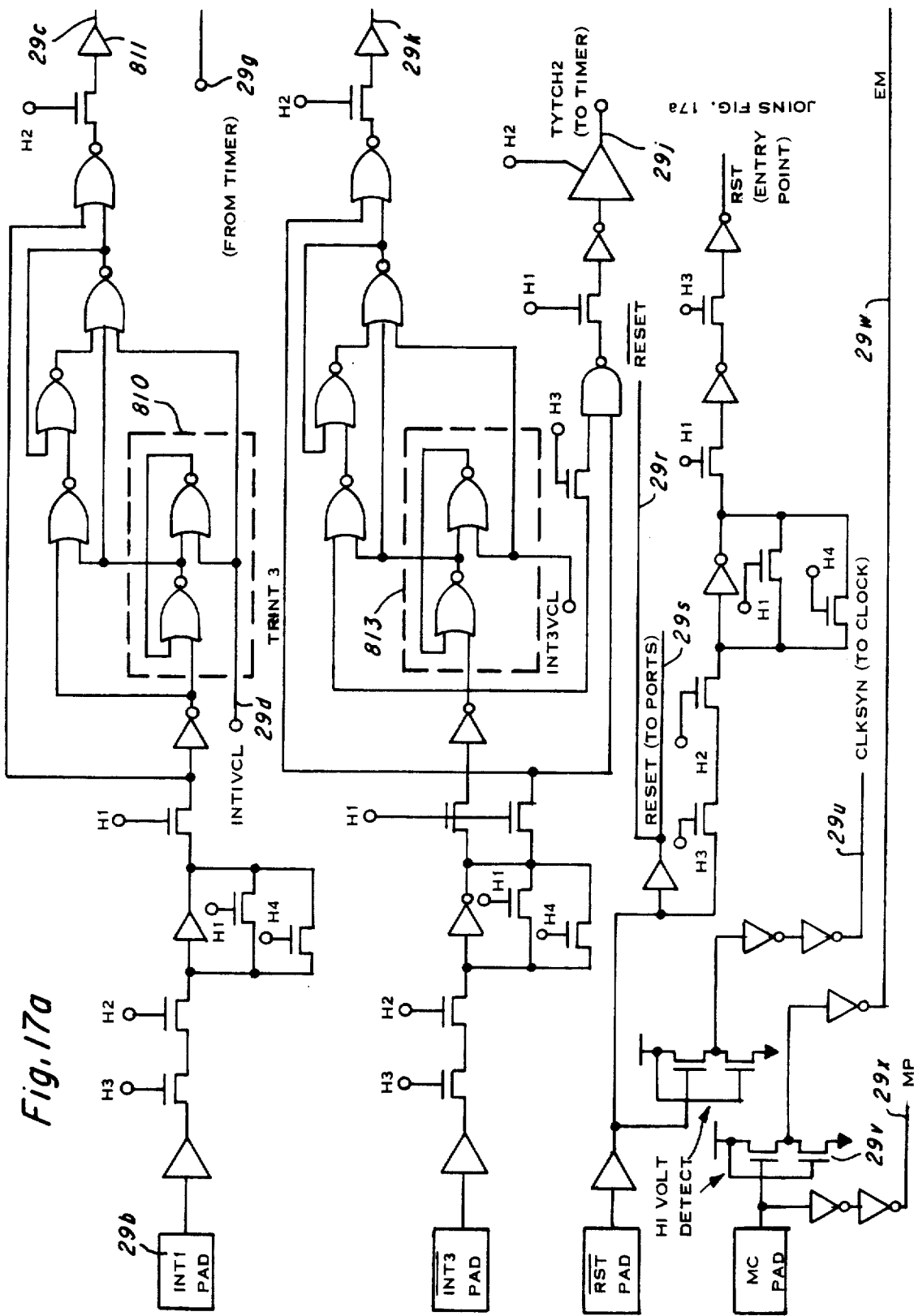
FIGS. 17a and 17b are schematic diagrams of the interrupt circuitry 29 and I/O control register 25.
Figure 17A:
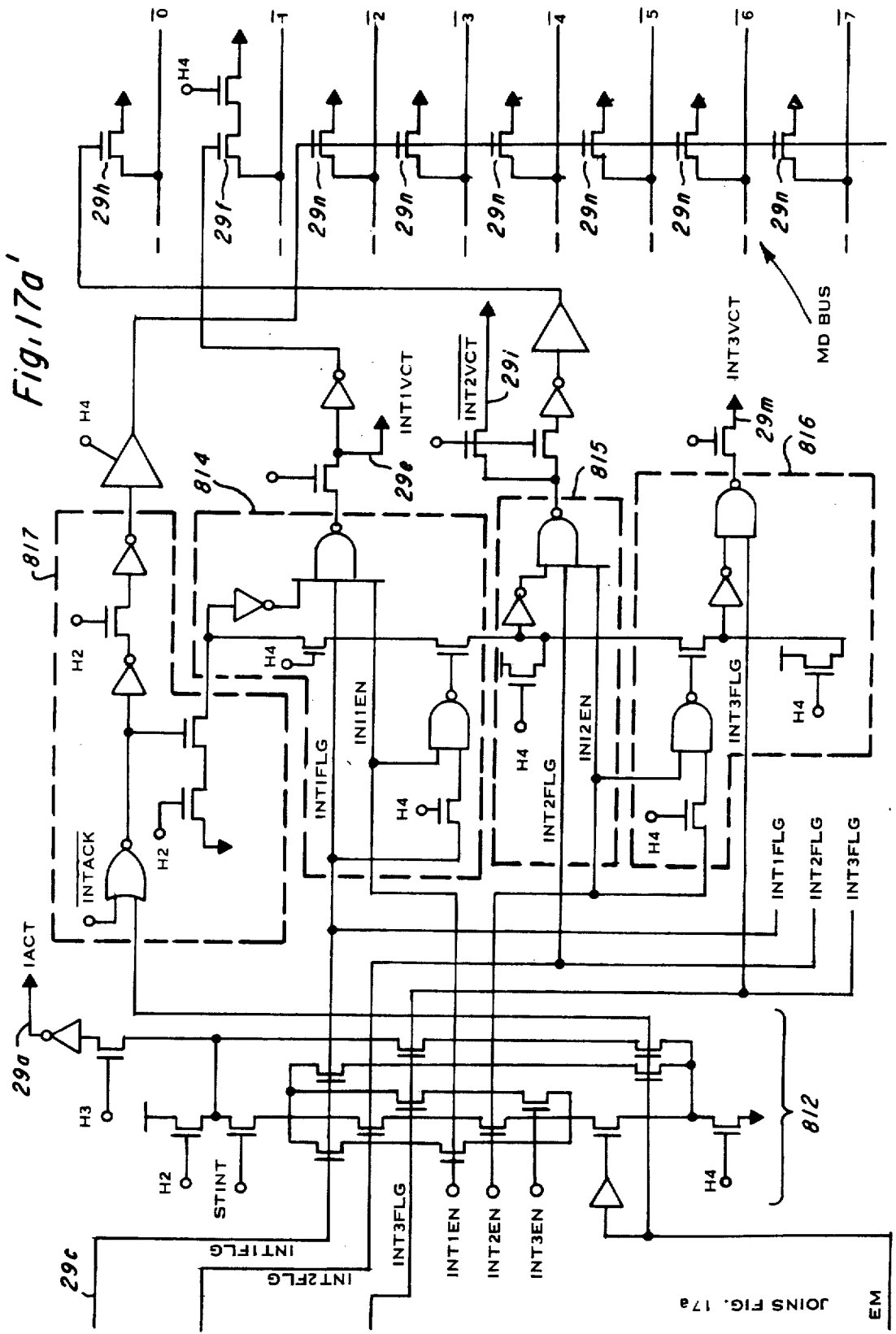

The microprocessor system has the capability to receive two external interrupts INT-1 and INT-3, one internal timer interrupt INT-2 and a reset signal RST. When an interrupt is received by the interrupt logic 29, the peripheral hardware 20 asserts the IACT signal on a control line 29a (FIG. 17a) to the CPU 13. The CPU 13 may then read an interrupt vector supplied by the peripheral control hardware 20 on to the memory data bus MD, indicating which interrupt has occurred. The interrupt vector read requires two cycles, as shown in the timing diagram in FIG. 4. It should be noted in FIG. 4 that both #MEM and #WR must be low during both cycles of the interrupt vector read. Like a long memory read, the vector is not available until the end of the second microinstruction cycle as seen in FIG. 4. The value of the vector supplied by the peripheral circuitry 20 for each interrupt is shown in FIG. 17d. There is a difference between the trap vector supplied by the peripheral control circuitry 20 and the trap vector address at which the interrupt subroutine entry point address is stored. The trap vector supplied by the peripheral circuitry 20 is the same as the "TRAPn" opcode for the processor's Table A instruction set. In order to call the interrupt handler, service routine the microcode must generate the trap vector address from the vector (FIG. 17d) supplied and read memory 11 at that location to get the address of the interrupt handler subroutine.

Interrupts can be recognized only if the interrupt enable flag STINT in the status register ST of FIG. 7e is set. If the flag is cleared, no interrupts will be recognized. Each interrupt can also be individually enabled and disabled in the I/O control register 25 of FIG. 17b, the contents of register 25 being seen in FIG. 17c. The I/O control register 25 is mapped into location P0 of the peripheral file PF, FIG. 2. The memory expansion mode, individual interrupt masks, and individual interrupt sets are controlled through this register 25, FIG. 17b, by writing the appropriate bits via MD at location P1, activating transistors 25a. The interrupt sources may also be individually tested by reading the interrupt flags via MP at address P1, activing transistors 25b. The interrupt flag values are individually tested by reading the interrupt flags. Interrupt flag values are independent of the interrupt enable values as shown in the interrupt logic circuitry of FIGS. 17a and 17b. FIG. 17c illustrates the contents of the I/O control register 25 for a read operation or for a write operation. Writing a "1" to an interrupt clear bit location in the I/O control register will clear the corresponding interrupt flag. The interrupt flag is unaffected if a "0" is written to the interrupt clear bit. Once the interrupt is recognized, the status register ST and program counter PCL, PCH contents are pushed on the data stack; the starting address of the interrupt routine is then fetched from the memory location as shown in FIG. 17d. The interrupt enable status bit STINT is automatically reset after the interrupt is recognized. It is automatically restored by the interrupt return instruction; it can also be set or reset by program control. The interrupt source can be determined by testing the I/O control register 25 illustrated in FIG. 17c. Interrupts 1 and 3 are externally generated as previously discussed. The timer interrupt, interrupt 2, is generated internally and can be reset in the I/O control register 25.

The external interrupt, interrupt 1 and interrupt 3, can be configured to be either level or edge triggered. At the falling edge of interrupt 1 or interrupt 3, the corresponding flag bit in the I/O control register 25 is set independently of the state of the interrupt enable bit. The interrupt then remains pending until the interrupt input returns high, and the interrupt flag bit is cleared. Referring to FIG. 17a, interrupt 1 is input on the interrupt 1 pad 29b through a Schmitt trigger for squaring the waveform, then is clocked by H3 and H2 into a network of inverters and devices clocked by H1 and H4 in order to latch the input into a series of NOR gates 810 which produce the interrupt flag signal on line 29c. Therefore, a single low pulse on the interrupt pad is sufficient to set the interrupt pending flag 29c and whenever this interrupt is acknowledged, the flag will be cleared by the INT1VCL signal input 29d into the NOR gate circuitry. If on the other hand, a level "low" is applied to the pad, the flag is set, and will remain set (even if acknowledged) until the level is removed. If the interrupt is acknowledged while the level is still present, the level edge detect latch 810 is cleared even though the level is still present and if the level is removed then no interrupt will be pending. INT1VCL is produced by either an interrupt acknowledge or by writing a "1" to the interrupt clear bit in the I/O control register 25. INT1VCL clears only the leading edge detect circuitry and will not clear a pending interrupt if the level is produced. Therefore, if the leading edge latch is cleared and the level is present, the interrupt flag will be set. However, if the leading edge latch is cleared and the level is removed, the interrupt will no longer be pending. Since the interrupt is pending if the flag bit is set, a pulsed interrupt can be easily detected and serviced. The interrupt is reset as soon as the interrupt flag bit is cleared since the interrupt is pulsed and automatically returns to the high or inactive state. The interrupt/enable must not be reenabled sooner than the maximum pulse length of the interrupt. Multiple level sensitive interrupts may be wire ORed on an interrupt input since the interrupt input will remain pending until all interrupt sources are reset, thus allowing the input to return to the inactive state. If multiple interrupt requests are enabled and pending, then the interrupts will be serviced in the order shown in FIG. 17d.

Referring back to FIG. 17a, the interrupt 1 flag INT1FLG signal on line 29c is produced by the inverter 811 and transmitted through a network of devices 812. This network of devices compares the inputs of the interrupt flags with the interrupt enable signals, the set interrupt signal together and the emulator mode signal. If the interrupts have been enabled, i.e., STINT inactive, and a particular interrupt flag signal is active together with this enable signal, the signal IACT (interrupt active) becomes valid on line 29a. This signal goes to entry point circuit 21, but a microjump on this signal is not performed until after the second state of the instruction acquisition IAQ1, FIG. 8. Since this jump is performed into an active interrupt flag, the control ROM 17 will later cause an interrupt acknowledge signal INTAC to be produced in the memory control logic of FIG. 16c. This signal causes the interrupt logic to place a vector on the memory data bus MD corresponding to the highest priority interrupt present. At the same time, the edge protecting latch corresponding to the accepted interrupt is cleared. If more than one interrupt request is made, the highest priority interrupt is accepted and then cleared, but the unaccepted interrupts are not cleared.

Referring to FIG. 17a, the interrupt 1 flag on line 29c is also transmitted through the devices 812 into a NAND gate in logic 814 where it is combined with the interrupt "1" enable (INT1EN) in gate circuitry for prioritization where interrupt 1 has the highest priority. These signals are then combined with a NAND gate to produce $\overline{INT1VCT}$ on line 29e and INT1VCT (interrupt 1 vector clear) and the vector address for the interrupt service routine which is placed on the MD bus by transistor 29f, this adders being 11111101 or FD.

The second interrupt is obtained from the timer and input into the interrupt logic circuitry device network 812 at line 29g as shown in FIG. 17a. The remaining processing of this interrupt flag is similar to the interrupt "1" flag processing in that it is input into the interrupt 2 prioritization circuitry 815 and when enabled loads the vector address (11111110) for the interrupt service routine on the MD bus by transistor 29h and activates IN2VCT (interrupt 2 vector clear) on line 29i.

Interrupt 3 is input on the interrupt 3 pad as shown through Schmitt trigger circuitry similar to that for interrupt "1". However, interrupt 3 has a dual purpose. In the nonemulator mode, interrupt 3 is a maskable low priority interrupt that can either be edge or level triggered. This is accomplished in a manner similar to that for interrupt "1" in that the NOR gate network 813 is similar to the operation of the NOR gate network 810. The additional circuitry for interrupt 3 produces the signal TDTCH2 at line 29j which is input to the timer circuitry to be discussed. The interrupt 3 flag on line 29k is input into prioritization circuitry 816 to produce INT3VCT on line 29m (interrupt 3 vector clear) and the appropriate vector address.

It should be noted that circuit 817 is used to load bits 2 through 7 on the MD bus via transistor 29n when an interrupt vector address is loaded. Three bits are also loaded in the system emulation mode when an external interrupt is received.

The reset pad of FIG. 17a is the input for the reset signal. When the reset pin is asserted externally, the peripheral control circuit 20 asserts the reset signal to the CPU. The entry point logic 21 immediately forces the next microinstruction to the hex FF address via transistor 21n of FIG. 10. Unlike a normal interrupt facility, the microcode does not pole the RST line; rather, the microinstruction at the control ROM 17 address, hex FF, is unconditionally forced to be the next microinstruction executed. In other words, this address is jam set. The insertion of Reset causes the following actions: By hardware the I/O control register 25 bits 6-7, the two most significant bits (memory mode control), are reset to "0"; the port data direction registers for the ports are loaded with all "1's" thus forcing bidirectional I/O ports to the input mode; All status register ST bits are cleared, and the stack pointer SP is initialized to a value of "1"; This is done by the microinstructions RST-0 to RST-3 of Table B and FIG. 8, and circuitry as indicated. The remaining registers in the I/O function must be initialized by the reset service routine as required. Reset must be held active on the reset pin for a minimum of 5 clock cycles to guarantee recognition. When it is removed, the reset function is initialized. Thus, the reset input requires no external synchronization. Referring to FIG. 17a, the reset signal is transmitted through a Schmitt trigger as before to a network which produces the $\overline{RESET}$ signal on line 29r used in circuitry shown in FIG. 17b, RESET, on line 29s which is sent to the I/O ports and RST on line 29t which is sent to the entry point logic 21. In addition, when the MC pad is set to 12 volts, reset is transmitted to the internal clock 33 so it synchronized via the "CLKSYN" line 29u.

The mode control MC voltage is also input into the interrupt logic circuitry of FIG. 17a as shown via the MC pad. This voltage goes into a circuit 29v to detect high voltage input (i.e., 12 volts) to produce the EM signal on line 29w which indicates the emulator mode. A normal "1" or Vcc=5 v on the MC pad will produce the MP signal or microprocessor mode signal on line 29x. Both the EM and MP signals are transmitted to the memory control circuitry 28. The EM signal in addition is transmitted to the port B logic into the circuitry shown in FIG. 19b. In addition, the emulator mode signal is used in the device network 812, together with the interrupt 1 and 3 flag as previously discussed.

Figure 17B:
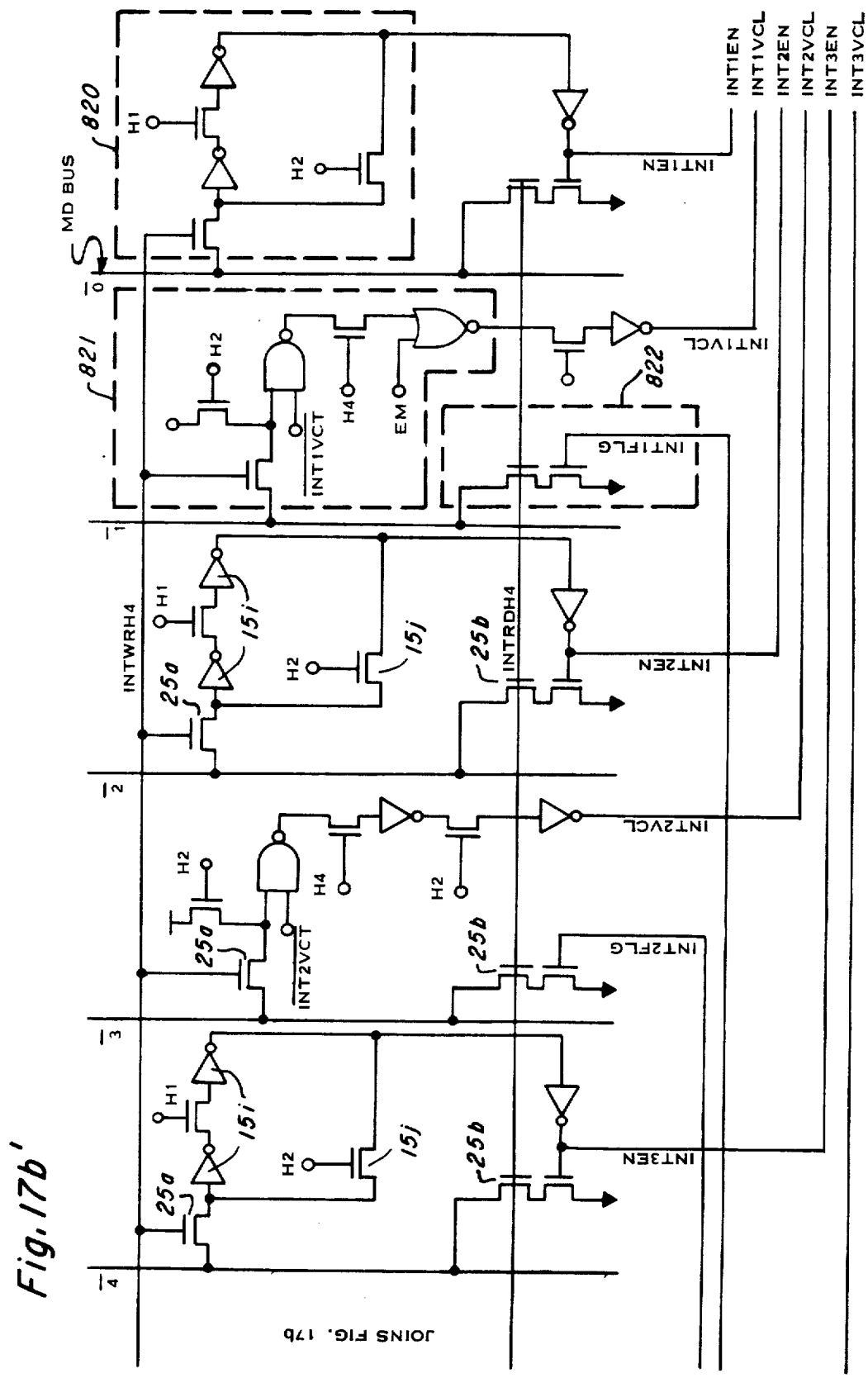

Referring to FIG. 17b, the I/O control register 25 is illustrated interfacing to the MD bus. It should be noted that there are two inputs from the memory control logic, $\overline{GI}$ and $\overline{LNGWR}$. These two inputs are used to designate access to the I/O control register 25 via MD bus and a read or write operation in conjunction therewith. The line INTWRH4 going to gates of transistors 25a is produced by the NOR or $\overline{LNGWR}$ and $\overline{GIP}$ from the memory control circuitry. This signal is clocked through a device when a write operation is performed. In a smaller manner, the signal INTRDH4 going to gates of transistors 25b is produced from the NOR of $\overline{GIP}$ and RWRI which is a deriviative of $\overline{LNGWR}$ signal from the memory control circuit 28. This signal (likewise clocked by H4) signifies a read of the I/O control register 25. The contents of the I/O control register is illustrated in FIG. 17c. The circuitry 820 of FIG. 17b serves as a inverter storage latch for the interrupt "1" enable signal. This storage cell can be written into when INTWRH4 is active and the "0" bit of the MD bus is active. Likewise this signal can be read when the INTRDH4 line is active. This signal is then read by examining the "0" bit on the MD bus. The MD bus bit position "1" on a read cycle is devoted to the interrupt "1" flag. The interrupt "1" flag signal is derived from the circuitry in FIG. 17a as previously discussed. When the interrupt "1" flag is to be read, the INTRDH4 line should be active, thus allowing the contents of the INT1FLG line to be input on the bit 1 of the MD bus. In the write mode, a bit written at this position will be interpreted as a clear of interrupt "1". Therefore, in the write mode the circuitry 821 will serve to produce the INTVCL signal which serves as a clear signal for interrupt 1 flag 29c. Specifically the circuit receives the signal INTWRH4 to signify a write operation along with the bit "1" position of the MD bus, but "1" is input into a NAND gate with $\overline{INT1VCT}$ and transmitted through a device and clocked by H4 into a NOR gate with an input from the emulator signal to produce the interrupt/clear signal, INT1VCL. As previously discussed, the interrupt/clear signal will provide a clear to the edge latch detecting circuitry. However, if the interrupt is a level interrupt, and the level is still active (i.e., low) the signal will not clear the interrupt. Therefore, the flag will still be set. The circuitry associated with MD bus bit position 2 is similar to that for the MD bus bit position "0" (i.e., circuitry 820) and will not be discussed. Likewise the circuitry for bit position 3 is similar to the circuitry for position "1" with the exception of the fact that there is no NOR gate to receive the clear bit transferred through device clocked by H4; instead there is an inverter. However, the interrupt flag circuitry is the same. The circuitry associated with bit position 5 and bit position 4 for the MD bus is similar to the circuitry for bit position 1 and bit position 0, respectively, and will not be discussed. The register 25 of FIG. 17b is part of the strip and is in a regular pattern with inventers 15i and feedback transistos 15j just like the registers 15 of FIG. 7b; the MD bus is a continuation of the eight metal lines of FIG. 3, and the control lines to gates of 25a, 25b are polysilicon.

Bit position 7 and bit position 6 of register 25 are dedicated to storage of the MMD1 and MMD0 bits. The MMD1 bit is stored in the circuitry of 823 and outputted via circuit 824. Note that the combination of these two circuitries is effectively a master slave latch as in 820 with the exception of a NAND gate 25g which allows this circuitry to be reset when the reset condition is present. This reset condition is obtained via line 29r from the circuitry in FIG. 17a. It should also be noted that read or write operations can be performed on MMD1 or MMD0.

In emulator mode interrupt 3 becomes a non maskable interrupt (no enable required) and interrupt 1 is a maskable interrupt enabled only by STIT.

PROGRAMMABLE TIMER/EVENT COUNTER

The programmable timer/event counter will be described with reference to FIGS. 18a-18e; this device is an 8 bit binary counter with a programmable prescaled clock source as shown generally in FIG. 18d. The basic elements comprising the programmable timer/event counter are: (1) a fixed divide-by-8 pseudorandom shift-counter 26 for which the output $\phi/8$ is an internal input 26i divided by 8; (2) a 5-bit prescaler 26a (binary decrementor) which resides in the memory map of FIG. 2a as part of the timer control register at P3, represented by latch 26a' of FIG. 18d (these 5 bits of 26a' are write only); (3) A 5 bit control latch (write only) 26a-1; (4) 8 bit time value register (timer decremeter) 26; (5) 8 bit timer latch 26b; and (6) an 8 bit capture latch 26c.

The two accessible locations P2 and P3 (FIG. 2) for the timer function differently at read vs. write, as seen in FIG. 18e. The location P2, "timer data" contains a 8 bit, write-only latch register 26b-1 and an 8-bit read-only register 26b-2. Note during a read operation, the location P2 will contain the instantaneous count-down value. FIG. 18e shows the control register at location P3; here, for write, bit position 7 is the "counter start" command position. A "1" written in bit position 7 will immediately start the timer. Bit position 6 of FIG. 18e designates the timer source. A "1" in bit position 6 selects the internally generated PHI/8 (internal clock frequency divided by 8) clock; a "0" selects the external clock source obtained from bit position 7 in the A port. Bit positions 4–0 of the control register 26b, location P3, contain the prescaler 26a latch value for a write operation. For a read operation, all 8 bits of the timer control register of FIG. 18e contain the capture latch value. FIG. 18e illustrates the contents of the timer data register P2. Note that in the read mode, the current timer value will be read. However, in the write mode the data written will determine the current latch value. Any number from 0–255 can be written into the timer latch. Likewise, the prescale latch can be loaded with any number from 0–31. Thus, the device can count any number up to 256×32=8192. The timer source bit position 6 and a start/stop bit position 7 are also reloaded when loading the prescaler 26a. As long as the start/stop bit is equal to "0", neither the prescaler nor the timer can be decremented, thus stopping the timer. Whenever a "1" is written into the start/stop bit position (regardless of whether it was previously a "0" or "1") the following happens: (1) the 5 bit prescaler latch register 26a-1 (that was loaded together with the start/stop bit position) is transferred into the prescaler value register 25a. The value register 26a for both the prescaler and the value register 26 for the timer are registers that do the actual decrementing. The latch, or capture registers 26a-1 and 26b, do not decrement. The timer latch register 26b is also loaded into the timer value register 26 upon start. The divide by 8 logic (0/8) value is reset to its initial state. The decrement clock inputs to both the prescaler 26a and the timer value register 26 which are then enabled. The timer, whether in internal or external mode, is prescaled by the 5 bit binary counter 26a. The prescaling value is determined by the least significant 5 bits of the timer control register P3, FIG. 18e. The actual prescale value is equal to the timer control register prescale latch value 26a-1 plus 1. Thus a value of hex 88 in the timer controller register (i.e. start=1, source=0, prescale=8) would result in a PHI/72 clock output from the prescaler 26a. The prescaler clock is then used at input 26i to decrement the counter 26. The interrupt 2 flag in the I/O control register 25 is set each time the counter value 26 decrements past the 0 value. The prescaler 26a will count down past 0000 at which time the timer value register 26 is decremented 1 count via 26i and the prescaler value register 26a is reloaded with the contents of the prescaler latch register 26a-1. The timer 26 continues to be decremented in this fashion until it counts past hex 00 at which time the timer/interrupt flag (interrupt 2 flag) is set to "1" in the I/O control register 25 and the timer value register 26 is reloaded from the timer latch register 26b starting the full time period over again. If at any time during the countdown period, the timer control register bit position 7 change from a "1" to a "0", the timer stops, ceases decrementing. Upon timer start (a "1" in bit position 7 of the timer control register P3) both the prescaler and timer value register 26a, 26 are reloaded with the full latch contents 26a-1, 26b and the system begins to count normally again. Note that there is no way to stop the timer in progress and resume time from where it stopped.

When the timer is in the event counter mode (timer control register bit position 6=1), the counter functions as above except bit position 7 of I/O port A is the decrementing clock source. A positive edge transition on port A bit 7 decrements the count chain. Note that port A bit 7 can function as a positive edge triggered interrupt by loading a start value of "0" into both the prescaler 26a-1 and the timer latch 26b. This timer mode can also be used as an externally clocked, real time clock if the external clock is input to port A pin 7. The maximum pulse frequency should on port A, bit 7, in the event counter mode must not be greater than PHI/8.

Another feature that exists in this timer is the capture latch 26c. This register 26c is loaded from the timer value register 26 whenever the interrupt is active. At the falling edge of interrupt 3, the timer value is loaded into the capture latch. When read, the timer control register P3 contains the capture latch 26c value. This capture latch feature provides the capability to determine when an external event occurred relative to the internal timer and is ideally suited for pulse width measurement. Note that if an interrupt is not desired, interrupts should be totally disabled by the interrupt enable bit or the individual enable bit for interrupt 3 should be disabled.

Since the interrupt 2 flag is raised only after the timer has decremented passed "0" for a given count of N (or division by N), a value of N − 1 must be loaded into the latch registers (prescaler 26a-1 or timer 26b).

Figure 18A:
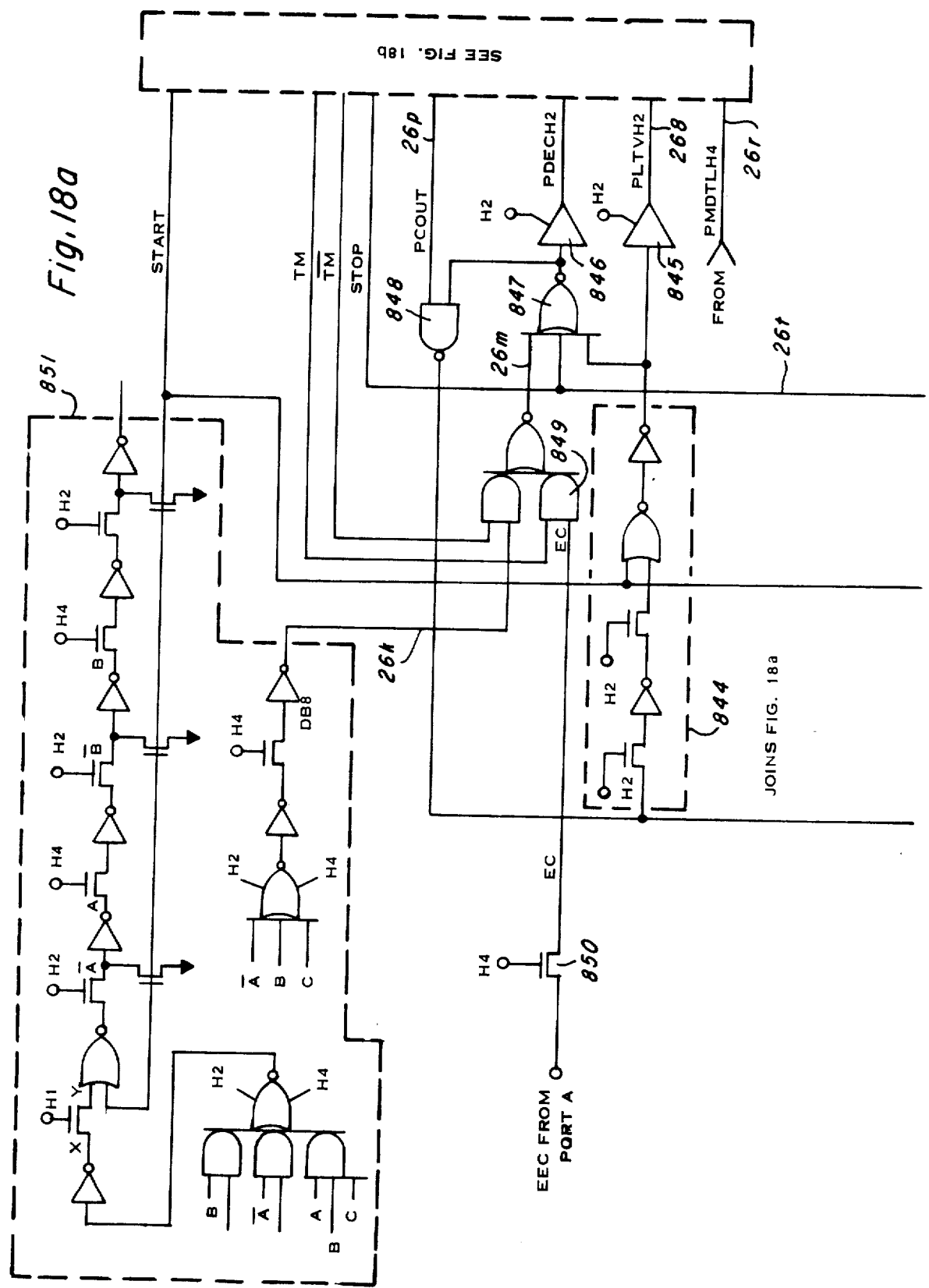
FIGS. 18a–18c are schematic diagrams of the programmable timer/event counter circuitry 26, 26a, 26b, 26c of the device of FIG. 1.
Figure 18A:
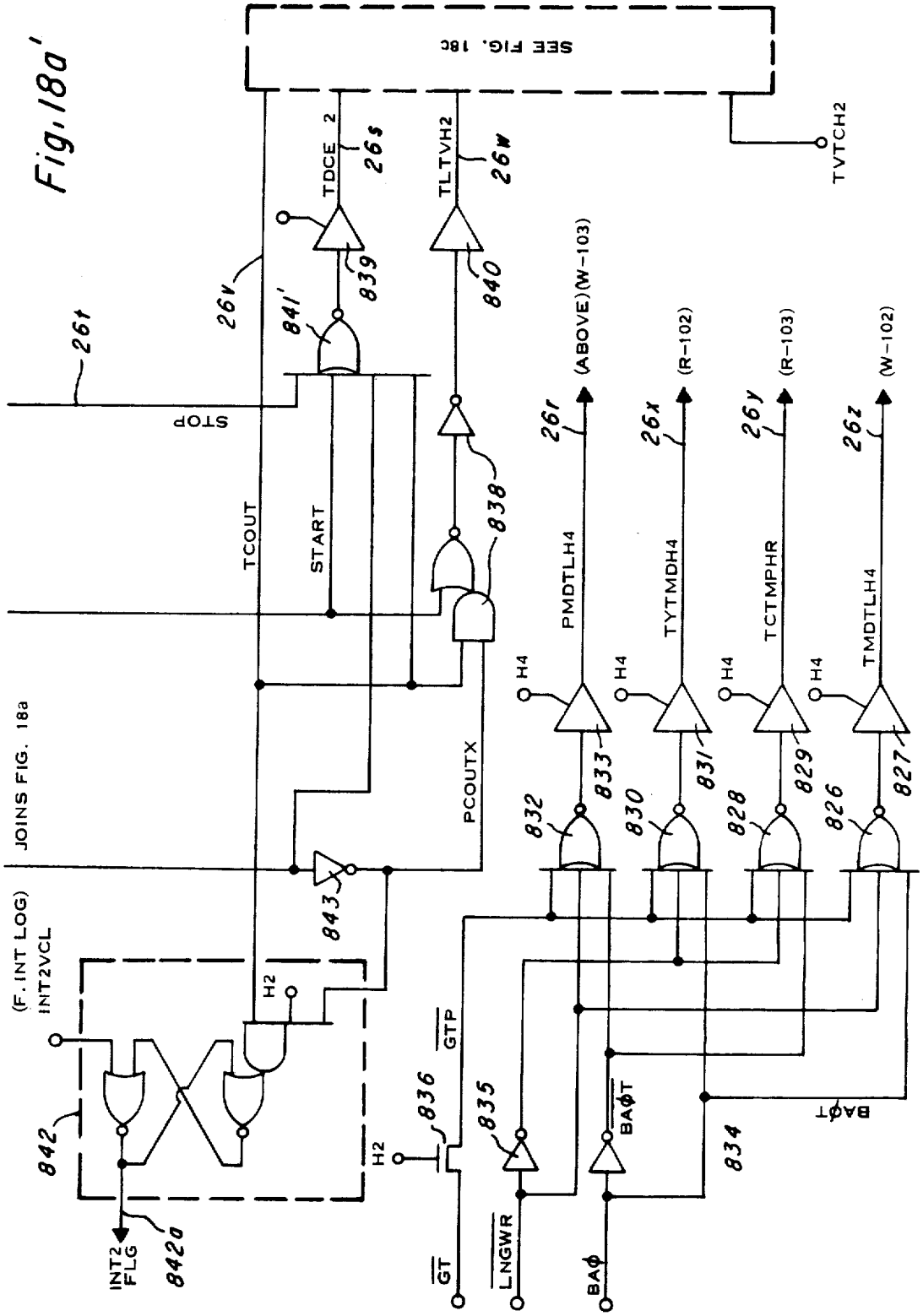
Figure 18B:
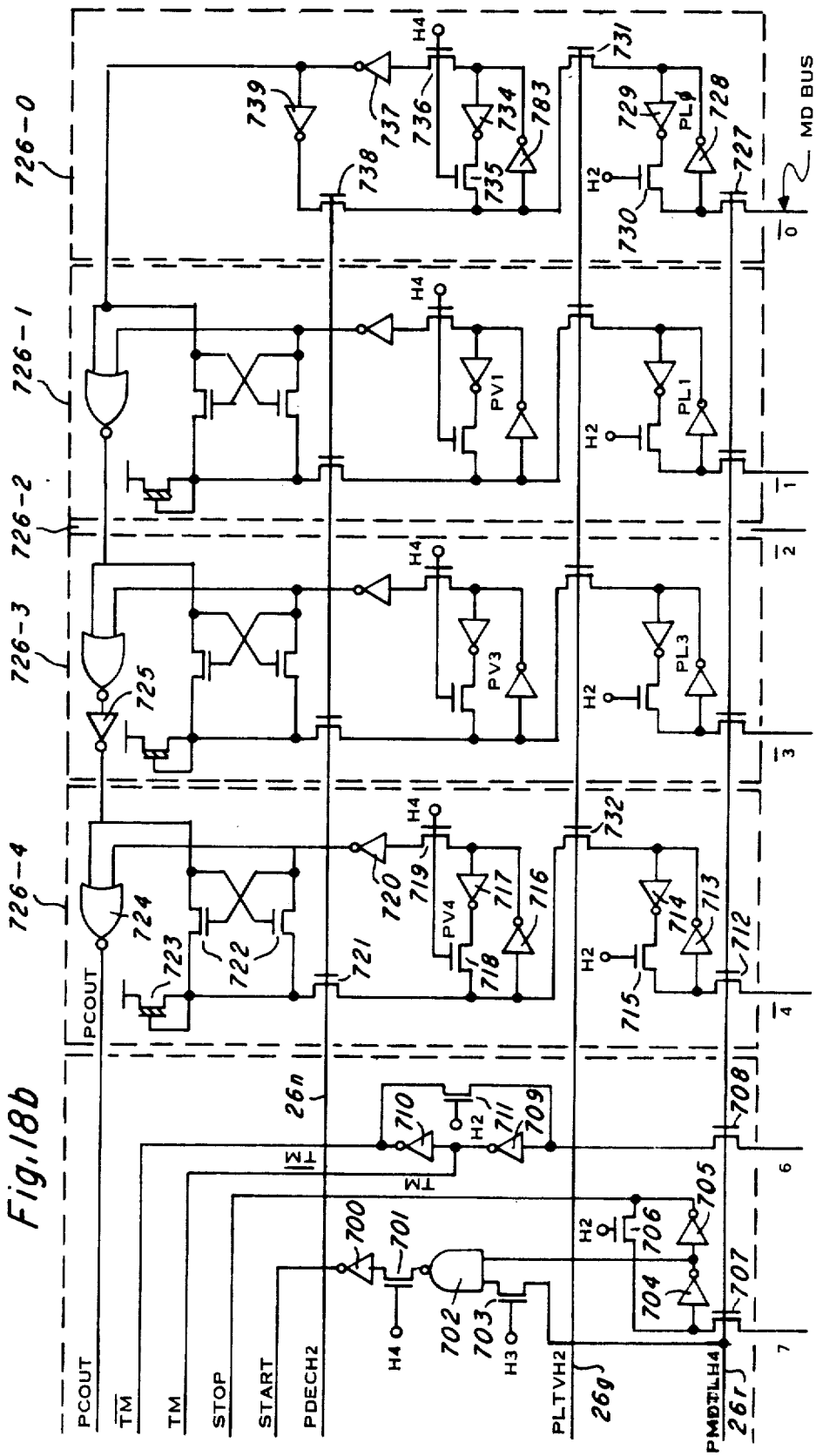
Figure 18C:
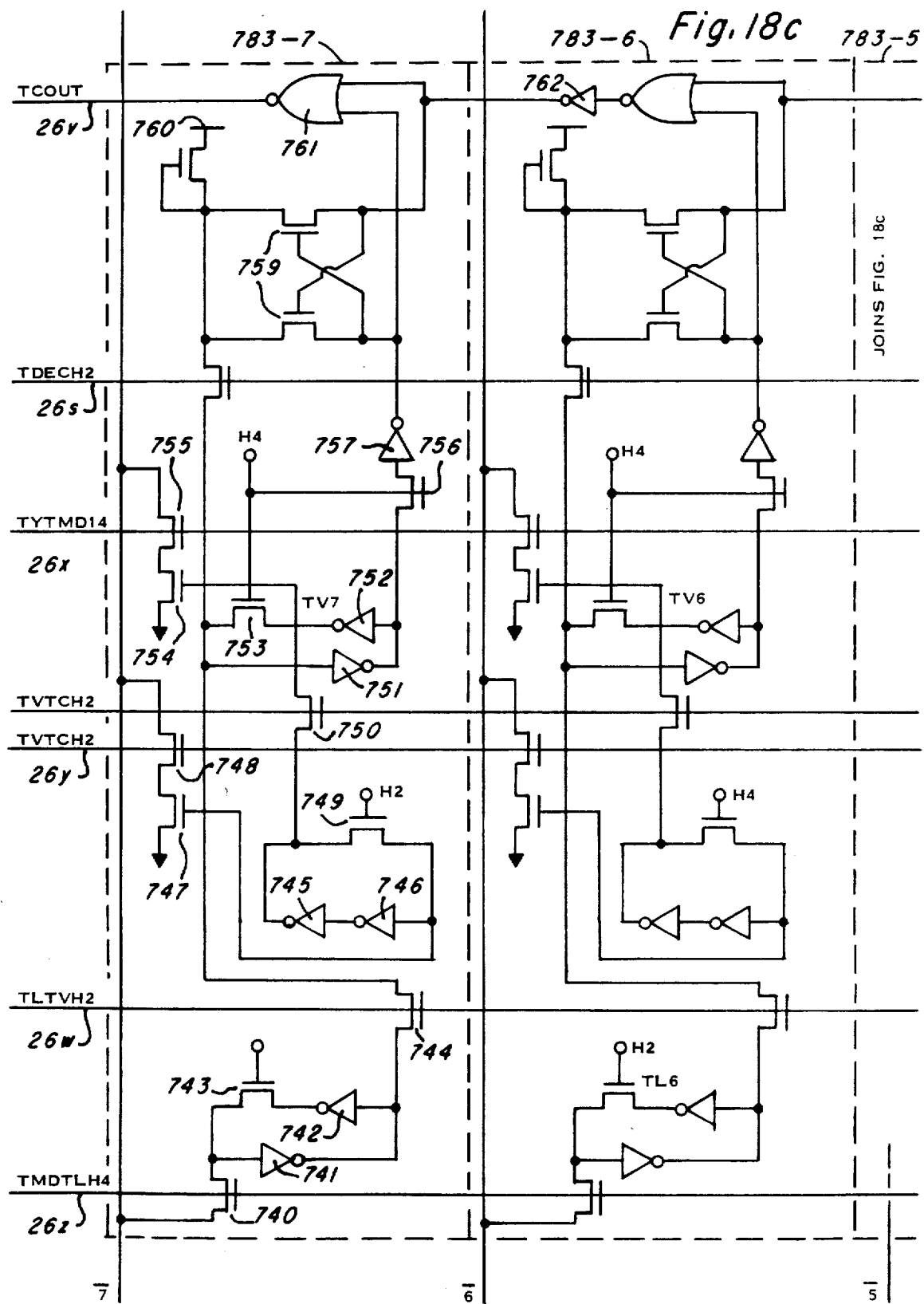
Figure 18C:
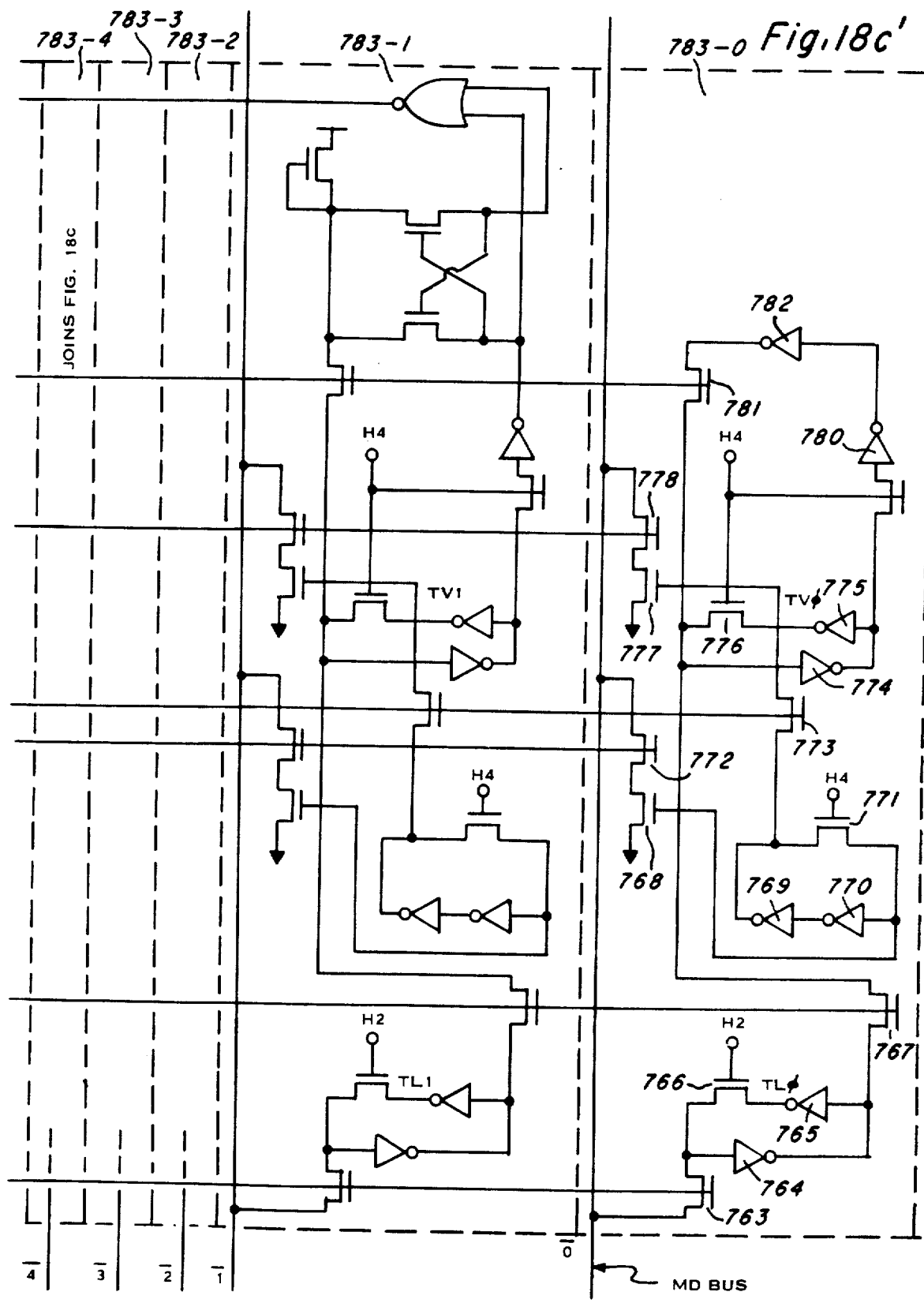

The actual circuitry for the programmable timer/counter is illustrated in FIGS. 18a, 18b and 18c. Referring now to FIG. 18a, the divide-by-8 circuit producing PHI/8 is shown to be the circuitry contained in the block 851, a psendo-random shift counter clocked on the internal clock (H phases) of FIG. 4. The output signal 0/8 on line 26k becomes active after 8 internal clock phases have occurred. Note that for the circuitry contained in block 851 to produce $\phi/8$, the start signal from the circuitry contained in FIG. 18b must be active. The other source of clock input is the external clock marked "ECC" input through device 850. The complex gate circuitry 849 determines which of these two clock sources 26k or ECC will be the single clock source for the timer circuitry; this is done by examining the TM and $\overline{TM}$ signals from the timer control register P3. If the bit 6 of the timer control register is "2", then the external clock source EC obtained from the 7th bit of port A is used, otherwise the signal $\phi/8$ on line 26k is used as a clock source. The clock source 26m is then input into NOR gate 847 which also receives inputs from the start/stop bit −7 of the timer control register P3 and the timer output 21j. This signal is further clocked by H2 in device 846 and used as the decrement signal PDECH2 input on line 26u into the circuitry contained in FIG. 18b. The output of the clock circuit PCOUT in FIG. 18b, on line 26p, is transformed into the signal PLTVH2 through the circuitry 844 combining it with a start signal and through device 845 which clocks PLTVH2 by the clock phase H2 and then transmits the signal via line 26q into the circuitry illustrated in FIG. 18b.

PMDTLH4 on a line 26r produced by circuitry in FIG. 18a that is also input into FIG. 18b and will be discussed; this signal causes a write into P3 or address 0103. The output of the prescaler circuitry PCOUT is also used as an input through inverter 843 into the latch circuitry 842. This latch circuitry and its gate input is used to generate and latch the interrupt 2 flag at 842a which is a function of PCOUT, the timer generate and output and the clock phase H2.

The PCOUT signal is also used to construct TDECH2 at line 26s, FIG. 18a. This uses PCOUT after inverter 848 and is input into a NOR gate 841 which receives inputs from the stop line 26t, start line 26u and TCOUT line 26v and further clocked by H2 through device 840. TDECH2, line 26s, is the decrement command for the timer value register 26. TLTVH2 (load timer value) on line 26w is also produced by PCOUT from inverter 843 combined with TCOUT (output 26v of the timer) and the quantity ANDed, NORed with the start line 26u in the complex gate circuitry 838, and then further clocked by H2 in device 839. Memory data bus MD access to the timer control register and timer data registers P2 and P3 are provided by lines PMDTLH4, TVTMDH4, TCTMDH4, and TMDTLH4 generated in the circuitry of FIG. 18a. PMDTLH4 results from NOR gate 832 receiving the enable input $\overline{GTP}$ derived from the group decode circuitry 27, $\overline{LNGWR}$ input through inverter 835 from the memory control circuitry 28, and BAO from the memory control circuitry 28. This signal from 832 is then clocked by H4 through buffer 833 and input into the circuitry illustrated in FIG. 18b via line 26r. The purpose of this signal is to provide the write access into the timer control register P3. TVTMDH4 on line 26x provides the read capability for the timer data latch register P2, 0102, or the capability to read the current timer value, and is generated by devices 830 and 831 which work in the same way as devices 832 and 833. Likewise, TCTMDH4 on line 26y from devices 828 and 829 provide a read capability for the timer capture register P3. TMDTLH4 on line 26z from devices 826 and 827 likewise provides the write enable signal for the timer data latch register P2, allowing the user to write from the MD bus the latch value into the timer data latch register. TVTCH2 is an input to the FIG. 18c circuitry from the interrupt logic circuitry that provides the interrupt 3 input to activate 26c for the event latch timer mode.

In FIGS. 18b and 18c, each register bit for the timer contains two inverters and a feedback transistor like 15i and 15j of FIG. 7b; the timer registers are part of the strip with the eight metal lines of the MD bus running vertically and the control lines 26q 26s and 26v-26z running horizontally.

The circuitry contained in FIG. 18b is the circuitry representative of the write function of the timer control register P3 illustrated in FIG. 18e. That is, bits 0-4 represent the value input into the prescale latch 26a—1. Bit-5 is always a "0"; or unused; therefore there is no circuitry provided. Bit-6 specifies the source for the timer, i.e., internal clock or external clock; and bit-7 is the start/stop bit for timer control. Circuitry block 726-0 contains the circuitry to read the prescale value latch data being input into the prescale latch. This data when read in from the memory bus through $\overline{MDO}$ is loaded into a bit latch circuitry consisting of inverters 728, 729 and timing device 730, labelled PLO. This input is made through device 727 which becomes active when a write operation is performed as activating PMDTLH4 previously discussed. This value is then input into the prescale latch value register PVO consisting of inverters 733, 734 and timing device 735 further controlled by device 731 which is active when PLTVH2 becomes active. PLTVH2 becomes active when either a start signal is received (a "1" in bit 7 of the control register) or the prescale latch value register is decremented below "0". During the normal timing sequence, the contents of the prescaler value register PVO, is decremented by device 737 and 739 together with the gating device which is activated by PDECH2. In addition, the value through inverter 737 is input into the next column of circuitry 726-1. The circuitry in 726-1 is similar to that in 726-2, 726-3 and 726-4. Therefore only the circuitry in 726-4 will be discussed.

The input from the memory data bus for 726-4, $\overline{MD4}$, is stored in the prescaler bit latch PL4 similar to PLO in 726-0. Likewise, the value written is then stored in the prescaler value register section PV4 in a manner similar to PV0. A difference from circuitry 726-0 and 726-4 is the existance of the devices 722, 723 and 724 and in addition 725 in 726-3, 726-2 and 726-1. These devices provide for the decrementing and restorage of the value in the prescaler value register and for the prescaler output on line PCOUT when the contents of the prescaler value register is decremented below "0" as previously discussed. It should be noted FIG. 18b only contains the circuitry for the timer control register write state and not the timer control register read state consisting of the event latch value.

The timer data latch, the actual timer value and the capture latch value are contained in the circuitry as shown in FIG. 18c. These three registers are similar in circuitry to the registers in the prescale value register and prescale latch in FIG. 18b. Specifically the timer latch register is signified by TL7, through TL0 in FIG. 18c. TL0 consists of two inverters, 764, 765 and a timing device 766 which operates as a master/slave latch similar to the prescale circuitry previously discussed. The timer latch value is written into this bit position during the activation of device 763 which is activated by the signal TMDTLH4 as previously discussed. Therefore, when TMDTLH4 is active, the timer latch value is written into the timer latch registers or the timer latch register cells TL7-TL0. The contents of the timer latch is then input into the timer value register TV7-TV0. TV0 contains the inverters 774, 775 and timing device 776 operating as a master/slave bit latch. The timer value is input upon the occurrence of TLTVH2 which is produced when either the prescale circuitry ouput PCOUT and when the timer outputs TCOUT, or when the start signal is active as previously discussed. Therefore when this line becomes active, the value in the timer latch register TL7-TL0 is loaded into the timer value register TV7-TV0. Located in between the timer value register and the timer latch register in FIG. 18c is the event latch register. In section 783-0 the event latch register bit is stored in the master/slave bit latch circuitry containing inverters 769, 770 and timing device 771. It should be noted that the contents of this master/slave latch can be read when TCTMDH4 becomes active, i.e., device 772 becomes active allowing the master/slave circuitry to activate device 768. In addition, the input from the interrupt logic circuitry signifying the occurrence of interrupt 3 (TVTCH2) is used to update the capture latch register with current timer value. The circuitry used to decrement the contents of the timer value register (TV7-TV0) is similar to that used to decrement the prescaler value shown in FIG. 18b. Specifically inverters 780 and 782 and timing device 781 in circuit segment 783-0 is similar to the inverters 737, 739 and timing device 738 and circuit segment 726 in FIG. 18b. The actual decrementing occurs when the device 781 and similar devices and circuit segments 783-7-783-1 becomes active; this occurs when TDECH2 is active. When the contents of the timer value register passes through a "0", TCOUT becomes active which produces the interrupt 2 flag through latch 842 in FIG. 18a as previously discussed.

Input/Output Ports

The processor system includes four 8 bit input/output ports, A, B, C, and D. These I/O ports can be reconfigured for each of the different processor modes: single chip mode, peripheral expansion mode, full expansion mode, microprocessor mode, and emulator mode as explained in reference to FIGS. 2 and 13. The I/O configuration during initialization is reset to the single chip mode with four external I/O ports. While two most significant bits in the I/O control register must be "0"s to select the single chip mode, these bits are automatically cleared during reset. There are four 8 bit I/O ports as shown in FIG. 2a and FIG. 1 for the single chip mode. All four ports are located in the peripheral file PF, addresses 01XX, tied to the MD bus, and may thus be manipulated efficiently with the I/O manipulation instructions of Table A. Referring now to FIG. 1, port A is an input 8 bit port with high impedance inputs. Port B is an 8 bit output only port. When port B is read, the value at the I/O pin is being read. Port C and D are 8-bit bidirectional data ports in which each bit can be individually programmed to be input or output. Associated with each bidirectional port is a data register such as P8 or P10 and a data directional register such as P9 or P11. Each I/O bit line can be programmed to be an input or output by setting a "1" in the corresponding data direction register for those lines which are to be outputs. A "0" in a bit of the data direction causes the corresponding I/O line to be a high impedance input. The data register P4,P6,P8,P10 is used to read and write the I/O lines. A "1" in the data register will cause a high on the I/O line if it is programmed as an output.

When the processor is in the peripheral expansion mode, I/O port C and bits 4–7 of I/O port B are used for the memory expansion. Port A, Port D and bits 0–3 of Port B are not affected. Specifically port C bits 0–7 and port B bits 4–7 are used for the external memory interface. The I/O lines of port C 0–7 are used to pass multiplex address/data as shown in FIG. 13a. Output lines of port B bits 4–7 are used for memory interface timing and control as shown in FIG. 13a. The peripheral expansion mode memory map is shown in FIG. 2b.

In the full expansion memory mode, the I/O port C, port D and bits 4–7 of port B are used for the memory expansion. port A and bits 0–3 of port B are not affected. I/O port C bits 0–7, port D bits 0–7, and port B bits 4–7 are used for external memory interface. I/O port D bits 0–7 are used to pass the most significant byte of the 16 bit address. I/O port C bits 0–7 are used to pass the least significant byte multiplexed address and data as shown in FIG. 13b. The output lines for port B bits 4 7 are used for memory interface timing and control. The full expansion mode memory map is shown in FIG. 2c.

The I/O configuration for the microprocessor mode is the same as the I/O configuration for the full expansion mode. The processor is placed in the microprocessor mode when the MC pin is tied to Vcc. The microprocessor mode is identical to the full expansion mode, except that the internal on-chip ROM 11 is disabled and removed from the memory map of FIG. 2d. The revised memory map is shown in FIG. 2d.

The emulator mode is enabled when the MC pin is tied to a high voltage source (+12 volts). In the emulator mode, all on-chip I/O and ROM is disabled and removed from the memory map as shown in FIG. 2e. The emulator memory expansion interface operates identical to the microprocessor mode memory map interface with the exception of the memory map and the pin-out. Specifically, in the emulator mode, all internal peripheral files (Ports A, B, C, D, timer, I/O control register, ROM) are disabled. Port B bits 7-4 become external memory control outputs. Port B bit 3 serves as an output for $\overline{INTA}$, the external interrupt acknowledge. Port C and port D are configured in the same manner as in the microprocessor or full expansion modes. The emulator mode can support up to 128 interrupts, either maskable or nonmaskable. When the interrupt acknowledge $\overline{INTA}$ line goes low, the external I/O circuitry must place the appropriate interrupt vector on the data bus. The interrupt vector transfer is independent of the other memory control signals. The interrupt vector is used to form the lower order bit of the memory address which contains the low order bit of the interrupt service routine entry point. The entry point vector is multiplied by 2 to obtain the address bit. Hex FF is the high order byte of the memory address which contains the entry point address least significant bit. The entry point address least significant bit is stored adjacent to the most significant bit. It should be noted that the interrupt vector values are equivalent to the trap opcodes. Thus the interrupt vector corresponding to interrupt 2 is hex FD as before.

The I/O Port A functions as an input port for the single chip mode, the partial expansion mode, the full expansion mode and the microprocessor mode. During the emulator mode, port A is disabled by the group decode circuitry as previously described.

Figure 19A:
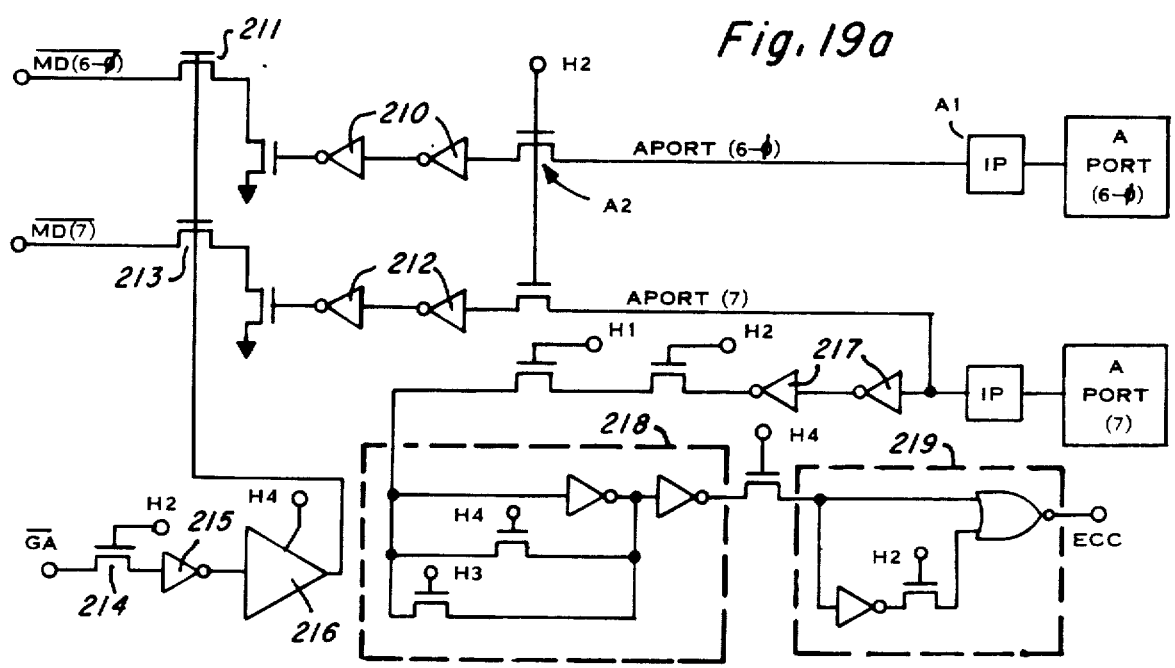
FIG. 19a is a schematic diagram of the A port.

Referring now to FIG. 19a, 7 bits of information are obtained from the seven pads of the "A Port" (bits 6-0). Actually there is a separate line of circuitry and pad for each separate bit that are identical to the one shown in FIG. 19a. For these 7 bits the signal is transmitted through standard input protection circuitry A-1 and through a device A-2 clocked by H2 and through dual inverters 210 and device 211 activated from the A port enable signal $\overline{GA}$ generated in the group decode circuitry 27, FIG. 16b. It should be noted that the A port enable $\overline{GA}$ signal is clocked through device 214 by H2 and transmitted through inverter 215 into a driver 216 clocked by H4. Bit 7 of A port is different from bits 0-6 and serves two purposes. The first purpose is merely as the 8th bit of information input just as bits 0-6 and thus is transmitted through similar circuitry, gated by H2, transmitted through inverters 212 and controlled by the A port enable signal $\overline{GA}$ from the group decode circuitry as in A port bits 6-0. In addition the bit 7 may be used as the event counter input (ECC) transmitted to the timer circuitry (see FIG. 18a). To this end, the event counter signal from A7 is transmitted through inverters 217 and further clocked by H1 and H2 into circuitry 218 which latches the occurrence of the event before it is further clocked by H4 through the NOR gate circuitry 219 to the timer FIG. 18a.

In the single chip mode, I/O port B serves as an 8 bit output port. In the partial expansion mode, the full expansion mode and microprocessor mode four bits of port B are external memory controls (CLOCKOUT, $\overline{ENABLE}$, $\overline{RDR}/$ and ALATCH). In the emulator mode port B bits 7-4 are external memory controls as before but bit 3 serves as an output for $\overline{INTA}$, the external interrupt acknowledge line. In these modes (all modes but the emulator mode) where the 4 bits are used for external memory controls, the other 4 bits are unused. If it is desired to emulate an 8-bit output port, circuitry has been included that allows the user to make use of the four unused bits of port B in combination with 4 bits built externally see FIG. 13b or i c. To output from port B, a port B address is output on port C (or port C and D depending on the mode) and external hardware places $\overline{MD}$ (3-0) or the bits 0-3 of the memory data bus into the port B bits 3-0 latches and onto the port B pads. The hardware further allows port C to output from the memory data bus bits 7-4 into the external 4 bits of port B (7-4). Bits 0-3 of the memory data bus, $\overline{MD}$ (3-0) is also output from port C, but are not used externally if the 4 internal B port bits are used. It should be noted that the data output on port B is latch data and thus can be read. To read port B the port B address is sent out to port C and hardware allows only the external port B bits 3-0 or the contents of their data latch to be read onto the memory bus, $\overline{MD}$ (3-0) and allows only port C bits 7-4 to be read from the external port B onto the memory data bus, $\overline{MD}$ (7-4).

Figure 19B:
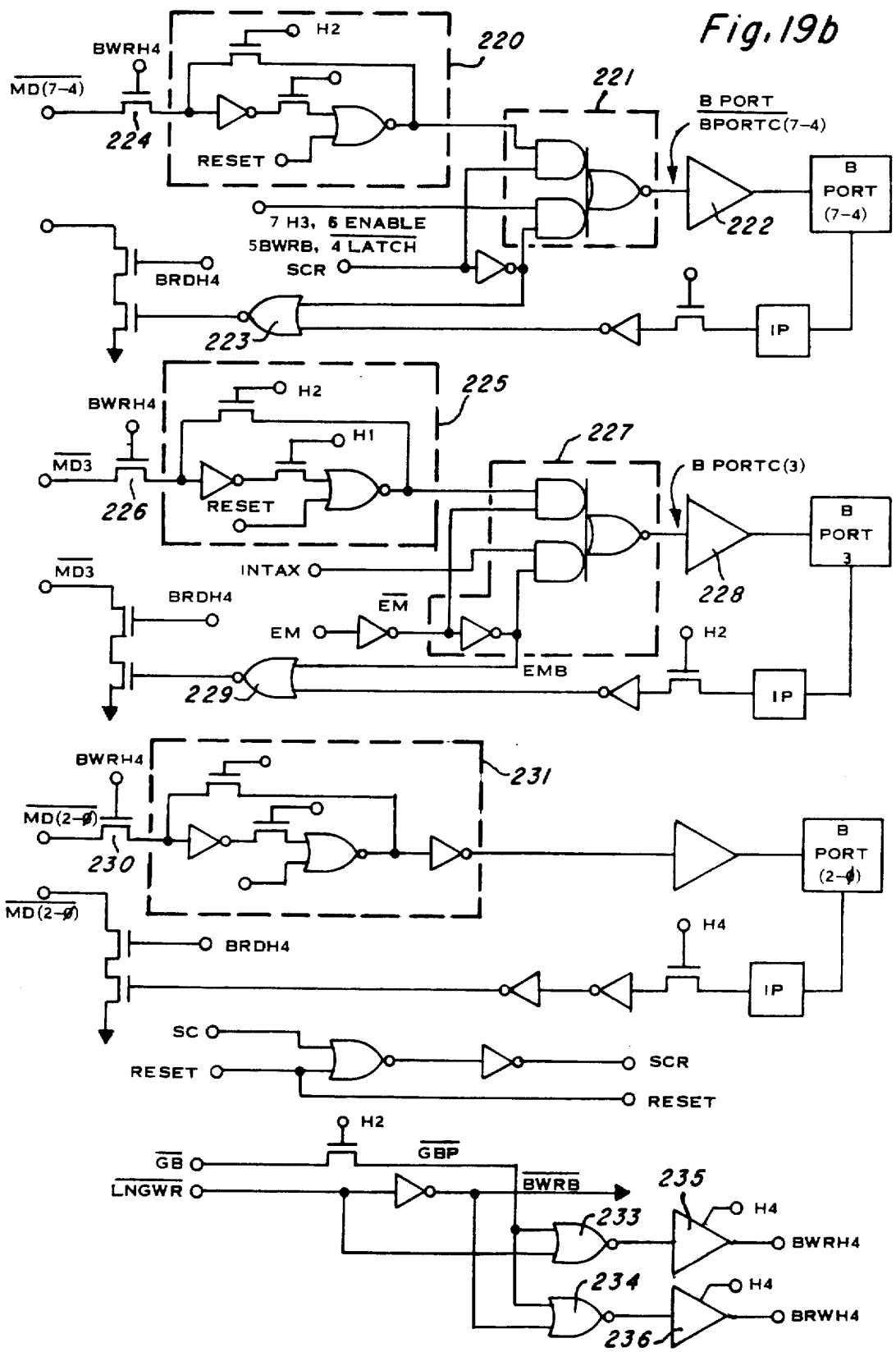
FIG. 19b is a schematic diagram of the B port.

Referring now to FIG. 19b, the pads for the B port bits 7-4 are shown and the associated circuitry is identical for each individual bit pad. The difference is for the circuit structure 221. The one of the four control lines are input into the NAND gate in the circuit structure 221 according to which bit position. The bit 7 input is the clock or phase H3, the bit 6 input is the enable line, the bit 5 input is the read/write signal (BWRB) and the bit 4 input is the $\overline{ALATCH}$ signal. $\overline{MD}$ (7-4), is clocked through device 224 by the port B write signal clocked by BWRH4. This line is then transmitted through the circuitry 220 as previously discussed which also includes the reset signal (RESET) for clearing the latch and then into complex gate 221 where it is combined with the single chip mode signal line, SCR, and the respective control line and through device 222 onto the pad for the respective bit. Also, the input can be taken from this bit pad through standard input protection through a device clocked by H2 and inverter and a NOR gate 223 which also receives an input from the single chip mode line. This input can then be read onto the memory bus as shown.

Bit 3 originates from the memory data bus line marked "$\overline{MD3}$" through a gating device 226 which is gated by the read/write line originating from the circuitry below in FIG. 19b through a series of gating devices and inverter NAND gate 225 which serves the purpose to gate the output by H2 or during a reset operation to change the gate to an input mode. For the output mode, the signal is then transmitted to the gate circuit 227 which receives inputs from the INTAX signal used during the emulator mode as a interrupt acknowledge and also the emulator mode signal EM. Since B3 serves this external acknowledge purpose in the emulator mode, the output from this complex gate 227 is then transmitted through device 228 onto the bit 3 pad. The input from the bit 3 pad is transmitted through the input protection circuitry, clocked by H2 through an inverter, then into a NOR gate 229 which also receives an input from the emulator mode in order to disable the input line during the emulator mode. The bits 2 to 0 of the data bus are input through a gating device 230 which is gated by BWRH4 from the circuitry contained below and through the circuitry 231 which clocks the output onto the respective pads and resets the port to input during a reset condition. The output signal during the output mode is then transmitted through device 232 onto the respective pad. The input from the respective pad is transmitted through the input protection circuitry as before, and gated by H2 through two inverters onto the memory data bus lines for bits 20 marked $\overline{MD}$ (2-0) and clocked by BRDH4. Note that SCR is the OR of the SC and the reset signal from the interrupt logic circuitry illustrated in FIG. 17a. $\overline{GB}$ and $\overline{LNGWR}$ are the B port enable line and read/write line from the memory control circuitry illustrated in FIG. 16c. $\overline{GB}$ is clocked by H2 and is an input to NOR gate 233 along with $\overline{LNGWR}$ which is then transmitted through device 235 clocked by H4 to produce the output or write signal BWRH4. In a similar manner, the $\overline{GBP}$ signal is input into NOR gate 234 together with the inverted $\overline{LNGWR}$ signal (BWRB) and then transmitted through device 236 clocked by H4 to produce the input or read signal BRDH4.

In the single chip mode, port C is an 8 bit I/O port with one address for data and one address for port direction. In other words, setting a bit in a port direction will determine whether that bit in port C is in input bit or an output bit. Specifically, setting the direction latch to "1" sets the corresponding bit position of the port into an output mode. The signals CDATAOUT from the memory control circuitry illustrated in FIG. 16c enables port C to output an address in the first state of a long read or write cycle and then if in an output mode, allows port C to output the contents of the data latch onto the port C bit pads.

Figure 19C:
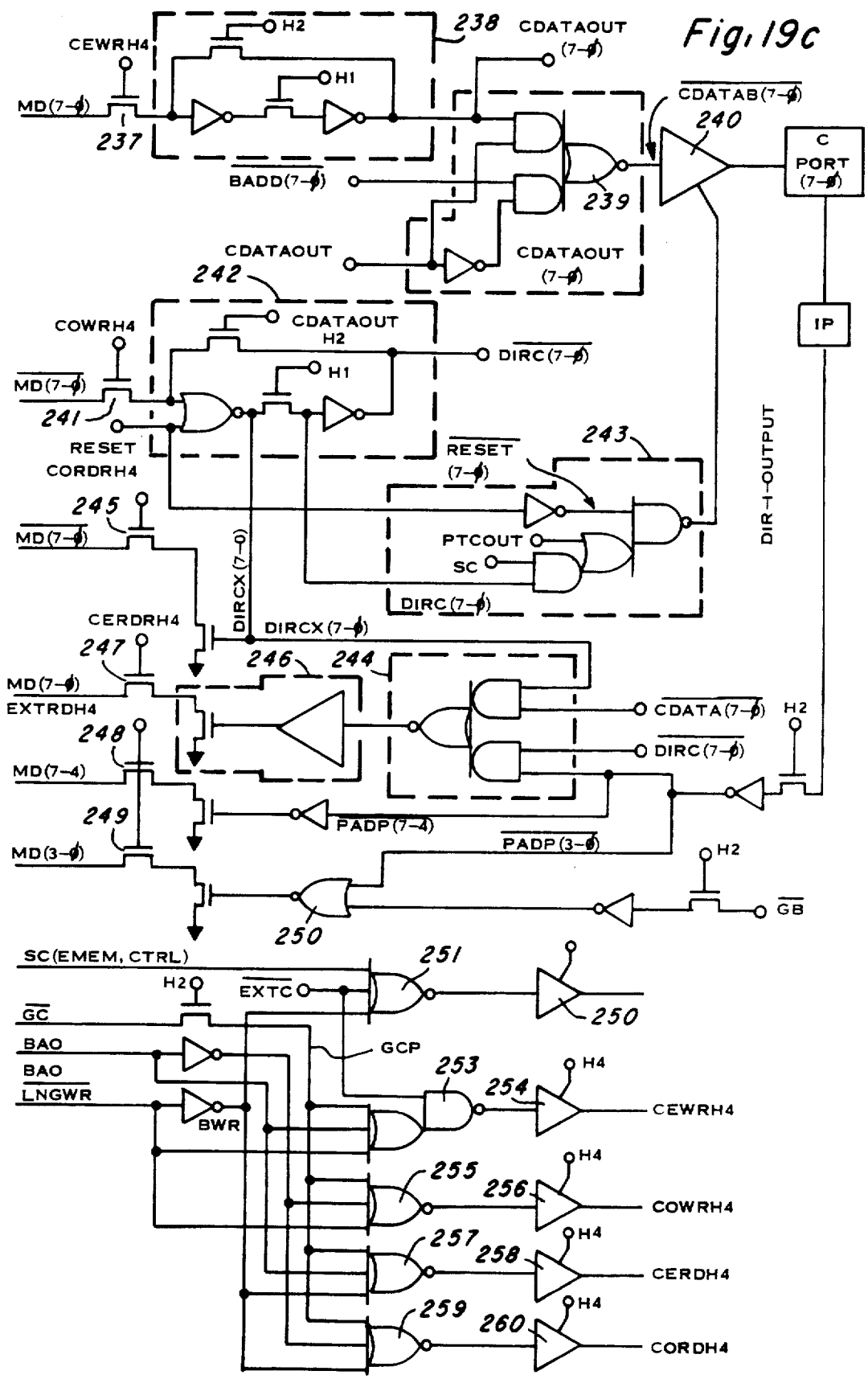
FIG. 19c is a schematic diagram of the C port.

Referring to FIG. 19c, the data from the memory bus, $\overline{MD}$ (7-0), is clocked through device 237 into the data latch circuitry 238. The data is then transmitted through the complex gate circuitry 239. Note that the circuitry 239 also receives the address, $\overline{BADD}$ (7-0), from the address bus together with the CDATAOUT signal from the memory control circuitry as previously mentioned. This data (or address) is then transmitted over the line marked CDATAB (7-0) to device 240 which also receives an enabling signal CHIZ. The enabled output is then transmitted to the C port pads. CHIZ originates from a circuitry containing a direction latch. The direction latch inputs originate from the memory bus on lines $\overline{MD}$ (7-0) clocked through gate 241 by COWRH4 into the direction latch circuitry 242. Note that the direction latch circuitry also receives the reset signal from the interrupt circuitry in FIG. 17a. This reset signal resets the data latch for each bit to the input mode as previously explained. The output of the data latch is $\overline{DIRC}$ (7-0). The reset signal is input into the complex circuitry 243 together with DIRC (7-0) from circuitry 242. Complex circuitry 243 also receives PTCOUT and SC. SC is the signal for the single chip mode and during the single chip mode PCOUT is disabled allowing the contents of the direction latch to determine the port direction. PTCOUT is enabled and places port C into an output mode in both states of a long write cycle and input mode in the first state of a long read cycle. PTCOUT originates from the memory control circuitry illustrated in FIG. 16c. Inputs from port C originate on the pad for the respective bits 7-0 and are transmitted through the input protection circuitry through a device clocked by H2 and an inverter into complex gate 244. The input data CPADP (7-0) is gated with $\overline{DIRC}$ (7-0) from the directional latch 242 and is read through device 246 onto the memory bus $\overline{MD}$ (7-0) clocked in by CERDH4 through device 247. Also the same line to the memory data MD bus can be used to write the data contained in the port C latch 238 which has been gated with the directional latch 242. This enables the user to read the data that is being output or stored in the output latch. The devices 248 and 249 are clocked by a signal EXTRDH4 which is used in any nonsingle chip mode to read the C port pads onto the memory data bus in state 2 of a long memory read cycle if a valid external address is provided. However, if port B address is provided, the port B enable signal GB is active and does not allow the bits 3-0 of Port C to be read onto the MD bus via NOR gate 250. These 4 bits are contained in the internal B port and read onto the memory data $\overline{MD}$ (3-0) as previously discussed. The EXTRDH4 signal is produced by the inputs from the memory control circuitry including SC, single chip mode, $\overline{EXTC}$ signifying an external operation, and $\overline{LNGWR}$ for the read/write operations. These signals are combined in NOR gate 251 and then clocked by H4 in device 252. CEWRH4 is the output signal for the data and is used to clock device 237 to transfer data from the memory data bus into the port C data latch 238. This signal originates from complex gate 253 which receives inputs from the single chip signal signifying a single chip mode and from the port C enable signal from the group decode circuitry (FIG. 16b), $\overline{GC}$, BA0 from the memory control circuitry illustrated in (FIG. 16c) signifying a data operation and $\overline{LNGWR}$ from the memory control circuitry in (FIG. 16c) signifying a write operation. The signal from 253 is then transmitted through device 254 clocked by H4. The directional or control information is written into the directional latch 242 through device 241 clocked by COWRH4. COWRH4 originates from NOR gate 255 which receives inputs from the decoder circuitry in a form of $\overline{GCP}$, $\overline{BA}$ indicating a write operation into this latch, and $\overline{LNGWR}$ signifying a write operation. The output from gate 255 is transmitted through device 256 clocked by H4. CERDH4 is the signal that enables the input data from port C to be input on the memory data bus, $\overline{MD}$ (7-0) through device 247 and originates from NOR gate 257 which receives inputs from $\overline{GCP}$, BA, and BWR which is the negated $\overline{LNGWR}$ signifying a read operation. The output of gate 258 is then transmitted through device 257, clocked by H4. CORDH4 is used to input the contents of the direction register 242 through device 245 onto the memory data bus $\overline{MD}$ (7-0) and originates from NOR gate 259 which receives inputs of $\overline{GC}$, $\overline{BA0}$ and BWR. The output of gate 259 is transmitted through device 260 clocked by H4.

In the single chip mode, port D is similar to port C in that it is a bidirectional I/O port that contains a directional latch and a "1" set in the latch for a corresponding bit the output mode. In a peripheral expansion mode, port D is the same as the single chip mode. However, in the microprocessor mode full expansion mode and emulator mode, port D serves as a 8 bit high address output.

Figure 19D:
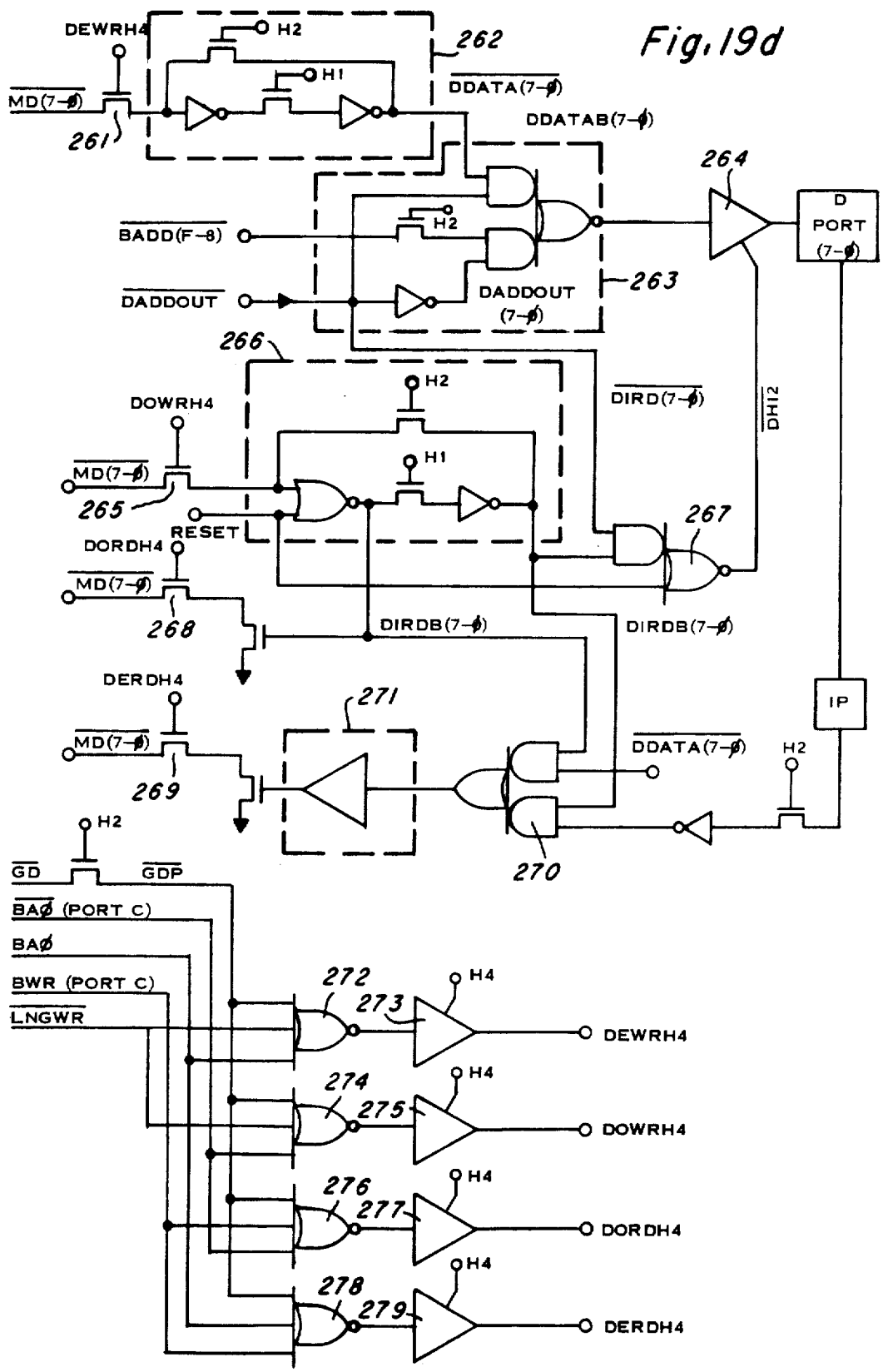
FIG. 19d is a schematic diagram of the D port.
Figure 19E:
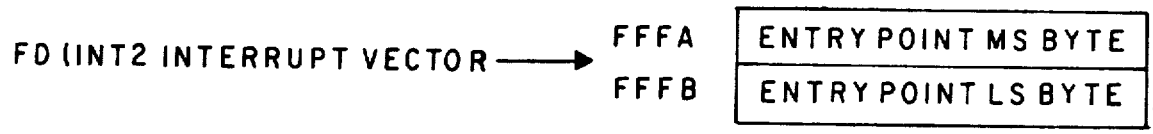
FIG. 19e is table illustrating interrupt generation for the system emulator mode.

Referring now to FIG. 19d, if port D is in the output mode, the output information is obtained from the memory data bus $\overline{MD}$ (7-0) and transmitted through device 261 clocked by signal DEWRH4. This information is transmitted through the data latch 262 into complex circuitry 263. The complex circuitry 263 also receives inputs from the data bus address line $\overline{BADD}$ (F-8) and $\overline{DADDOUT}$ which allows port D to output the high address, $\overline{BADD}$ (F-8), during the emulator mode, microprocessor mode and full expansion mode. The output from complex gate 263 is then transmitted through device 264 onto the D port pads. Similar circuitry exists for each of the 8 pads. Device 264 is disabled when that bit position is in the input mode determined by the direction latch 266. The contents of the direction latch for each of the bit positions is read from the memory bus $\overline{MD}$ (7-0) gated by DOWRH4 in device 265 into the direction latch 266. The output of the direction latch is transmitted into complex gate 267 which is combined with the reset signal also input into the directional latch together with the $\overline{DADOUT}$ signal previously discussed. The output of complex gate 267 is $\overline{DHIZ}$ which is the disabling signal for the device 264. Two sets of information can be read from port D. The actual data input from the port pad and the contents of the direction latch. The contents of the direction latch is output by the line marked DIRDB (7-0) through a device 268 gated by DORDH4. The input from the D port pads is transmitted through the input protection circuitry clocked by H2 and through an inverter into complex circuitry 270 which also receives the contents of the directional latch. This enables the user to read the input from the pad or the information contained in the output data latch 262 determined by the information for that bit contained in the direction latch. The output of this complex gate is then transmitted through device 271 and through device 269 clocked by the signal DERDH4 onto the memory data bus. The signal DEWRH4 (write data into data latch) used to gate device 261 is produced in NOR gate 272 from the enable D port signal, $\overline{GDP}$, $\overline{LNGWR}$ and BA0, all from the memory control circuitry illustrated in FIGS. 16b and 16c. BA0 signifies a write operation into the latches contained in port D. $\overline{LNGWR}$ signifies a write operation or output operation from port D. The output from gate 272 is transmitted through device 273 clocked by H4. DOWRH4 is the signal to enable device 265 to enable the user to write into the direction latch 266 and is produced in NOR gate 274 from signals $\overline{GDP}$, $\overline{BA0}$ and $\overline{LNGWR}$. The output of NOR gate 274 is transmitted through device 275 clocked by H4. DORDH4 is used to enable the output of the contents of the direction latch onto the memory bus and is produced in NOR gate 276 from the signal $\overline{GDP}$, BWR from port C and BA0. The output of NOR gate 276 is transmitted through device 277 clocked by H4. DERDH4 is the signal used to clock device 269 to allow the output of either the contents of the port D data latch 262 or the inputs from the port D input pad and originates from NOR gate 278 which has signals $\overline{GDP}$, BA0, and BWR. The output of gate 278 is transmitted through device 279 which is clocked by H4.

The buffers 222, 228, 232 for the B port may be conventional MOS output buffers, while the buffers 240 and 262 for the C and D ports may be conventional tri-state MOS output buffers.

Conclusion

The microcomputer described in detail herein is in the form of an N-channel silicon gate integrated circuit in a single silicon chip. However, features of the invention can be used in devices made by other processes such as metal gate, P-channel, CMOS, silicon-on-sapphire, and the like. Also, the memory 11 has been described as a ROM of the fixed-program type, but of course an electrically-programmable ROM or electrically-erasable ROM may be used. The ROM 11 is referred to as a program memory and the RAM 12 as a data memory, and these are the primary functions in many applications; it is understood, however, that "data" from the ROM 11 is used in some algorithms ("data" being numerical constants and the like), and that the device can execute instruction codes from the RAM 12, or program blocks can be down-loaded into RAM 12 from external tape or disc drive, or from a telephone coupler, for example, and executed from RAM 12. Furthermore, additional control lines and functions such as READY, HOLD, bus-status code, etc. as in said application Ser. No. 210,109 may be used in a device having features of the invention.

While this invention has been described with reference to an illustrative embodiment, this description is not intended to be construed in a limiting sense. Various modifications of the illustrative embodiment, as well as those embodiments of the invention, will be apparent to persons skilled in the art upon reference to this description. It is therefore contemplated that the appended claims will cover any such modifications or embodiments as fall within the true scope of the invention.

TABLE A

THE INSTRUCTION SET

ARITHMETIC INSTRUCTIONS
ADC: ADD WITH CARRY                Opcode: 0XXX1001
Definition: Add the source operand to the destination
operand (both from RAM 12) with carry-in and store the
result at the destination address in RAM 12. Set status bit
C to '1' on carry-out of (s) + (d) + C. Set N and Z on result.
Application: ADC is used to implement multi-precision
addition of signed or unsigned integers.
ADD: ADD                           Opcode: 0XXX1000
Definition: Add the source operand to the destination
operand and store the result at the destination address in
RAM 12. Set status bit C to '1' on carry-out of (s) + (d).
Set N and Z on result. Applications: ADD is used to add
two bytes, and may be used for signed two's complement or
unsigned addition.
CMP: COMPARE                       Opcode: 0XXX1101
Definition: Subtract the source operand from the destination
operand; do not store the result. Set status bit C to '1'
if (d) is logically greater than or equal to (s). Set N to
'1' if (d) is arithmetically less than (s). Set Z to '1' if
(d) is equal to (s). Applications: CMP is used to compare
the destination operand to the source operand. The N bit is
set to '1' if (d) is less than (s), interpreting (d) and (s)
as two's complement integers. The C bit is set to '1' if
(d) is greater than or equal to (s), interpreting (d) and
(s) as unsigned integers. For either signed or unsigned
interpretations, the Z bit is set to '1' if (d) and (s) are
equal. The status bits are set upon the result of computing
(d)-(s). N and Z are set on the result of this subtraction.
The carry bit C is a "borrow" bit--i.e. it is "0" if (d) is
logically less than (s). Negative numbers are considered
arithmetically less than, but logically greater than, positive
numbers. The CMP instruction can be used with the conditional
branch instructions to branch on the comparison between the
destination operand (D) and the source operand(S).
DAC: DECIMAL ADD WITH CARRY        Opcode: 0XXX1110
Definition: Add the source operand to the destination
operand with carry in and store the result at the destination
address in RAM 12. Each operand is a two digit integer

TABLE A-continued
THE INSTRUCTION SET using BCD format. Set status bit C to '1' if value of (s) + (d) + C is equal to or greater than 100. Applications: DAC is used to add bytes in binary-coded decimal (BCD) form. Each byte is assumed to contain two BCD digits. Operation of DAC is undefined for non-BCD operands. DAC with an immediate operand of zero value is equivalent to a conditional increment of the destination operand. The DAC instruction automatically performs a decimal adjust of the binary sum of (s) + (d) + C. The carry bit is added to facilitate adding multi-byte BCD strings, and so the carry bit must be clearing before execution of the first DAC instruction.

DEC: DECREMENT                       Opcode: 1XXX0010
Definition: Subtract one from a copy of the operand and store the result in the operand address. Set status bit C to '1' if (d) decrements from 00 to FF; '0' otherwise. N: set on result. Z: set on result.

DSB: DECIMAL SUBTRACT
WITH BORROW                          Opcode: 0XXX1111
Definition: Subtract the source operand and borrow-in from the destination operand and store the result at the destination address. Each operand is a two digit integer using BCD format. Set status bit C to '1' if no borrow required, '0' if borrow required. Set N, Z on result. Applications: DSB is used for multiprecision decimal BCD subtraction. A DSB instruction with an immediate operand of zero value is equivalent to a conditional decrement of the destination operand. The carry status bit functions as a borrow bit, so if no borrow-in is required, the carry bit should be set to '1'. This can be accomplished by executing the SETC instruction.

INC: INCREMENT                       Opcode: 1XXX0011
Definition: ADD one to a copy of the operand and store the result at the operand address. Set status bits C to '1' if (d) incremented from FF to 00; '0' otherwise. Set N, Z on result.

SBB: SUBTRACT WITH BORROW            Opcode: 0XXX1011
Definition: Subtract the source operand and borrow-in from the destination operand and store the result at the destination address in RAM 12. Set status bits C to '1' if no borrow is required, '0' otherwise. Set N, Z on result. Applications: SBB is used for multiprecision two's complement subtract. A SBB instruction with an immediate operand of zero value is equivalent to a conditional decrement of the destination operand. With (s) = 0, if C = '0', then (d) is decremented, otherwise it is unchanged. A borrow is required if the result is negative, in this case, the carry bit is set to '0'.

SUB: SUBTRACT                        Opcode: 0XXX1010
Definition: Subtract the source operand from the destination operand and store the result at the destination address. Set status bit C to '1' if result equal to or greater than 0; '0' otherwise. Set N, Z on result. Applications: SUB is used for two's complement subtraction. The carry bit is set to '0' if a borrow is required, i.e. if the result is negative.

JUMP AND BRANCH INSTRUCTIONS

BTJO: BIT TEST AND JUMP IF ONE       Opcode: 0XXX0110
Definition: Logically AND the source and destination operands and do not copy the result. If the result is non-zero, then perform a program counter relative jump using the offset operand. The program counter is set to the first byte AFTER the BTJO instruction before the offset is added. Set status bits to zero. Set Z, N on (s) AND (D). Applications: The BTJO instruction is used to test for at least one bit which has a corresponding one bit in each operand. For example, the source operand can be used as a bit mask to test for one bits in the destination address.

BTJZ: BIT TEST AND
JUMP IF ZERO                         Opcode: 0XXX0111
Definition: Logically AND the source and the inverted destination operand; do not copy the result. If the result is not equal to zero, then perform a program counter relative jump using the offset operand. The program counter is incremented to the instruction after the BTJZ instruction before the offset is added. Set status bits to '0'. Set Z, N on (s) AND (NOT d). Applications: The BTJZ instruction is used to test for at least one zero bit in the destination operand which has a corresponding one bit in the source operand.

BR: BRANCH                           Opcode: 1XXX1100
Definition: Branch directly to location specified by the 16-bit addressing mode. The effective address is obtained using any one of the three extended addressing modes. Set no status bits on direct and indirect addressing. For indexed addressing, C, N, Z set on addition of B and the low address byte.

DJNZ: DECREMENT REGISTER
AND JUMP IF NON ZERO                 Opcode: 1XXX1010
Definition: Decrement the operand the copy result to operand address. If result is non-zero, then take relative jump. Set status bit C to '1' if (d) decrements from 00 to FF; '0' otherwise. Set Z, N on resulting (d). Applications: The DJNZ instruction is used for looping control.

JC (etc.): JUMP ON CONDITION         Opcode: 11100XXX
Definition: If tested condition is true, PC + offset is loaded into PC. No status bits are affected. Execution Results: The following table lists each conditional jump instruction, and the condition in which it will cause a jump to the location specified in the operand field.

| | Condition for Jump (Status Bit Values) | | | |
|---|---|---|---|---|
| Mnemonic | Carry | Negative | Zero | Instruction |
| JC | 1 | x | x | Jump if Carry |
| JN | x | 1 | x | Jump if Negative |
| JNC | 0 | x | x | Jump if No Carry |
| JNZ | x | x | 0 | Jump if NonZero |
| JP | x | 0 | 0 | Jump if Positive |
| JPZ | x | 0 | x | Jump if Positive or Zero |
| JZ | x | x | 1 | Jump if Zero |

Applications: The Jump on Condition instructions may be used after a CMP instruction to branch according to the relative values of the operands tested. After MOV, MOVP, LDA, or STA operations, a JZ or JNZ may be used to test if the value moved was equal to zero. JN and JPZ may be used in this case to test the sign bit of the value moved.

JMP: JUMP UNCONDITIONAL              Opcode: 11100000
Definition: Jump unconditionally using program relative addressing. PC plus offset is loaded into PC. No status bits are affected. Target address is within $-127$ to $+128$.

LOAD AND MOVE INSTRUCTIONS

LDA: LOAD A REGISTER                 Opcode: 1XXX1010
Definition: Copy the contents of the source operand address to and A register; addressing modes include direct, indexed, and indirect. Set status bit C to '0'. Z, N are set on value loaded. Applications: The LDA instruction is used to read values stored in extended memory. The direct addressing provides an efficient means of directly accessing a variable in general memory. Indexed addressing provides an efficient table look-up capability. Indirect addressing allows the use of very large look-up tables and the use of multiple memory pointers since any pair of file registers can be used as the pointer. The 'decrement register and jump if non-zero' instruction (DJNZ) can be used with either indexed or indirect addressing to create fast and efficient program loops or table searches.

LDSP: LOAD STACK POINTER             Opcode: 00001101
Definition: Copy the contents of the B register to the stack pointer register. No status bits are affected. Applications: LDSP is used to initialize the stack pointer.

LDST: LOAD STATUS REGISTER
Definition: Copy the contents of the A register to the Status register. No status bits are affected. Applications: This instruction may be used to restore a saved copy of the status register.

MOV: MOVE                            Opcodes: 0XX0010, 110X000X
Definition: Copy the source operand to the destination operand address. Set status bit C to '0'. Z, N are set on value loaded. Applications: MOV is used to transfer values in the register file. Immediate values may be loaded into registers directly from the instruction.

STA: STORE A REGISTER                Opcode: 10XX1011
Definition: Copy the contents of the A register to the operand address; addressing modes include direct, indexed, and indirect. Set status bits C to '0'. N, Z are set on value loaded. Application: The STA instruction is used to read values not stored in the register or peripheral files. The direct addressing provides an efficient means of directly accessing a variable in general memory. Indexed addressing provides an efficient table look-up capability for most applications. Indirect addressing allows the use of very

TABLE A-continued
THE INSTRUCTION SET large look-up tables and the use of multiple memory pointers since any pair of file registers can be used as the pointer. The 'decrement register and jump if non-zero' instruction (DJNZ) can be used with either indexed or indirect addressing to create fast and efficient program loops or table searches.
STSP: STORE STACK POINTER    Opcode: 00001001
Definition: Copy the contents of the stack pointer register to the B register. No status bits are affected. Applications: LDSP is used to save the stack pointer if required. This instruction can be used to test the stack size.
SWAP: NIBBLE SWAP    Opcode: 1XXX0111
Definition: Swap the least significant nibble (4 bits) of the operand with the most significant nibble and copy the result to the operand address. The SWAP instruction is equivalent to four consecutive rotate left (RL) instructions with the carry status bit set equal to the least significant bit of the result. Set status bit C to Bit 0 of result. Z, N are set on result. Applications: SWAP is used to manipulate four bit operands, especially during packed BCD operations.
XCHB: EXCHANGE WITH
B REGISTER    Opcode: 11010110
Definition: Copy the operand to the B register and then copy the original operand value to the B register. Set status bit C to '0'. Z, N are set on original contents of B. Applications: XCHB is used to exchange a file register with the B register without going through an intermediate location. The XCHB instruction with the B register as the operand can be used to test the B register contents for sign and equality with zero, like TSTB instruction.
LOGICAL INSTRUCTIONS
AND: AND    Opcode: 0XXX0011
Definition: Logically "and" the source operand to the destination operand and store the result at the destination address. Set status bit C to '0'. N, Z are set on result. Applications: AND is used to perform a logical AND of the two operands.
CLR: CLEAR    Opcode: 1XXX0101
Definition: Replace the operand value with all zeroes. Set status bits C and N to '0'. Z is set to '1'. Applications: CLR is used to clear or initialize any file register including the A and B registers.
INV: INVERT    Opcode: 1XXX0100
Definition: Invert or complement all bits in the operand. Set status bit C to '0'. N, Z are set on result. Applications: INV performs a logical "or" one's complement of the operand. A two's complement of the operand can be made by following the INV instruction with an increment (INC).
OR: OR    Opcode: 0XXX0100
Definition: Logically "OR" the source operand to the destination operand and store the result at the destination address. Set status bits C to '0'. N, Z are set on result. Applications: OR is used to perform a logical OR of the two operands.
XOR: EXCLUSIVE OR    Opcode: 0XXX0101
Definition: Logically "exclusive or" the source operand to the destination operand and store the result at the destination address. Set status bit C to '0'. N, Z are set on results. Applications: XOR is used to perform a bit wise exclusive OR of the operands. The XOR instruction can be used to complement a bit(s) in the destination operand.
ROTATES
RL: ROTATE LEFT    Opcode: 1XXX1110
Definition: Shift the operand to the left one bit position and fill the least significant bit and the carry status bit with the value of the original most significant bit; copy the result to destination address. Set status bits C to Bit(7) of original operand. N, Z are set on result. Applications: An example of the RL instruction is: If the B register contains the value 93, then the RL instruction changes the contents of B to 27 and sets the carry status bits. Numbers are in hex.
RLC: ROTATE LEFT
THROUGH CARRY    Opcode: 1XXX1111
Definition: Shift the operand to the left one bit position and fill the least significant bit with the original value of the carry status bit; copy the result to the destination address. Move the original operand most significant bit to the carry status bit. Execution Results: Bit(n)→Bit(n + 1); Carry→Bit (0); Bit(7)→Carry. Set status bit C to bit(7) of operand. N, Z are set on result. Applications: An example of the RLC instruction is: if the B register contains the value 93 and the carry status bit is a zero, then the RLC instruction changes the operand value to 26 and carry to one. Numbers are in hex.
RR: ROTATE RIGHT    Opcode: 1XXX1100
Definition: Shift the operand to the right one bit position and fill the most significant bit and the carry status bit with the value of the original least significant bit; copy the result to operand address. Execution Results: Bit(n + 1)→Bit(n);Bit(0)→carry also. Set status bit C to Bit(0) of operand. N, Z ale set on result. Applications: An example of the RR instruction is: If the B register contains the value 93, then the RR instruction changes the contents of B to C9 and sets the carry status bit.
RRC: ROTATE RIGHT
THROUGH CARRY    Opcode: 1XXX1101
Definition: Shift the operand to the right one bit position and fill the most significant bit from the carry status bit. Fill the carry status bit with the value of the original least significant bit. Set status bit C to Bit(0) of operand. N, Z are set on result. Applications: An example of the RRC instruction is: If the B register contains the value 93 (hex) and the carry status bit is zero, then the RRC instruction changes the operand value to 49 (hex) and sets the carry status bit.
SUBROUTINE CALLS
CALL: CALL    Opcode: 1XXX1110
Definition Push the current PC on the stack and branch to the effective operand address. For Indirect and Direct addressing mode there is no effect on Status bits. For Indexed mode, C, N, Z are set on addition of B and low address byte. Applications: CALL is used to invoke a subroutine. The PUSH and POP instructions can be used to save, pass, or restore status or file register values.
RETS: RETURN FROM
SUBROUTINE    Opcode: 00001010
Definition: Pull the top two bytes from the stack and branch to the resulting 16-bit address. No status bits are affected. Applications: RETS is typically the last instruction in a subroutine. RETS results in a branch to the location immediately following the subroutine call instruction.
TRAP: SUBROUTINE TRAP    Opcodes: 1111XXXX, 11101XXX
Definition: Push the current PC on the stack and branch to the subroutine using a 16-bit address stored in high memory. No status bits are affected. Application: TRAP is used to invoke a subroutine. The PUSH and POP instructions can be used to save, pass, or restore status or file register values. There are 24 TRAP vectors which correspond to TRAP 0 through TRAP 24. The TRAP vectors are stored in memory in preselected vector address ending in FFFF. TRAP 1, TRAP 2, and TRAP 3 correspond to the hardware-invoked interrupts 1, 2, and 3 respectively. The hardware-invoked interrupts, however, push the program counter and the status register before branching to the interrupt routine, while the TRAP instruction pushed only the program counter. TRAP 0 will branch to the same code executed for a system reset.
STACK INSTRUCTIONS
POP: POP FROM STACK    Opcode: 1XXX1001
Definition: Remove the top entry from the stack and copy to the operand address. Decrement the stack pointer to point to the new top-of-stack entry. Set status bit to '0'. N, Z are set on value popped. Applications: The data stack can be used to save or to pass operands, especially during subroutines and interrupt service routines. The POP instruction pulls an operand from the stack.
PUSH: PUSH ON STACK    Opcode: 1XXX1000
Definition: Increment the stack pointer and place the operand value on the stack as the new top-of-stack. Set status bit C to '0'. N, Z are set on value pushed. Applications: The data stack can be used to save or to pass operands, especially during subroutines and interrupt service routines. The PUSH instruction places an operand on the stack.
CONTROL INSTRUCTIONS
CLRC: CLEAR CARRY    Opcode 10110110
Definition: Clear the carry status; the sign and zero flags are determined by the contents of the A register. Set status bit C to '0'. N, Z are set on value of A register. Applications: CLRC is used to clear the carry flag if required before an arithmetic or rotate instruction. Note

TABLE A-continued
THE INSTRUCTION SET that the logical and move instructions typically clear the carry status. The CLRC instruction is equivalent to the TSTA instruction.

DINT: DISABLE INTERRUPTS  Opcode: 00000110
Definition: Clear the interrupt enable flag in the status thus disabling further interrupts. Set status bit I to '0'. C, N, Z are set to '0'. Applications: DINT is used to turn off all interrupts simultaneously. Since the interrupt enable flag is stored in the status register, the POP ST, LDST, and RETI instructions may reenable interrupts even though a DINT instruction has been executed. During the interrupt service, the interrupt enable bit is automatically cleared after the old status register value has been pushed onto the stack.

EINT: ENABLE INTERRUPTS  Opcode: 00000101
Definition: Set the interrupt enable flag in the status thus enabling interrupts. Set status bit I to '1'. C, N, A set to '1'. Applications: EINT is used to turn on all enabled interrupts simultaneously. Since the interrupt enable flag is stored in the status register, the POP ST, LDST, and RETI instructions may disable interrupts even though a TINT instruction has been executed. During the interrupt service, the interrupt enable bit is automatically cleared after the old status register value has been pushed onto the stack. Thus, the EINT instruction must be included inside the interrupt service routine to permit nested or multilevel interrupts.

IDLE: IDLE UNTIL INTERRUPT  Opcode: 00000001
Definition: Suspend further instruction execution until an interrupt or a reset occurs. No status bits are affected. Applications: IDLE is used to allow the program to suspend operation until either an interrupt or reset occurs. The programmer assures that the interrupt enable status bit (and individual interrupt enable bits in the I/O control register) are set before executing the IDLE instruction.

NOP: NO OPERATION  Opcode: 00000000
Definition: Perform no operation. No status bits are affected. Execution results in PC + 1 loaded into PC. Applications: NOP is a null instruction which can be used as a pad instruction.

RETI: RETURN FROM INTERRUPT  Opcode: 00001011
Definition: Pull the top two bytes from the stack to form the return address, pull the status from the top of stack, and branch to the return address. No status bits are affected because ST register is loaded from stack. Applications: RETI is typically the last instruction in a interrupt service routine. RETI restores the status register to its state immediately before the interrupt occurred and branches back to the program at the instruction boundary where the interrupt occurred.

SETC: SET CARRY  Opcode: 00000111
Definition: Set the carry and zero status flags and clear the sign status flag. Set status bit C to '1'. N is set to '0'. Z is set to '1'. Applications: SETC is used to set the carry flag if required before an arithmetic or rotate instruction.

TSTA: TEST A REGISTER  Opcode: 10110000
Definition: Set the status bits on the value of the A register. Set status bit C to '0'. Z, N are set on value in A register. Applications: This instruction can be used to set the status bits according to the value in the A register. It is equivalent to the TSTA instruction. It may be used to clear the carry bit.

TSTB: TEST B REGISTER  Opcode: 11000001
Definition: Set the status bits on the value of the B register. Set status bit C to '0'. Z, N are set on value in B register. Applications: This instruction can be used to set the status bits according to the value in the B register. It may be used to clear the carry bit.

PERIPHERAL FILE INSTRUCTIONS

BTJOP: BIT TEST AND
JUMP IF ONE - PERIPHERAL  Opcode: 10XX0110
Definition: Logically AND the source and destination operands and do not copy the result. If the result is non-zero, then perform a program counter relative jump using the offset operand. The program counter is set to the first byte AFTER the BTJO instruction before the offset is added. Set Status bit C to zero. Z, N are set on (s) AND (D). Application: The BTJOP instruction is used to test for at least one bit position which has a corresponding '1' in each operand. For example, the source operand can be used as a bit mask to test for one bits in the destination peripheral file register, i.e. test bit 0 of the input A port, and jump if it is a '1'

BTJZP: BIT TEST AND
JUMP IF ZERO - PERIPHERAL  Opcode: 1000X01
Definition: Logically AND the source and inverted destination operands, and do not copy the result. If the result is non-zero, then perform a program counter relative jump using the offset operand. The program counter is set to the first byte AFTER the BTJO instruction before the offset is added. Set status bit C to zero. Z, N are set on (s) AND (NOT D). Applications: Similar to STJOP.

ANDP: AND-PERIPHERAL  Opcode: 10XX0011
Definition: Logically AND the source and the peripheral file register specified in the destination, and place the result in the PF register. The source may be the A or B registers, or an immediate value. Set status bit C to '0'. Z, N are set on result. Applications: ANDP may be used to clear an individual bit in the peripheral file. Thus, it may be used to set an individual output line to zero. This may be done with an ANDP instruction where the source is an immediate operand that serves as a mask field. For example, bit 5 of the I/O control register (PO) is cleared, thus disabling level 3 interrupts.

MOVP: MOVE TO/FROM
PERIPHERAL  Opcode: 10XX0010
Definition: Read or write data to the peripheral file. The destination is read before the source is written into it. Set status bits C to '0'. Z, N are set on value moved. Applications: MOVP is used to transfer values to and from the peripheral file. This may be used to input or output 8-bit quantities on the I/O ports. For examples, MOVP P6,A reads the data on input port B. The instruction MOVP B,P4 outputs the contents of the B register onto I/O port A. The peripheral file also contains control registers for the interrupt lines, the I/O ports, and the timer controls. A peripheral file port is read during ALL peripheral file instructions including output operations such as 'MOV A, P1'. If this read is undesirable as a result of hardware concerns, then a STA instruction should be used, using the memory-mapped address of the peripheral register.

ORP: OR-PERIPHERAL  Opcode: 10XX0100
Definition: Logically OR the source operand to the destination peripheral file register and write the result to the peripheral file register. The source may be the A or B registers, or an immediate value. Set status bit C to '0'. N, Z are set on result. Applications: ORP is used to perform a logical OR of the source operand with a peripheral file location, and write the result back to the peripheral file. May be used to set an individual bit in the I/O control register, for example.

XORP: EXCLUSIVE-OR
PERIPHERAL FILE  Opcode: 10XX0101
Definition: Logically exclusive-or the source operand to the peripheral file register specified, and write the result to the peripheral file register. Execution Results: (s) XOR (d)→(d). Set status bit C to '0'. N, Z are set on result. Applications: XORP is used to perform a bit-wise exclusive OR of the operands. The XORP instruction can be used to complement a bit(s) in the destination PF register. For example, invert bit 0 of P9, which is the port C data direction register, thus reversing the direction of the bit

TABLE B

| MICROINSTRUCTIONS | | | | | |
|---|---|---|---|---|---|
| CROM 17 ADDRESS | | | CROM 17 ADDRESS | | |
| HEX | BINARY | MICRO-INSTRUCTION | HEX | BINARY | MICRO-INSTRUCTION |
| 00 | 00000000 | IAQ-0 | 30 | 00110000 | DAC-1 |

TABLE B-continued
MICROINSTRUCTIONS

| CROM 17 ADDRESS | | | CROM 17 ADDRESS | | |
|---|---|---|---|---|---|
| HEX | BINARY | MICRO-INSTRUCTION | HEX | BINARY | MICRO-INSTRUCTION |
| 01 | 00000001 | IDLE-0 | 31 | 00110001 | MOVD-1 |
| 02 | 00000010 | INT-2 | 32 | 00110010 | RESET-2 |
| 03 | 00000011 | INT-4 | 33 | 00110011 | MOVD-2 |
| 04 | 00000100 | MPY-1 | 34 | 00110100 | MPY-7 |
| 05 | 00000101 | EINT-0 | 35 | 00110101 | MPY-6 |
| 06 | 00000110 | DINT-0 | 36 | 00110100 | IAQ-1 |
| 07 | 00000111 | SETC-0 | 37 | 00110101 | MOVD-3 |
| 08 | 00001000 | POPST-0 | 38 | 00110000 | IDLE-1 |
| 09 | 00001001 | STSP-0 | 39 | 00110001 | INT-3 |
| 0A | 00001010 | RETS-0 | 3A | 00111010 | RETS-2 |
| 0B | 00001011 | RETI-0 | 3B | 00111011 | RETI-2 |
| 0C | 00001100 | TGA-6 | 3C | 00111000 | DSB-1 |
| 0D | 00001101 | LDSP-0 | 3D | 00111101 | AtoPPL-4 *(3) |
| 0E | 00001110 | PUSHST-0 | 3E | 00111110 | RJMP-4 |
| 0F | 00001111 | LDST-0 | 3F | 00111111 | RJMP-5 |
| 10 | 00010000 | MOVD-4 | 40 | 01000000 | DECD-1 |
| 11 | 00010001 | MOVD-5 | 41 | 01000001 | MISCGRP-0 |
| 12 | 00010010 | ST-0 | 42 | 01000010 | DECD-2 |
| 13 | 00010011 | AND-0 | 43 | 01000011 | RFtoA-0 |
| 14 | 00010100 | OR-0 | 44 | 01000100 | DRJN-1 |
| 15 | 00010101 | XOR-0 | 45 | 01000101 | ITOA-0 |
| 16 | 00010110 | STH-0 | 46 | 01000110 | RETS-1 *(2) |
| 17 | 00010111 | BTL-0 | 47 | 01000111 | RFtoB-0 |
| 18 | 00011000 | ADD-0 | 48 | 01001000 | INT-5 |
| 19 | 00011001 | ADC-0 | 49 | 01001001 | RFtoRF-0 |
| 1A | 00011010 | SUB-0 | 4A | 01001010 | MPY-5 |
| 1B | 00011011 | SBB-0 | 4B | 01001011 | ItoB-0 |
| 1C | 00011100 | MPY-0 | 4C | 01001100 | TGA-7 |
| 1D | 00011101 | CMP-0 | 4D | 01001101 | BtoA-0 *(2) |
| 1E | 00011110 | DAC-0 | 4E | 01001110 | INT-1 |
| 1F | 00011111 | DSB-0 | 4F | 01001111 | ItoRF-0 |
| 20 | 00100000 | STA-0 | 50 | 01010000 | AtoPPL-0 |
| 21 | 00100001 | STB-0 | 51 | 01010001 | DIRtoA-0 *(2) |
| 22 | 00100010 | DEC-0 | 52 | 01010010 | AtoPPL-1 *(3) |
| 23 | 00100011 | INC-0 | 53 | 01010011 | INDtoA-0 *(3) |
| 24 | 00100100 | INV-0 | 54 | 01010100 | ItoPPL-0 |
| 25 | 00100101 | CLR-0 | 55 | 01010101 | INDXtoA-0 |
| 26 | 00100110 | XCHB-0 | 56 | 01010110 | SglAS-0 |
| 27 | 00100111 | SWAP-0 | 57 | 01010111 | SglA-O |
| 28 | 00101000 | PUSH-0 | 58 | 01011000 | SglBS-0 |
| 29 | 00101001 | POP-0 | 59 | 01011001 | SglB-0 |
| 2A | 00101010 | DRJN-0 | 5A | 01011010 | SglRFS-0 |
| 2B | 00101011 | DECD-0 | 5B | 01011011 | SglRF-0 |
| 2C | 00101100 | RR-0 | 5C | 01011100 | RJMP-0 |
| 2D | 00101101 | RRC-0 | 5D | 01011101 | TGC-0 |
| 2E | 00101110 | RL-0 | 5E | 01011110 | TGB-0 |
| 2F | 00101111 | RLC-0 | 5F | 01011111 | TGA-0 |
| 80 | 10000000 | ItoPPL-01 | E0 | 11100000 | IAQ-2 |
| 81 | 10000001 | RFtoRF-4 *(3) | E1 | 11100001 | INT-0 |
| 82 | 10000010 | AtoPPL-2 *(2) | E2 | 11100010 | MPY-2 |
| 83 | 10000011 | RFtoA-2 | E3 | 11100011 | AtoPPL-3 *(3) |
| 84 | 10000100 | RFtoA-1 *(8) | E4 | 11100100 | DAC-2 |
| 85 | 10000101 | ItoAO-2 | E5 | 11100101 | TGA-4 |
| 86 | 10000110 | RFtoRF-5 *(2) | E6 | 11100110 | DSB-2 |
| 87 | 10000111 | RFtoB-2 | E7 | 11100111 | INDXtoA-6 |
| 88 | 10001000 | DIRtoA-1 *(2) | E8 | 11101000 | CMPL-1 |
| 89 | 10001001 | RFtoRF-2 | E9 | 11101001 | TGA-1 |
| 8A | 10001010 | MPY-4 | EA | 11101010 | MPY-3 |
| 8B | 10001011 | RFtoB-3 *(2) | EB | 11101011 | JMPL-1 |
| 8C | 10001100 | DRJN-3 | EC | 11101100 | RESET-1 |
| 8D | 10001101 | DRJN-2 | ED | 11101101 | TGA-3 |
| 8E | 10001110 | STAL-2 | EE | 11101110 | TGA-5 |
| 8F | 10001111 | RFtoRF-3 *(3) | EF | 11101111 | TGA-2 |
| 90 | 10010000 | PUSH-1 | F0 | 11110000 | LDAP-0 |
| 91 | 10010001 | DIRtoA-4 | F1 | 11110001 | LDBP-0 |
| 92 | 10010010 | XCHB-1 | F2 | 11110010 | STP-0 |
| 93 | 10010011 | INDtoA-2 | F3 | 11110011 | ANDP-0 |
| 94 | 10010100 | PUSHST-1 | F4 | 11110100 | ORP-0 |
| 95 | 10010101 | INDXtoA-5 | F5 | 11110101 | XORP-0 |
| 96 | 10010110 | SWAP-1 | F6 | 11110110 | BTHP-0 |
| 97 | 10010111 | INDtoA-3 | F7 | 11110111 | BTLP-0 |
| 98 | 10011000 | SWAP-2 | F8 | 11111000 | MOVD-0 |
| 99 | 10011001 | TGA-8 | F9 | 11111001 | TEST-0 |
| 9A | 10011010 | SglRFS-2 | FA | 11111010 | LDAL-0 |
| 9B | 10011011 | SglFR-2 | FB | 11111011 | STAL-0 |
| 9C | 10011100 | RJMP-3 | FC | 11111100 | JMPL-0 |
| 9D | 10011101 | STAL-1 | FD | 11111101 | CMPL-0 |

TABLE B-continued

MICROINSTRUCTIONS

| CROM 17 ADDRESS | | | CROM 17 ADDRESS | | |
|---|---|---|---|---|---|
| HEX | BINARY | MICRO-INSTRUCTION | HEX | BINARY | MICRO-INSTRUCTION |
| 9E | 10011110 | RJMP-1 | FE | 11111110 | CALL-0 |
| 9F | 10011111 | ItoA-1 *(5) | FF | 11111111 | RESET-0 |

TABLE C

THE MICROINSTRUCTION SET

| Micro-Instruction | Microinstruction Bits | Operations |
|---|---|---|
| IAQ-0: | First half of instruction fetch; increment PCL via ALU | |
| | #PCHtAH | PCH goes to AH bus |
| | #PCLtP, #PtAL | PCL goes to AL bus via P bus |
| | default N | All zeros to N bus for input to ALU |
| | #AluCntl = | Add P and N |
| | #ShftCntl = | Carry In is "1" |
| | #OtPCL | ALU output goes to PCL |
| | #MEMCNT, #MEM IAQ | First half of long read |
| | #JmpAddr = | |
| | #JmpCntl = | |
| IAQ-1: | Second half of Inst. Fetch; increment PCH; sample Interrupts | |
| | Don't Care to AH, AL | Address went out on AH', AL' during first half |
| | #PCHtP | PCH to P bus for ALU input |
| | default N | All zeros to N bus for ALU input |
| | #AluCntl = | Add P and N |
| | #ShftCntl = | Increment on uC of PCL |
| | #OtPCH | ALU output goes to PCH |
| | #MEM | Second half of long read |
| | #MDtIR IAQ | Instruction from memory goes to IR |
| | #JmpAddr = | |
| | #JmpCntl = | |
| IAQ-2: | Prefetch B register; Group dispatch to addressing mode | |
| | default AH | All zeros to AH bus |
| | #ONEtAL | 01 on AL bus for B register address |
| | #ALtP | AL to P bus for pass |
| | default N | All zeros to N bus for pass |
| | #AluCntl = | Add P and N |
| | #ShftCntl = | Zero carry in |
| | #OtMAL | ALU output (B register address) goes to MAL |
| | #MEM | Short memory read cycle to fetch B register |
| | #MDtT | B register contents loaded into T register from MD bus |
| | #JmpAddr = | Group dispatch based on contents of IR |
| | #JmpCntl = | |
| BtoA-O: | B Register to A Register Addressing Mode; Fetch A Register to MAL | |
| | default AH, AL | All zeros to AH, AL for A register address |
| | #ALtP | Zeros to P bus for pass |
| | default | zeros to N bus for pass |
| | #AluCntl = | Add P plus N (pass zeros) |
| | #ShftCntl = | Zero carry in |
| | #OtMAL | Zeros to MAL |
| | #MEM | Fetch A Register, result on MD bus |
| | #JmpAddr = | Function dispatch to DOPRUN, using function field in IR |
| | #JmpCntl+ | |
| RFtoA-O: | Register file to A Register Addressing Mode | |
| | #PCHtAH | Address for immediate fetch |
| | #PCLtP | PCL to P bus |
| | #PtAL | PCL to AL via P bus |
| | default N | Zeros to N bus for increment |
| | #AluCntl = | Add P plus N |
| | #ShftCntl = | Carry in is 1 to increment PCL |
| | #OtPCL | Result from ALU back to PCL |
| | #MEMCNT, #MEM | First half of long read |
| RFtoA-1: | Second half of Register File Fetch | |
| | Don't Care to AH, AL | Address bus continues from previous state |
| | #PCHtP | Set up PCH for increment |
| | default N | Zeros to N bus |
| RFtoA-2: | Fetch register file operand | |
| | default AH | Zeros to AH for MSH of RF address |
| | #PtAL, #MDtP | LSH of address comes from previous |

TABLE C-continued
THE MICROINSTRUCTION SET

| Micro-Instruction | Microinstruction Bits | Operations |
|---|---|---|
| | | memory fetch |
| | default N | Zeros to N bus for pass |
| | #AluCntl = | Pass P bus to MAL |
| | #ShftCntl = | Zero carry in |
| | #OtMAL | Result to MAL via O bus |
| | #MEM | Short memory read |
| | #MDtT | Read source operand into T register |
| | #JmpAddr = | Jump to B to A-O for A register fetch |
| | #JmpCntl = | |
| RFtoB-O: | Register file to B Register addressing mode; First half of long read, increment PCL | |
| | #PCHtAH | Address for immediate fetch |
| | #PtAL, #PCLtP | PCL to AL and P bus |
| | default N | Zeros to N for increment |
| | #AluCntl = | Add P plus N |
| | #ShftCntl = | Carry in is 1 for increment |
| | #OtPCL | Result back to PCL |
| | #MEMCNT, #MEM | First half of long read |
| | #JmpAddr = | Jump to RFtoA-1 |
| | #JmpCntl = | |
| RFtoB-2: | Fetch RF operand | |
| | default AH | Zeros for MSH of register file Address |
| | #MDtP, #PtAL | LSH of address comes from previous fetch |
| | default N | Zeros to N for pass P |
| | #AluCntl = | Add P plus N for pass |
| | #ShftCntl = | Zero carry |
| | #OtMAL | Result to MAL |
| | #MEM | Short read cycle |
| | #MDtT | Read source operand into T register |
| | #JmpAddr = | Jump to ItoB-2 |
| | #JmpCntl = | |
| RFtoRF-O: | Register file to register file addressing mode; fetch RF and increment PCL | |
| | #PCHtAH | MSH of address |
| | #PCLtP, #PtAL | PCL to AL and P bus for RF address |
| | default N | Zeros to N for increment |
| | #AluCntl = | Add P plus N |
| | #ShftCntl = | Carry in is 1 for increment |
| | #OtPCL | Result back to PCL |
| | #MEMCNT; #MEM | First half of long read |
| | #JmpAddr = | Jump to RFtoA-1 |
| | #JmpCntl = | |
| RFtoRF-2: | Fetch register file operand | |
| | default AH | MSH of register file address |
| | #MStP, #PtAL | LSH of address comes from previous fetch |
| | default N | Zeros to N for pass P |
| | #AluCntl = | Add P plus N |
| | #ShftCntl = | Zero Carry |
| | #OtMAL | Result to MAL |
| | #MEM | Short read cycle |
| | #MDtT | Register file operand to T register as source |
| | #JmpAddr = | Jump to ItRf = 2 to fetch destination operand |
| | #JmpCntl = | |
| ItoA-O: | Fetch immediate operand; increment PCL | |
| | #PCHtAH | Address for immediate fetch |
| | #PCLtP, #PtAL | PCL to AL and P bus for fetch and increment |
| | default N | Zeros to N bus |
| | #AluCntl = | Add P plus N |
| | #ShftCntl = | Carry in is 1 for increment |
| | #OtPCL | Result back to PCL |
| | #MEMCNT, #MEM | First half of long read |
| | #JmpAddr = | Unconditional jump to ItA-1 |
| | #JmpCntl = | |
| ItoA-1: | Second half of immediate fetch; increment PCH | |
| | don't care AH, AL | Address defined in first half |
| | #PCHtP | Set up PCH for increment |
| | default N | Zeros to N bus |
| | #AluCntl = | Add P plus N |
| | #ShftCntl = | Micro carry in from PCL increment |
| | #OtPCH | Result back to PCH |
| | #MEM | Second half of long read |
| | #MDtT | Source operand to T register |

TABLE C-continued
THE MICROINSTRUCTION SET

| Micro-Instruction | Microinstruction Bits | Operations |
|---|---|---|
| | #JmpAddr = | 3-way dispatch on group field |
| | #JmpCntl = | |
| ItoA-2: | Fetch Register A as destination operand | |
| | default AH, AL | Zeros to AH and AL for A register address |
| | default P, N | Zeros to P and N busses |
| | #AluCntl = | Add P plus N; all zeros |
| | #ShftCntl = | Zero carry in |
| | #OtMAL | Zeros to MAL |
| | #MEM | Short read cycle for A register, result on MD |
| | #JmpAddr = | Function dispatch on IR low; DOPFUN |
| | #JmpCntl = | |
| ItoB-O: | Immediate operand to B register addressing mode | |
| | #PCHtAH | High address for immediate fetch |
| | #PCLtP, #PtAL | PCL to AL and P bus for fetch and increment |
| | default N | Zeros to N for increment |
| | #AluCntl = | Add P plus N |
| | #ShftCntl = | Carry in is 1 for increment |
| | #OtPCL | Result back to PCL |
| | #MEMCNT, #MEM | First half long read |
| | #JmpAddr = | Jump to ItoA-1 (shared state) |
| | #JmpCntl = | |
| ItoB-2: | Fetch B register for destination operand | |
| | default AH | Zeros to AH bus for register file address |
| | #ONEtAL | 01 to AL bus for B register address |
| | #PtAL | 01 to P bus |
| | default N | Zeros to N for pass |
| | #AluCntl = | Add P plus N for pass |
| | #ShftCntl = | Zero carry in |
| | #OtMAL | Output to MAL |
| | #MEM | Short read cycle for B register, result on MD |
| | #JmpAddr = | Function dispatch using IR low; to DOPFUN |
| | #JmpCntl = | |
| ItoRF-O: | Immediate operand to register file mode; increment PCL | |
| | #PCHtAH | |
| | #PCLtP, #PtAL | |
| | default N | |
| | #AluCntl = | |
| | #ShftCntl = | |
| | #OtPCL | |
| | #MEMCNT, #MEM | |
| | #JmpAddr = | Unconditional jump to ItoA-1 (shared) |
| | #JmpCntl = | |
| ItoRf-2: | Address fetch for register file destination operand; increment PCL | |
| | #PCHtAH | |
| | #PCLtP, #PtAL | |
| | default N | |
| | #AluCntl = | |
| | #ShftCntl = | |
| | #OtPCL | |
| | #MEMCNT, #MEM | |
| | #JmpAddr = | |
| | #JmpCntl = | |
| ItoRF-3: | Second half of register file address fetch | |
| | don't care AH, AL | Address busses continued from previous cycle |
| | #PCHtP | Set up PCH for increment |
| | default N | Zeros to N bus |
| | #AluCntl = | Add P plus N |
| | #ShftCntl = | Increment on micro carry from PCL |
| | #OtPCH | Result back to PCH |
| | #MEM | Second half of long read |
| | #JmpAddr = | Unconditional jump to ItoRF-4 |
| | #JmpCntl = | |
| ItoRF-4: | Fetch register file operand | |
| | default AH | Zeros to AH for register file address |
| | #MDtP, #PtAL | LSH of address comes from fetch in previous state |
| | default N | Zeros to N for pass P |
| | #AluCntl = 0000 | Add P plus N (Pass P) |
| | #ShftCntl = | Zero carry in |
| | #OtMAL | Result to MAL |

TABLE C-continued
THE MICROINSTRUCTION SET

| Micro-Instruction | Microinstruction Bits | Operations |
|---|---|---|
| | #MEM | Short read cycle for destination operand |
| | #JmpAddr = | Function dispatch on IR low; to DOPFUN |
| | #JmpCntl = | |
| AtoPPL-0: | Addressing Mode for A register to peripheral page logical; fetch A register to T register | |
| | default AH, AH | Zeros for A register address |
| | don't care P,N | No ALU operation so P, N ALU and carry controls are "don't care" |
| | don't care #AluCntl | |
| | don't care #ShftCntl | |

TABLE D

| Format '0' | | Format '1' | |
|---|---|---|---|
| IR CONTENTS | Group Number | IR CONTENTS | Group Number |
| 0000xxxx | 0 | 10000xxx | 8L |
| 0001xxxx | 1 | 10001xxx | 8H |
| 0010xxxx | 2 | 10010xxx | 9L |
| 0011xxxx | 3 | 10011xxx | 9H |
| 0100xxxx | 4 | 10100xxx | AL |
| 0101xxxx | 5 | 10101xxx | AH |
| 0110xxxx | 6 | 10110xxx | BL |
| 0111xxxx | 7 | 10111xxx | BH |
| | | 11000xxx | CL |
| | | 11001xxx | CH |
| | | 11010xxx | DL |
| | | 11011xxx | DH |
| | | 11100xxx | EL |
| | | 11101xxx | EH |
| | | 11110xxx | FL |
| | | 11111xxx | FH |

TABLE F-continued
FUNCTION DISPATCH
Selection of Function to be Executed For Dual Operand Function

| OPCODE: IR Contents | CROM Address Hex | CROM Address Binary | Microinstruction |
|---|---|---|---|
| 0XXX0101 | 15 | 00010101 | XOR-0 |
| 0XXX0110 | 16 | 00010110 | BTH-0 |
| 0XXX0111 | 17 | 00010111 | BTL-0 |
| 0XXX1000 | 18 | 00011000 | ADD-0 |
| 0XXX1001 | 19 | 00011001 | ADC-0 |
| 0XXX1010 | 1A | 00011010 | SUB-0 |
| 0XXX1011 | 1B | 00011011 | SBB-0 |
| 0XXX1100 | 1C | 00011100 | MPY-0 |
| 0XXX1101 | 1D | 00011101 | CMP-0 |
| 0XXX1110 | 1E | 00011110 | DAC-0 |
| 0XXX1111 | 1F | 00011111 | DBS-0 |

CROM Address = Base address bits J7, J6, J5, J4 (here hex 10); plus function field of OPCODE (IR3, IR2, IR1, IR0)

| J7 | J6 | J5 | J4 | IR3 | IR2 | IR1 | IR0 |

TABLE E
GROUP DISPATCH
Selection of Addressing Mode

| FORMAT "0" | | | | FORMAT "1" | | | |
|---|---|---|---|---|---|---|---|
| IR CONTENTS | CROM ADDRESS HEX | CROM ADDRESS BINARY | MICRO-INSTRUCTION | IR CONTENTS | CROM ADDRESS HEX | CROM ADDRESS BINARY | MICRO-INSTRUCTION |
| 0000XXXX | 41 | 01000001 | MISC-0 | 10000XXX | 50 | 01010000 | AtoPPL-0 |
| 0001XXXX | 43 | 01000011 | RFtoA-0 | 10001XXX | 51 | 01010001 | DIRtoA-0 |
| 0010XXXX | 45 | 01000101 | ItoA-0 | 10010XXX | 52 | 01010010 | BtoPPL-0 |
| 0011XXXX | 47 | 01000111 | RFtoB-0 | 10011XXX | 53 | 01010011 | INDtoA-0 |
| 0100XXXX | 49 | 01001001 | RFtoRF-0 | 10100XXX | 54 | 01010100 | ItoPPL-0 |
| 0101XXXX | 4B | 01001011 | ItoB-0 | 10101XXX | 55 | 01010101 | INDXtoA-0 |
| 0110XXXX | 4D | 01001101 | BtoA-0 | 10110XXX | 56 | 01010110 | SglAS-0 |
| 0111XXXX | 4F | 01001111 | ItoRF-0 | 10111XXX | 57 | 01010111 | SglA-0 |
| | | | | 11000XXX | 58 | 01011000 | SglBS-0 |
| | | | | 11001XXX | 59 | 01011001 | SglB-0 |
| | | | | 11010XXX | 5A | 01011010 | SglRFS-0 |
| | | | | 11011XXX | 5B | 01011011 | SglRF-0 |
| | | | | 11100XXX | 5C | 01011100 | RJmp-0 |
| | | | | 11101XXX | 5D | 01011101 | TGC-0 |
| | | | | 11110XXX | 5E | 01011110 | TGB-0 |
| | | | | 11111XXX | 5F | 01011111 | TGA-0 |

CROM Address = Base Address bits J7, J6, J5 (base address is 40 in hex); plus the 4-bit group field or IR7, IR6, IR5, IR4 multiplied by 2 or left shifted one bit; plus IR3 or IR7.

| J7 | J6 | J5 | IR7 | IR6 | IR5 | IR4 | IR3 OR IR7 |

TABLE F
FUNCTION DISPATCH
Selection of Function to be Executed For Dual Operand Function

| OPCODE: IR Contents | CROM Address Hex | CROM Address Binary | Microinstruction |
|---|---|---|---|
| 0XXX0010 | 12 | 00010010 | ST-0 |
| 0XXX0011 | 13 | 00010011 | AND-0 |
| 0XXX0100 | 14 | 00010100 | OR-0 |

We claim:

1. A microprocessor device comprising:
a CPU formed in a semiconductor body and operating in a machine cycle, and
a memory including rows and columns of cells formed in said body, the CPU generating addresses for coupling to said memory, the memory being of the type requiring refresh within a given time period, a refresh address generator for generating addresses for coupling to said memory, addressing means for coupling to the memory every machine cycle one of said addresses from the CPU or one of said addresses from the refresh address generator, means for incrementing the refresh address generator every machine cycle only if an address from the refresh address generator is coupled to the memory, the machine cycle being less than said given time period divided by the number of said rows in the memory.

2. A device according to claim 1 wherein the address from the CPU includes a row and column address and the address from the refresh address generator includes only a row address.

3. A microprocessor device comprising:
- a CPU formed in a semiconductor body and operating in a machine cycle, and
- a memory including N rows of one-transistor dynamic storage cells formed in said body and accessed by the CPU by row and column address, the memory being of the type requiring refresh within a given time period, a refresh address generator for generating addresses only of said rows, addressing means for accessing the memory every machine cycle based on a row and column address from the CPU or a row address from the refresh address generator, means for incrementing the refresh address generator every machine cycle if the CPU does not access the memory, wherein the refresh address generator is not incremented if the CPU accesses the memory, the machine cycle being less than said given time period divided by N.

4. A device according to claim 3 wherein a bistable sense/refresh amplifier is connected to the center of each column of cells.

5. A method of operating a microcomputer system;
said microcomputer system having an arithmetic/logic unit, a plurality of data/address registers, an instruction register, a read-only memory, and a read/write memory; and said microcomputer system having data/address bus means for accessing the arithmetic/logic unit, the data/address registers, the instruction register, the read-only memory and the read/write memory; the sytem having a microinstruction memory means for addressing the microinstruction memory coupled to the instruction register;

comprising the steps of:
(a) clocking said system to access the read-only or read/write memory, to access the microinstruction memory and to operate the arithmetic/logic unit, in a repetitive machine state,
(b) generating a first address in a refresh address counter,
(c) generating a second address in one of said data-/address registers,
(d) generating a third address in another of said data-/address registers,
(e) applying an address to said read-only memory via said bus means to access a program instruction for loading in said instruction register,
(f) and selecting between said first and second addresses for applying an address to the read/write memory during every machine state.

6. A method according to claim 5 including the step of incrementing said refresh address counter during each machine cycle except when the second address is selected.

7. A method according to claim 5 wherein said second address is selected in response to the content thereof.

8. A method according to claim 7 wherein said second address is selected when said read-only memory is accessed.

9. A method according to claim 8 wherein said read/write memory has a maximum refresh time and said counter repeats within said refresh time.

* * * * *